United States Patent
Lee

(10) Patent No.: US 8,062,429 B2
(45) Date of Patent: Nov. 22, 2011

(54) METHODS OF CLEANING SEMICONDUCTOR DEVICES AT THE BACK END OF LINE USING AMIDOXIME COMPOSITIONS

(75) Inventor: Wai Mun Lee, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 464 days.

(21) Appl. No.: 12/260,625

(22) Filed: Oct. 29, 2008

(65) Prior Publication Data

US 2010/0043823 A1    Feb. 25, 2010

Related U.S. Application Data

(60) Provisional application No. 61/000,727, filed on Oct. 29, 2007, provisional application No. 61/006,224, filed on Dec. 31, 2007.

(51) Int. Cl.
*B08B 6/00* (2006.01)

(52) U.S. Cl. .................. 134/1.3; 134/2; 134/3; 510/175; 510/176; 510/407; 510/412; 438/199; 438/745; 438/754

(58) Field of Classification Search .................... 134/1.3, 134/2, 3; 510/175, 176, 407, 412; 438/199, 438/745, 754
See application file for complete search history.

(56) References Cited

U.S. PATENT DOCUMENTS

| | | | |
|---|---|---|---|
| 3,480,391 A | 11/1969 | Carlos | |
| 3,544,270 A | 12/1970 | Carlos et al. | |
| 3,794,488 A | 2/1974 | Henn et al. | |
| 3,882,018 A | 5/1975 | Depree | |
| 4,551,318 A | 11/1985 | Grosskinskey et al. | |
| 4,564,659 A * | 1/1986 | Kataoka et al. ............ | 525/328.2 |
| 4,576,804 A | 3/1986 | Grosskinskey et al. | |
| 4,629,613 A | 12/1986 | Grosskinskey et al. | |
| 4,634,584 A | 1/1987 | Grosskinskey et al. | |
| 5,808,150 A | 9/1998 | Michelotti | |
| 5,981,454 A * | 11/1999 | Small ............................ | 510/175 |
| 6,534,681 B1 | 3/2003 | Watzenberger et al. | |
| 6,546,939 B1 | 4/2003 | Small | |
| 7,220,322 B1 | 5/2007 | Sun et al. | |
| 2001/0020348 A1 | 9/2001 | Ueda et al. | |
| 2003/0119692 A1 | 6/2003 | So et al. | |

(Continued)

FOREIGN PATENT DOCUMENTS

DE    3343597    6/1985

(Continued)

OTHER PUBLICATIONS

U.S. Appl. No. 12/260,389, Lee, filed Oct. 29, 2008, Office Action mailed Oct. 13, 2009, 10 pgs.

(Continued)

*Primary Examiner* — Michael Barr
*Assistant Examiner* — Caitlin N Dennis
(74) *Attorney, Agent, or Firm* — Dunlap Codding, P.C.

(57) ABSTRACT

The present invention relates to aqueous compositions comprising amidoxime compounds and methods for cleaning plasma etch residue from semiconductor substrates including such dilute aqueous solutions. The compositions of the invention may optionally contain one or more other acid compounds, one or more basic compounds, and a fluoride-containing compound and additional components such as organic solvents, chelating agents, amines, and surfactants. The invention also relates to a method of removing residue from a substrate during integrated circuit fabrication.

18 Claims, 24 Drawing Sheets

U.S. PATENT DOCUMENTS

| | | |
|---|---|---|
| 2003/0171239 A1 | 9/2003 | Patel et al. |
| 2003/0235989 A1 | 12/2003 | Jayashankar |
| 2004/0089196 A1 | 5/2004 | Anderson et al. |
| 2004/0214931 A1 | 10/2004 | Ihara et al. |
| 2007/0007196 A1 | 1/2007 | Komatsu et al. |
| 2007/0049025 A1 | 3/2007 | Siddiqui et al. |
| 2009/0107520 A1 | 4/2009 | Lee et al. |
| 2009/0111965 A1 | 4/2009 | Lee |
| 2009/0112024 A1 | 4/2009 | Lee |
| 2009/0130849 A1 | 5/2009 | Lee |
| 2009/0133716 A1 | 5/2009 | Lee |
| 2009/0137191 A1 | 5/2009 | Lee |

FOREIGN PATENT DOCUMENTS

| | | |
|---|---|---|
| DE | 3343599 | 6/1985 |
| EP | 1167290 | 2/2002 |
| EP | 1266956 | 12/2002 |
| EP | 1610365 | 12/2005 |
| EP | 1610365 A1 * | 12/2005 |
| WO | 01/62710 | 8/2001 |
| WO | 2004/099086 | 11/2004 |
| WO | 2005/072338 | 8/2005 |
| WO | 2006/036368 | 4/2006 |
| WO | 2006/062178 | 6/2006 |
| WO | 2006/107517 | 10/2006 |
| WO | 2007/050409 | 5/2007 |
| WO | 2009/058272 | 5/2009 |
| WO | 2009/058273 | 5/2009 |
| WO | 2009/058274 | 5/2009 |
| WO | 2009/058275 | 5/2009 |
| WO | 2009/058277 | 5/2009 |
| WO | 2009/058278 | 5/2009 |
| WO | 2009/058287 | 5/2009 |
| WO | 2009/058288 | 5/2009 |
| WO | 2009/085072 | 7/2009 |

OTHER PUBLICATIONS

U.S. Appl. No. 12/260,389, Lee, filed Oct. 29, 2008, Office Action Response mailed Jan. 12, 2010, 7 pgs.

U.S. Appl. No. 12/260,649, Lee, filed Oct. 29, 2008, Office Action mailed Feb. 19, 2010, 11 pgs.

U.S. Appl. No. 12/260,649, Lee et al., filed Oct. 29, 2008, Application and Drawings, 70 pgs.

U.S. Appl. No. 12/260,672, Lee et al., filed Oct. 29, 2008, Application and Drawings, 149 pgs.

PCT/US2008/012234 (WO2009/058272), International Search Report and Written Opinion mailed Feb. 16, 2009, 10 pgs.

PCT/US2008/012235 (WO2009/058273), International Search Report and Written Opinion mailed Feb. 11, 2009, 8 pgs.

PCT/US2008/012236 (WO2009/058274), International Search Report and Written Opinion mailed Feb. 16, 2009, 9 pgs.

PCT/US2008/012237 (WO2009/085072), International Search Report and Written Opinion mailed Feb. 16, 2009, 10 pgs.

PCT/US2008/012238 (WO2009/058275), International Search Report and Written Opinion mailed Feb. 13, 2009, 9 pgs.

PCT/US2008/012240 (WO2009/058277), International Search Report and Written Opinion mailed Feb. 16, 2009, 9 pgs.

PCT/US2008/012241 (WO2009/058278), International Search Report and Written Opinion mailed Feb. 13, 2009, 9 pgs.

PCT/US2008/012253 (WO2009/058287), International Search Report and Written Opinion mailed Feb. 16, 2009, 10 pgs.

PCT/US2008/012254 (WO2009/058288), International Search Report and Written Opinion mailed Feb. 20, 2009, 7 pgs.

* cited by examiner

CRX08-035 30°C 10 min

CRX08-035 30°C 1 min

UNPROCESSED REFERENCE
(65nm BD2 Cu)

10% GLYCOLIC ACID/10% AMIDOXIME

METHODS OF CLEANING SEMICONDUCTOR DEVICES AT THE BACK END OF LINE USING AMIDOXIME COMPOSITIONS

CROSS-REFERENCE TO RELATED APPLICATIONS

This application claims the benefit of U.S. Provisional Application No. 61/000,727, filed Oct. 29, 2007, and U.S. Provisional Application No. 61/006,224, filed Dec. 31, 2007, both of which are incorporated herein by reference in its entirety.

BACKGROUND

Front End Of Line process (FEOL) operations are performed on the semiconductor wafer in the course of device manufacturing up to the first metallization. Back End Of Line process (BEOL) operation perform on the semiconductor wafer in the course of device manufacturing following the first metallization.

The present invention relates to the fabrication of semiconductor integrated circuits, and in particular, to the use of cleaning compositions comprising amidoxime compounds in the fabrication of semiconductor integrated circuits. Such cleaning compositions are useful in methods for cleaning plasma etch residue from semiconductor substrates and in methods for cleaning surfaces during fabrication, in particular, surfaces where the active components (transistors, resistors, etc.) are interconnected with wiring on the wafer—i.e., in the BEOL process.

BEOL generally begins when the first layer of metal is deposited on the wafer. It includes contacts, insulator, metal levels, and bonding sites for chip-to-package connections. Dicing the wafer into individual integrated circuit chips is also a BEOL process. More than 100 steps are involved in a standard integrated circuit ("IC") manufacturing process that involves wafer cleaning or surface preparation. Wafer cleaning and surface preparation includes post-resist strip/ash residue removal, native oxide removal, and even selective etching. Although dry processes continue to evolve and offer unique advantages for some applications, most cleaning/surface preparation processes are "wet," involving the use of a mixture of chemicals such as hydrofluoric; hydrochloric (HCl), sulfuric or phosphoric acid; or hydrogen peroxide, along with copious amounts of deionized water for dilution and rinsing. Wafers are typically processed in a batch immersion or batch spray system or, increasingly, with a single-wafer approach. The trend is toward more dilute chemistries, aided by the use of some form of mechanical energy, such as megasonics or jet-spray processing.

An important distinction in wafer cleaning today is that the main goal is not only particle removal, but some other function, such as removing oxide and photoresist residues after etching, stripping and/or ashing steps.

Surfaces may also be characterized as hydrophobic or hydrophilic. Hydrophilic surfaces in semiconductor substrates, include, for example, $SiO_2$, carbon doped oxide (low k dielectric), copper oxide surfaces and benzotriazole treated copper surfaces. Hydrophobic surfaces are more difficult to clean, in part because cleaning solutions do not wet as well due to the high contact angle. During the drying step, the solutions tend to "bead" up on the surface, leaving particles on the surface instead of keeping the particles in solution. Hydrophobic surfaces are easily wetted by cleaning solutions, and, during drying, any particles on the surface tend to stay in solution until the solution is removed from the surface.

The analytical method for describing wetting and determining whether a surface is hydrophobic or hydrophilic is to measure contact angle.

Contact angle is a quantitative measure of the wetting of a solid by a liquid. It is defined geometrically as the angle formed by a liquid at the three phase boundary where a liquid, gas and solid intersect as shown below. Contact angle measurement characterizes the interfacial tension between a solid and a liquid drop. The technique provides a simple method to generate a great amount of information for surface analysis. And because the technique is extremely surface sensitive, it can be used in semiconductor cleaning applications. Contact angle measurement is a simplified method of characterizing the interfacial tension present between a solid, a liquid, and a vapor. As shown in FIG. 1, when a droplet of a high surface tension liquid rests on a solid of low surface energy, the liquid surface tension will cause the droplet to form a spherical shape (lowest energy shape). Conversely, when the solid surface energy exceeds the liquid surface tension, the droplet is a flatter, lower profile shape.

Most cleaning challenges are evolutionary as structures get smaller and specifications get tighter. The evolution is driven by a variety of new materials, new integration schemes and process flows.

Another common problem with cleaning semiconductor surfaces is the deposition of contaminants on the surface of the semiconductor device. Any cleaning solutions that deposit even a few molecules of undesirable composition, such as carbon or sodium, will adversely affect the performance of the semiconductor device. Cleaning solutions that require a rinsing step can also result in depositing contaminants on the surface. Thus, it is desirable to use a cleaning chemistry that is will leave little to no residue on the semiconductor surface.

It may also be desirable to have a surface wetting agent in the cleaning solution. Surface wetting agents prevent contamination of the semiconductor work-piece by helping to stop spotting of the surface caused by droplets clinging to the surface. Spotting (also called watermarks) on the surface can saturate metrology tools that measure light point defects, thus masking defects in the semiconductor work-piece.

In the manufacture of integrated circuits, interconnects are used to couple active and passive devices together and to couple together conductive lines formed on different layers of the integrated circuits. To keep the resistivity low, interconnects are generally fabricated from good conductors, such as gold, silver, aluminum, copper, or alloys of aluminum or copper. Keeping interconnects resistivity low will decreases the heat generated in the circuit, which permits the fabrication of higher density circuits. Unfortunately, even using conducting metals having a low resistivity, the interface between interconnects and an active or passive device or the interfaces between interconnect and a conductive line may have a high resistivity. High resistivity at an interconnect interface is often caused by an unclean surface at the interface.

More than one hundred steps are involved in a standard IC manufacturing process which involve wafer cleaning or surface preparation including post-resist strip/ash residue removal, native oxide removal, and even selective etching. Although dry processes continue to evolve and offer unique advantages for some applications, most cleaning/surface prep processes are "wet," sometimes involving the use of other chemicals that may offer environmental challenges. Due to in part of environmental reasons, the use of more dilute chemistries has increased, aided by the use of some form of mechanical energy, such as megasonics or jet-spray processing. Accordingly, there is a need for chemistries that can effectively be used in diluted form.

Devices with critical dimensions on the order of 65 nanometers or less have involved integration of copper conductors and low-k dielectrics. Devices with critical dimensions on the order of 65 nanometers or less require alternating material deposition processes and planarization processes. Following almost each step in the fabrication process, e.g., a planarization step, a trenching step, or an etching step, cleaning processes are required to remove residues of the plasma etch, oxidizer, abrasive, metal or other liquids or particles remaining which contaminate the surface of the copper wafer. Fabrication of the current advanced generation of devices require copper conductors and low-k dielectric materials (typically carbon-silica or porous silica materials), both of which can react with and be damaged by various classes of prior art removers.

Low-k dielectrics in particular may be damaged in the cleaning process as evidenced by etching, changes in porosity/size, and ultimately changes in dielectric properties. Continuous wet process is required to remove the residues without any effect on damaged low-k layer, for instance k-value shift and CD loss. In addition, copper surface control is considered to be important for reliable electrical properties: Oxide layer on copper surface (CuOx) is required to be removed in the wet process and re-oxidation on the bare copper surface needs to be prevented.

In juxtaposition, cleaning needs and goals have become more demanding. Increasingly, wafers are being processed with a single-wafer approach, as compared to a batch immersion or batch spray system or, increasingly, with a single-wafer approach. This requires faster and effective chemical cleaning. Further, in wafer cleaning applications, particle removal may not be the main goal, but some other goal, such as removing native oxide or photoresist residue removal after strip/ash. Accordingly, there is a need for chemistries that can be used in both single-wafer and batch processing, while addressing a variety of goals in the removal process.

This concern in semiconductor cleaning processes increase the need to use chemistries containing more effective complexing agents.

Complexing agents for metal ions are required for a wide variety of industries. Examples of relevant purposes and uses are: detergents and cleaners, industrial cleaners, electroplating, water treatment and polymerizations, the photographic industry, the textile industry and the papermaking industry, and various applications in pharmaceuticals, in cosmetics, in foodstuffs and in plant feeding.

Most formulations being used in cleaning semiconductor substrates also contain complexing agents, sometimes called chelating agents.

Examples of complexing agents are nitrilotriacetic acid (NTA), ethylenediaminetetraacetic acid (EDTA), N,N'-bis(2-hydroxyphenyl)ethylenediiminodiacetic acid (HPED), triethylenetetranitrilohexaacetic acid (TTHA), desferriferrioxamin B,N,N',N"-tris[2-(N-hydroxycarbonyl)ethyl]-1,3,5-benzenetricarboxamide (BAMTPH), and ethylenediaminediorthohydroxyphenylacetic acid (EDDHA), ethylenediaminetetramethylenephosphonic acid (EDTMP), propylenediaminetetraacetic acid (PDTA), hydroxypropylenediaminetetraacetic acid (HPDTA), isoserinediacetic acid (ISDA), β-alaninediacetic acid (β-ADA), hydroxyethanediphosphonic acid, diethylenetriaminetetraacetic acid, diethylenetriaminetetramethylenephosphonic acid, hydroxyethyleneaminodiacetic acid, hydroxyethylethylenediaminetriacetic acid, diethylenetriaminepentaacetic acid and, furthermore, diethanolglycine, ethanolglycine, citric acid, glycolic acid, glyoxylic acid, lactic acid, phosphonic acid, glucoheptonic acid or tartaric acid, polyacrylates, carbonates, phosphonates, and gluconates.

In some cases, the biodegradability is also unsatisfactory. Thus, EDTA proves to have inadequate biodegradability in conventional tests, as does PDTA or HPDTA and corresponding aminomethylenephosphonates which, moreover, are often undesirable because of their phosphorus content. Phosphorus is also a dopant in semiconductor devices; therefore it is desirable to have cleaning solutions with non-phosphor containing compounds.

Much metal-chelating functionality is known. Metal chelation is when a central metal ion attaches by coordination links to two or more nonmetal atoms (ligands) in the same molecule. Heterocyclic rings are formed with the central (metal) atom as part of each ring. When the complex becomes more soluble in the solution, it functions as a cleaning process. If the complexed product is not soluble in the solution, it becomes a passivating agent by forming an insoluble film on top of the metal surface.

The current complexing agents being used as complexing agent for semiconductor cleaning include compounds, such as, glycolic acid, glyoxylic acid, lactic acid, phosphonic acid etc. They are acidic in nature and have a tendency to attack the residue and remove both metals and metal oxides, such as copper and copper oxide. This presents a problem for formulators where a chelating function is sought but only selectively to metal oxide and not the metal itself, e.g., in an application involving metal, such as copper. Accordingly, there is a need for complexing agents that are not aggressive toward metal substrates, while effectively providing for the chelation of metal ions residue created during the manufacturing processes.

The present invention addresses these problems.

SUMMARY OF PREFERRED EMBODIMENTS

One embodiment of the present invention involves the use of an aqueous composition comprising an amidoxime compound containing one or more amidoxime functional groups in a semiconductor application wherein the amidoxime compound complexes with metal (or metal oxide) on a surface, in a residue, or both.

An embodiment of the invention relates to a method for removing residue from a substrate during integrated circuit fabrication, the method including the steps of providing a substrate comprising metal and/or metal alloy portions and/or layers and a surface having organic, organometallic, and/or metal oxide etching residue thereon, and contacting the substrate with a composition comprising at least one amidoxime compound and water for a time and at a temperature sufficient to remove the residue from the substrate.

In one embodiment, the composition of the invention can include one or more organic solvents miscible in water. The one or more organic solvents can be present in an amount from about 5% to about 75% by weight and can be selected from the group consisting of glycol, sulfoxide, sulfolane and pyrrolidone.

In one embodiment, the composition of the invention can optionally include one or more surfactants.

In one embodiment, the composition of the invention can optionally include one or more additional compounds that contain functional groups which complex or chelate with metals or metal oxides.

In one embodiment, the composition of the invention can optionally include one or more acid compounds. The acids compounds can be organic acids. In one embodiment, the one or more organic acids can be present in an amount from about 0.2% to about 45% by weight and can be selected from the group consisting of methanesulfonic acid, oxalic acid, lactic acid, citric acid, xylenesulfonic acid, toluenesulfonic acid, dodecylbenzenesulfonic acid, formic acid, tartaric acid, propionic acid, benzoic acid, ascorbic acid, gluconic acid, malic acid, malonic acid, succinic acid, gallic acid, butyric acid, trifluoracetic acid, and mixtures thereof. In another embodiment, the one or more organic acid compounds are present in an amount from about 0.2% to about 15% by weight.

In one embodiment, the composition of the invention can optionally include one or more basic compounds. In another embodiment, the one or more basic compounds can be present in an amount from about 0.1% to about 50% by weight, and the one or more basic compounds can be selected from the group consisting of an ammonium compound; hydroxylamine; a hydroxylamine derivative; one or more alkanolamines and mixtures thereof. In another embodiment, the one or more basic compounds can be present in an amount from about 0.1% to about 50% by weight and the one or more basic compounds can be selected from the group consisting of an ammonium compound; hydroxylamine; a hydroxylamine derivative; one or more alkanolamines and mixtures thereof. The one or more basic compounds can comprise hydroxylamine and/or a hydroxylamine derivative present in an amount from about 0.3% to about 45% by weight. The hydroxylamine derivative can be N,N-diethylhydroxylamine. Hydroxylamine is present in a 50% solution in water. In another embodiment, the ammonium compound is present in the amount from about 0.3% to about 45% by weight and is selected from the group consisting of tetramethylammonium hydroxide (TMAH), TMAH pentahydrate, BTMAH, TBAH, choline, and THEMAH. In another embodiment, the alkanolamine component can be present in the amount from about 0.3% to about 45% by weight and can comprise monoethanolamine, 2-(2-hydroxylethylamino)ethanol, 2-(2-aminoethoxy)ethanol, N,N,N-tris(2-hydroxyethyl)-ammonia, isopropanolamine, 3-amino-1-propanol, 2-amino-1-propanol, 2-(N-methylamino)ethanol, 2-(2-aminoethylamino)ethanol, tris(hydroxymethyl)aminoethane, or mixtures thereof.

Preferred alkanolamines can include monoethanolamine, 2-(2-hydroxylethylamino)ethanol, 2-(2-aminoethoxy)ethanol, N,N,N-tris(2-hydroxyethyl)-ammonia, isopropanolamine, 3-amino-1-propanol, 2-amino-1-propanol, 2-(N-methylamino)ethanol, 2-(2-aminoethylamino)ethanol, and mixtures thereof. In one embodiment, the range of alkanolamine is from about 0.3% to about 65% by weight.

In a preferred embodiment, a basic component may be present in an amount from about 0.3% to about 65% by weight. The basic component may also be N,N-diethylhydroxylamine, a tri-alkylammonium hydroxide or tetra-alkylammonium hydroxide present in an amount from about 0.5% to about 15% by weight. In another preferred embodiment the basic component is hydroxylamine or a hydroxylamine derivative.

Optionally, the composition can include a compound which has oxidation and reduction potentials, such as a hydroxylamine, a hydroxylamine derivative, a salt, or hydrogen peroxide.

In one embodiment, the composition can optionally include one or more fluoride-containing compounds which are substantially free from metal ions. The one or more fluoride-containing compounds can be present in an amount from about 0.01% to about 5% by weight, and the fluoride-containing compounds comprise ammonium bifluoride, quaternary ammonium fluoride, ammonium fluoride, or mixtures thereof.

In one embodiment, the composition can optionally include a chelating agent and/or a corrosion inhibitor.

The compositions of the invention contemplate various combinations of the above optional components. For example, the composition can comprise or consist essentially of at least one amidoxime compound and water. Or, in another exemplary aspect, the composition can comprise at least one amidoxime compound, water and one or more organic solvents miscible in water. Or, in another exemplary aspect, the composition can comprise at least one amidoxime compound, water and one or more acid compounds. Or, in another exemplary aspect, the composition can comprise at least one amidoxime compound, water, and one or more basic compounds. Or, in another exemplary aspect, the composition can comprise at least one amidoxime compound, water, one or more organic solvents miscible in water and one or more acidic compounds. Or, in another exemplary aspect, the composition can comprise at least one amidoxime compound, water, and one or more fluoride-containing compounds which are substantially free from metal ions. Or, in another exemplary aspect, the composition can comprise at least one amidoxime compound, water, one or more organic solvents miscible with water and one or more fluoride-containing compounds which are substantially free from metal ions.

In another embodiment, the compositions are substantially free from fluorine-containing compounds, acid compounds, organic solvents, alkanolamines, quaternary ammonium compounds, hydroxylamine and hydroxylamine derivatives, non-hydroxyl-containing amines, alkanolamines, non-amidoxime group chelating agents, and surfactants.

In another embodiment, the amidoxime has any one of the following structures:

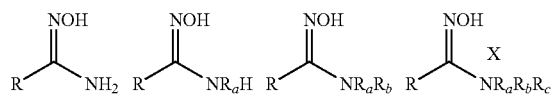

or tautomers thereof, wherein X is a counterion and R, $R_a$, $R_b$ and $R_c$ are independently selected from alkyl, heteroalkyl, aryl and heteroaryl, and wherein the alkyl, heteroalkyl, aryl and heteroaryl are optionally substituted. In one embodiment, R is an optionally substituted alkyl group. In another embodiment, R is an optionally substituted heteroalkyl group.

In another embodiment, the amidoxime has the following structure:

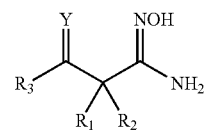

wherein $R_1$, $R_2$ and $R_3$ are independently selected from hydrogen, alkyl, heteroalkyl, aryl or heteroaryl, wherein the alkyl, heteroalkyl, aryl and heteroaryl are optionally substituted, and wherein Y is O, NH or NOH.

In another embodiment, the amidoxime has the following structure:

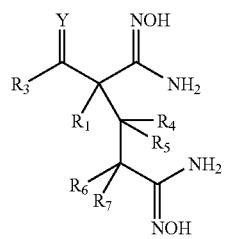

wherein $R_1$, $R_2$, $R_3$, $R_4$, $R_5$, $R_6$ and $R_7$ are independently selected from hydrogen, alkyl, heteroalkyl, aryl and heteroaryl, wherein the alkyl, heteroalkyl, aryl and heteroaryl are optionally substituted, and wherein Y is O, NH or NOH.

In one embodiment, the amidoxime is selected from the group consisting of
1,2,3,4,5,6-hexakis-O-[3-(hydroxyamino)-3-iminopropyl hexitol;
3,3',3'',3'''-(ethane-1,2-diylbis(azanetriyl))tetrakis(N'-hydroxypropanimidamide);
3,3'-(ethane-1,2-diylbis(oxy))bis(N'-hydroxypropanimidamide);
3-(diethylamino)-N'-hydroxypropanimidamide;
3,3'-(piperazine-1,4-diyl)bis(N'-hydroxypropanimidamide);
3-(2-ethoxyethoxy)-N'-hydroxypropanimidamide;
3-(2-(2-(dimethylamino)ethoxy)ethoxy)-N'-hydroxypropanimidamide;
N'-hydroxy-3-(phenylamino)propanimidamide;
3,3',3''-nitrilotris(N'-hydroxypropanimidamide);
3,3'-(2,2-bis((3-(hydroxyamino)-3-iminopropoxy)methyl)propane-1,3-diyl)bis(oxy)bis(N-hydroxypropanimidamide);
3,3'-(2,2'-(methylazanediyl)bis(ethane-2,1-diyl)bis(oxy))bis(N'-hydroxypropanimidamide);
N,N-bis(3-amino-3-(hydroxyimino)propyl)acetamide;
3,3'-(2-(N'-hydroxycarbamimidoyl)phenylazanediyl)bis(N'-hydroxypropanimidamide);
3,3'-(2,2'-(3-amino-3-(hydroxyimino)propylazanediyl)bis(ethane-2,1-diyl))bis(oxy)bis(N'-hydroxypropanimidamide);
N',3-dihydroxypropanimidamide;
NN'-hydroxyacetimidamide;
N'-hydroxy-3-(methylamino)propanimidamide;
3,3'-azanediylbis(N'-hydroxypropanimidamide);
3-amino-3-(hydroxyimino)propanoic acid;
3-amino-3-(hydroxyimino)propanamide;
N'1,N'10-dihydroxydecanebis(imidamide);
N'-hydroxyisonicotinimidamide;
2-dihydroxyacetimidamide;
2-chloro-N'-hydroxyacetimidamide;
2-amino-N'-hydroxybenzimidamide;
2,2'-azanediylbis(N'-hydroxyacetimidamide);
N'-hydroxy-1-oxo-1,3-dihydroisobenzofuran-5-carboximidamide;
3-aminoisoquinolin-1(4H)-one oxime;
3-(hydroxyamino)-3,4-dihydroisoquinolin-1-amine;
N'-hydroxycinnamimidamide;
4-chloro-N'-hydroxybenzimidamide;
and salts thereof.

In one embodiment, the amidoxime compound is prepared from a reaction of hydroxylamine and a nitrile compound. In another embodiment, the nitrile compound can be prepared from cyanoethylation of nucleophilic compounds with acrylonitrile. The nucleophilic compounds can be selected from the group consisting of
a. compounds containing one or more —OH or —SH groups;
b. compounds containing one or more —NH— groups;
c. ketones or aldehydes possessing a —CH—, —$CH_2$—, or —$CH_3$ group adjacent to the carbonyl group; and
d. malonic esters, malonamide and cyanoacetamide.

In one embodiment, the above compounds containing one or more —OH or —SH groups are alcohols, phenols, oximes, hydrogen sulphide and thiols.

In one embodiment, the above compounds containing one or more —NH— groups are ammonia, primary and secondary amines, hydrazines, and amides.

In one embodiment, the method includes further diluting the composition with water prior removing residue from a substrate during integrated circuit fabrication. The dilution factor can be from about 10 to 500.

In one embodiment, the composition may contain from about 0.1% to about 99.9% water and from about 0.01% to about 99.9% of one or more compounds with one or more amidoxime functional groups.

In one embodiment, the composition contains about 5% to about 85% by weight of an organic solvent miscible in water.

One embodiment is a method of cleaning a substrate during interconnect fabrication using an method comprising: at least about 75% by weight of a mixture of water and optionally an organic solvent; from about 0.5% to about 10% by weight of at least one compound containing at least one amidoxime functional group; optionally one or more other acid compounds; and optionally one or more fluoride-containing compounds.

The compositions herein may contain substantially no additional components.

In another embodiment, the concentration of water is at least about 85% by weight. Preferably at least about 90% or at least 95% by weight.

A preferred source of the amidoxime group is from a nitrile compound that is derived from the cyanoethylation of a compound selected from the group consisting of sugar alcohols, hydroxy acids, sugar acids, monomeric polyols, polyhydric alcohols, glycol ethers, polymeric polyols, polyethylene glycols, polypropylene glycols, amines, amides, imides, amino alcohols, and synthetic polymers.

The reaction of nitrile-containing compounds with hydroxylamine are as follows, for example:

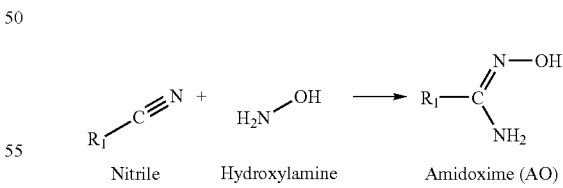

Nitrile    Hydroxylamine    Amidoxime (AO)

The amidoxime structure can be represented in their resonance form as illustrated below

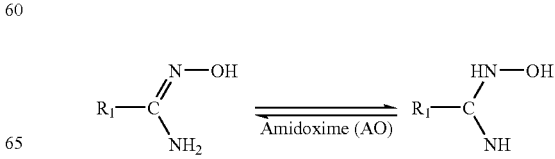

Amidoximes are made by the reaction of hydroxylamine with nitrile compounds. The most preferred compounds which undergo cyanoethylation include the following:

Compounds containing one or more —OH or —SH groups, such as water, alcohols, phenols, oximes, hydrogen sulphide and thiols.

Compounds containing one or more —NH— groups, e.g., ammonia, primary and secondary amines, hydrazines, and amides.

Ketones or aldehydes possessing a —CH—, —$CH_2$—, or —$CH_3$ group adjacent to the carbonyl group.

Compounds such as malonic esters, malonamide and cyanoacetamide, in which a —CH— or —$CH_2$— group is situated between. —$CO_2R$, —CN, or —CONH— groups.

A list of the above compounds can be found in the CRC Handbook—Table for Organic Compound Identification, $3^{rd}$ Ed. Published by The Chemical Rubber Company, such Table is incorporated herein by reference.

Formulations containing amidoximes may optionally include other complexing agents and the amidoxime compound could have other functional groups that have a chelate functionality within the molecule itself.

The compositions of the present application include semiconductor processing compositions comprising water and at least one compound containing at least one amidoxime functional group. It a preferred embodiment the at least one amidoxime functional groups are derived from a nitrile compound.

In some embodiments the nitrile compound is derived from the cyanoethylation of a compound selected from the group consisting of sugar alcohols, hydroxy acids, sugar acids, monomeric polyols, polyhydric alcohols, glycol ethers, polymeric polyols, polyethylene glycols, polypropylene glycols, amines, amides, imides, amino alcohols, and synthetic polymers.

Another embodiment is a method of cleaning a wafer comprising: placing a wafer in single wafer cleaning tool; cleaning said wafer with a solution comprising: water, a compound with an amidoxime group; an organic solvent in the amount of about 0 to about 99 percent by weight; a base in the amount of about 1 to about 45 percent by weight; a compound with oxidation and reduction potential in an amount of about 0.001 to about 25 percent by weight; an activator in the amount of about 0.001 to about 25 percent by weight; optionally an additional chelating or complexing agent in the amount of about 0 to about 15 percent by weight; a surfactant in an amount of about 10 ppm to about 5 percent by weight; and a fluoride ion source in an amount of about 0.001 to about 10 percent by weight.

In another embodiment, the compositions herein are diluted prior to use in an amount of up to about 1000 parts water by weight to about 1 part of the composition by weight, more preferably up to about 500 parts water by weight to about 1 part of the composition, or up to about 100 parts water by weight to about 1 part of the composition or up to about 10 parts water by weight to about 1 part of the composition, or 1 part water to about 1 part of the composition, including ratios in between. The dilution is performed prior to use in some embodiments and after use in another embodiment. When performed prior to use, the water is added, for example, within about one week, or about one day, or about one hour. It has been found that the fresh dilution is more effective than if said dilution occurred greater than about one week from use. By use, for example, the mixture is contacted with a substrate.

BRIEF DESCRIPTION OF THE FIGURES

In order to facilitate a fuller understanding of the present disclosure, reference is now made to the accompanying figures. These figures should not be construed as limiting the present disclosure, but are only intended to be exemplary. It will be obvious to the skill in the art that the cleaning performance can be adjusted by varying time, temperature, pH, composition and dilution of the present invention.

FIGS. 8A to 8D provide the results comparing compositions S (0% glycolic acid), U (1% glycolic acid), M (5% glycolic acid and P (10% glycolic acid) in Table 9 at 30° C. for 1 minute and 10 minutes. The compositions were used to clean a dual damascene structure with carbon doped oxide—BlackDiamond II (BDII) from Applied Material. The mixtures of 1%, 5% and 10% glycolic acid in a compositions with an amidoxime concentration of 1% further improve the removal of the post etch residue at 30° C. from 1 to 10 minutes without damaging the copper surface and the low k dielectric material.

FIGS. 8E to 8H provide the results comparing formulations N (0% glycolic acid), R (1% glycolic acid), Q (5% glycolic acid and T (10% glycolic acid) in Table 9 at 30° C. for 1 minute and 10 minutes. The compositions were used to clean a dual damascene structure with carbon doped oxide—BlackDiamond II (BDII) from Applied Material. The mixtures of 1%, 5% and 10% glycolic acid in a composition with an amidoxime concentration of 5% further improve the removal of the post etch residue at 30° C. in 1 to 10 minutes without damaging the copper surface and the low k dielectric material.

Figure 1:
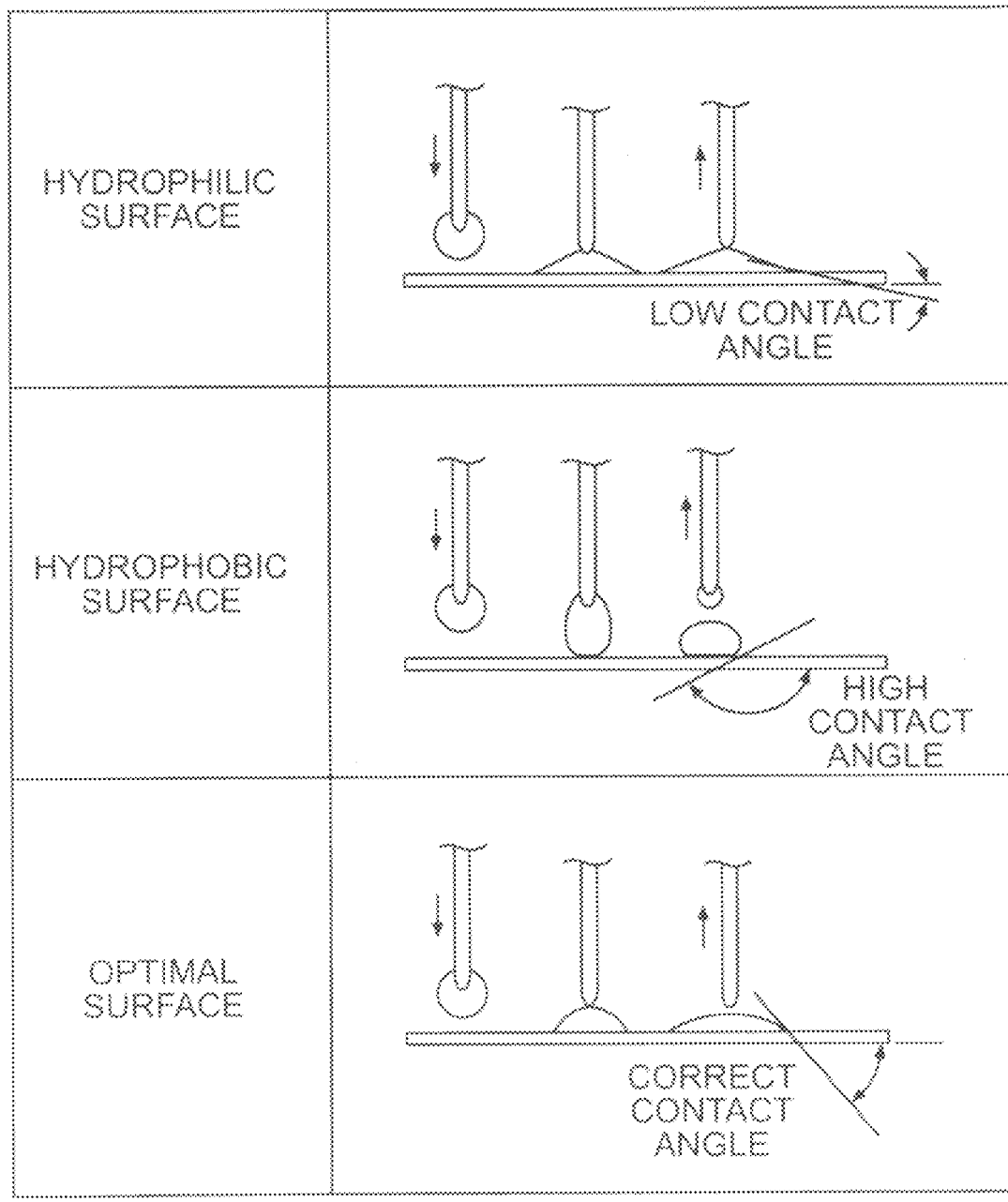
FIG. 1 is an illustration of the importance of the contact angle between the cleaning composition and the substrate surface to attain optimal cleaning performance.

FIG. 8I to 8L provide the result comparing formulations V (0% glycolic acid), K (1% glycolic acid), L (5% glycolic acid and O (10% glycolic acid) in Table 9 at 30° C. for 1 minute and 10 minutes. The composition comprising 10% amidoxime were used to clean a dual damascene structure with carbon doped oxide—BlackDiamond II (BDII) from Applied Material. The mixtures of 1%, 5% and 10% glycolic acid in a composition comprising 10% amidoxime become too aggressive on the copper surface and begin to attack the copper, however it did not damage low k dielectric material

DESCRIPTION OF PREFERRED EMBODIMENTS

The present invention is to methods of removing residues at the back end of the line using aqueous compositions containing one or more complexing agents or compounds having one or more multidentate chelating groups where at least one agent or group is an amidoxime. Such compositions exhibit improved performance in removing such residues, particularly where such residues contain metals and metal oxides.

Dilute aqueous solutions of one or more amidoxime compounds can conveniently be used to clean plasma ash residues from semiconductor substrates due to their effectiveness in binding metal oxide in wide range of pH. The following illustrates the Principle of metal capture by amidoxime group:

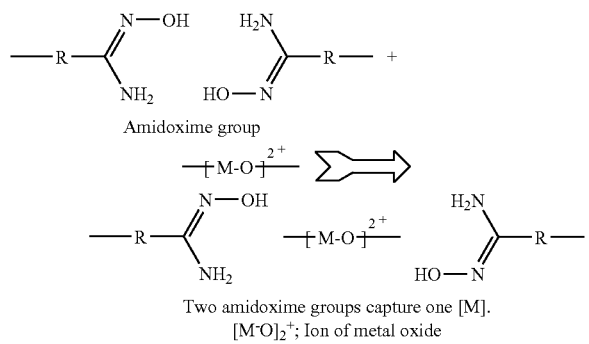

Two amidoxime groups capture one [M].
[M⁻O]₂⁺; Ion of metal oxide

In addition to the one or more amidoxime compounds or groups, the compositions preferably contain other chelating agents or compounds having chelating/complexing functional groups. Non-exhaustive examples of such complexing agents include nitrilotriacetic acid (NTA), ethylenediaminetetraacetic acid (EDTA), ethylenediaminetetramethylenephosphonic acid (EDTMP), propylenediaminetetraacetic acid (PDTA), hydroxypropylenediaminetetraacetic acid (HPDTA), isoserinediacetic acid (ISDA), β-alaninediacetic acid (β-ADA), hydroxyethanediphosphonic acid, diethylenetriaminetetraacetic acid, diethylenetriaminetetramethylenephosphonic acid, hydroxyethyleneaminodiacetic acid, hydroxyethylethylenediaminetriacetic acid, diethylenetriaminepentaacetic acid and, furthermore, diethanolglycine, ethanolglycine, citric acid, glycolic acid, glyoxylic acid, lactic acid, phosphonic acid, glucoheptonic acid, catechol, gallic acid, tartaric acid, and groups such as hydroxamic acid, thiohydroxamic acid, N-hydroxyurea, N-hydroxycarbamate and N-nitroso-alkyl-hydroxylamine groups.

Surprisingly, it has been found that the addition of such compounds to residue removal, precleaning, and resist stripping applications effectively remove contaminants while having no negative effect on the substrate surfaces.

Without being bound to any particular theory, it is understood that the multidentate complexing agents disclosed above complex with substrate surfaces to remove contaminants on such surfaces. Amidoxime molecules can be designed to function as passivation agents on a metal surface by rendering insoluble the metal complex. Or such molecules can function as a cleaning agent by rendering the metal containing residue more soluble.

Amidoxime copper complexes have shown to be readily soluble in water under basic conditions while less soluble under acidic conditions. Accordingly, the passivating/cleaning effect of the amidoxime chemistry can be affected by altering the pH.

U.S. Pat. No. 6,166,254, for example, discusses the formation of amidoximes from aqueous hydroxylamine freebase and nitrites, such as the reaction of acetonitrile with aqueous hydroxylamine at ambient temperature to yield high purity acetamidoxime.

It will be obvious to those skills of the art that other nitrites will react with hydroxylamine freebase in similar manners.

Amidoximes have been shown to complex with metals, such as copper. Amidoximes of cyanoethylated cellulose have also been shown to complex with copper and other metal ions. (See, Altas H. Basta, International Journal of Polymeric Materials, 42, 1-26 (1998)).

One preferred embodiment of the present invention is to compositions, and method of use thereof, containing a group of higher pH range chelating compounds comprising at least two functional groups where at least one such group is an amidoxime. The other groups or complexing compounds may be selected as may be beneficial for the application, the chemistry, and/or the conditions. Examples of other complexing groups include hydroxamic acid, thiohydroxamic acid, N-hydroxyurea, N-hydroxycarbamate, and N-nitroso-alkyl-hydroxylamine. These groups offer synergistic advantages when used with amidoximes of removing metal oxide, such as copper oxide, residue by rendering such oxides soluble in aqueous solutions. As with amidoximes, these functional groups can be formed by reaction with hydroxylamine or hydroxylamine derivatives.

Regarding other complexing agents that may optionally be used with amidoximes in the compositions of the present application, complexing agents may be purchased commercially or prepared by known methods. A non-exhaustive list has been previously presented.

One example of a synergistic functional group is a hydroxamic acid group. Such groups are well known (H. L. Yale, "The Hydroxamic Acids", Chem. Rev., 209-256 (1943)). Polymers containing hydroxamic acid groups are known and can be prepared by addition of hydroxylamine to anhydride groups of anhydride-containing copolymers, such as styrene-maleic anhydride copolymer or poly(vinylmethylether/maleic anhydride) copolymers, or by reaction of hydroxylamine with ester groups. Hydroxamic acid-containing polymers can also be prepared by acid-catalyzed hydrolysis of polymers that contain amidoxime groups (U.S. Pat. No. 3,345,344).

U.S. Pat. No. 6,235,935, for example, discusses the formation of high purity oximes from aqueous hydroxylamine and ketones reacted at ambient temperature without addition of impurities such as salts or acids.

Thiohydroxamic acids are another synergistic type of functional groups with amidoximes and can be prepared by addition of hydroxylamine to dithiocarboxylic acids (H. L. Yale, Chem. Rev., 33, 209-256 (1943)).

N-hydroxyureas are another synergistic type of functional groups with amidoximes and can be prepared by reaction of hydroxylamine with an isocyanate (A. O. Ilvespaa et al., Chime (Switz.) 18, 1-16 (1964)).

N-Hydroxycarbamates are another synergistic type of functional groups with amidoximes and can be prepared by reaction of hydroxylamine with either a linear or cyclic carbonate (A. O. Ilvespaa et al., Chimia (Switz.) 18, 1-16 (1964)).

N-Nitroso-alkyl-hydroxylamines are another synergistic type of functional groups with amidoximes and can be prepared by nitrosation of alkyl hydroxylamines (M. Shiino et al., Bioorganic and Medicinal Chemistry 95, 1233-1240 (2001)).

One embodiment of the present invention involves methods of precleaning substrates or removing stripping or ashing residues using aqueous cleaning solutions which comprise at least one chelating compound with one or more amidoxime functional group.

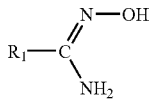

The amidoximes can be prepared by the reaction of nitrile-containing compounds with hydroxylamine.

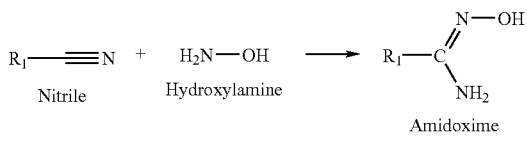

A convenient route to the formation of amidoxime chelating compounds is by adding hydroxylamine to the corresponding nitrile compound. There are several methods known for preparing nitrile-containing compounds, including cyanide addition reactions such as hydrocyanation, polymerization of nitrile-containing monomers to form polyacrylonitrile or copolymers of acrylonitrile with vinyl monomers, and dehydration of amides. Typical procedures for the syntheses of nitriles may be found in J. March, Advanced Organic Chemistry, 4th ed., John Wiley and Sons, NY, (1992).

Nitriles compounds listed in the CRC Handbook (pages 344-368) can be used in this invention include but not limited to the followings: Cyanoacetylene, Cyanoacetaldehyde, Acrylonitrile, Fluoroacetonitrile, Acetonitrile (or Cyanomethane), Trichloroacetonitrile, Methacrylonitrile (or α-Methylacrylonitrile), Proionitrile (or Cyanoethane), Isobutyronitrile, Trimethylacetonitrile (or tert-Butylcyanide), 2-Ethyacrylonitrile, Dichloroacetonitrile, α Chloroisobutyronitrile, n-Butyronitrile (or 1-Cyanopropane), trans-Crotononitrile, Allycyanide, Methoxyacetonitrile, 2-Hydroxyisobutyronitrile (or Acetone cyanohydrins), 3-Hydroxy-4-methoxybenzonitrile, 2-Methylbutyronitrile, Chloroacetonitrile, Isovaleronitrile, 2,4-Pentadienenitrile, 2-Chlorocrotononitrile, Ethoxyacetonitrile, 2-Methycrotononitrile, 2-Bromoisobutyronitrile, 4-Pentenonitrile, Thiophene-2,3-dicarbonitrile (or 2,3-Dicyanothiophene), 3,3-Dimethylacrylonitrile, Valeronitrile (or 1 Cyanobutane), 2-Chlorobutyronitrile, Diethylacetonitrile, 2-Furanecarbonitrile (or β-Furonitrile; 2 Cyanofuran), 2-Methylacetoacetonitrile, Cyclobutanecarbonitrile (or Cyanocyclobutane), 2-Chloro-3-methybutyronitrile, Isocapronitrile (or 4-Methylpentanonitrile), 2,2-Dimethylacetoacetonitrile, 2-Methylhexanonitrile, 3-Methoxypropionitrile, n-Capronitrile (n-Hexanonitrile), (Ethylamino) acetonitrile (or N-Ethylglycinonitrile), d,l-3-Methylhexanonitrile, Chlorofumaronitrile, 2-Acetoxypropionitrile (or O-Acetyllactonitrile), 3-Ethoxypropionitrile, 3-Chlorobutyronitrile, 3-Chloropropionitrile, Indole-3-carbonitrile (or 3-Cyanoindole), 5-Methylhexanonitrile, Thiophene-3-carbonitrile (or 3-Cyanothiophene), d,l-4-Methylhexanonitrile, d,l-Lactonitrile (or Acetaldehydecyanohydrin), Glycolnitrile (or Formaldehydecyanohydrin), Heptanonitrile, 4-Cyanoheptane, Benzonitrile, Thiophene-2-carbonitrile (or 2-Cyanothiophene), 2-Octynonitrile, 4-Chlorobutyronitrile, Methyl cyanoacetate, Dibenzylacetonitrile, 2-Tolunitrile (or 2-Methoxybenzonitrile), 2,3,3-Trimethyl-1-cyclopentene-1-carbonitrile (or β-Campholytonitrile), Caprylonitrile (or Octanonitrile), 1,1-Dicyanopropane (or Ethylmalononitrile), Ethyl cyanoacetate, 1,1-Dicyanobutane (or Propylmalononitrile), 3-Tolunitrile (or 3-Methylbenzonitrile), Cyclohexylacetonitrile, 4,4-Dicyano-1-butene (or Allylmalononitrile), 3-Isopropylidene-1-methyl-cyclopentane-1-carbonitrile (or β Fencholenonitrile), 3-Hydroxypropionitrile, 1,1-Dicyano-3-methylbutane (or Isobutylmalononitrile), Nonanonitrile, 2-Phenylcrotononitrile, Ethylenecyanohydrin, 2-Phenylpropionitrile, Phenylacetonitrile (or Benzylcyanide), Phenoxyacetonitrile, 4-Hydroxybutyronitrile, (3-Tolyl)acetonitrile (or m-Xylycyanide), (4-Tolyl)acetonitrile (or p-Xylycyanide), 4-Isopropylbenzonitrile, (2-Tolyl)acetonitrile (or o-Xylycyanide), Decanonitrile, 3-Methyl-2-phenylbutyronitrile, 1,2-Dicyanopropane, 1-Undecanonitrile (or 1-Hendecanonitrile), 2-Phenylvaleronitrile, 10-Undecenonitrile (or 10 Hendecenonitrile), 3-Phenylpropionitrile, 2-Cyanobenzalchloride (or α,α Dichloro-o-toluinitrile), N-Methylanilinonitrile (or N-Cyano-N-methylaniline), 3-(2-Chlorophenyl)propionitrile, 1,3-Dicyano-2-methypropane (or 2-Methylglutaronitrile), O-Benzoyl lactonitrile (or Lactonitrile benzoate), 3-Cyanobenzalchloride (or α,α-Dichloro-m-toluinitrile), 4-Cyanobenzalchloride (or α,α-Dichloro-p-toluinitrile), Dodecanonitrile (or Lauronitrile), 1,3-Dicyanopropane (or Glutaronitrile), 4-Methoxyhydrocinnamonitrile (or 3-(4-Methoxyphenyl)-propionitrile), 1,4-Dicyanobutane (Adiponitrile), 1,2,2,3-Tetramethyl-3-cyclopentene-1-acetonitrile (or 5-Methyl-α-campholenonitrile), 1-Cyanocyclohexene, 2-Hydroxybutyronitrile (or Propanalcyanohydrin), Hydnocarponitrile, α-Chloro-α-phenylacetonitrile, Butyl cyanoacetate, 3-Bromopropionitrile, 2,4-Diphenylbutyronitrile, Thiophene-2-acetonitrile, Trans-4-Chlrocrotononitrile, 2-Cyanopentanoic acid, Azelaonitrile (or 1,7-Dicyanoheptane), 3-Chloro-2-hydroxy-2-methylpropionitrile (or Chloroacetone cyanohydrins), 1,11-Dicyanoundecane (or 1,11-Dicyanohendecane), 2-Cyanobutyric acid, 2-Cyanobiphenyl, 1,12-Dicyanodedecane (or α,ω-Dodecane dicyanide), 1-Cyano-4-isopropenylcyclohexene, Sebaconitrile (or 1,8-Dicyanooctane), Suberonitrile (or 1,6-Dicyanohexane), 3-Cyanoindene (or Indene-3-carbonitrile), Aminoacetonitrile (or Glycinonitrile), 2-Cyanodiphenylmethane, N-Piperdinoacetonitrile, 3-Chloro-2-toluinitrile, Tetradecanonitrile, Cinnamonitrile, Trichloroacrylonitrile, DL-Mandelonitrile (or Benzaldehyde cyanohydrins), Pentadecanonitrile, 2-Methoxybenzonitrile, (2-Chlorophenyl) acetonitrile (or 2-Chlorobenzylcyanide), 1,1-Dicyanoethane (or Methylmalononitrile), 2-Cyanopyridine (or 2-Pyridinecarbonitrile;

Picolinonitrile), 4-tolunitrile (or 4-Methylbenzonitrile), D-Mandelonitrile, d,l-(2-Bromophenyl) acetonitrile (or 2-Bromobenzyl cyanide), (4-Chlorophenyl) acetonitrile (or 4-Chlorobenzyl cyanide), Malononitrile (or Methylene cyanide), Hexadecanonitrile, Maleonitrile (or cis-1,2-Dicyanoethylene), 2,2-Dicyanopropane (or Dimethylmalononitrile), tert-Butylacetonitrile (or Neopentyl cyanide), 1-Naphthylacetonitrile, 4,4-Dicyanoheptane (or Dipropylmalononitrile), Heptadecanonitrile, 1-Naphthonitrile (or 1-Cyanonapthalene), 2-Cyanopropionic acid, 4-Fluorobenzonitrile, Coumarilonitrile (or Coumarin-2-carbonitrile), Indole-3-acetonitrile, 3-Bromobenzonitrile, 2-(N-Anilino)-butyronitrile, Trans-o-Chlorocinnamonitrile, Octadecanonitrile, 3-Chlorobenzonitrile, 2-Chlorobenzonitrile, 4-Chloromandelonitrile, Nonadecanonitrile, 2-Bromo-4-tolunitrile, 3,3-Dicyanopentane (or Diethylmalononitrile), 4-Cyanobutyric acid, 5-Chloro-2-tolunitrile, (4-Aminophenyl)acetonitrile (or 4-Aminobenzyl cyanide), meso-2,3-Dimethyl-succinonitrile, 3-Bromo-4-tolunitrile, (4-Bromophenyl)acetonitrile (or 4-Bromobenzyl cyanide), N-Anilinoacetonitrile, 3-Cyanopropionic acid, 3-Chloro-4-tolunitrile, 3,3-Diphenylacrylonitrile (β-Phenylcinnamonitrile), 3-Bromo-2-hydroxy benzonitrile, 4,4-Dicyanoheptane (or Dipropylmalononitrile), trans-2,3-Diphenyl acrylonitrile, Eicosanonitrile, 3-Cyanopyridine (or Nicotinonitrile), (4-Iodophenyl)acetonitrile (or 4-Iodobenzyl cyanide), 4-Cyanodiphenyl methane, 2-(N-Anilino) valeronitrile, 2-Aminobenzonitrile (or Anthranilonitrile), 2-Bromobenzonitrile, 5-Cyanothiazole, 3-Aminobenzonitrile, 2-Quinolinoacetonitrile, 2-Iodobenzonitrile, 2,4,6-Trimethylbenzonitrile, α-Aminobenzyl cyanide, Cyanoform (or Tricyanomethane), Succinonitrile, 2-Iodo-4-tolunitrile (2-Iodo-4-methylbenzonitrile), 2,6-Dinitrobenzonitril, d,l-2,3-Dimethylsuccinonitrile, 2-Chloro-4-tolunitrile, 4-Methoxybenzonitrile, 2,4-Dichlorobenzonitrile, 4-Methoxycinnamonitrile, 3,5-Dichlorobenzonitrile, cis-1,4-Dicyanocyclohexane, Bromomalononitrile, 2-Naphthonitrile (or 2-Cyanonaphthalene), Cyanoacetic acid, 2-Cyano-2-ethylbutyric acid (or Diethylcyanoacetic acid), 2,4-Diphenylglutaronitrile, β-Chloro-3-tolunitrile, 4-Chloro-2-tolunitrile, 1-Cyanoacenaphthene (or Acenaphthene-1-carbonitrile), Phenylmalononitrile (β-Cyanobenzyl cyanide), 6-Nitro-2-tolunitrile, (4-Hydroxyphenyl)acetonitrile (or 4-Hydroxybenzyl cyanide), 5-Bromo-2-tolunitrile, β-Bromo-2-tolunitrile, 2,2-Diphenylglutaronitrile, (2-Aminophenyl) acetonitrile (or 2-Aminobenzyl cyanide), 3,4-Dichlorobenzonitrile, 1,2,2,3-Tetramethylcyclopentene-1-carbonitrile (or Campholic nitrile), Dicyanodimethylamine (or Bis(cyanomethyl)amine), Diphenylacetonitrile (β-Phenylbenzyl cyanide), 4-Cyano-N,N-dimethylaniline, 1-Cyanoisoquinoline, 4-Cyanopyridine, β-Chloro-4-tolunitrile (or 4-Cyanobenzyl chloride), 2,5-Diphenylvaleronitrile, 3-Cyanobenzaldehyde (or 3-Formylbenzonitrile), 6-Nitro-3-tolunitrile, Benzoylacetonitrile, 6-Chloro-2-tolunitrile, 8-Cyanoquinoline, 2-Nitro-3-tolunitrile, 2,3,4,5-Tetrachlorobenzonitrile, 4-Cyanobiphenyl, 2-Naphthylacetonitrile, cis-2,3-Diphenylacrylonitrile, 4-Aminobenzonitrile (or 4-Cyanoaniline), 1-Cyano-2-phenylacrylonitrile (or Benzalmalononitrile), 5-Bromo-2,4-dimethyl-benzonitrile, 2-Cyanotripbenylmethane, 5-Cyanoquinoline, 2,6-Dimethylbenzonitrile, Phenylcyanoacetic acid, 2-(N-Anilino)-propionitrile, 2,4-Dibromobenzonitrile, β-(2-Nitrophenyl)-acrylonitrile, 5-Chloro-2-nitro-4-tolunitrile, βBromo-3-tolunitrile (or 3-Cyanobenzyl bromide), 4-Nitro-3-tolunitrile, 2-(N-Anilino)-isobutyronitrile, 2-Cyanoquinoline, 4-Cyanovaleric acid (or 2-Methylglutaromononitrile), Fumaronitrile, 4-Chlorobeuzonitrile, 9-Phenanthrylacetonitrile, 3,5-Dibromobenzonitrile, 2-Chloro-3-nitrobenzonitrile, 2-Hydroxybenzonitrile (or 2-Cyanophenol), 4-Chloro-2-nitrobenzonitrile, 4-Cyanotriphenylmethane, 4-Chloro-3-nitrobenzonitrile, 3-Nitro-4-tolunitrile, 2-Cyano-3-phenylpropionic acid, 3-Cyanophenanthrene, 2,3,3-Triphenylpropionitrile, 4-Cyanoquinoline, 4-Bromo-1-naphthonitrile (or 1-Bromo-4-cyanonaphthalene), 4-Bromo-2,5-dimethylbenzonitrile, 5-Nitro-3-tolunitrile, 2,4-Dinitrobenzonitrile, 4-Nitro-2-tolunitrile, 6-Chloro-3-nitrobenzonitrile, 5-Bromo-3-nitro-2-tolunitrile, 2-Nitro-4-tolunitrile, 9-Cyanophenanthrene, 3-Cyanoquinoline, 2-Cyanophenanthrene, 3-Nitro-2-tolunitrile, 2-Nitrobenzonitrile, 4-Chloro-1-naphthonitrile (or 1-Chloro-4-cyanonaphthalene), 5-Cyanoacenaphthene (or Acenaphthene-5-carbonitrile), 4-Bromobenzonitrile, 2,4,5-Trimethoxybenzonitrile, 4-Hydroxybenzonitrile (or 4-Cyanophenol), 2,3-Diphenylvaleronitrile, βBromo-4-tolunitrile (or 4-Cyanobenzylbromide), (4-Nitropbenyl)aceto nitrile (or 4-Nitrobenzylcyanide), 6-Bromo-3-nitrobenzonitrile, (2-Hydroxyphenyl)acetonitrile (or 2-Hydroxybenzyl cyanide), 3-Nitrobenzonitrile, 4-Bromo-3-nitrobenzonitrile, 4-Cyanoazobenzene, Dipicolinonitrile (or 2,6-Dicyanopyridine), 2-Cyanohexanoic acid, Dibromomalononitrile (or Bromodicyanomethane), 1-Cyanoanthracene, 2,2,3-Triphenylpropionitrile, 1-Cyanophenanthrene, 2,3-Diphenylbutyronitrile, 5-Bromo-3nitro-4-tolunitrile, 2,5-Dichlorobenzonitrile, 2,5-Dibromobenzonitrile, 5-Bromo-2-nitro-4-tolunitrile, 2-Hydroxy-3-nitrobenzonitrile (or 2-Cyano-6-nitrophenol), 4-Nitro-1-naphthonitrile (or 1-Cyano-4-nitronaphthalene), 4-Acetamidobenzonitrile, 6-Cyanoquinoline, Apiolonitrile (or 2,5-Dimethoxy-3,4-methylenedioxybenzonitrile), 1-Nitro-2-naphthonitrile (or 2-Cyano-1-nitronaphthalene), 3,5-Dichloro-2-hydroxybenzonitrile, trans-1,4-Dicyanocyclohexane, 3,3,3-Triphenylpropionitrile, 4-Cyano-2-phenylquinoline (or 2-Phenyl-4quinolinonitrile), Phthalonitrile (or o-Dicyanobenzene), 8-Nitro-2-naphthonitrile (or 2-Cyano-8-nitronaphthalene), 5-Chloro-2-naphthonitrile (or 5-Chloro-2cyanonaphthalene), 5-Chloro-1-naphthonitrile (or 5-Chloro-1-cyanonaphthalene), 3,5-Dichloro-4-hydroxybenzonitrile, 4-Nitrobenzonitrile, 5-Bromo-1-naphthonitrile (or 1-Bromo-5cyanonaphthalene), 5-Iodo-2-naphthonitrile (or 2-Cyano-5-iodonaphthalene), 3-Cyano-3-phenylpropionic Acid, 2-Cyano-2-propylvaleramide (or Dipropylcyanoacetamide), 2,6-Dibromobenzonitrile, 3-Chloro-4-hydroxybenzonitrile, 5-Chloro-2,4-dinitrobenzonitrile, 4-Benzamidobenzonitrile (or N-Benzoylanthranilonitrile), 5-Bromo-2-hydroxybenzonitrile, d,l-2,3-Diphenylsuccinonitrile, Isophthalonitrile (or m-Dicyanobenzene), 2-Hydroxy-4-nitrohenzonitrile (or 2-Cyano-5-nitrophenol), d,l-4-Cyano-3,4-diphenylbutyric acid (or d,l-2,3-Diphenylglutaromononitrile), d-3-Carboxy-2,2,3-trimethyicyclopentylacetonitrile, 5-Chloro-2-hydroxyhenzonitrile (or 4-Chloro-2-cyanophenol), 2,3-Diphenylcinnamonitrile (or Cyanotriphenylethylene), 1,7-Dicyanonaphthalene, 4,4'-Dicyanodiphenylmethane, 2,2'-Diphenic acid mononitrile (or 2-Carboxy-2'-cyanobiphenyl), 5-Nitro-2-naphthonitrile (or 2-Cyano-5-nitronaphthalene), 9-Cyanoanthracene (or 9-Anthracenecarbonitrile), 2,3-Dicyanopyridine, 1,3-Dicyanonaphthalene, 3-Cyanocoumarin, 2-Cyanocinnamic acid, 2-Cyanobenzoic acid, 1,2-Dicyanonaphthalene, 2-Hydroxy-5-nitrobenzonitrile (or 2-Cyano-4-nitrophenol), Tetracyanoethylene, 5-Nitro-1-naphthonitrile (or 1-Cyano-5-nitronaphthalene), 1,4-Dicyanonaphthalene, 1,6-Dicyanonaphthalene, 1,5-Dicyanonaphthalene, 3-Cyanobenzoic acid, 4-Cyanobenzoic acid, Terephthalonitrile (or p-Dicyanobenzene), 1,8-Dicyanonaphthalene, 4,4'-Dicyanobiphenyl, 1-2,3-Diphenylsuccinonitrile, 1-Cyano-9,10-anthraquinone, 2,3-Dicyanonaphthalene, 2,7-Dicyanonaphthalene, 2,6-Dicyanonaphthalene.

The present invention further include the "nitrile quaternaries", cationic nitrites of the formula

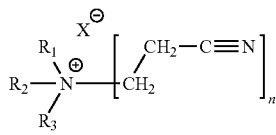

in which R1 is —H, —CH$_3$, a C$_{2-24}$-alkyl or -alkenyl radical, a substituted C$_{2-24}$-alkyl or -alkenyl radical with at least one substituent from the group —Cl, —Br, —OH, —NH$_2$, —CN, an alkyl- or alkenylaryl radical with a C$_{1-24}$-alkyl group, or is a substituted alkyl- or alkenylaryl radical with a C$_{1-24}$-alkyl group and at least one further substituent on the aromatic ring, R2 and R3, independently of one another, are chosen from CH$_2$—CN, —CH$_3$, —CH$_2$—CH$_3$, —CH$_2$—CH$_2$—CH$_3$, —CH(CH$_3$)—CH$_3$, —CH$_2$—OH, —CH$_2$—CH$_2$—OH, —CH(OH)—CH$_3$, —CH$_2$—CH$_2$—CH$_2$—OH, —CH$_2$—CH(OH)—CH$_3$, —CH(OH)—CH$_2$—CH$_3$, —(CH$_2$CH$_2$—O)$_n$H where n=1, 2, 3, 4, 5 or 6 and X is an anion.

The general formula covers a large number of cationic nitrites which can be used within the scope of the present invention. With particular advantage, the detergent and cleaner according to the invention comprises cationic nitrites in which R1 is methyl, ethyl, propyl, isopropyl or an n-butyl, n-hexyl, n-octyl, n-decyl, n-dodecyl, n-tetradecyl, nhexadecyl or n-octadecyl radical. R2 and R3 are preferably chosen from methyl, ethyl, propyl, isopropyl and hydroxyethyl, where one or both of the radicals may advantageously also be a cyanomethylene radical.

For reasons of easier synthesis, preference is given to compounds in which the radicals R$_1$ to R$_3$ are identical, for example (CH$_3$)$_3$N$^{(+)}$CH$_2$—CN(X$^-$), (CH$_3$CH$_2$)$_3$N$^{(+)}$CH$_2$—CNX$^-$, (CH$_3$CH$_2$CH$_2$)$_3$N$^{(+)}$CH$_2$—CNX$^-$, (CH$_3$CH(CH$_3$))$_3$N$^{(+)}$CH$_2$—CNX$^-$ or (HO—CH$_2$—CH$_2$)$_3$N$^{(+)}$CH$_2$—CNX$^-$, where X$^-$ is preferably an anion which is chosen from the group consisting of hydroxide, chloride, bromide, iodide, hydrogensulfate, methosulfate, p-toluenesulfonate (tosylate) or xylenesulfonate.

Examples of typical acrylonitrile polymeric materials, which serve as precursors for preparing our polyamidoximes, are listed Table 1 below. The figures are the percents by weight of each monomer in the polymer.

TABLE 1

| | | |
|---|---|---|
| 90% acrylonitrile | 10% vinylacetonitrile | |
| 50%' acrylonitrile | 50% methacrylonitrile | |
| 97% acrylonitrile | 3% vinyl acetate | |
| 50% acrylonitrile | 50% vinyl acetate | |
| 95% acrylonitrile | 5% methyl methacrylate | |
| 65% acrylonitrile | 35% methyl acrylate | |
| 45% acrylonitrile | 10% methyl acrylate | 45% vinyl acetate |
| 44% acrylonitrile | 44% vinyl chloride | 12% methyl acrylate |
| 93% acrylonitrile | 7% 2-vinyl pyridine | |
| 26% acrylonitrile | 74% butadiene | |
| 40% 1 acrylonitrile | 60% butadiene | |
| 33% acrylonitrile | 67% styrene | |
| 100% acrylonitrile | | |

Several of the polymers listed in Table 2 are available commercially, such as:

TABLE 2

| Product | Manufacturer | Composition |
|---|---|---|
| Orion | DuPont de Nemours | 90% Acrylonitriles |
| Acrilan | Chemstrand | 90% Acrylonitriles |
| Creslan | American Cyanamid | 95-96% Acrylonitriles |
| Zefran | Dow Chemical Co. | 90% Acrylonitriles |
| Verel | Eastman | About 50% acrylonitrile |
| Dyrel | Carbide & Carbon Chemical | 40% acrylonitrile-60% Vinyl chloride |
| Darlan | B. F Goodrich | 50 Mole percent vinylidene cyanide - 50 Mole percent Vinyl acetate |

A particularly useful route to nitrites is termed "cyanoethylation", in which acrylonitrile undergoes a conjugate addition reaction with protic nucleophiles such as alcohols and amines. Other unsaturated nitrites can also be used in place of acrylonitrile.

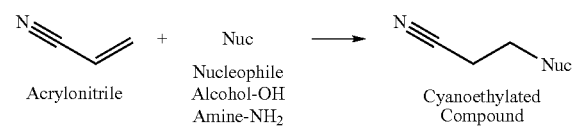

Preferred amines for the cyanoethylation reaction are primary amines and secondary amines having 1 to 30 carbon atoms, and polyethylene amine. Alcohols can be primary, secondary, or tertiary. The cyanoethylation reaction (or "cyanoalkylation" using an unsaturated nitrile other than acrylonitrile) is preferably carried out in the presence of a cyanoethylation catalyst. Preferred cyanoethylation catalysts include lithium hydroxide, sodium hydroxide, potassium hydroxide and metal ion free bases from tetraalkylammonium hydroxide, such as tetramethylammonium hydroxide, TMAH pentahydrate, BTMAH (benzyltetramethylammonium hydroxide), TBAH, choline, and TEMAH (Tris(2-hydroxyethyl)methylammonium hydroxide). The amount of catalyst used is typically between 0.05 mol % and 15 mol %, based on unsaturated nitrile.

Preferably, the cyanolates are derived from the following groups:

arabitol, erythritol, glycerol, isomalt, lactitol, maltitol, mannitol, sorbitol, xylitol, sucrose and hydrogenated starch hydrosylate (HSH).

From the group of hydroxy acids: hydroxyphenylacetic acid (mandelic acid), 2-hydroxypropionic acid (lactic acid), glycolic acid, hydroxysuccinic acid (malic acid), 2,3-dihydroxybutanedioic, acid (tartaric acid), 2-hydroxy-1,2,3-propanetricarboxylic, acid (citric acid), ascorbic acid, 2-hydroxybenzoic, acid (salicylic acid), 3,4,5-trihydroxybenzoic acid (gallic acid).

From the group of sugar acids: galactonic acid, mannonic, acid, fructonic acid, arabinonic acid, xylonic acid, ribonic, acid, 2-deoxyribonic acid, and alginic acid.

From the group of amino acids: alanine, valine, leucine, isoleucine, proline, tryptophan, phenylalanine, methionine, glycine, serine, tyrosine, threonine, cysteine, asparagine, glutamine, aspartic acid, glutamic acid, lysine, arginine, and histidine.

From the group of monomeric polyols- or polyhydric alcohols, or glycol ethers, chosen from ethanol, n- or isopropanol, butanols, glycol, propane- or butanediol, glycerol, diglycol, propyl or butyl diglycol, hexylene glycol, ethylene glycol methyl ether, ethylene glycol ethyl ether, ethylene glycol propyl ether, ethylene glycol mono-n-butyl ether, diethylene glycol methyl ether, diethylene glycol ethyl ether, propylene glycol methyl, ethyl or propyl ether, dipropylene glycol methyl or ethyl ether, methoxy, ethoxy or butoxy triglycol, 1-butoxyethoxy-2-propanol, 3-methyl-3-methoxybutanol, propylene glycol t-butyl ether, and pentaerythritol.

From the group of polymeric polyols, chosen from the group of polyethylene glycols and polypropylene glycols:

Polyethylene glycols (abbreviation PEGS) PEGs are polymers of ethylene glycol which satisfy the general formula

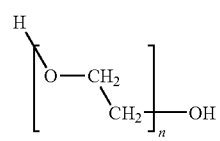

where n can assume values between 1 (ethylene glycol, see below) and about 16. Polyethylene glycols are commercially available, for example under the trade names Carbowax® PEG 200 (Union Carbide), Emkapol® 200 (ICI Americas), Lipoxol® 200 MED (HOLS America), Polyglycol® E-200 (Dow Chemical), Alkapol® PEG 300 (Rhone-Poulenc), Lutrol® E300 (BASF), and the corresponding trade names with higher numbers.

Polypropylene glycols (PPGs) which can be used according to the invention are polymers of propylene glycol which satisfy the general formula

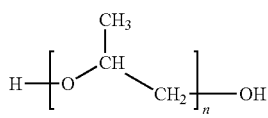

where n can assume values between 1 (propylene glycol) and about 12. Of industrial significance here are, in particular, di-, tri- and tetrapropylene glycol, i.e. the representatives where n=2, 3 and 4 in the above formula.

From the group of organic nitrogen compounds:

Amines: Amines are organic compounds and a type of functional group that contain nitrogen as the key atom. Structurally amines resemble ammonia, wherein one or more hydrogen atoms are replaced by organic substituents such as alkyl, aryl and cyclic groups. Compounds containing one or more —NH— groups of the formula:

Amides—an amide is an amine where one of the nitrogen substituent is an acyl group; it is generally represented by the formula: $R_1(CO)NR_2R_3$, where either or both $R_2$ and $R_3$ may be hydrogen. Specifically, an amide can also be regarded as a derivative of a carboxylic acid in which the hydroxyl group has been replaced by an amine or ammonia, in which a —CH— or —CH2- group is situated between —CONH— groups.

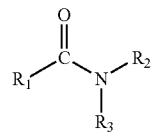

Imides—an imide is a functional group consisting of two carbonyl groups bound to a primary amine or ammonia. The structure of the imide moiety is as shown, which possessing a —CH—, —CH2-, or —CH3 group adjacent to the carbonyl group.

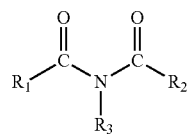

From the group of amino alcohol (or alkanolamine)—Amino alcohols are organic compounds that contain both an amine functional group and an alcohol functional, where the amine can be primary or secondary amines of the formula, wherein X is independently selected from alkylene, heteroalkylene, arylene, heteroarylene, alkylene-heteroaryl, or alkylene-aryl group.

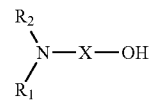

From the group of synthetic polymers: Synthetic polymers such as acetone-formaldehyde condensate, acetone-isobutyraldehyde condensate, methyl ethyl ketone-formaldehyde condensate, poly(allyl alcohol), poly(crotyl alcohol), poly(3-chloroallyl alcohol), ethylene-carbon monoxide copolymers, polyketone from propylene, ethylene and carbon monoxide, poly(methallyl alcohol, poly(methyl vinyl ketone, and poly (vinyl alcohol).

Synthetic polymers such as acetone-formaldehyde condensate, acetone-isobutyraldehyde condensate, methyl ethyl ketone-formaldehyde condensate, poly(allyl alcohol), poly (crotyl alcohol), poly(3-chloroallyl alcohol), ethylene-carbon monoxide copolymers, polyketone from propylene, ethylene and carbon monoxide, poly(methallyl alcohol, poly (methyl vinyl ketone, and poly(vinyl alcohol) have also been cyanoethylated and can also serve as platforms for further modification into metal-binding polymers.

The nitrile groups of these cyanoethylates or cyanoalkylates can be reacted with hydroxylamine to form the amidoxime. In the process described herein for preparing amidoxime groups, hydroxylamine, hydroxylamine hydrochloride, and hydroxylamine sulfate are suitable sources of hydroxylamine. If hydroxylamine salt is used instead of hydroxylamine freebase, a base such as sodium hydroxide, sodium carbonate or metal ion free base such ammonium hydroxide, tetraalkylammonium hydroxide should be used to release hydroxylamine as freebase for the reaction.

Metal ion freebase, such as ammonium hydroxide or a group of tetraalkylammonium hydroxide, such as tetramethylammonium hydroxide, TMAH pentahydrate, BTMAH (benzyltetramethylammonium hydroxide), TBAH, choline, and TEMAH (Tris(2-hydroxyethyl)methylammonium hydroxide) are preferred.

Metals, such as copper and others, complex strongly with molecules containing amidoxime groups, for example amidoximes of sucrose and sorbitol, to bind metal contaminant residues.

The present invention offers the benefit of binding to the metal oxide surface to create an oxidation barrier, particularly where the amidoxime is derived from functionalized amidoxime polymer, such as from polyvinylalcohol, polyacrylonitriles and its copolymers.

The present invention utilizes the cyanoethylated compounds referenced in "The Chemistry of Acrylonitrile, 2nd ed." as starting materials for synthesis of amidoximes, such reference is incorporated herein to the extent of the cyanoethylated compounds disclosed therein. The most preferred staring materials for synthesis of amidoximes are those prepared from cyanoethylated sugar alcohols, like sucrose, or reduced sugar alcohols, like sorbitol.

The present invention further offers the benefit of increasing the bulk removal of metal during the CMP process when a chelating agent disclosed herein (e.g., (1,2,3,4,5,6-(hexa-(2-amidoximo)ethoxy)hexane) combined with a compound with oxidation and reduction potentials such as hydroxylamine and its salts, hydrogen peroxide, hydrazines.

Because the chelating agents disclosed herein are not carboxylic acid based but are instead contain multiple ligand sites, the present invention further offers the benefit of more efficient and effective binding to metal ions found in semiconductor manufacturing processes, such as residue after plasma etching particularly with leading edge technology where copper is used as conducting metal.

Another advantage of the chelating agents disclosed herein is that such chelating agent could be used in dilution as a Post-copper CMP clean because these groups of compounds are less acidic than organic acid and less basic than ammonia, choline hydroxide and THEMAH.

General Procedures on Preparation of Amidoxime

Examples of cyanoethylation to produce nitrile compounds:

Preparation of β-Ethoxypropionitrile, $C_2H_5$—O—$CH_2$—$CH_2$—CN

Place 25 ml of 2 percent aqueous sodium hydroxide and 26 g. (33 ml.) of ethyl alcohol in a 250 ml. reagent bottle, add 26·5 g. (33 ml.) of acrylonitrile and close the mouth of the bottle with a tightly-fitting cork. Shake the resulting clear homogeneous liquid in a shaking machine for 2 hours. During the first 15 minutes the temperature of the mixture rises 15° to 20° and thereafter falls gradually to room temperature; two liquid layers separate after about 10 minutes. Remove the upper layer and add small quantities of 5 percent acetic acid to it until neutral to litmus; discard the lower aqueous layer. Dry with anhydrous magnesium sulfate, distil and collect the β-Ethoxypropionitrile at 172-174°. The yield is 32 g.

β-n-Propoxypropionitrile, $C_3H_7$—O—$CH_2$—$CH_2$—CN

Introduce 0.15 g of potassium hydroxide and 33 g. (41 ml) of dry n-propyl alcohol into a 150 ml. bolt-head flask, warm gently until the solid dissolves, and then cool to room temperature. Clamp the neck of the flask and equip it with a dropping funnel, a mechanical stirrer and a thermometer (suitably supported in clamps). Introduce from the dropping funnel, with stirring, 26.5 g. (33 ml) of pure acrylonitrile over a period of 2.5-30 minutes (1 drop every ca. 2 seconds). Do not allow the temperature of the mixture to rise above 35-45°; immerse the reaction flask in a cold water bath, when necessary. When all the acrylonitrile has been added, heat under reflux in a boiling water bath for 1 hour; the mixture darkens. Cool, filter and distil. Collect the β-n-Propoxypropionitrile at 187-189°. The yield is 38 g.

β-Diethylaminopropionitrile, $(C_2H_5)_2N$—$CH_2$—$CH_2$—CN

Mix 42.5 g (60 ml) of freshly-distilled diethylamine and 26.5 g. (33 ml) of pure acrylonitrile in a 250 ml round-bottomed flask fitted with a reflux condenser. Heat at 50° in a water bath for 10 hours and then allow to stand at room temperature for 2 days. Distil off the excess of diethylamine on a water bath, and distil the residue from a Claisen flask under reduced pressure. Collect the β-Diethylaminopropionitrile at 75-77°/11 mm. The yield is 54 g.

β-Di-n-butylaminopropionitrile, $(C_4H_9)_2N$—$CH_2$—$CH_2$—CN

Proceed as for the diethyl compound using 64·5 g. (85 ml) of redistilled di-n-butylamine and 26·5 g. (33 ml.) of pure acrylonitrile. After heating at 50° and standing for 2 days, distil the entire product under diminished pressure (air bath); discard the low boiling point fraction containing unchanged di-n-butylamine and collect the β-Di-n-butylaminopropionitrile at 120-122° 110 mm. The yield is 55 g.

Ethyl n-propyl-2-cyanoethylmalonate

Add 8.0 g (10.0 ml) of redistilled acrylonitrile to a stirred solution of ethyl n-propyl malonate (30.2 g.) and of 30 percent methanolic potassium hydroxide (4.0 g.) in tert-butyl alcohol (100 g.). Keep the reaction mixture at 30°-35° C. during the addition and stir for a further 3 hours. Neutralize the solution with dilute hydrochloric acid (1:4), dilute with water and extract with ether. Dry the ethereal extract with anhydrous magnesium sulfate and distil off the ether: the residue (ethyl n-propyl-2-cyanoethylmalonate; 11 g) solidifies on cooling in ice, and melts at 31°-32° after recrystallization from ice-cold ethyl alcohol.

Preparation of Cyanoethylated Compound

A cyanoethylated diaminocyclohexane is prepared according to U.S. Pat. No. 6,245,932, which is incorporated herein by reference, with cyanoethylated methylcyclohexylamines are readily prepared in the presence of water.

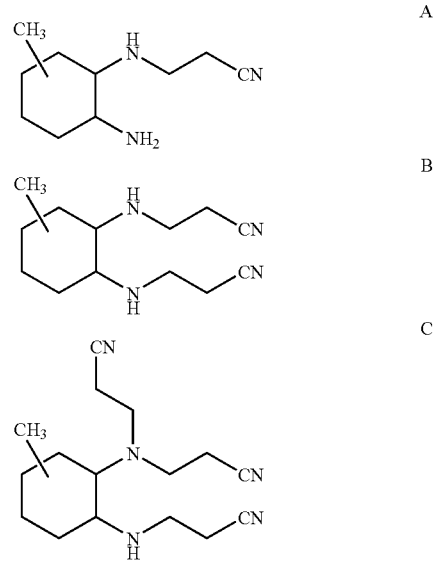

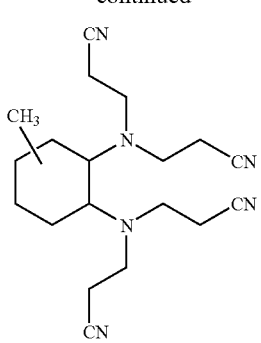

Analysis shows that almost no compounds exhibiting secondary amine hydrogen reaction and represented by structures C and D are produced when water alone is used as the catalytic promoter.

Examples of a reaction of a nitrile compound with hydroxylamine to form amidoxime compound follow:

Preparation and Analysis of Polyamidoxime (See, U.S. Pat. No. 3,345,344)

80 parts by weight of polyacrylonitrile of molecular weight of about 130,000 in the form of very fine powder (−300 mesh) was suspended in a solution of 300 parts by weight of hydroxylammonium sulfate, 140 parts by weight of sodium hydroxide and 2500 parts by weight of deionized water. The pH of the solution was 7.6. The mixture was heated to 90° C. and held at that temperature for 12 hours, all of the time under vigorous agitation. It was cooled to 35° C. and the product filtered off and washed repeatedly with deionized water. The resin remained insoluble throughout the reaction, but was softened somewhat by the chemical and heat. This caused it to grow from a very fine powder to small clusters of 10 to 20 mesh. The product weighed 130 grams. The yield 40 is always considerably more than theoretical because of firmly occluded salt. The product is essentially a polyamidoxime having the following reoccurring unit.

The mixture of hydroxylamine sulfate and sodium hydroxide can be replaced with equal molar of hydroxylamine freebase solution.

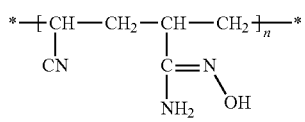

Table 3 listed portions of this product were then analyzed for total nitrogen and for oxime nitrogen by the well-known Dumas and Raschig methods and the following was found:

TABLE 3

|  | Percent |
|---|---|
| Total nitrogen (Dumas method) | 22.1 |
| Oxime nitrogen (Raschig method) | 6.95 |
| Amidoxime nitrogen (twice the amount of oxime nitrogen) (calculated) | 13.9 |
| Nitrile nitrogen (difference between the total nitrogen and amidoxime nitrogen) (calculated) | 8.2 |

Conversion of reacted product from cyanoethylation of cycloaliphatic vicinal primary amines (See, U.S. Pat. No. 6,245,932), For example, Cyanoethylated methylcyclohexylamines

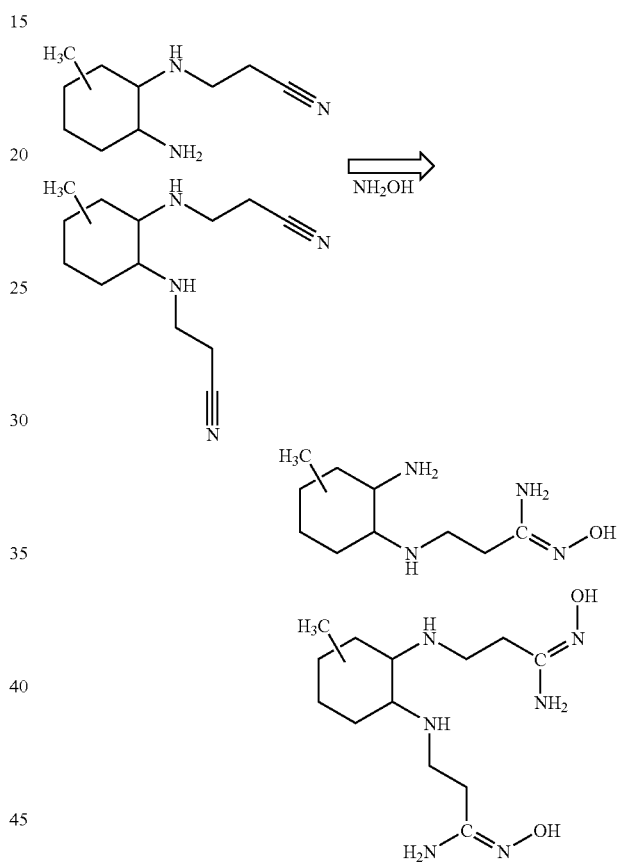

Due to large number of the amidoxime compounds are not commercially available. The amidoxime chelating compound can also prepare in-situ while blending the cleaning formulation.

The following are photoresist stripper formulations that can be used with the amidoximes compounds of the present invention:

|  |  |  |  | Start | | After Step 1 | | After Step 2 | | End | | Stripper Composition |
|---|---|---|---|---|---|---|---|---|---|---|---|---|
|  |  | Ingredient | MW | mole | Wt | mole | Wt | mole | Wt | mole | Wt | position |
| Step 1 | Amine | 2-Pyrolidone | 85.11 | 1.00 | 85.11 | 0.00 | 0.00 | 0.00 | 0.00 | 0.00 | 0.00 | 0% |
|  | Nitrile | Acrylonitrile | 53.00 | 1.00 | 53.00 | 0.00 | 0.00 | 0.00 | 0.00 | 0.00 | 0.00 | 0% |
|  | Metal Ion free base | TMAH | 91.00 | 0.05 | 4.55 | 0.05 | 4.55 | 0.05 | 4.55 | 0.05 | 4.55 | 2% |
|  |  | Water | 18.00 | 0.76 | 13.65 | 0.76 | 13.65 | 0.76 | 13.70 | 0.76 | 13.68 | 6% |

|  | Ingredient | MW | Start | | After Step 1 | | After Step 2 | | End | | Stripper Composition |
|---|---|---|---|---|---|---|---|---|---|---|---|
|  |  |  | mole | Wt | mole | Wt | mole | Wt | mole | Wt | position |
| Step 2 | Cyanoethylated Compound | 137.10 | 0.00 | 0.00 | 1.00 | 137.10 | 0.00 | 0.00 | 0.00 | 0.00 | 0% |
|  | Oxidizing/Reducing compound — Hydroxylamine | 31.00 | 1.00 | 31.00 | 0.00 | 0.00 | 0.00 | 0.00 | 0.00 | 0.00 | 0% |
|  | Water — Water | 18.00 | 1.72 | 31.00 | 0.00 | 0.00 | 1.72 | 31.00 | 1.72 | 31.00 | 14% |
|  | Amidoxime — Amidoxime | 170.00 | 0.00 | 0.00 | 0.00 | 0.00 | 1.00 | 170.00 | 1.00 | 170.00 | 78% |
|  |  |  |  |  |  |  |  |  |  | 219.20 | 100% |

Stripping Composition

| | Ingredient | Stripper Composition |
|---|---|---|
| Metal Ion free base | TMAH | 2% |
| Water | Water | 20% |
| Amidoxime |  | 78% |
|  |  | 100% |

Example of Amidoxime Derived from Ammonia

| R1 | R2 | R3 | Nitrile | Amidoxime |
|---|---|---|---|---|
| —H | —H | —H | 1:3 | 1:3:3 |

-continued
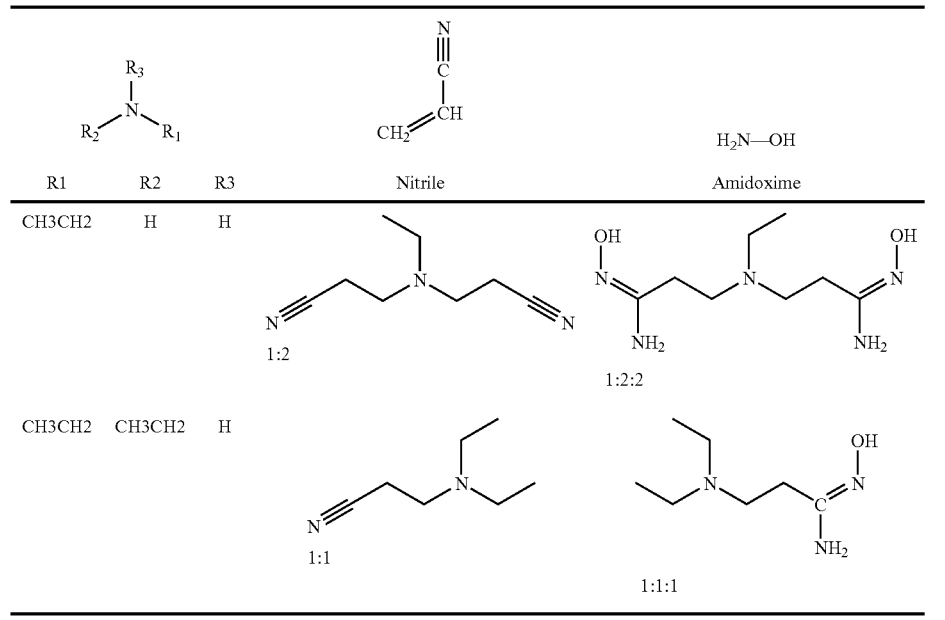
Amidoxime Derived from Citric Acid
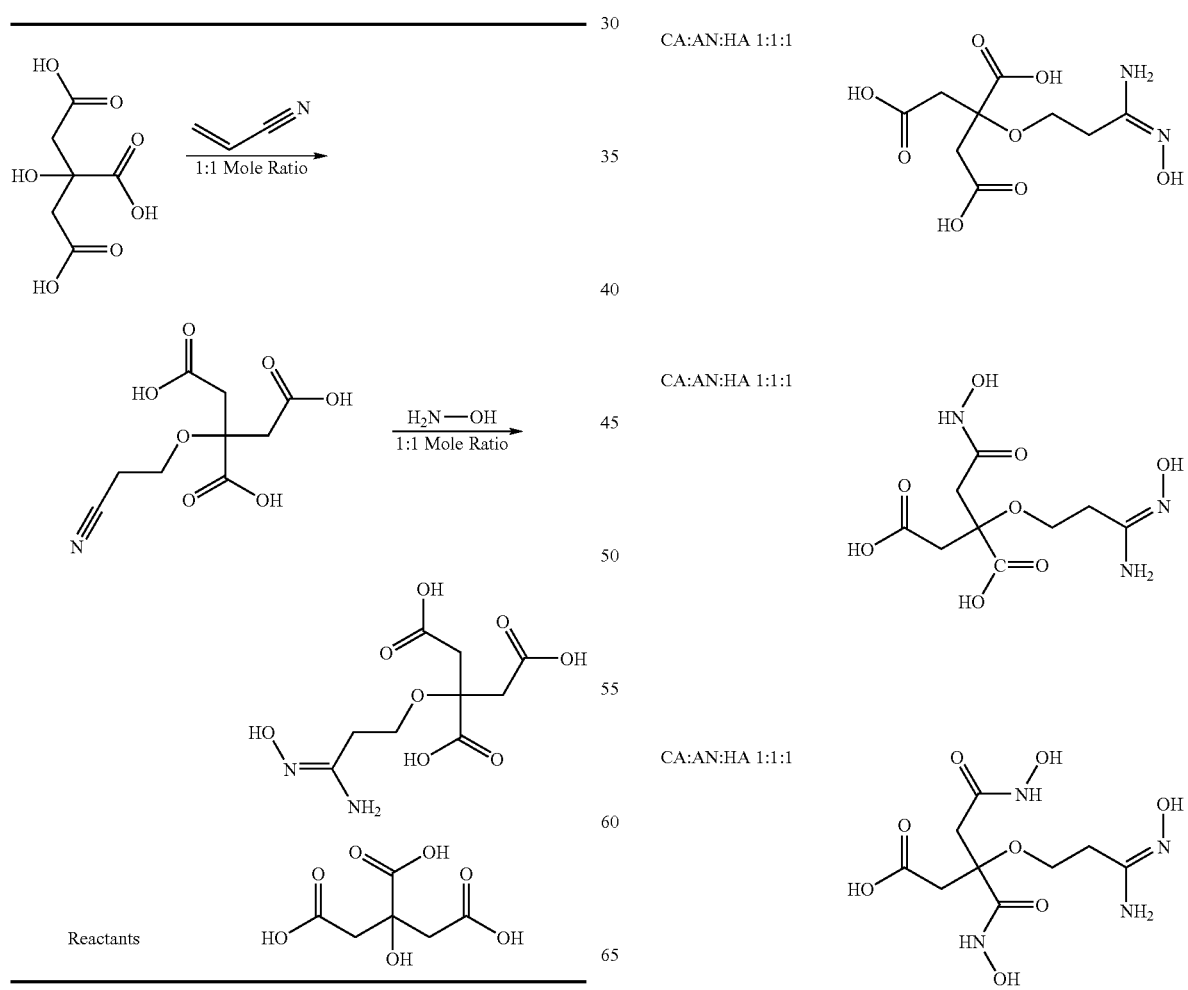

CA:AN:HA 1:1:1
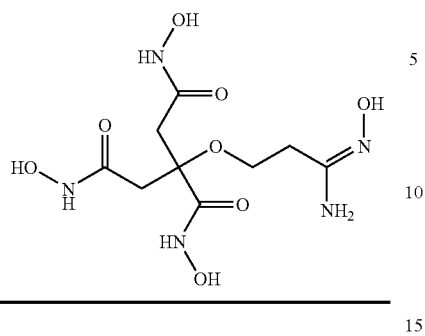
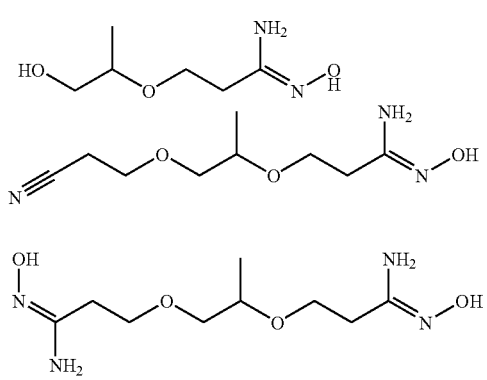
Amidoxime Derived from Lactic Acid
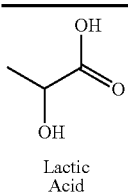
Lactic Acid
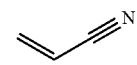
Amidoxime Compounds
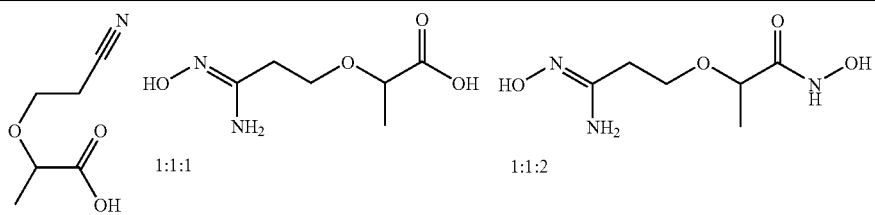
Amidoxime Derived from Propylene Glycol
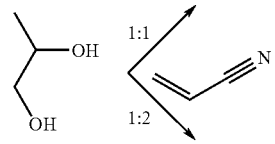
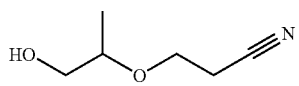
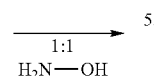
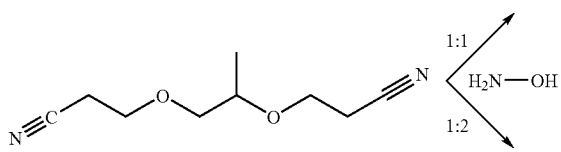
-continued
| | Amidoxime Compounds | | |
|---|---|---|---|
| Reactant | PG:AN:HA 1:1:1 | PG:AN:HA 1:2:1 | PG:AN:HA 1:2:2 |
| 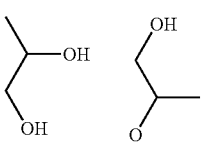 | 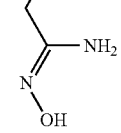 | 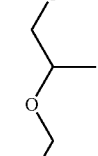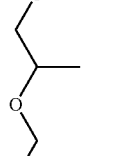 | 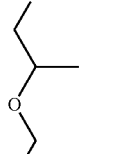 |

Amidoxime Derived from Pentaerythritol—DS1
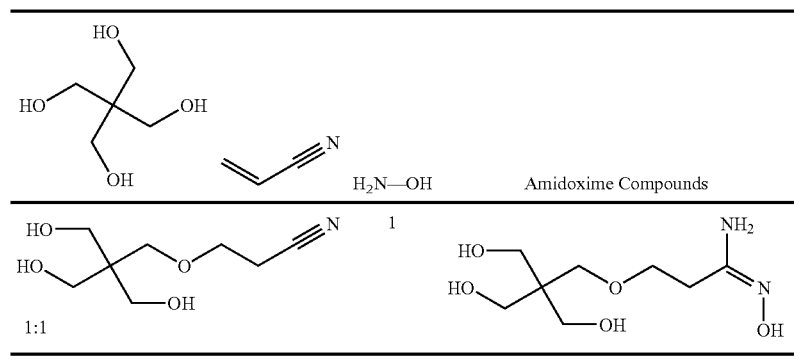
Amidoxime Derived from Pentaerythritol—DS2
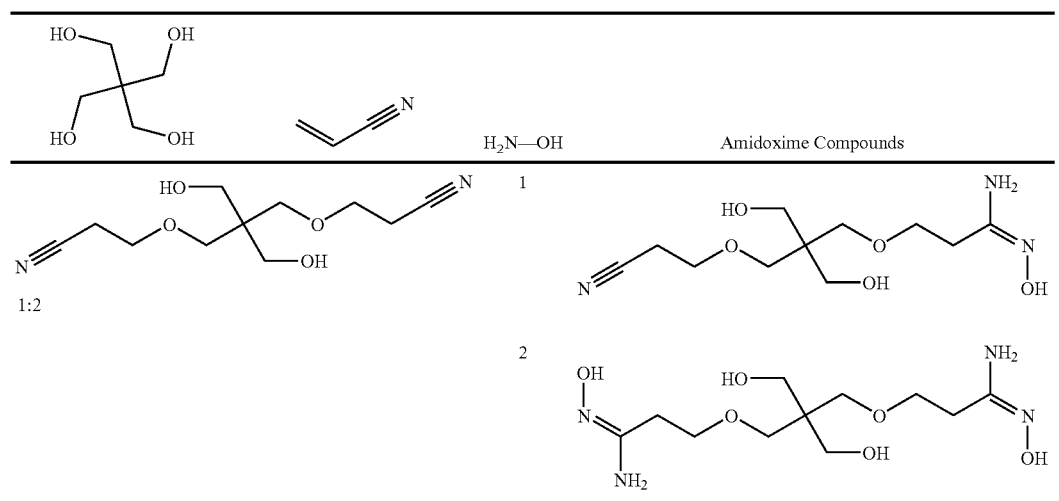
Amidoxime Derived from Pentaerythritol—DS3
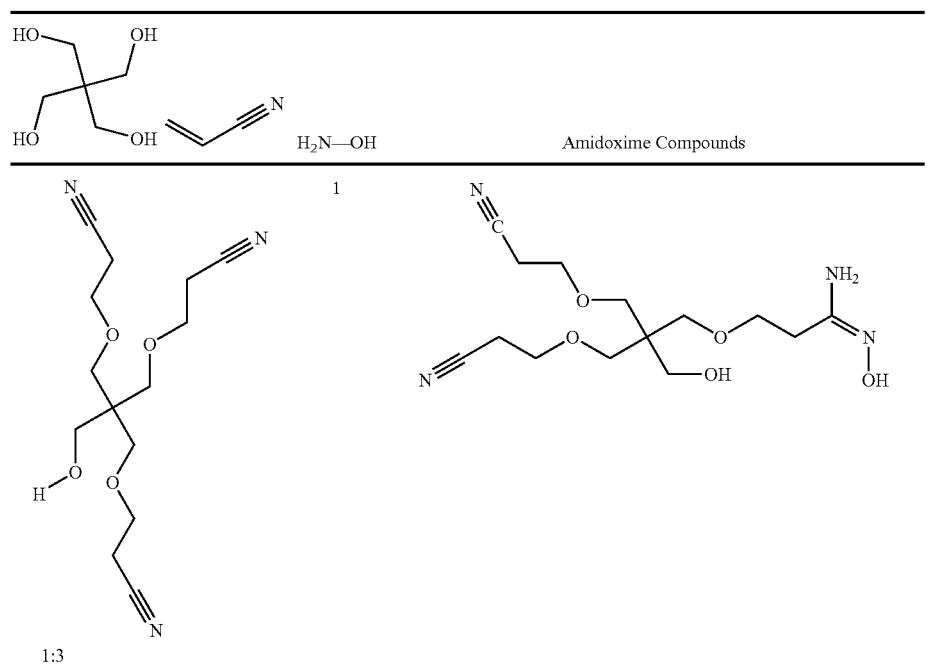

-continued
| 2 | 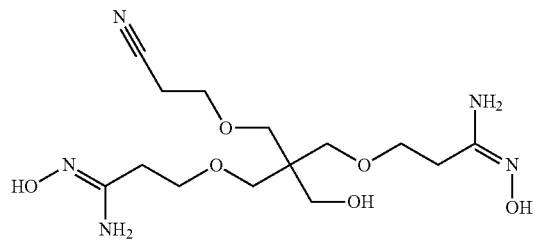 |
| 3 | 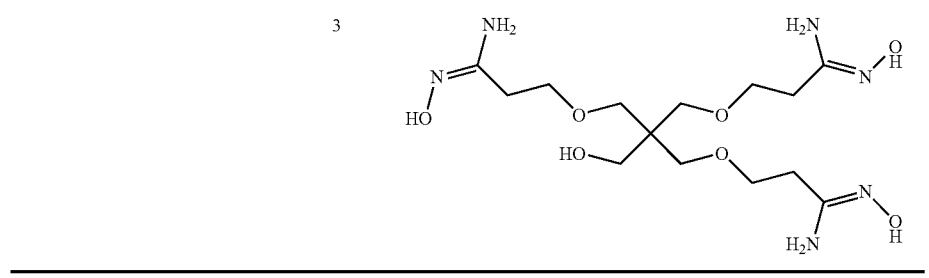 |
Amidoxime Derived from Pentaerythritol—DS4
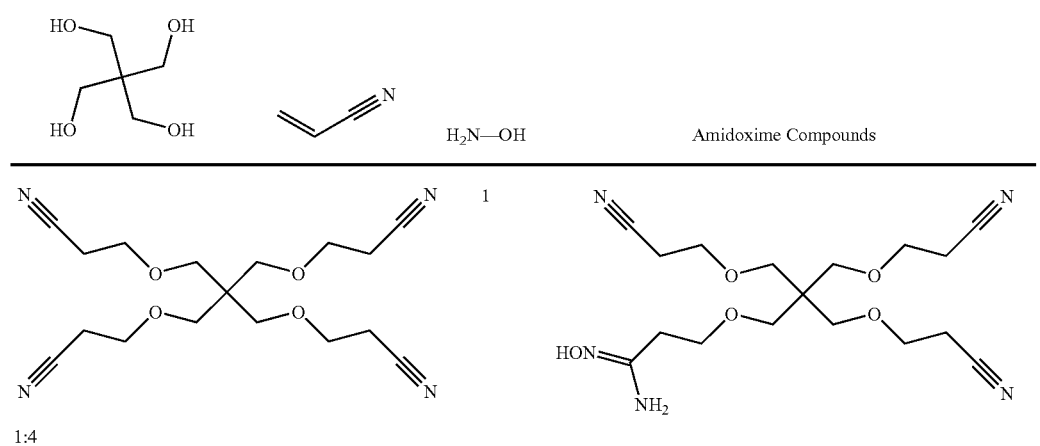
1:4
2 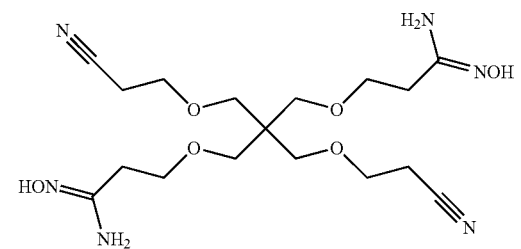

-continued
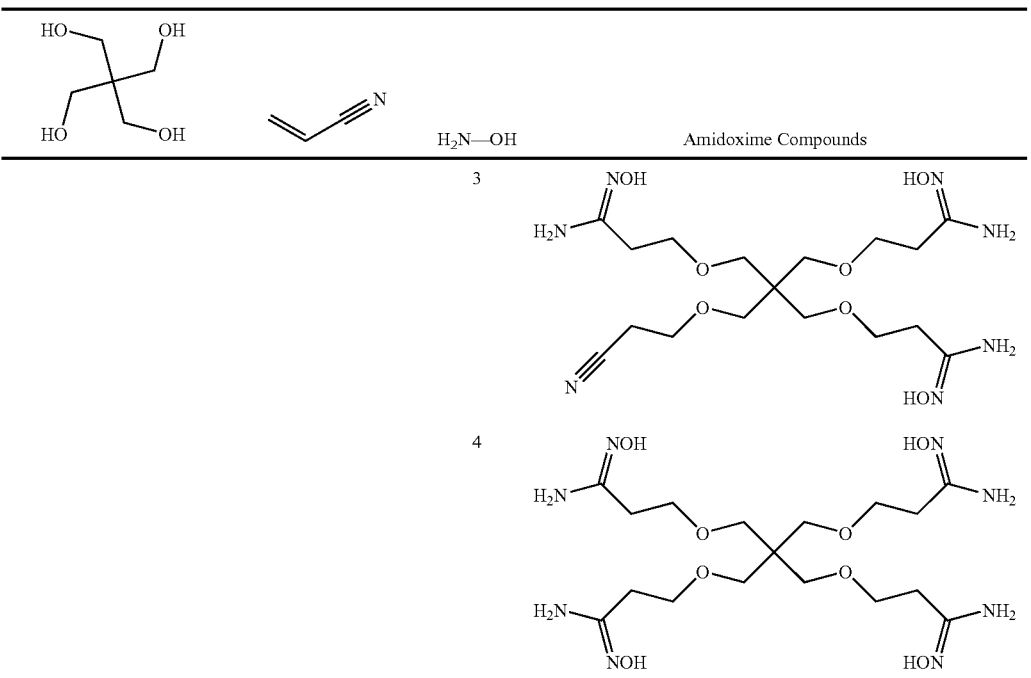
α-Substituted Acetic Acid
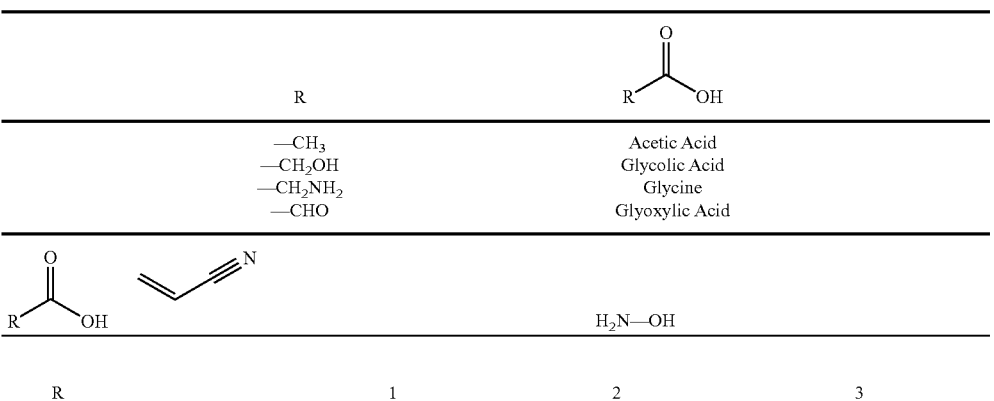
| R | |
|---|---|
| —CH₃ | Acetic Acid |
| —CH₂OH | Glycolic Acid |
| —CH₂NH₂ | Glycine |
| —CHO | Glyoxylic Acid |
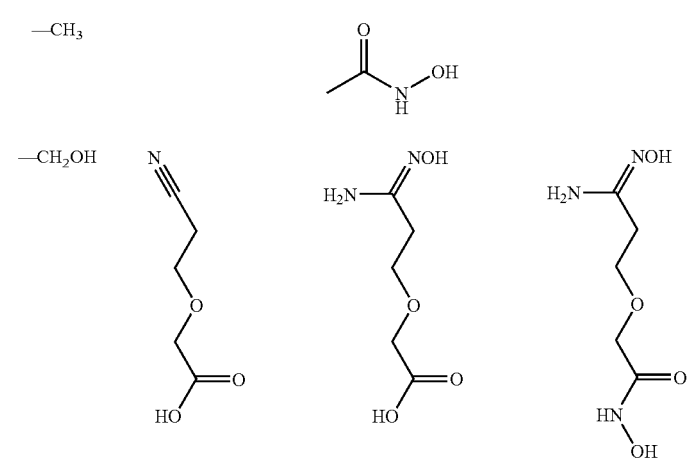
| R | 1 | 2 | 3 |
|---|---|---|---|

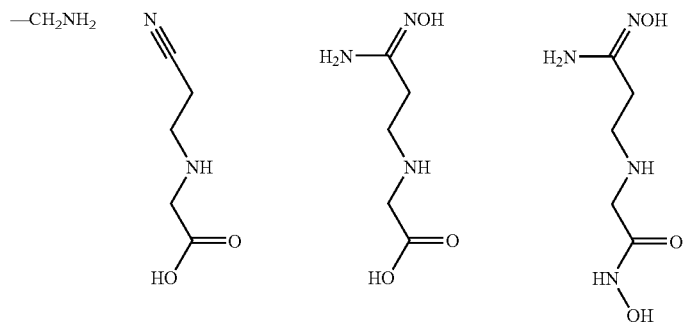
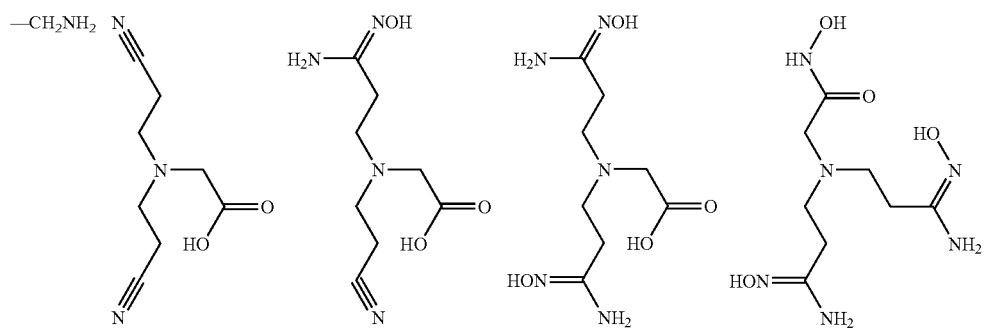
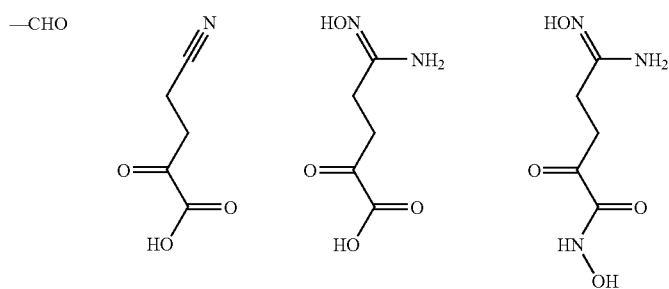

Amidoxime Derived from Iminodiacetic Acid
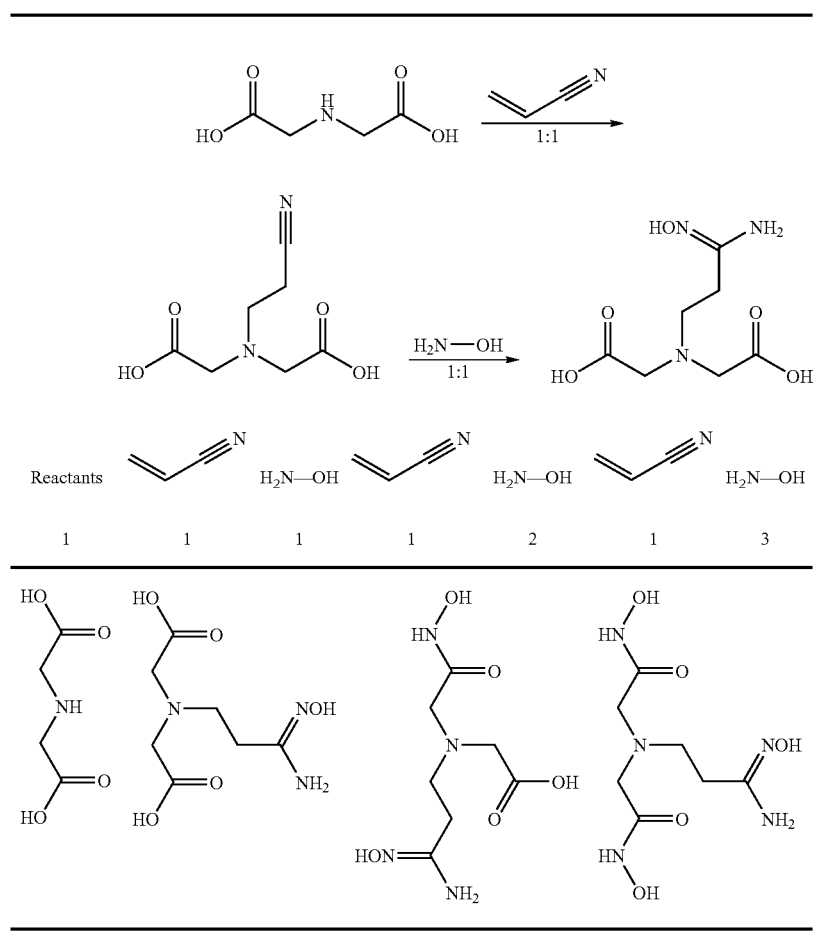
Amidoxime Derived from 2,5-piperazinedione
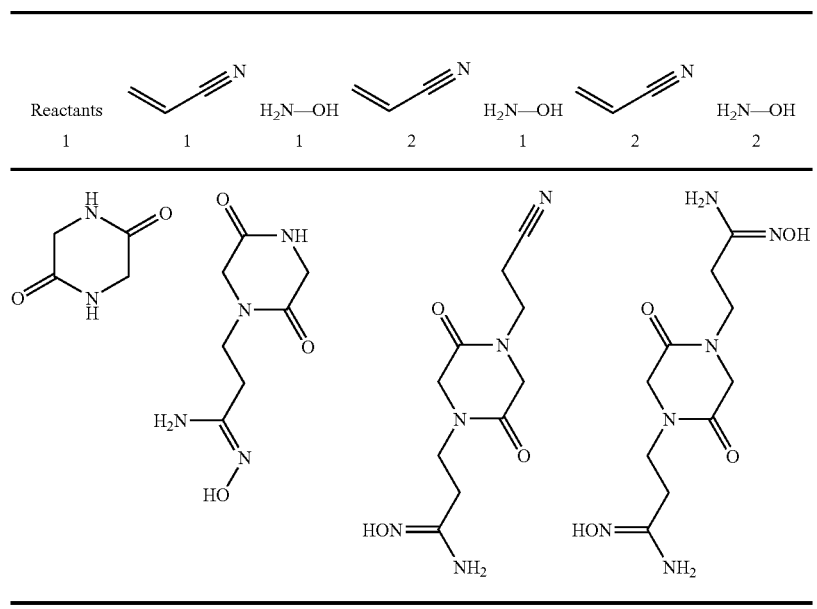

Amidoxime Derived from Cyanopyridine

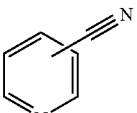

Reactions to Produce Nitrile Precursors to Amidoxime Compounds

Cyanoethylation of diethylaminexine

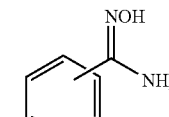

A solution of diethylamine (1 g, 13.67 mmol) and acrylonitrile (0.798 g, 15 mmol, 1.1 eq) in water (10 cm³) were stirred at room temperature for 3 hours, after which the mixture was extracted with dichloromethane (2×50 cm³). The organic extracts were evaporated under reduced pressure to give the pure cyanoethylated compound 3-(diethylamino) propanenitrile (1.47 g, 85.2%) as an oil.

Monocyanoethylation of glycine

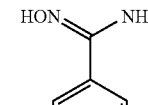

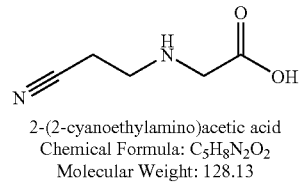

2-(2-cyanoethylamino)acetic acid
Chemical Formula: C$_5$H$_8$N$_2$O$_2$
Molecular Weight: 128.13

Glycine (5 g, 67 mmol) was suspended in water (10 cm³) and TMAH (25% in water, 24.3 g, 67 mmol) was added slowly, keeping the temperature at <30° C. with an ice-bath. The mixture was then cooled to 10° C. and acrylonitrile (3.89 g, 73 mmol) was added. The mixture was stirred overnight, and allowed to warm to room temperature slowly. The mixture was then neutralized with HCl (6M, 11.1 cm³), concentrated to 15 cm³ and diluted to 100 cm³ with EtOH. The solid precipitated was collected by filtration, dissolved in hot water (6 cm³) and reprecipitated with EtOH (13 cm³) to give 2-(2-cyanoethylamino)acetic acid (5.94 g, 69.6%) as a white solid, mp 192° C. (lit mp 190-191° C.).

Cyanoethylation of piperazinexine

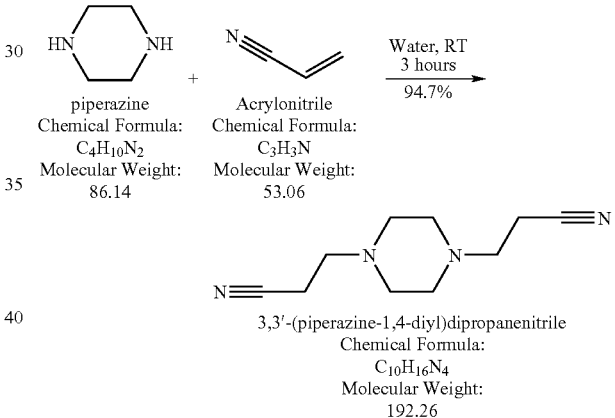

A solution of piperazine (1 g, 11.6 mmol) and acrylonitrile (1.6 g, 30.16 mmol, 2.6 eq) in water (10 cm³) were stirred at room temperature for 5 hours, after which the mixture was extracted with dichloromethane (2×50 cm³). The organic extracts were evaporated under reduced pressure to give the pure doubly cyanoethylated compound 3,3'-(piperazine-1,4-diyl)dipropanenitrile (2.14 g, 94.7%) as a white solid, mp 66-67° C.

Cyanoethylation of 2-ethoxyethanol

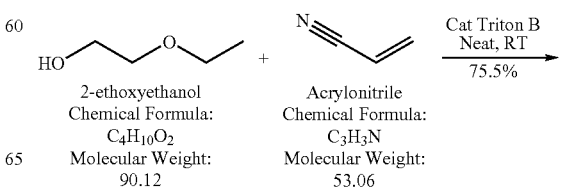

-continued

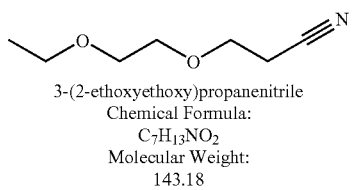

3-(2-ethoxyethoxy)propanenitrile
Chemical Formula:
C$_7$H$_{13}$NO$_2$
Molecular Weight:
143.18

To an ice-water cooled mixture of 2-ethoxyethanol (1 g, 11.1 mmol) and Triton B (40% in MeOH, 0.138 g, 0.33 mmol) was added acrylonitrile (0.618 g, 11.6 mmol) and the mixture was stirred at room temperature for 24 hours. It was then neutralized with 0.1 M HCl (3.3 cm$^3$) and extracted with CH$_2$Cl$_2$ (2×10 cm$^3$) The extracts were concentrated under reduced pressure and the residue was Kugelrohr-distilled to give the product 3-(2-ethoxyethoxy)propanenitrile (1.20 g, 75.5%) as a colorless oil, bp 100-130° C./20 Torr.

Cyanoethylation of 2-(2-dimethylaminoethoxy)ethanol

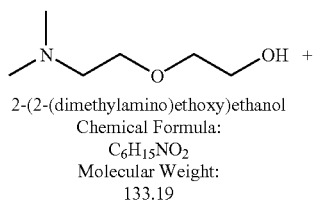

2-(2-(dimethylamino)ethoxy)ethanol
Chemical Formula:
C$_6$H$_{15}$NO$_2$
Molecular Weight:
133.19

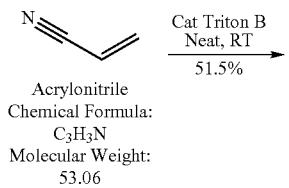

Acrylonitrile
Chemical Formula:
C$_3$H$_3$N
Molecular Weight:
53.06

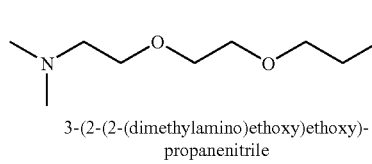

3-(2-(2-(dimethylamino)ethoxy)ethoxy)-propanenitrile
Chemical Formula:
C$_9$H$_{18}$N$_2$O$_2$
Molecular Weight:
186.25

To an ice-water cooled mixture of 2-(2-dimethyleminothoxy)ethanol (1 g, 7.5 mmol) and Triton B (40% in MeOH, 0.094 g, 0.225 mmol) was added acrylonitrile (0.418 g, 7.9 mmol) and the mixture was stirred at room temperature for 24 hours. It was then neutralized with 0.1 M HCl (2.3 cm$^3$) and extracted with CH$_2$Cl$_2$ (2×10 cm$^3$) The extracts were concentrated under reduced pressure and the residue was purified by column chromatography (silica, Et$_2$O, 10% CH$_2$Cl$_2$, 0-10% EtOH) to give 3-(2-(2-(dimethylamino)ethoxy)ethoxy)propanenitrile as an oil.

Cyanoethylation of isobutyraldehyde

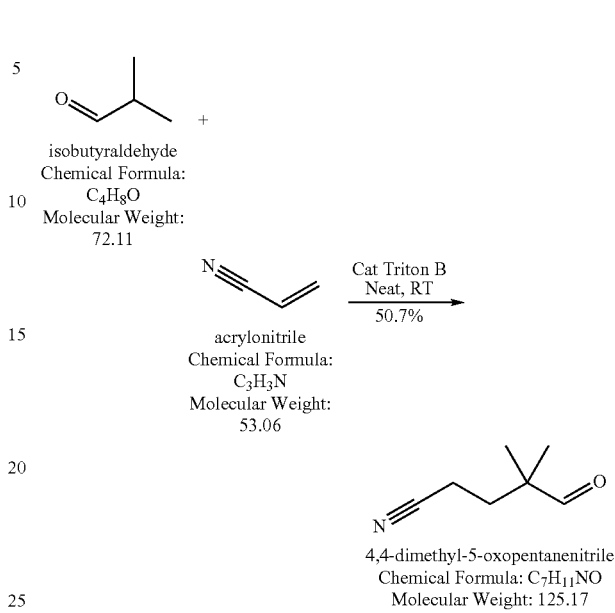

Isobutyraldehyde (1 g, 13.9 mmol) and acrylonitrile (0.81 g, 15 mmol) were mixed thoroughly and cooled with an ice-bath. Triton B (40% in MeOH, 0.58 g, 1.4 mmol) was added. The mixture was stirred at room temperature overnight. It was then neutralized with 0.1 M HCl (14 cm$^3$) and extracted with CH$_2$Cl$_2$ (100 cm$^3$) The extracts were concentrated under reduced pressure and the residue was Kugelrohr-distilled to give the product 4,4-dimethyl-5-oxopentanenitrile (0.8 g, 50.7%) as an oil, bp 125-130° C./20 Torr.

Cyanoethylation of aniline

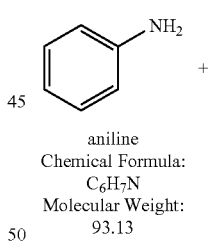

aniline
Chemical Formula:
C$_6$H$_7$N
Molecular Weight:
93.13

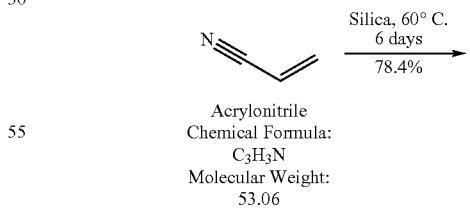

Acrylonitrile
Chemical Formula:
C$_3$H$_3$N
Molecular Weight:
53.06

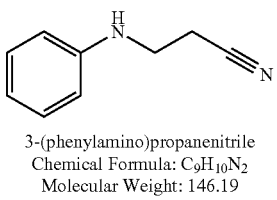

3-(phenylamino)propanenitrile
Chemical Formula: C$_9$H$_{10}$N$_2$
Molecular Weight: 146.19

Silica was activated by heating it above 100° C. in vacuum and was then allowed to cool to room temperature under nitrogen. To the activated silica (10 g) was absorbed aniline (1.86 g, 20 mmol) and acrylonitrile (2.65 g, 50 mmol) and the flask was capped tightly. The contents were then stirred with a magnetic stirrer for 6 days at 60° C. After this time the mixture was cooled to room temperature and extracted with MeOH. The extracts were evaporated to dryness and the residue was Kugelrohr-distilled under high vacuum to give the product 3-(phenylamino)propanenitrile (2.29 g, 78.4%) as an oil which crystallised on standing; bp 120-150° C./1-2 Torr (lit bp 120° C./1 Torr), mp 50.5-52.5° C.

Cyanoethylation of ethylenediamine

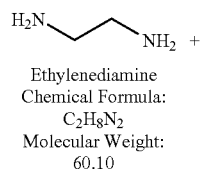

Ethylenediamine
Chemical Formula:
$C_2H_8N_2$
Molecular Weight:
60.10

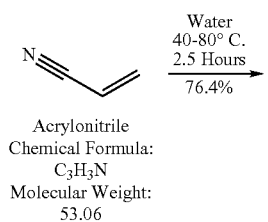

Acrylonitrile
Chemical Formula:
$C_3H_3N$
Molecular Weight:
53.06

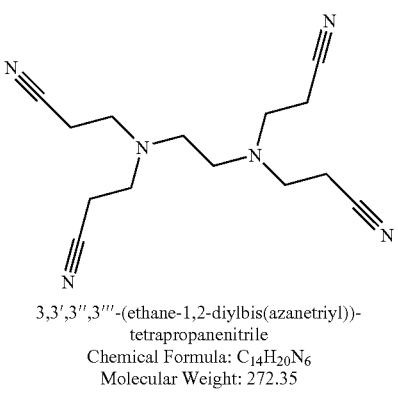

3,3',3'',3'''-(ethane-1,2-diylbis(azanetriyl))-tetrapropanenitrile
Chemical Formula: $C_{14}H_{20}N_6$
Molecular Weight: 272.35

Acrylonitrile (110 g, 137 cm$^3$, 2.08 mol) was added to a vigorously stirred mixture of ethylenediamine (25 g, 27.8 cm$^3$, 0.416 mol) and water (294 cm$^3$) at 40° C. over 30 min. During the addition, it was necessary to cool the mixture with a 25° C. water bath to maintain temperature at 40° C. The mixture was then stirred for additional 2 hours at 40° C. and 2 hours at 80° C. Excess acrylonitrile and half of the water were evaporated off and the residue, on cooling to room temperature, gave a white solid which was recrystallised from MeOH-water (9:1) to give pure product 3,3',3'',3'''-(ethane-1,2-diylbis(azanetriyl))tetrapropanenitrile (86.6 g, 76.4%) as white crystals, mp 63-65° C.

Cyanoethylation of ethylene glycol

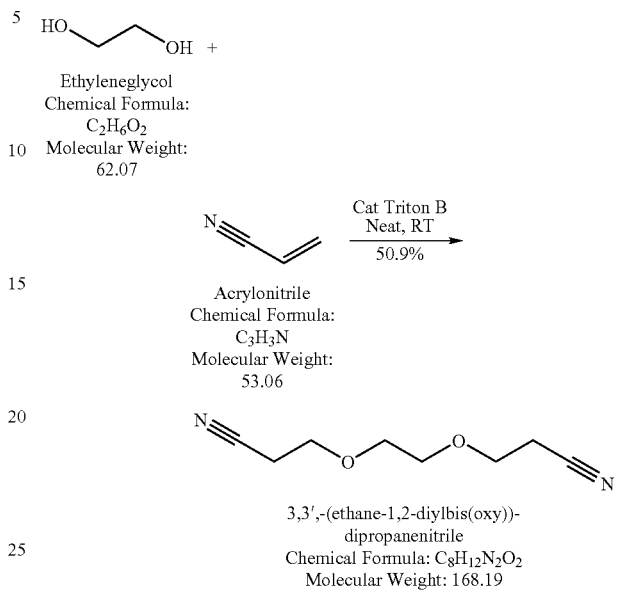

3,3',-(ethane-1,2-diylbis(oxy))-dipropanenitrile
Chemical Formula: $C_8H_{12}N_2O_2$
Molecular Weight: 168.19

Small scale: Ethylene glycol (1 g, 16.1 mmol) was mixed with Triton B (40% in MeOH, 0.22 g, 0.53 mmol) and cooled in an ice-bath while acrylonitrile (1.71 g, 32.2 mmol) was added. The mixture was stirred at room temperature for 60 hours after which it was neutralized with 0.1 M HCl (0.6 cm$^3$) and extracted with $CH_2Cl_2$ (80 cm$^3$) The extracts were concentrated under reduced pressure and the residue was Kugelrohr-distilled to give 3,3'-(ethane-1,2-diylbis(oxy))dipropanenitrile (1.08 g, 39.9%) as a light colored oil, bp 150-170° C./20 Torr.

Large scale: Ethylene glycol (32.9 g, 0.53 mol) was mixed with Triton B (40% in MeOH, 2.22 g, 5.3 mmol) and cooled in an ice-bath while acrylonitrile (76.2 g, 1.44 mol) was added. The mixture was allowed to warm slowly to room temperature and stirred for 60 hours after which it was neutralized with 0.1 M HCl (50 cm$^3$) and extracted with $CH_2Cl_2$ (300 cm$^3$) The extracts were passed through a silica plug three times to reduce the brown coloring to give 86 g (quantitative yield) of the product as an amber colored oil, pure by $^1$H-NMR, containing 10 g of water (total weight 96 g, amount of water calculated by $^1$H NMR integral sizes).

Cyanoethylation of diethyl malonate

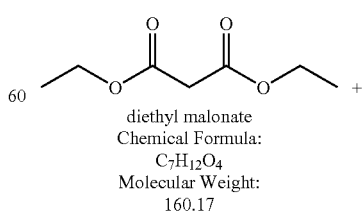

diethyl malonate
Chemical Formula:
$C_7H_{12}O_4$
Molecular Weight:
160.17

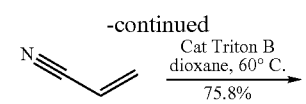

acrylonitrile
Chemical Formula:
C₃H₃N
Molecular Weight:
53.06

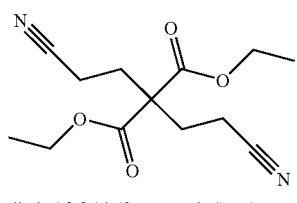

diethyl 2,2-bis(2-cyanoethyl)malonate
Chemical Formula:
C₁₃H₁₈N₂O₄
Molecular Weight:
266.29

To a solution of diethyl malonate (1 g, 6.2 mmol) and Triton B (40% in MeOH, 0.13 g, 0.31 mmol) in dioxane (1.2 cm³) was added dropwise acrylonitrile (0.658 g, 12.4 mmol) and the mixture was stirred at 60° C. overnight. The mixture was then cooled to room temperature and neutralized with 0.1 M HCl (3 cm³) and poured to ice-water (10 cm³). Crystals precipitated during 30 min. These were collected by filtration and recrystallised from EtOH (cooling in freezer before filtering off) to give diethyl 2,2-bis(2-cyanoethyl)malonate (1.25 g, 75.8%) as a white solid, mp 62.2-63.5° C.

Hydrolysis of diethyl 2,2-bis(2-cyanoethyl)malonate

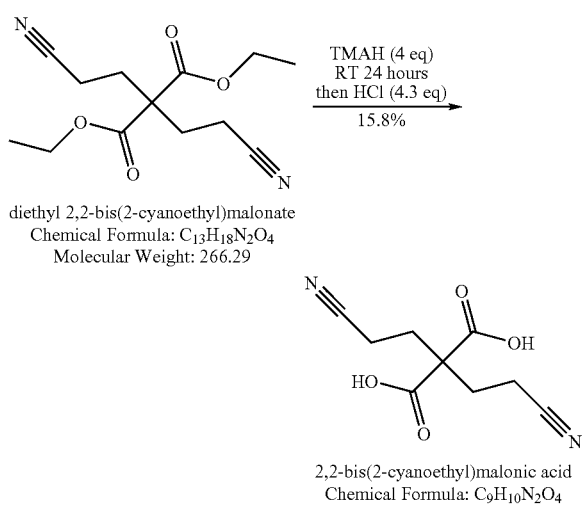

diethyl 2,2-bis(2-cyanoethyl)malonate
Chemical Formula: C₁₃H₁₈N₂O₄
Molecular Weight: 266.29

2,2-bis(2-cyanoethyl)malonic acid
Chemical Formula: C₉H₁₀N₂O₄
Molecular Weight: 210.19

Diethyl 2,2-bis(2-cyanoethyl)malonate (2 g, 7.51 mmol) was added to TMAH (25% in water, 10.95 g, 30.04 mmol) at room temperature. The mixture was stirred for 24 hours, and was then cooled to 0° C. A mixture of 12M HCl (2.69 cm³, 32.1 mmol) and ice (3 g) was added and the mixture was extracted with CH₂Cl₂ (5×50 cm³). The extracts were evaporated under vacuum to give 2,2-bis(2-cyanoethyl)malonic acid (0.25 g, 15.8%) as a colorless very viscous oil (lit decomposed. 158° C.).

Dicyanoethylation of glycine to give 2-(bis(2-cyanoethyl)amino)acetic acid

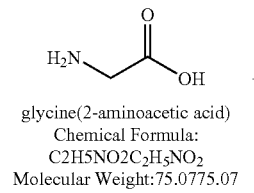

glycine(2-aminoacetic acid)
Chemical Formula:
C2H5NO2C₂H₅NO₂
Molecular Weight:75.0775.07

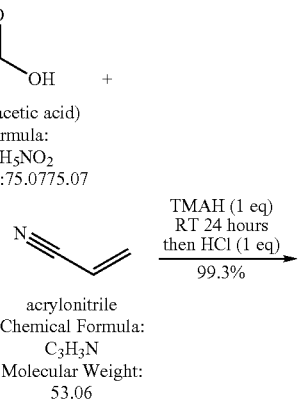

acrylonitrile
Chemical Formula:
C₃H₃N
Molecular Weight:
53.06

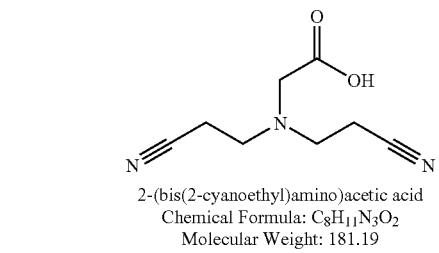

2-(bis(2-cyanoethyl)amino)acetic acid
Chemical Formula: C₈H₁₁N₃O₂
Molecular Weight: 181.19

Glycine (5 g, 67 mmol) was suspended in water (10 cm³) and TMAH (25% in water, 24.3 g, 67 mmol) was added slowly, keeping the temperature at <30° C. with an ice-bath. The mixture was then cooled to 10° C. and acrylonitrile (7.78 g, 146 mmol) was added. The mixture was stirred overnight, and allowed to warm to room temperature slowly. It was then heated at 50° C. for 2 hours, using a reflux condenser. After cooling with ice, the mixture was neutralized with HCl (6M, 11.1 cm³) and concentrated to a viscous oil. This was dissolved in acetone (100 cm³) and filtered to remove NMe₄Cl. The filtrate was concentrated under reduced pressure to give an oil that was treated once more with acetone (100 cm³) and filtered to remove more NMe₄Cl. Concentration of the filtrate gave 2-(bis(2-cyanoethyl)amino)acetic acid (11.99 g, 99.3%) as a colorless, viscous oil that crystallized over 1 week at room temperature to give a solid product, mp 73° C. (lit mp 77.8-78.8° C. Duplicate ¹³C signals indicate a partly zwitterionic form in CDCl₃ solution.

When NaOH is used in the literature procedure, the NaCl formed is easier to remove and only one acetone treatment is necessary.

Dicyanoethylation of N-methyldiethanolamine to give 3,3'-(2,2'-(methylazanediyl)bis(ethane-2,1-diyl) bis(oxy))dipropanenitrile

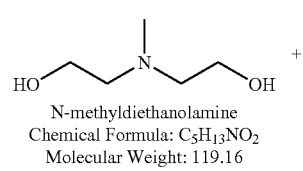

N-methyldiethanolamine
Chemical Formula: C₅H₁₃NO₂
Molecular Weight: 119.16

-continued

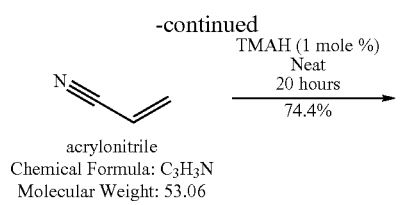

acrylonitrile
Chemical Formula: C₃H₃N
Molecular Weight: 53.06

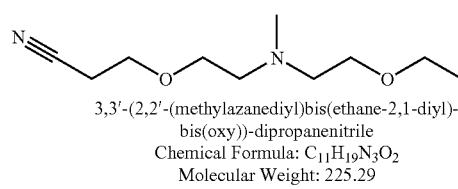

3,3'-(2,2'-(methylazanediyl)bis(ethane-2,1-diyl)-
bis(oxy))-dipropanenitrile
Chemical Formula: C₁₁H₁₉N₃O₂
Molecular Weight: 225.29

To a cooled, stirred mixture of N-methyldiethanolamine (2 g, 17 mmol) and acrylonitrile (2.33 g, 42 mmol) was added TMAH (25% in water, 0.25 cm³, 0.254 g, 7 mmol). The mixture was then stirred overnight, and allowed to warm to room temperature slowly. It was then filtered through silica using a mixture of Et₂O and CH₂Cl₂ (1:1, 250 cm³) and the filtrated was evaporated under reduced pressure to give 3,3'-(2,2'-(methylazanediyl)bis(ethane-2,1-diyl)bis(oxy))dipropanenitrile (2.85 g, 74.4%) as a colorless oil.

Dicyanoethylation of glycine anhydridev

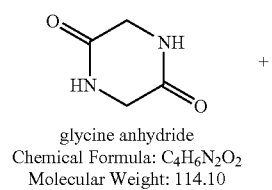

glycine anhydride
Chemical Formula: C₄H₆N₂O₂
Molecular Weight: 114.10

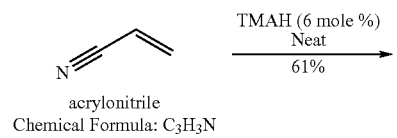

acrylonitrile
Chemical Formula: C₃H₃N
Molecular Weight: 53.06

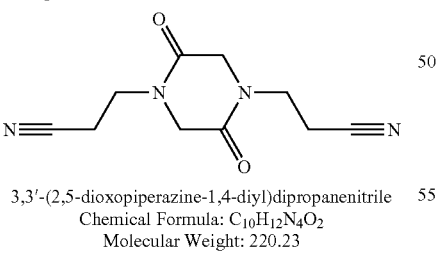

3,3'-(2,5-dioxopiperazine-1,4-diyl)dipropanenitrile
Chemical Formula: C₁₀H₁₂N₄O₂
Molecular Weight: 220.23

Glycine anhydride (2 g, 17.5 mmol) was mixed with acrylonitrile (2.015 g, 38 mmol) at 0° C. and TMAH (25% in water, 0.1 cm³, 0.1 g, 2.7 mmol) was added. The mixture was then stirred overnight, allowing it to warm to room temperature slowly. The solid formed was recrystallised from EtOH to give 3,3'-(2,5-dioxopiperazine-1,4-diyl)dipropanenitrile (2.35 g, 61%) as a white solid, mp 171-173° C. (lit mp 166° C.).

N,N-Dicyanoethylation of acetamide

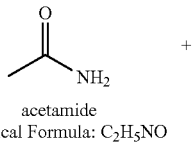

acetamide
Chemical Formula: C₂H₅NO
Molecular Weight: 59.07

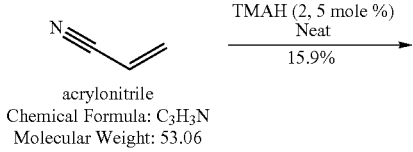

acrylonitrile
Chemical Formula: C₃H₃N
Molecular Weight: 53.06

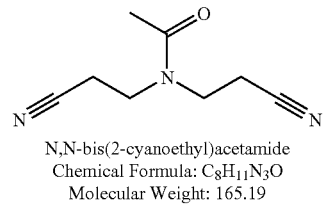

N,N-bis(2-cyanoethyl)acetamide
Chemical Formula: C₈H₁₁N₃O
Molecular Weight: 165.19

Acetamide (2 g, 33.9 mmol) was mixed with acrylonitrile (2.26 g, 42.7 mmol) at 0° C. and TMAH (25% in water, 0.06 cm³, 0.06 g, 1.7 mmol) was added. The mixture was then stirred overnight, allowing it to warm to room temperature slowly. The mixture was filtered through a pad of silica with the aid of Et₂O/CH₂Cl₂ (200 cm³) and the filtrate was concentrated under reduced pressure. The product was heated with spinning in a Kugelrohr at 150° C./2 mmHg to remove side products and to give N,N-bis(2-cyanoethyl)acetamide (0.89 g, 15.9%) as a viscous oil.

The N-substituent in the amides is non-equivalent due to amide rotation.

Tricyanoethylation of ammonia

NH₃ + ammonia
Chemical Formula: H₃N
Molecular Weight: 17.03

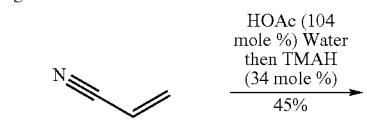

acrylonitrile
Chemical Formula: C₃H₃N
Molecular Weight: 53.06

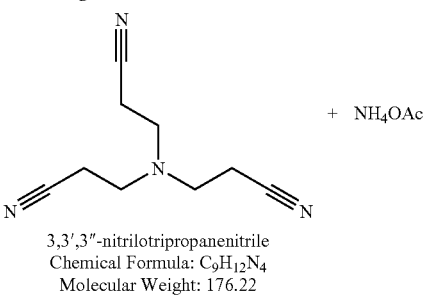

+ NH₄OAc 3,3',3''-nitrilotripropanenitrile
Chemical Formula: C₉H₁₂N₄
Molecular Weight: 176.22

Ammonia (aq 35%, 4.29, 88 mmol) was added dropwise to ice-cooled AcOH (5.5 g, 91.6 mmol) in water (9.75 cm$^3$), followed by acrylonitrile (4.65 g, 87.6 mol). The mixture was stirred under reflux for 3 days, after which it was cooled with ice and aq TMAH (25% in water, 10.94 g, 30 mmol) was added. The mixture was kept cooled with ice for 1 hours. The crystals formed was collected by filtration and washed with water. The product was dried in high vacuum to give 3,3',3"-nitrilotripropanenitrile (2.36 g, 45.8%) as a white solid, mp 59-61° C. (lit mp 59° C.).

When NaOH was used to neutralise the reaction (literature procedure), the yield was higher, 54.4%.

Dicyanoethylation of cyanoacetamide

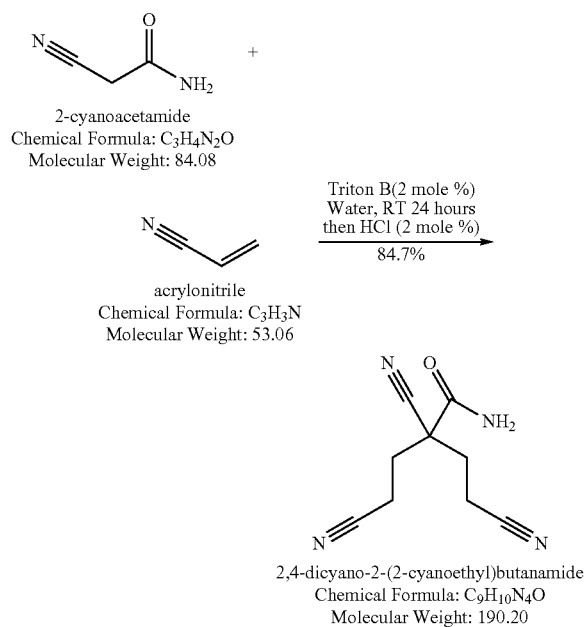

2-cyanoacetamide
Chemical Formula: C$_3$H$_4$N$_2$O
Molecular Weight: 84.08 acrylonitrile
Chemical Formula: C$_3$H$_3$N
Molecular Weight: 53.06

Triton B(2 mole %)
Water, RT 24 hours
then HCl (2 mole %)
——————→
84.7%

2,4-dicyano-2-(2-cyanoethyl)butanamide
Chemical Formula: C$_9$H$_{10}$N$_4$O
Molecular Weight: 190.20

To a stirred mixture of cyanoacetamide (2.52 g, 29.7 mmol) and Triton B (40% in MeOH, 0.3 g, 0.7 mmol) in water (5 cm$^3$) was added acrylonitrile (3.18 g, 59.9 mmol) over 30 minutes with cooling. The mixture was then stirred at room temperature for 30 min and then allowed to stand for 1 hours. EtOH (20 g) and 1M HCl (0.7 cm$^3$) were added and the mixture was heated until all solid had dissolved. Cooling to room temperature gave crystals that were collected by filtration and recrystallised from EtOH to give 2,4-dicyano-2-(2-cyanoethyl)butanamide (4.8 g, 84.7%) as a pale yellow solid, mp 118-120° C. (lit mp 118° C.), N,N-Dicyanoethylation of anthranilonitrile

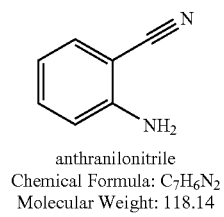

anthranilonitrile
Chemical Formula: C$_7$H$_6$N$_2$
Molecular Weight: 118.14

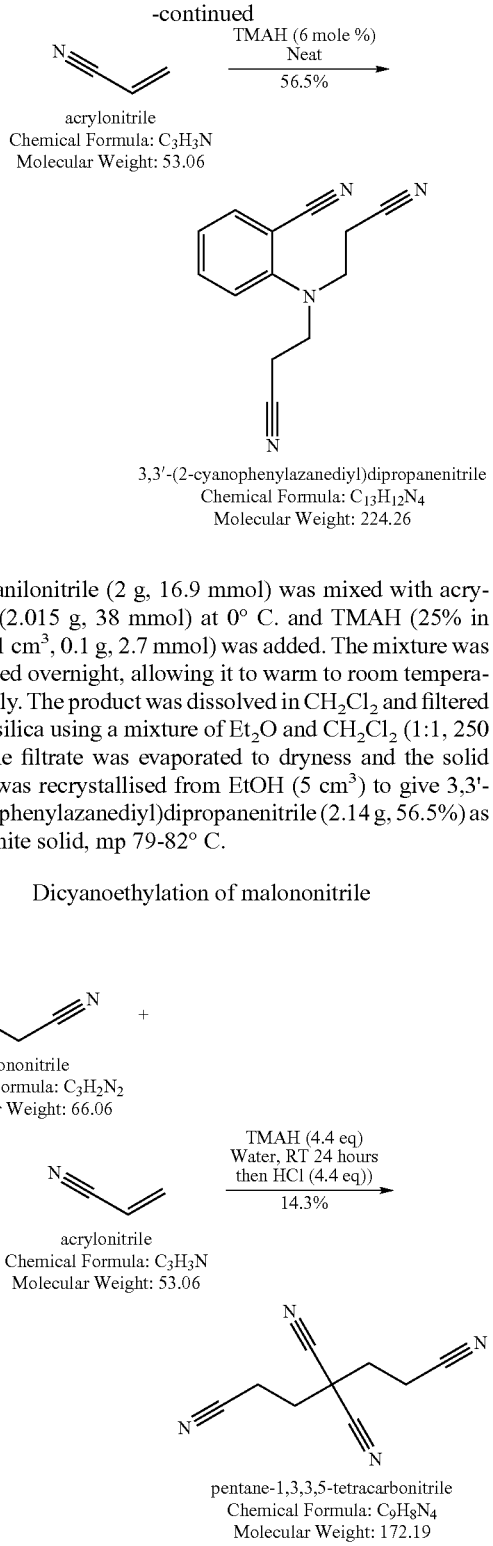

acrylonitrile
Chemical Formula: C$_3$H$_3$N
Molecular Weight: 53.06

TMAH (6 mole %)
Neat
——————→
56.5%

3,3'-(2-cyanophenylazanediyl)dipropanenitrile
Chemical Formula: C$_{13}$H$_{12}$N$_4$
Molecular Weight: 224.26

Anthranilonitrile (2 g, 16.9 mmol) was mixed with acrylonitrile (2.015 g, 38 mmol) at 0° C. and TMAH (25% in water, 0.1 cm$^3$, 0.1 g, 2.7 mmol) was added. The mixture was then stirred overnight, allowing it to warm to room temperature slowly. The product was dissolved in CH$_2$Cl$_2$ and filtered through silica using a mixture of Et$_2$O and CH$_2$Cl$_2$ (1:1, 250 cm$^3$). The filtrate was evaporated to dryness and the solid product was recrystallised from EtOH (5 cm$^3$) to give 3,3'-(2-cyanophenylazanediyl)dipropanenitrile (2.14 g, 56.5%) as an off-white solid, mp 79-82° C.

Dicyanoethylation of malononitrile malononitrile
Chemical Formula: C$_3$H$_2$N$_2$
Molecular Weight: 66.06 acrylonitrile
Chemical Formula: C$_3$H$_3$N
Molecular Weight: 53.06

TMAH (4.4 eq)
Water, RT 24 hours
then HCl (4.4 eq))
——————→
14.3% pentane-1,3,3,5-tetracarbonitrile
Chemical Formula: C$_9$H$_8$N$_4$
Molecular Weight: 172.19

Malononitrile (5 g, 75.7 mmol) was dissolved in dioxane (10 cm$^3$), followed by trimethylbenzylammonium hydroxide (Triton B, 40% in MeOH, 1.38 g, 3.3 mmol). The mixture was cooled while acrylonitrile (8.3 g, 156 mmol) was added. The mixture was stirred overnight, allowing it to warm to room temperature slowly. It was then neutralized with HCl (1 M, 3.3 cm$^3$) and poured into ice-water. The mixture was extracted with CH$_2$Cl$_2$ (200 cm$^3$) and the extracts were evaporated under reduced pressure. The product was purified by column chromatography (silica, 1:1 EtOAc-petroleum) followed by recrystallisation to give 1,3,3,5-tetracarbonitrile (1.86 g, 14.3%), mp 90-92° C. (lit mp 92° C.).

Tetracyanoethylation of pentaerythritol

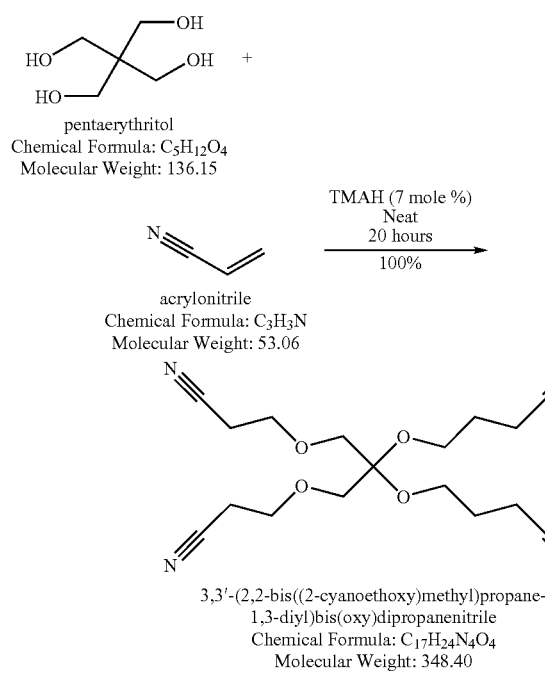

Pentaerythritol (2 g, 14.7 mmol) was mixed with acrylonitrile (5 cm$^3$, 4.03 g, 76 mmol) and the mixture was cooled in an ice-bath while tetramethylammonium hydroxide (=TMAH, 25% in water, 0.25 cm$^3$, 0.254 g, 7 mmol) was added. The mixture was then stirred at room temperature for 20 hours. After the reaction time the mixture was filtered through silica using a mixture of Et$_2$O and CH$_2$Cl$_2$ (1:1, 250 cm$^3$) and the filtrated was evaporated under reduced pressure to give 3,3'-(2,2-bis((2-cyanoethoxy)methyl)propane-1,3-diyl)bis(oxy)dipropanenitrile (5.12 g, 100%) as a colorless oil.

Hexacyanoethylation of sorbitol

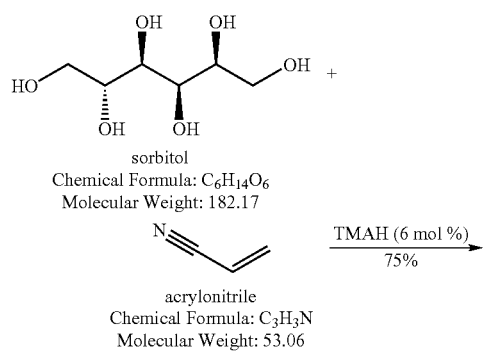

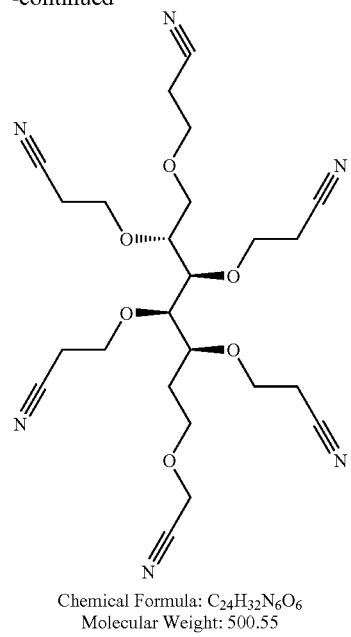

Sorbitol (2 g, 11 mmol) was mixed with acrylonitrile (7 cm$^3$, 5.64 g, 106 mmol) and the mixture was cooled in an ice-bath while tetramethylammonium hydroxide (=TMAH, 25% in water, 0.25 cm$^3$, 0.254 g, 7 mmol) was added. The mixture was then stirred at room temperature for 48 hours, adding another 0.25 cm$^3$ of TMAH after 24 hours. After the reaction time the mixture was filtered through silica using a mixture of Et$_2$O and CH$_2$Cl$_2$ (1:1, 250 cm$^3$) and the filtrate was evaporated under reduced pressure to give a fully cyanoethylated product (4.12 g, 75%) as a colorless oil.

Tricyanoethylation of diethanolamine to give 3,3'-(2, 2'-(2-cyanoethylazanediyl)bis(ethane-2,1-diyl)bis (oxy))dipropanenitrile

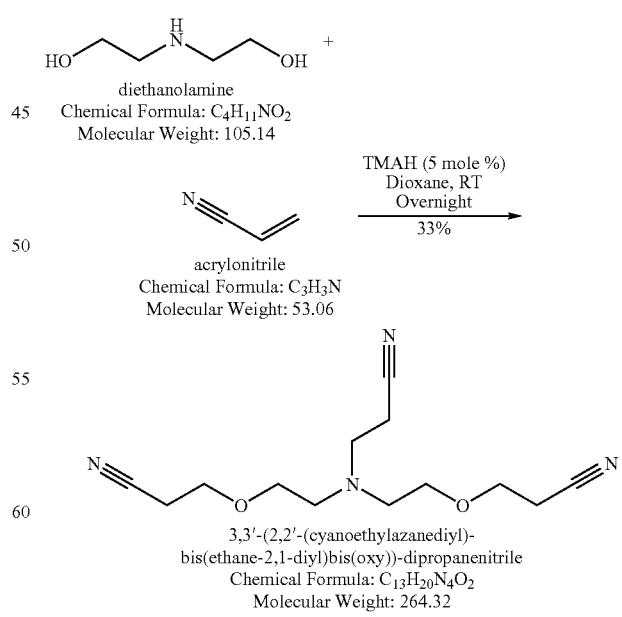

To an ice-cooled stirred solution of diethanolamine (2 g, 19 mmol) and TMAH (25% in water, 0.34 cm$^3$, 0.35 g, 9.5 mmol) in dioxane (5 cm³) was added acrylonitrile (3.53 g, 66.1 mmol) dropwise. The mixture was then stirred overnight, and allowed to warm to room temperature. More acrylonitrile (1.51 g, 28 mmol) and TMAH (0.25 cm³, 7 mmol) was added and stirring was continued for additional 24 h. The crude mixture was filtered through a pad of silica (Et₂O/CH₂Cl₂ as eluent) and evaporated to remove dioxane. The residue was purified by column chromatography (silica, Et₂O to remove impurities followed by EtOAc to elute product) to give 3,3'-(2,2'-(2-cyanoethylazanediyl)bis(ethane-2,1-diyl) bis(oxy))dipropanenitrile (1.67 g, 33%) as an oil.

Reactions to Produce Amidoxime Compounds

Reaction of acetonitrile to give
N'-hydroxyacetimidamide

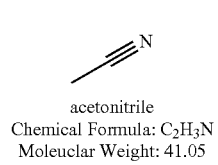

acetonitrile
Chemical Formula: C₂H₃N
Moleuclar Weight: 41.05

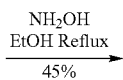

N'-hydroxyacetimidamide
Chemical Formula: C₂H₆N₂O
Moleuclar Weight: 74.08

A solution of acetonitrile (0.78 g, 19 mmol) and hydroxylamine (50% in water, 4.65 cm³, 5.02 g, 76 mmol, 4 eq) in EtOH (100 cm³) was stirred under reflux for 1 hours, after which the solvent was removed under reduced pressure and the residue was recrystallised from iPrOH to give the product N'-hydroxyacetimidamide (0.63 g, 45%) as a solid, mp 134.5-136.5° C.

Reaction of octanonitrile to give
N'-hydroxyoctanimidamide

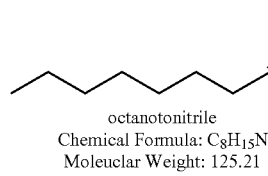

octanotonitrile
Chemical Formula: C₈H₁₅N
Moleuclar Weight: 125.21

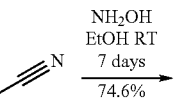

N'-hydroxyoctanimidamide
Chemical Formula: C₈H₁₈N₂O
Moleuclar Weight: 158.24

Octanonitrile (1 g, 7.99 mmol) and hydroxylamine (50% in water, 0.74 cm3, 0.79 g, 12 mmol, 1.5 eq) in EtOH (1 cm³) were stirred at room temperature for 7 days. Water (10 cm³) was then added. This caused crystals to precipitate, these were collected by filtration and dried in high vacuum line to give the product N'-hydroxyoctanimidamide (0.94 g, 74.6%) as a white solid, mp 73-75° C.

Reaction of chloroacetonitrile to give
2-chloro-N'-hydroxyacetimidamide

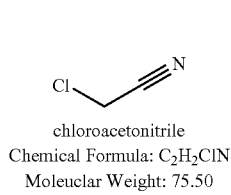

chloroacetonitrile
Chemical Formula: C₂H₂ClN
Moleuclar Weight: 75.50

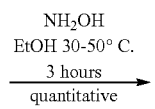

2-chloro-N'-hydroxyacetimidamide
Chemical Formula: C₂H₅ClN₂O
Moleuclar Weight: 108.53

Chloroacetonitrile (1 g, 13 mmol) and hydroxylamine (50% in water, 0.89 cm³, 0.96 g, 14.6 mmol, 1.1 eq) in EtOH (1 cm³) were stirred at 30-50° C. for 30 min. The mixture was then extracted with Et2O (3×50 cm³). The extracts were evaporated under reduced pressure to give the product 2-chloro-N'-hydroxyacetimidamide (0.81 g, 57.4%) as a yellow solid, mp 79-80° C.

Reaction of ethyl 2-cyanoacetate to give
3-amino-N-hydroxy-3-(hydroxyimino)propanamide

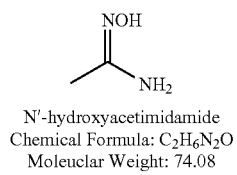

ethyl 2-cyanoacetate
Chemical Formula: C₅H₇NO₂
Moleuclar Weight: 113.11

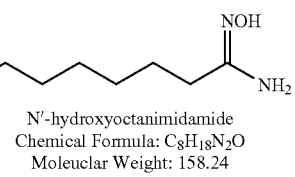

3-amino-N-hydroxy-3-
(hydroxyimino)propanamide
Chemical Formula: C₃H₇N₃O₃
Moleuclar Weight: 133.11

Ethyl cyanoacetate (1 g, 8.84 mmol) and hydroxylamine (50% in water, 1.19 cm3, 1.29 g, 19.4 mmol, 2.2 eq) in EtOH (1 cm³) were allowed to stand at room temperature for 1 hour with occasional swirling. The crystals formed were collected by filtration and dried in high vacuum line to give a colorless solid, 3-amino-N-hydroxy-3-(hydroxyimino)propanamide, mp 158° C. (decomposed) (lit mp 150° C.).

Reaction of 3-hydroxypropionitrile to give N',3-dihydroxypropanimidamide

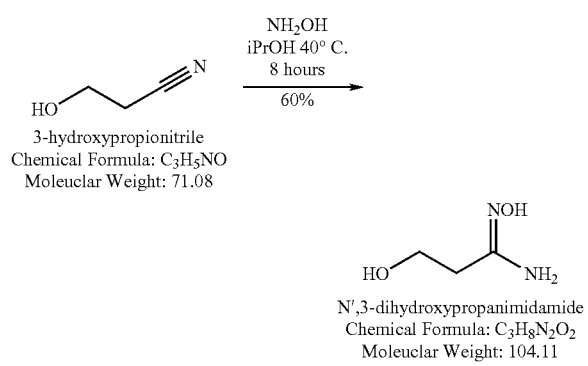

Equal molar mixture of 3-hydroxypropionitrile and hydroxylamine heated to 40° C. for 8 hours with stirring. The solution is allowed to stand overnight yielding a fine slightly off white precipitate. The precipitated solid was filtered off and washed with iPrOH and dried to a fine pure white crystalline solid N',3-dihydroxypropanimidamide mp 94° C.

Reaction of 2-cyanoacetic acid to give isomers of 3-amino-3-(hydroxyimino)propanoic acid

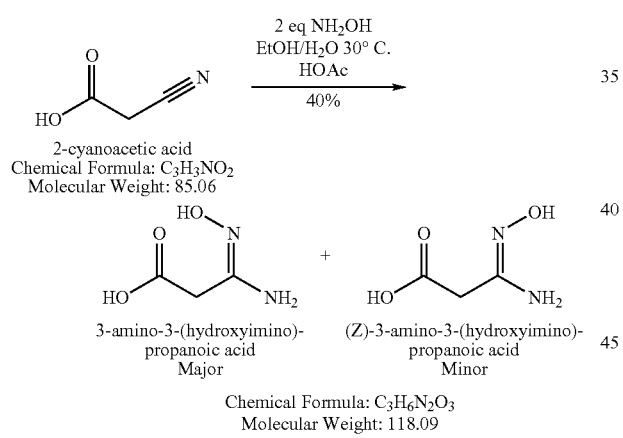

2-Cyanoacetic acid (1 g, 11.8 mmol) was dissolved in EtOH (10 cm3) and hydroxylamine (50% in water, 0.79 cm3, 0.85 g, 12.9 mmol, 1.1 eq) was added. The mixture was warmed at 40° C. for 30 min and the crystals formed (hydroxylammonium cyanoacetate) were filtered off and dissolved in water (5 cm$^3$). Additional hydroxylamine (50% in water, 0.79 cm3, 0.85 g, 12.9 mmol, 1.1 eq) was added and the mixture was stirred at room temperature overnight. Acetic acid (3 cm$^3$) was added and the mixture was allowed to stand for a few hours. The precipitated solid was filtered off and dried in high vacuum line to give the product 3-amino-3-(hydroxyimino)propanoic acid (0.56 g, 40%) as a white solid, mp 136.5° C. (lit 144° C.) as two isomers.

Characterization of the product using FTIR and NMR are as follows: vmax(KBr)/cm-1 3500-3000 (br), 3188, 2764, 1691, 1551, 1395, 1356, 1265 and 1076; δH (300 MHz; DMSO-d6; Me$_4$Si) 10.0-9.0 (br, NOH and COOH), 5.47 (2H, br S, NH$_2$) and 2.93 (2H, s, CH$_2$); δC (75 MHz; DMSO-d6; Me$_4$Si) 170.5 (COOH minor isomer), 170.2 (COOH major isomer), 152.8 (C(NOH)NH$_2$ major isomer) 148.0 (C(NOH)NH$_2$ minor isomer), 37.0 (CH$_2$ minor isomer) and 34.8 (CH$_2$ major isomer).

Reaction of adiponitrile to give N'1,N'6-dihydroxyadipimidamide

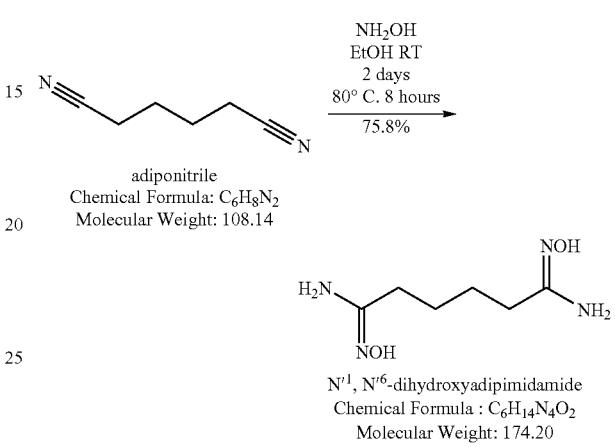

Adiponitrile (1 g, 9 mmol) and hydroxylamine (50% in water, 1.24 cm3, 1.34 g, 20 mmol, 2.2 eq) in EtOH (10 cm3) were stirred at room temperature for 2 days and then at 80° C. for 8 hours. The mixture was allowed to cool and the precipitated crystals were collected by filtration and dried in high vacuum line to give the product N'1,N'6-dihydroxyadipimidamide (1.19 g, 75.8%) as a white solid, mp 160.5 (decomposed) (lit decomposed 168-170° C.

Reaction of sebaconitrile to give N'1,N'10-dihydroxydecanebis(imidamide)

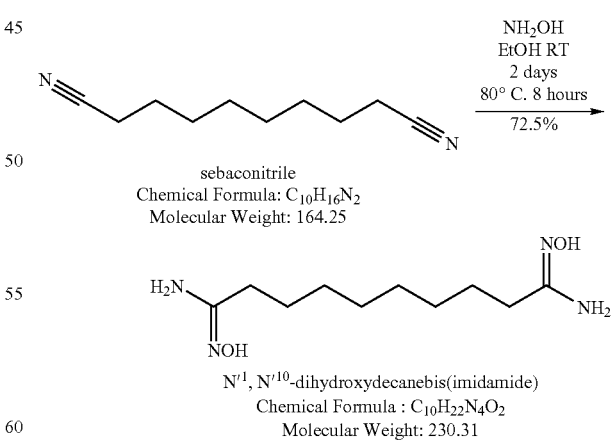

Sebaconitrile (1 g, 6 mmol) and hydroxylamine (50% in water, 0.85 cm$^3$, 0.88 g, 13.4 mmol, 2.2 eq) in EtOH (12 cm$^3$) were stirred at room temperature for 2 days and then at 80° C. for 8 h. The mixture was allowed to cool and the precipitated crystals were collected by filtration and dried in high vacuum line to give the product N'1,N'10-dihydroxydecanebis(imidamide) (1 g, 72.5%); mp 182° C.

Reaction of 2-cyanoacetamide to give 3-amino-3-(hydroxyimino)propanamidev

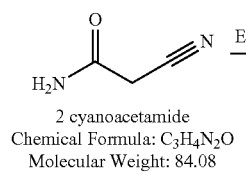

2 cyanoacetamide
Chemical Formula: C₃H₄N₂O
Molecular Weight: 84.08

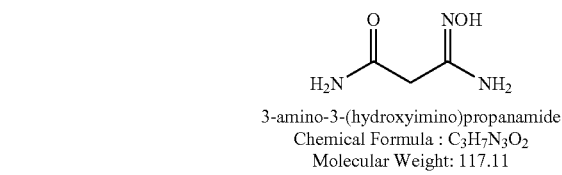

3-amino-3-(hydroxyimino)propanamide
Chemical Formula : C₃H₇N₃O₂
Molecular Weight: 117.11

2-Cyanoacetamide (1 g, 11.9 mmol) and hydroxylamine (0.8 cm³, 13 mmol, 1.1 eq) in EtOH (6 cm³) were stirred under reflux for 2.5 hours. The solvents were removed under reduced pressure and the residue was washed with CH₂Cl₂ to give the product 3-amino-3-(hydroxyimino)propanamide (1.23 g, 88.3%) as a white solid, mp 159° C.

Reaction of glycolonitrile to give N',2-dihydroxyacetimidamide

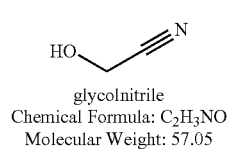

glycolnitrile
Chemical Formula: C₂H₃NO
Molecular Weight: 57.05

N',2-dihydroxyacetimidamide
Chemical Formula : C₂H₆N₂O₂
Molecular Weight: 90.08

Glycolonitrile (1 g, 17.5 mmol) and hydroxylamine (50% in water, 2.15 cm³, 35 mmol, 2 eq) in EtOH (10 cm³) were stirred under reflux for 6 hours and then at room temperature for 24 hours. The solvent was evaporated and the residue was purified by column chromatography (silica, 1:3 EtOH—CH₂Cl₂) to give the product N',2-dihydroxyacetimidamide (0.967 g, 61.4%) as an off-white solid, mp 63-65° C.

Reaction of 5-hexynenitrile to give 4-cyano-N'-hydroxybutanimidamide

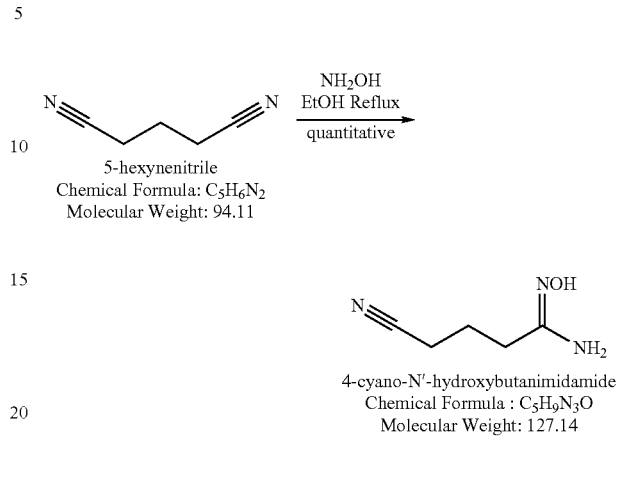

A solution of 5-hexynenitrile (0.93 g, 10 mmol) and hydroxylamine (50% in water, 1.22 cm³, 20 mmol) was stirred under reflux for 10 hours, after which volatiles were removed under reduced pressure to give the product 4-cyano-N'-hydroxybutanimidamide (1.30 g, 100%) as a white solid, mp 99.5-101° C.

Reaction of iminodiacetonitrile to give 2,2'-azanediylbis(N'-hydroxyacetimidamide)

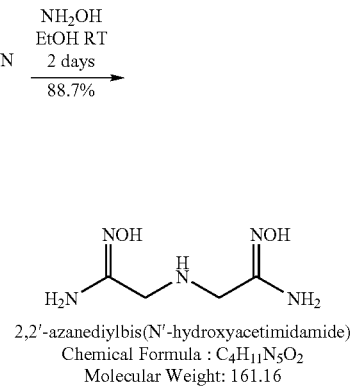

Commercial iminodiacetonitrile (Alfa-Aesar) was purified by dispersing the compound in water and extracting with dichloromethane, then evaporating the organic solvent from the extracts to give a white solid. Purified iminodiacetonitrile (0.82 g) and hydroxylamine (50% in water, 2.12 ml, 2.28 g, 34.5 mmol, 4 eq) in MeOH (6.9 ml) and water (6.8 ml) were stirred at room temperature for 48 hours. Evaporation of volatiles under reduced pressure gave a colorless liquid which was triturated with EtOH (40° C.) to give 2,2'-azanediylbis(N'-hydroxyacetimidamide) (1.23 g, 88.7%) as a white solid, mp 135-136° C., (lit mp 138° C.).

Reaction of 3-methylaminopropionitrile to give N'-hydroxy-3-(methylamino)propanimidamide

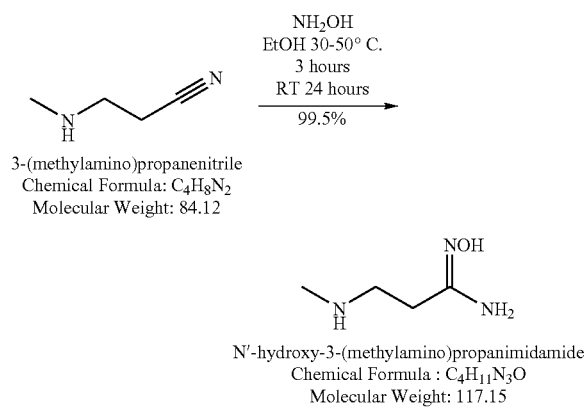

A solution of 3-methylaminopropionitrile (1 g, 11.9 mmol) and hydroxylamine (50% in water, 0.8 cm3, 0.864 g, 13.1 mmol, 1.1 eq) in EtOH (1 cm$^3$) was stirred at 30-50° C. for 3 hours and then at room temperature overnight. The solvent was removed under reduced pressure (rotary evaporator followed by high vacuum line) to give the product N'-hydroxy-3-(methylamino)propanimidamide (1.387 g, 99.5%) as a thick pale yellow oil.

Reaction of 3-(diethylamino)propanenitrile to give 3-(diethylamino)-N'-hydroxypropanimidamide

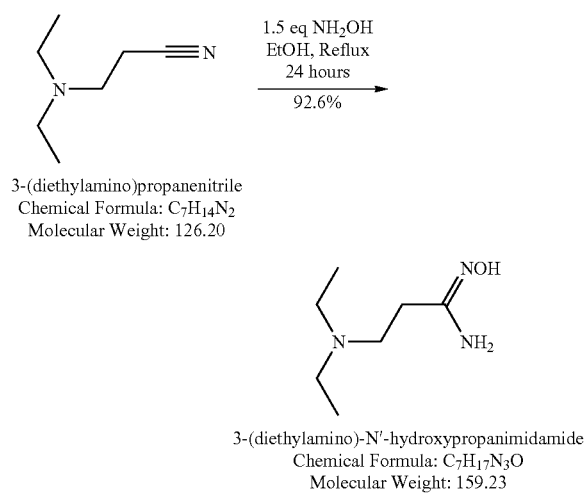

A solution of 3-(diethylamino)propanenitrile (1 g, 8 mmol) and NH$_2$OH (50% in water, 0.73 cm$^3$, 11.9 mmol) in EtOH (10 cm$^3$) were heated to reflux for 24 hours, after which the solvent and excess hydroxylamine were removed by rotary evaporator. The residue was freeze-dried and kept in high vacuum line until it slowly solidified to give 3-(diethylamino)-N'-hydroxypropanimidamide (1.18 g, 92.6%) as a white solid, mp 52-54° C.

Reaction of 3,3',3''-nitrilotripropanenitrile with hydroxylamine to give 3,3',3''-nitrilotris(N'-hydroxypropanimidamide)

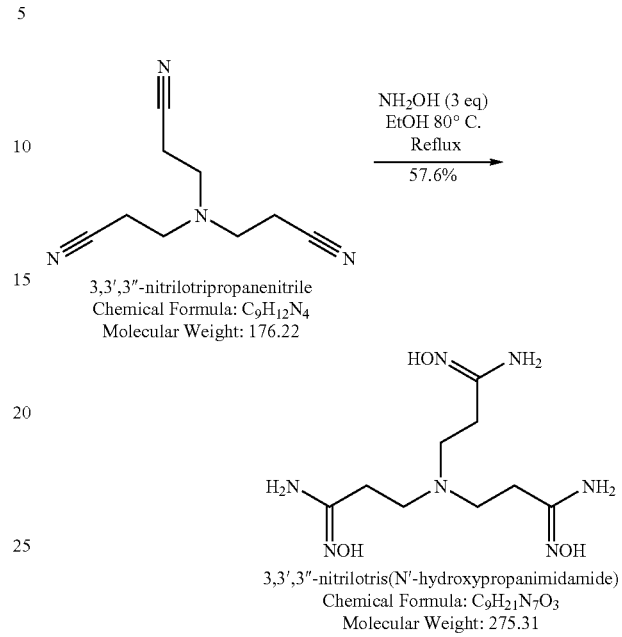

A solution of 3,3',3'-nitrilotripropanenitrile (2 g, 11.35 mmol) and hydroxylamine (50% in water, 2.25 g, 34 mmol) in EtOH (25 cm$^3$) was stirred at 80° C. overnight, then at room temperature for 24 hours. The white precipitate was collected by filtration and dried in high vacuum to give 3,3',3''-nitrilotris(N'-hydroxypropanimidamide) (1.80 g, 57.6%) as a white crystalline solid, mp 195-197° C. (decomposed).

Reaction of 3-(2-ethoxyethoxy)propanenitrile to give 3-(2-ethoxyethoxy)-N'-hydroxypropanimidamide

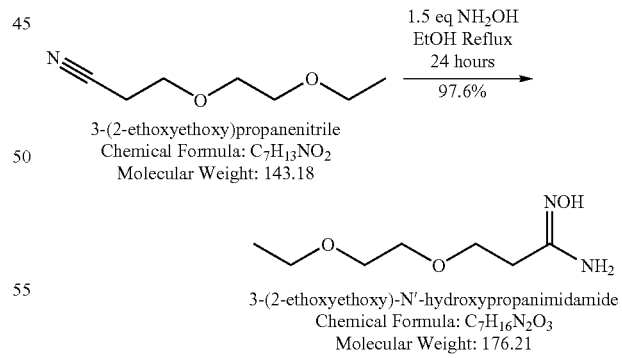

A solution of 3-(2-ethoxyethoxy)propanenitrile (1 g, 7 mmol) and NH$_2$OH (50% in water, 0.64 cm$^3$, 10.5 mmol) in EtOH (10 cm$^3$) were heated to reflux for 24 hours, after which the solvent and excess hydroxylamine were removed by rotary evaporator. The residue was freeze-dried and kept in high vacuum line for several hours to give 3-(2-ethoxyethoxy)-N'-hydroxypropanimidamide (1.2 g, 97.6%) as a colorless oil.

Reaction of 3-(2-(2-(dimethylamino)ethoxy)ethoxy)propanenitrile to give 3-(2-(2-(dimethylamino)ethoxy)ethoxy)-N'-hydroxypropanimidamide

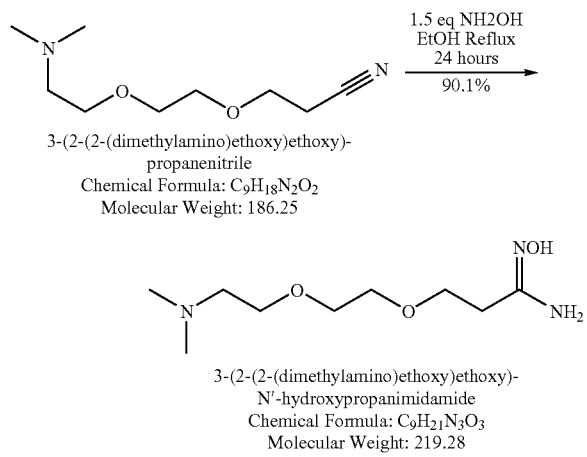

A solution of 3-(2-(2-(dimethylamino)ethoxy)ethoxy)propanenitrile (0.5 g, 2.68 mmol) and NH$_2$OH (50% in water, 0.25 cm$^3$, 4 mmol) in EtOH (10 cm$^3$) were stirred at 80° C. for 24 hours, after which the solvent and excess hydroxylamine were removed by rotary evaporator. The residue was freeze-dried and kept in high vacuum line for several hours to give give 3-(2-(2-(dimethylamino)ethoxy)ethoxy)-N'-hydroxypropanimidamide (0.53 g, 90.1%) as a light yellow oil.

Reaction of 3,3'-(2,2'-(2-cyanoethylazanediyl)bis(ethane-2,1-diyl)bis(oxy))dipropanenitrile with hydroxylamine to give 3,3'-(2,2'-(3-amino-3-(hydroxyimino)propylazanediyl)bis(ethane-2,1-diyl))bis(oxy)bis(N'-hydroxypropanimidamide)

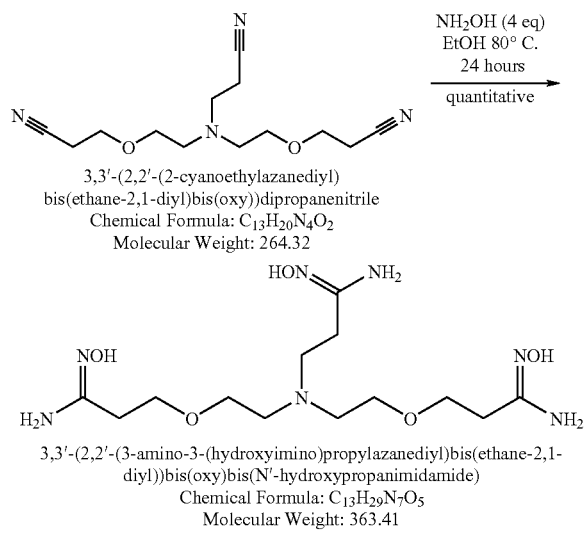

Treatment of 3,3'-(2,2'-(2-cyanoethylazanediyl)bis(ethane-2,1-diyl)bis(oxy))dipropanenitrile (0.8 g, 3 mmol) with NH$_2$OH (0.74 cm$^3$, 12.1 mmol) in EtOH (8 cm$^3$) gave 3,3'-(2,2'-(3-amino-3-(hydroxyimino)propylazanediyl)bis(ethane-2,1-diyl))bis(oxy)bis(N'-hydroxypropanimidamide) (1.09 g, 100%) as an oil.

Reaction of iminodipropionitrile to give 3,3'-azanediylbis(N'-hydroxypropanimidamide)

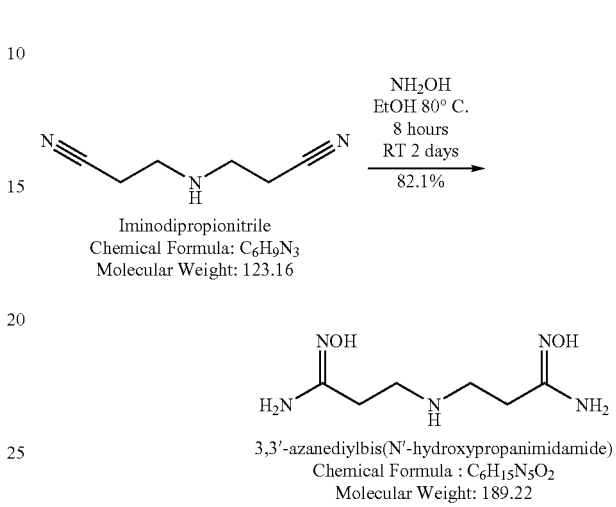

Iminodipropionitrile (1 g, 8 mmol) and hydroxylamine (50% in water, 1 cm$^3$, 1.07 g, 16 mmol, 2 eq) in EtOH (8 cm$^3$) were stirred at room temperature for 2 days and then at 80° C. for 8 hours. The mixture was allowed to cool and the precipitated crystals were collected by filtration and dried in high vacuum line to give the product 3,3'-azanediylbis(N'-hydroxypropanimidamide) (1.24 g, 82.1%) as a white solid, mp 180° C. (lit 160° C.

Reaction of 3,3',3'',3'''-(ethane-1,2-diylbis(azanetriyl))tetrapropanenitrile to give 3,3',3'',3'''-(ethane-1,2-diylbis(azanetriyl))tetrakis(N'-hydroxypropanimidamide) to produce EDTA analogue

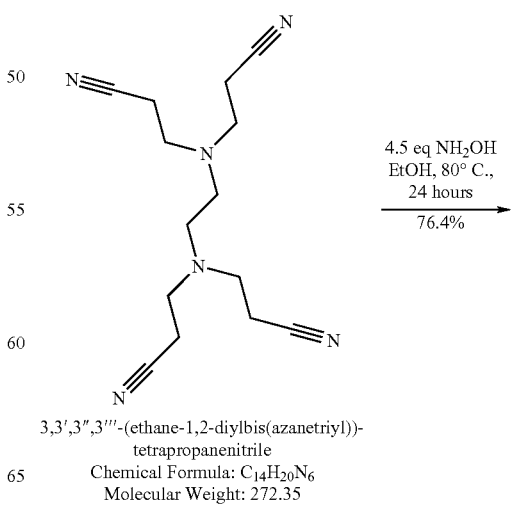

-continued

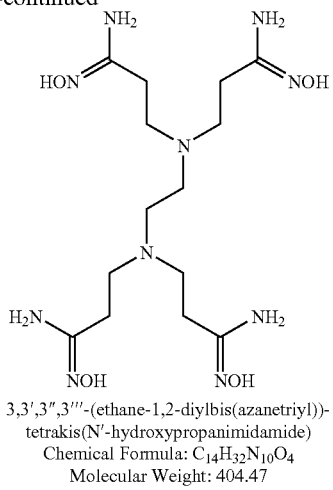

3,3',3'',3'''-(ethane-1,2-diylbis(azanetriyl))-
tetrakis(N'-hydroxypropanimidamide)
Chemical Formula: $C_{14}H_{32}N_{10}O_4$
Molecular Weight: 404.47

A solution of 3,3',3'',3'''-(ethane-1,2-diylbis(azanetriyl))tetrapropanenitrile (1 g, 4 mmol) and $NH_2OH$ (50% in water, 1.1 cm³, 18.1 mmol) in EtOH (10 cm³) was stirred at 80° C. for 24 hours and was then allowed to cool to room temperature. The solid formed was collected by filtration and dried under vacuum to give 3,3',3'',3'''-(ethane-1,2-diylbis(azanetriyl))tetrakis(N'-hydroxypropanimidamide) (1.17 g, 76.4%) as a white solid, mp 191-192° C.

Reaction of 3,3'-(2,2-bis((2-cyanoethoxy)methyl)propane-1,3-diyl)bis(oxy)dipropanenitrile with hydroxylamine to give 3,3'-(2,2-bis((3-(hydroxyamino)-3-iminopropoxy)methyl)propane-1,3-diyl)bis(oxy)bis(N-hydroxypropanimidamide)

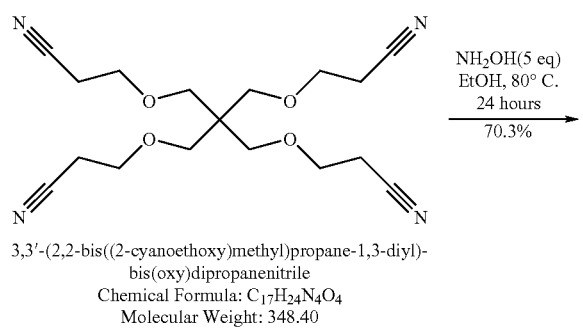

3,3'-(2,2-bis((2-cyanoethoxy)methyl)propane-1,3-diyl)-
bis(oxy)dipropanenitrile
Chemical Formula: $C_{17}H_{24}N_4O_4$
Molecular Weight: 348.40

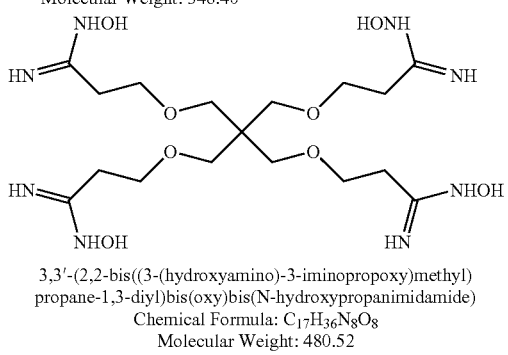

3,3'-(2,2-bis((3-(hydroxyamino)-3-iminopropoxy)methyl)
propane-1,3-diyl)bis(oxy)bis(N-hydroxypropanimidamide)
Chemical Formula: $C_{17}H_{36}N_8O_8$
Molecular Weight: 480.52

To a solution of 3,3'-(2,2-bis((2-cyanoethoxy)methyl)propane-1,3-diyl)bis(oxy)dipropanenitrile (1 g, 2.9 mmol) in EtOH (10 ml) was added NH2OH (50% in water, 0.88 ml, 0.948 g, 14.4 mmol), the mixture was stirred at 80° C. for 24 hours and was then cooled to room temperature. Evaporation of the solvent and excess NH2OH in the rotary evaporator followed by high vacuum for 12 hours gave 3,3'-(2,2-bis((3-(hydroxyamino)-3-iminopropoxy)methyl)propane-1,3-diyl)bis(oxy)bis(N-hydroxypropanimidamide) (0.98 g, 70.3%) as a white solid, mp 60° C.;

Reaction of 3,3'-(2-cyanophenylazanediyl)dipropanenitrile with hydroxylamine to give 3,3'-(2-(N'-hydroxycarbamimidoyl)phenylazanediyl)bis(N'-hydroxypropanimidamide)

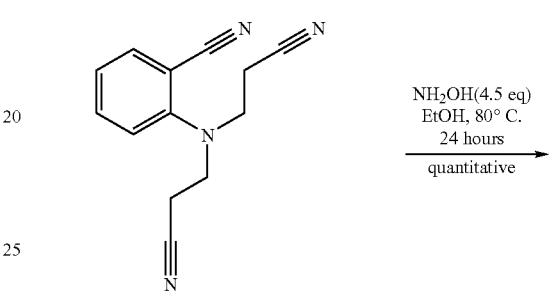

3,3'-(2-cyanophenylazanediyl)dipropanenitrile
Chemical Formula: $C_{13}H_{12}N_4$
Molecular Weight: 224.26

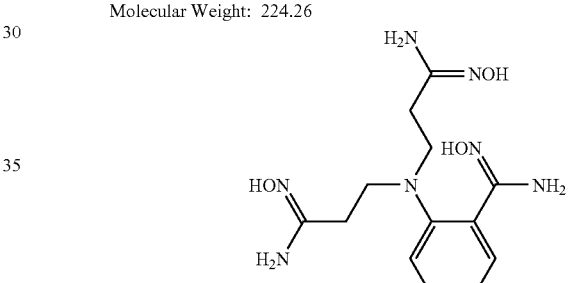

3,3'-(2-(N'-hydroxycarbamimidoyl)phenylazanediyl)-
bis(N'-hydroxypropanimidamide)
Chemical Formula: $C_{13}H_{21}N_7O_3$
Molecular Weight: 323.35

Treatment of 3,3'-(2-cyanophenylazanediyl)dipropanenitrile (1 g, 4.46 mmol) with NH2OH (1.23 ml, 20 mmol) in EtOH (10 ml) gave a crude product that was triturated with $CH_2Cl_2$ to give 3,3'-(2-(N'-hydroxycarbamimidoyl)phenylazanediyl)bis(N'-hydroxypropanimidamide) (1.44 g, 100%) as a solid, decomposed. 81° C.

Reaction of N,N-bis(2-cyanoethyl)acetamide with hydroxylamine to give N,N-bis(3-amino-3-(hydroxyimino)propyl)acetamide

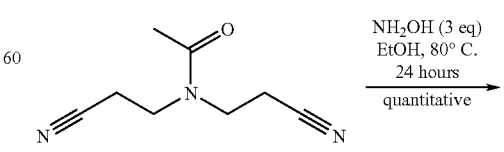

N,N-bis(2-cyanoethyl)acetamide
Chemical Formula: $C_8H_{11}N_3O$
Molecular Weight: 165.19

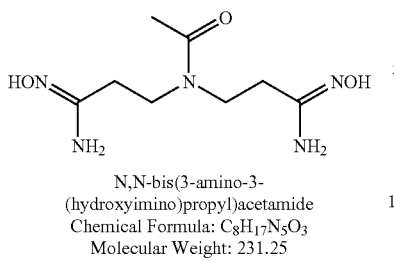

N,N-bis(3-amino-3-
(hydroxyimino)propyl)acetamide
Chemical Formula: $C_8H_{17}N_5O_3$
Molecular Weight: 231.25

Treatment of N,N-bis(2-cyanoethyl)acetamide (0.5 g, 3.03 mmol) with $NH_2OH$ (0.56 ml, 9.1 mmol) in EtOH (5 ml) gave N,N-bis(3-amino-3-(hydroxyimino)propyl)acetamide (0.564 g, 100%) as a white solid, mp 56.4-58° C.;

Reaction of 3,3'-(2,2'-(methylazanediyl)bis(ethane-2,
1-diyl)bis(oxy))dipropanenitrile with hydroxylamine
to give 3,3'-(2,2'-(methylazanediyl)bis(ethane-2,1-
diyl)bis(oxy))bis(N'-hydroxypropanimidamide)

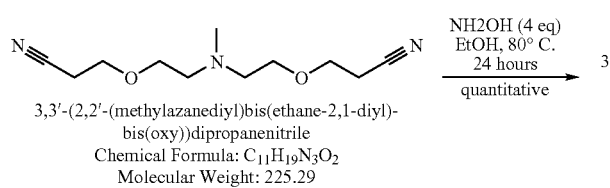

3,3'-(2,2'-(methylazanediyl)bis(ethane-2,1-diyl)-
bis(oxy))dipropanenitrile
Chemical Formula: $C_{11}H_{19}N_3O_2$
Molecular Weight: 225.29

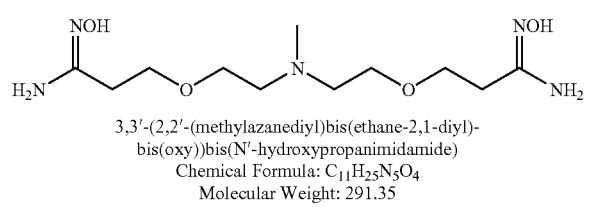

3,3'-(2,2'-(methylazanediyl)bis(ethane-2,1-diyl)-
bis(oxy))bis(N'-hydroxypropanimidamide)
Chemical Formula: $C_{11}H_{25}N_5O_4$
Molecular Weight: 291.35

Treatment of 3,3'-(2,2'-(methylazanediyl)bis(ethane-2,1-diyl)bis(oxy))dipropanenitrile (1 g, 4.4 mmol) with $NH_2OH$ (0.82 ml, 13.3 mmol) in EtOH (10 ml) gave 3,3'-(2,2'-(methylazanediyl)bis(ethane-2,1-diyl)bis(oxy))bis(N'-hydroxypropanimidamide) (1.28 g, 100%) as an oil.

Reaction of glycol derivative 3,3'-(ethane-1,2-diylbis
(oxy))dipropanenitrile to give 3,3'-(ethane-1,2-diyl-
bis(oxy))bis(N'-hydroxypropanimidamide)

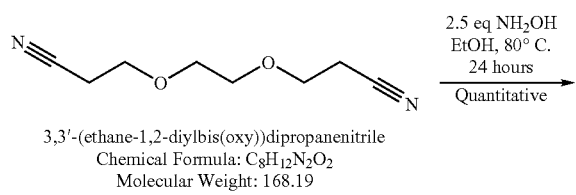

3,3'-(ethane-1,2-diylbis(oxy))dipropanenitrile
Chemical Formula: $C_8H_{12}N_2O_2$
Molecular Weight: 168.19

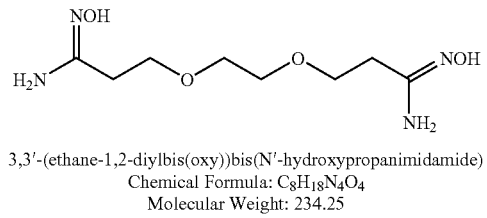

3,3'-(ethane-1,2-diylbis(oxy))bis(N'-hydroxypropanimidamide)
Chemical Formula: $C_8H_{18}N_4O_4$
Molecular Weight: 234.25

A solution of 3,3'-(ethane-1,2-diylbis(oxy))dipropanenitrile (1 g, 5 mmol) and $NH_2OH$ (50% in water, 0.77 cm³, 12.5 mmol) in EtOH (10 cm³) was stirred at 80° C. for 24 hours and then at room temperature for 24 hours. The solvent and excess $NH_2OH$ were evaporated off and the residue was freeze-dried to give 3,3'-(ethane-1,2-diylbis(oxy))bis(N'-hydroxypropanimidamide) (1.33 g, 100%) as a viscous oil.

Reaction of 3,3'-(piperazine-1,4-diyl)dipropanenitrile to give 3,3'-(piperazine-1,4-diyl)bis(N'-hydroxypropanimidamide)

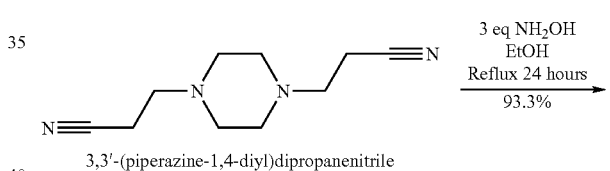

3,3'-(piperazine-1,4-diyl)dipropanenitrile
Chemical Formula: $C_{10}H_{16}N_4$
Molecular Weight: 192.26

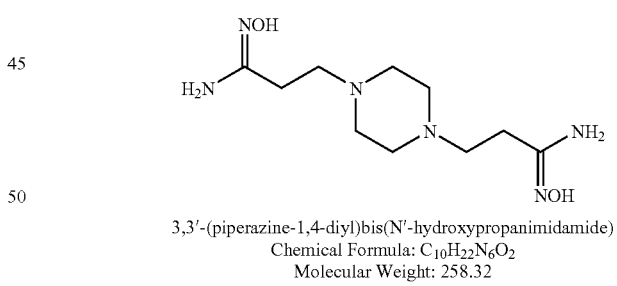

3,3'-(piperazine-1,4-diyl)bis(N'-hydroxypropanimidamide)
Chemical Formula: $C_{10}H_{22}N_6O_2$
Molecular Weight: 258.32

A solution of 3,3'-(piperazine-1,4-diyl)dipropanenitrile (1 g, 5.2 mmol) and $NH_2OH$ (50% in water, 0.96 cm³, 15.6 mmol) in EtOH (10 cm³) were heated to reflux for 24 hours, after which the mixture was allowed to cool to room temperature. The solid formed was collected by filtration and dried in high vacuum line to give 3,3'-(piperazine-1,4-diyl)bis(N'-hydroxypropanimidamide) (1.25 g, 93.3%) as a white solid, decp 238° C. (brown coloration at >220° C.

Reaction of cyanoethylated sorbitol Compound with hydroxylamine to give 1,2,3,4,5,6-hexakis-O-[3-(hydroxyamino)-3-iminopropyl Hexitol

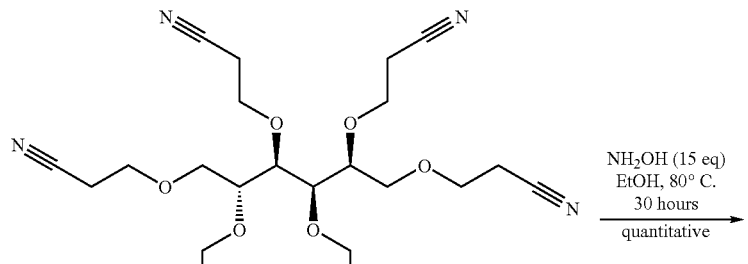

Chemical Formula: $C_{24}H_{32}N_6O_6$
Molecular Weight: 500.55

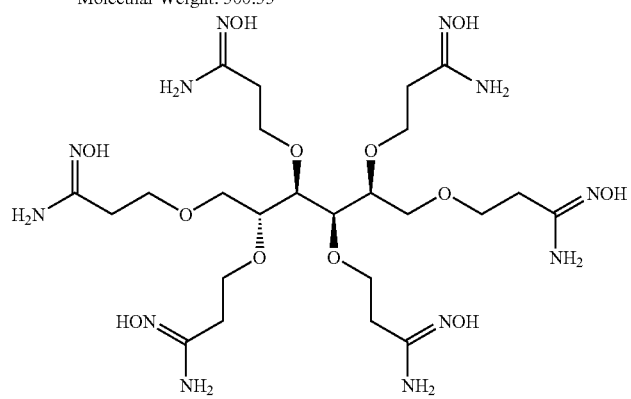

Hexitol, 1,2,3,4,5,6-hexakis-O-[3-(hydroxyamino)-3-iminopropyl
Chemical Formula: $C_{24}H_{50}N_{12}O_{12}$
Molecular Weight: 698.73

A solution of cyanoethylated product of sorbitol (0.48 g, 0.96 mmol) and $NH_2OH$ (50% in water, 0.41 ml, 0.44 g, 6.71 mmol) in EtOH (5 ml) was stirred at 80° C. for 24 hours. Evaporation of solvent and NMR analysis of the residue showed incomplete conversion. The product was dissolved in water (10 ml) and EtOH (100 ml) and $NH_2OH$ (0.5 g, 7.6 mmol) was added. The mixture was stirred at 80° C. for a further 7 hours. Removal of all volatiles after the reaction gave 1,2,3,4,5,6-hexakis-O-[3-(hydroxyamino)-3-iminopropyl Hexitol, (0.67 g, 100%) as a white solid, mp 92-94° C. (decomposed)

Reaction of Benzonitrile to give N'-hydroxybenzimidamide

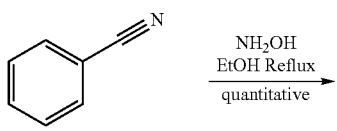

benzonitrile
Chemical Formula: $C_7H_5N$
Molecular Weight: 103.12

-continued

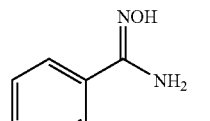

N'-hydroxybenzimidamide
Chemical Formula: $C_7H_8N_2O$
Molecular Weight: 136.15

Benzonitrile (0.99 cm³, 1 g, 9.7 mmol) and hydroxylamine (50% in water, 0.89 cm³, 0.96 g, 14.55 mmol, 1.5 eq) were stirred under reflux in EtOH (10 cm³) for 48 hours. The solvent was evaporated under reduced pressure and water (10 cm³) was added to the residue. The mixture was extracetd with dichloromethane (100 cm³) and the organic extract was evaporated under reduced pressure. The residue was purified by column chromatography to give the product N'-hydroxy-benzimidamide (1.32 g, 100%) as a white crystalline solid, mp 79-81° C. (lit 79-80° C. This procedure is suitable for all starting materials bearing a benzene ring.

Reaction of 3-phenylpropionitrile to give N'-hydroxy-3-phenylpropanimidamide

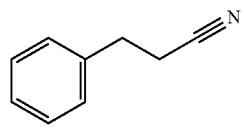

3-phenylpropionitrile
Chemical Formula: C$_9$H$_9$N
Molecular Weight: 131.17

NH$_2$OH
EtOH Reflux
70.5%

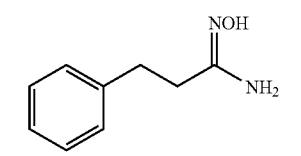

N'-hydroxy-3-phenylpropanimidamide
Chemical Formula: C$_9$H$_{12}$N$_2$O
Molecular Weight: 164.20

Phenylpropionitrile (1 g, 7.6 mmol) was reacted with hydroxylamine (50% in water, 0.94 cm$^3$, 15.2 mmol, 2 eq) in EtOH (7.6 cm$^3$) in the same manner as in the preparation of N'-hydroxybenzimidamide (EtOAc used in extraction) to give the product N'-hydroxy-3-phenylpropanimidamide (0.88 g, 70.5%) as a white solid, mp 42-43° C.

Reaction of m-tolunitrile to give N'-hydroxy-3-methylbenzimidamide

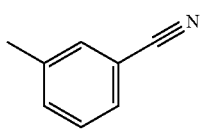

m-tolunitrile
Chemical Formula: C$_8$H$_7$N
Molecular Weight: 117.15

NH$_2$OH
EtOH Reflux
97.7%

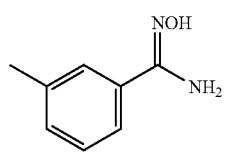

N'-hydroxy-3-methylbenzimidamide
Chemical Formula: C$_8$H$_{10}$N$_2$O
Molecular Weight: 150.18

The reaction of m-tolunitrile (1 g, 8.54 mmol) and hydroxylamine (0.78 cm$^3$, 12.8 mmol, 1.5 eq) in EtOH (8.5 cm$^3$) was performed in the same manner as in the preparation of N'-hydroxybenzimidamide, to give the product N'-hydroxy-3-methylbenzimidamide (1.25 g, 97.7%) as a white solid, mp 92° C. (lit 88-90° C.).

Reaction of benzyl cyanide to give N'-hydroxy-2-phenylacetimidamidev

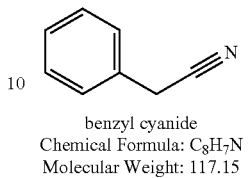

benzyl cyanide
Chemical Formula: C$_8$H$_7$N
Molecular Weight: 117.15

NH$_2$OH
EtOH Reflux
81.9%

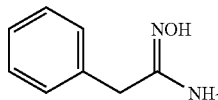

N'-hydroxy-2-phenylacetimidamide
Chemical Formula: C$_8$H$_{10}$N$_2$O
Molecular Weight: 150.18

Benzyl cyanide (1 g, 8.5 mmol) and hydroxylamine (50% in water, 1.04 cm$^3$, 17 mmol, 2 eq) in EtOH (8.5 cm$^3$) were reacted in the same manner as in the preparation of N'-hydroxybenzimidamide (EtOAc used in extraction) to give the product N'-hydroxy-2-phenylacetimidamide (1.04 g, 81.9%) as a pale yellow solid, mp 63.5-64.5° C. (lit 57-59° C.).

Reaction of anthranilonitrile to give 2-amino-N'-hydroxybenzimidamide

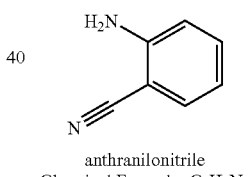

anthranilonitrile
Chemical Formula: C$_7$H$_6$N$_2$
Molecular Weight: 118.14

NH$_2$OH
EtOH Reflux
90.3%

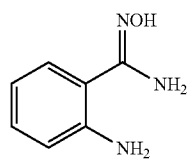

2-amino-N'-hydroxybenzimidamide
Chemical Formula: C$_7$H$_9$N$_3$O
Molecular Weight: 151.17

Anthranilonitrile (1 g, 8.5 mmol) and hydroxylamine (50% in water, 0.57 cm$^3$, 9.3 mmol, 1.1 eq) in EtOH (42.5 cm$^3$) were stirred under reflux for 24 hours, after which the volatiles were removed under reduced pressure and residue was partitioned between water (5 cm$^3$) and CH$_2$Cl$_2$ (100 cm$^3$). The organic phase was evaporated to dryness in the rotary evaporator followed by high vacuum line to give the product 2-amino-N'-hydroxybenzimidamide (1.16 g, 90.3%) as a solid, mp 85-86° C.

Reaction of phthalonitrile to give isoindoline-1,3-dione dioxime

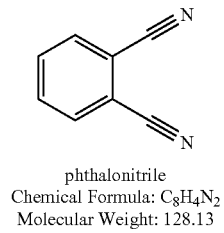

phthalonitrile
Chemical Formula: $C_8H_4N_2$
Molecular Weight: 128.13

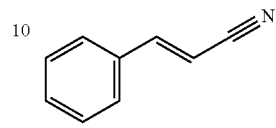

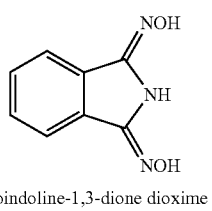

isoindoline-1,3-dione dioxime
Chemical Formula: $C_8H_7N_3O_2$
Molecular Weight: 177.16

Phthalonitrile (1 g, 7.8 mmol) and hydroxylamine (1.9 cm³, 31.2 mmol, 4 eq) in EtOH (25 cm³) were stirred under reflux for 60 hours, after which the volatiles were removed under reduced pressure and the residue was washed with EtOH (2 cm³) and $CH_2Cl_2$ (2 cm³) to give the cyclised product isoindoline-1,3-dione dioxime (1.18 g, 85.4%) as a pale yellow solid, mp 272-275° C. (decomposed) (lit 271° C.).

Reaction of 2-cyanophenylacetonitrile to give the cyclised product 3-aminoisoquinolin-1(4H)-one oxime or 3-(hydroxyamino)-3,4-dihydroisoquinolin-1-amine

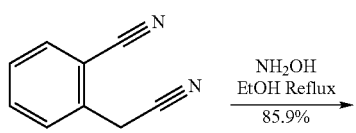

2 cyanophenylacetonitrile
Chemical Formula: $C_9H_6N_2$
Molecular Weight: 142.16

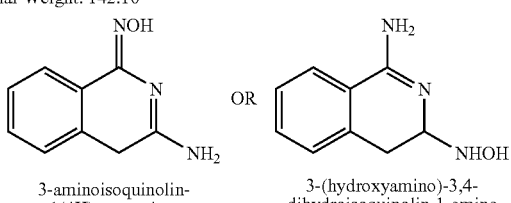

3-aminoisoquinolin-1(4H)-one oxime 3-(hydroxyamino)-3,4-dihydroisoquinolin-1-amine Chemical Formula: $C_9H_{11}N_3O$
Molecular Weight: 177.20

A solution of 2-cyanophenylacetonitrile (1 g, 7 mmol) and hydroxylamine (1.7 cm³, 28.1 mmol, 4 eq) in EtOH (25 cm³) were stirred under reflux for 60 hours, after which the volatiles were removed under reduced pressure. The residue was recrystallised from EtOH-water (1:4, 15 cm³) to give the cyclised product 3-aminoisoquinolin-1(4H)-one oxime or 3-(hydroxyamino)-3,4-dihydroisoquinolin-1-amine (1.15 g, 85.9%) as a solid, mp 92.5-94.5° C.

Reaction of cinnamonitrile to give N'-hydroxycinnamimidamide

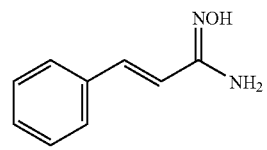

cinnamonitrile
Chemical Formula: $C_9H_7N$
Molecular Weight: 129.16

N'-hydroxycinnamimidamide
Chemical Formula: $C_9H_{10}N_2O$
Molecular Weight: 162.19

Cinnamonitrile (1 g, 7.74 mmol) and hydroxylamine (0.71 cm³, 11.6 mmol, 1.5 eq) were reacted in EtOH (7 cm³) as described for AO6 (two chromatographic separations were needed in purification) to give N'-hydroxycinnamimidamide (0.88 g, 70%) as a light orange solid, mp 85-87° C. (lit 93° C.).

Reaction of 5-cyanophthalide to give the product N'-hydroxy-1-oxo-1,3-dihydroisobenzofuran-5-carboximidamide

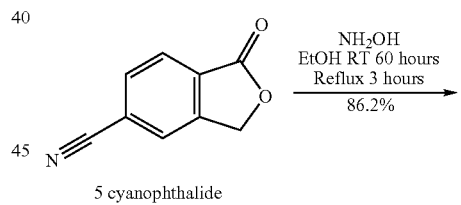

5 cyanophthalide
Chemical Formula: $C_9H_5NO_2$
Molecular Weight: 159.14

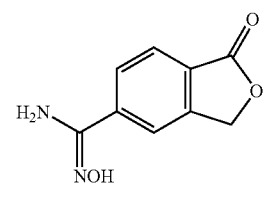

N'-hydroxy-1-oxo-1,3-dihydroisobenzofuran-5-carboximidamide
Chemical Formula: $C_9H_8N_2O_3$
Molecular Weight: 192.17

A solution of 5-cyanophthalide (1 g, 6.28 mmol) and hydroxylamine (50% in water, 0.77 cm³, 0.83 g, 12.6 mmol, 2 eq) in EtOH (50 cm³) was stirred at room temperature for 60 hours and then under reflux for 3 hours. After cooling to room temperature and standing overnight, the solid formed was collected by filtration and dried in high vacuum line to give the product N'-hydroxy-1-oxo-1,3-dihydroisobenzofuran-5-carboximidamide (1.04 g, 86.2%) as a white solid, mp 223-226° C. (decomposed).

Reaction of 4-chlorobenzonitrile to give the product 4-chloro-N'-hydroxybenzimidamide

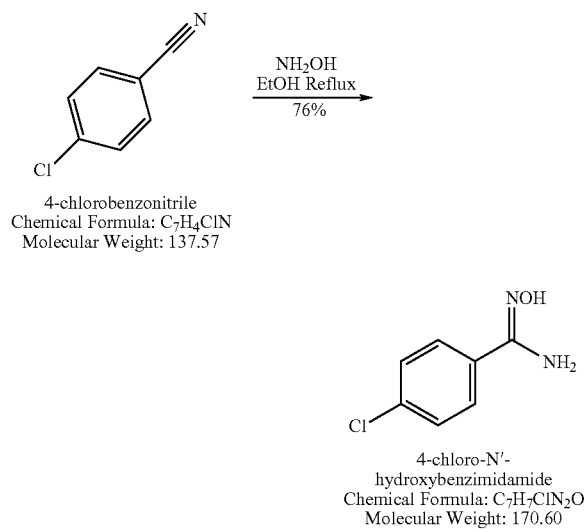

4-chlorobenzonitrile
Chemical Formula: $C_7H_4ClN$
Molecular Weight: 137.57

4-chloro-N'-hydroxybenzimidamide
Chemical Formula: $C_7H_7ClN_2O$
Molecular Weight: 170.60

A solution of 4-chlorobenzonitrile (1 g, 7.23 mmol) and hydroxylamine (50% in water, 0.67 cm$^3$, 10.9 mmol, 1.5 eq) in EtOH (12.5 cm$^3$) was stirred under reflux for 48 hours. The solvent was removed under reduced pressure and the residue was washed with $CH_2Cl_2$ (10 cm$^3$) to give the product 4-chloro-N'-hydroxybenzimidamide (0.94 g, 76%) as a white solid, mp 133-135° C.

Reaction of 3-(phenylamino)propanenitrile to give N'-hydroxy-3-(phenylamino)propanimidamide

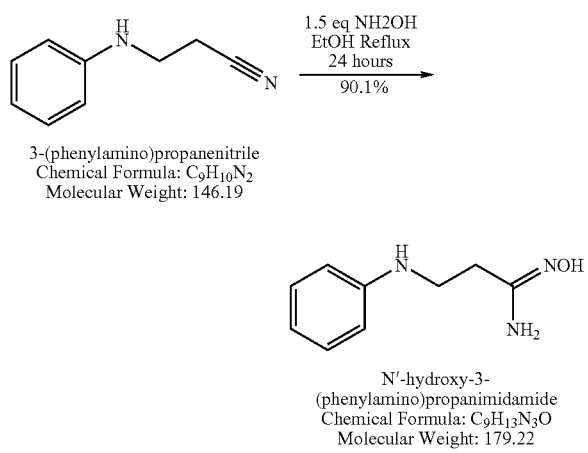

3-(phenylamino)propanenitrile
Chemical Formula: $C_9H_{10}N_2$
Molecular Weight: 146.19

N'-hydroxy-3-(phenylamino)propanimidamide
Chemical Formula: $C_9H_{13}N_3O$
Molecular Weight: 179.22

A solution of 3-(phenylamino)propanenitrile (1 g, 6.84 mmol) and $NH_2OH$ (50% in water, 0.63 cm$^3$, 10.26 mmol) in EtOH (10 cm$^3$) were heated to reflux for 24 hours, after which the solvent and excess hydroxylamine were removed by rotary evaporator. To the residue was added water (10 cm$^3$) and the mixture was extracted with $CH_2Cl_2$ (100 cm$^3$). The extracts were concentrated under reduced pressure and the residue was purified by column chromatography (silica, $Et_2O$) to give N'-hydroxy-3-(phenylamino)propanimidamide (0.77 g, 62.8%) as a white solid, mp 93-95° C. (lit mp 91-91.5° C.).

Reaction of 4-pyridinecarbonitrile to give the Product N'-hydroxyisonicotinimidamide

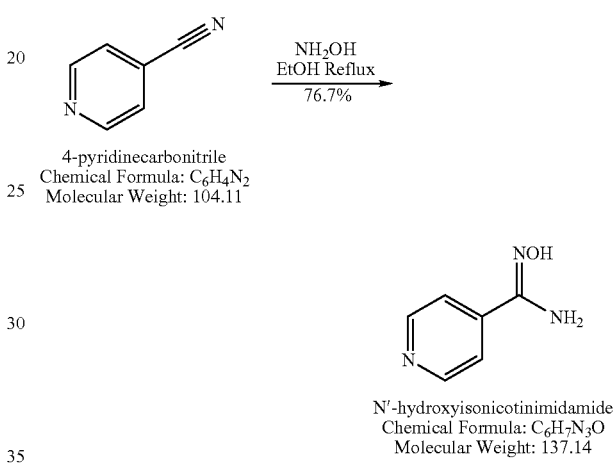

4-pyridinecarbonitrile
Chemical Formula: $C_6H_4N_2$
Molecular Weight: 104.11

N'-hydroxyisonicotinimidamide
Chemical Formula: $C_6H_7N_3O$
Molecular Weight: 137.14

Pyridinecarbonitrile (1 g, 9.6 mmol) and hydroxylamine (50% in water, 0.88 cm$^3$, 14.4 mmol, 1.5 eq) in EtOH (10 cm$^3$) were stirred under reflux for 18 hours, after which the volatiles were removed under reduced pressure and the residue was recrystallised from EtOH to give the product N'-hydroxyisonicotinimidamide (1.01 g, 76.7%) as a solid, mp 203-205° C.

Cyanoethylation of Sorbitol to produce multi substituted-(2-amidoximo)ethoxy)hexane (Sorbitol:Acrylonitrile=1:1 DS1)

A one-liter three-necked round-bottomed flask was equipped with a stirrer, reflux condenser, thermometer, and addition funnel under nitrogen. Lithium hydroxide monohydrate (1.0 g, 23.8 mmol, 0.036 eq) dissolved in water (18.5 ml) was added to the flask, followed by the addition of sorbitol (120 g, 659 mmol) in one portion, and then water (100 ml). The solution was warmed to 42° C. in a water bath and treated with acrylonitrile (43.6 ml, 659 mmol), drop-wise via the addition funnel for a period of 2 hr, while maintaining the temperature at 42° C. After the addition was complete, the solution was warmed to 50-55° C. for 4 hr and then allowed to cool to room temperature. The reaction was neutralized by addition of acetic acid (2.5 ml) and allowed to stand overnight at room temperature. The solution was evaporated under reduced pressure to give the product as a clear, viscous oil (155.4 g).

Tetramethylammonium hydroxide can be used to substitute lithium hydroxide.

Elemental analysis: Found, 40.95% C; 3.85% N. The IR spectrum showed a nitrile peak at 2255 cm$^{-1}$ indicative of the nitrile group.

Cyanoethylation of Sorbitol to produce multi substituted-(2-amidoximo)ethoxy)hexane
(Sorbitol:Acrylonitrile=1:3 DS3)

A one liter three-neck round-bottomed flask was equipped with a mechanical stirrer, reflux condenser, thermometer, and 100 ml addition funnel under nitrogen. Lithium hydroxide (1.0 g, 23.8 mmol, 0.036 eq) dissolved in water (18.5 ml) was added to the flask, followed by the addition of the first portion of sorbitol (60.0 g, 329 mmol) and then water (50 ml). The solution was warmed to 42° C. in a water bath and treated with acrylonitrile (42 ml, 633 mmol, 0.96 eq) drop-wise via the addition funnel for a period of 1 hr while maintaining the temperature at 42° C. The second portion of sorbitol (60 g, 329 mmol) and water (50 ml) were added to the flask. The second portion of the acrylonitrile (89.1 ml, 1.344 mol), was added in a drop-wise fashion over a period of 1 hr. After the addition was complete, the solution was warmed to 50-55° C. for 4 hr and then allowed to cool to room temperature. The reaction was neutralized by addition of acetic acid (2.5 ml) and allowed to stand overnight at room temperature. The solution was evaporated under reduced pressure to give the product as a clear, viscous oil (228.23 g).

Tetramethylammonium hydroxide can be used to substitute lithium hydroxide.

Elemental analysis: Found: 49.16% C, 10.76% N. The IR spectrum showed a nitrile peak at 2252 cm$^{-1}$ indicative of the nitrile group.

Cyanoethylation of Sorbitol to produce multi substituted-(2-amidoximo)ethoxy)hexane
(Sorbitol:Acrylonitrile=1:6 DS6)

A 1000 ml 3-necked round-bottomed flask equipped with an mechanical stirrer, reflux condenser, nitrogen purge, dropping funnel, and thermometer was charged with water (18.5 ml) and lithium hydroxide monohydrate (1.75 g) and the first portion of sorbitol (44.8 g). The solution was heated to 42° C. with a water bath with stirring and the second portion of sorbitol (39.2 g) was added directly to the reaction flask. The first portion of acrylonitrile (100 ml) was then added to the reaction drop-wise via a 500 ml addition funnel over a period of 2 hr. The reaction was slightly exothermic, raising the temperature to 51° C. The final portion of sorbitol (32 g) was added for a total of 0.638 moles followed by a final portion of acrylonitrile (190 ml) over 2.5 hr keeping the reaction temperature below 60° C. (A total of 4.41 moles of acrylonitrile was used.) The reaction solution was then heated to 50-55° C. for 4 hr. The solution was then allowed to cool to room temperature and the reaction was neutralized by addition of acetic acid (2.5 ml). Removal of the solvent under reduced pressure gave the product as a clear, viscous oil (324 g).

tetramethylammonium hydroxide can be used to substitute lithium hydroxide.

The IR spectrum showed a nitrile peak at 2251 cm$^{-1}$, indicative of the nitrile group.

Preparation of
(1,2,3,4,5,6-(hexa-(2-amidoximo)ethoxy)hexane
Hexitol

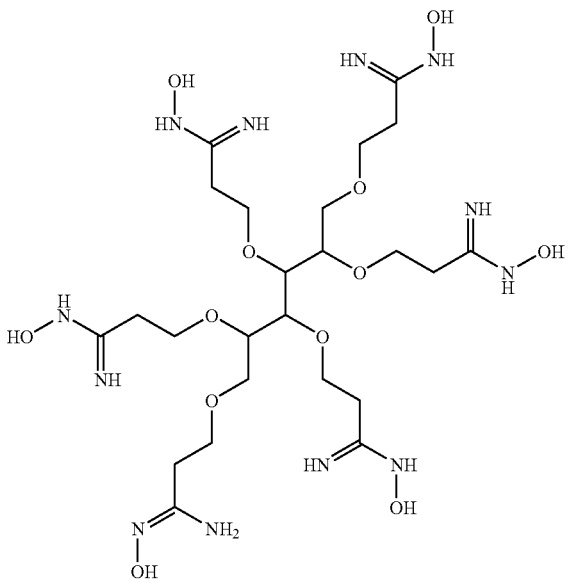

A 1000 mL three-necked round-bottomed flask was equipped with a mechanical stirrer, condenser, and addition funnel under nitrogen. DS6 (14.77 g, 29.5 mmol) and water (200 mL) were added to the flask and stirred. In a separate 500 mL Erlenmeyer flask, hydroxylamine hydrochloride (11.47 g, 165 mmol, 5.6 eq) was dissolved in water (178 ml) and then treated with ammonium hydroxide (22.1 ml of 28% solution, 177 mmol, 6.0 eq) for a total volume of 200 mL. The hydroxylamine solution was then added in one portion directly to the mixture in the round-bottomed flask at room temperature. The stirred mixture was heated at 80° C. for 2 hr, pH=8-9, and then allowed to cool to room temperature.

Hydroxylamine freebase (50%) aqueous solution can be used to replace the solution by blending hydroxylamine chloride and ammonium hydroxide.

The IR spectrum indicated loss of most of the nitrile peak at 2250 cm$^{-1}$ and the appearance of a new peak at 1660 cm$^{-1}$, indicative of the amidoxime or hydroxamic acid.

Preparation and analysis of polyamidoxime is essentially that described in U.S. Pat. No. 3,345,344, which is incorporated herein by reference in its entirety. In that process 80 parts by weight of polyacrylonitrile of molecular weight of about 130,000 in the form of very fine powder (–300 mesh) was suspended in a solution of 300 parts by weight of hydroxylammonium sulfate, 140 parts by weight of sodium hydroxide and 2500 parts by weight of deionized water. The pH of the solution was 7.6. The mixture was heated to 90° C. and held at that temperature for 12 hours, all of the time under vigorous agitation. It was cooled to 35° C. and the product filtered off and washed repeatedly with deionized water. The resin remained insoluble throughout the reaction, but was softened somewhat by the chemical and heat. This caused it to grow from a very fine powder to small clusters of 10 to 20 mesh. The product weighed 130 grams. The yield is always considerably more than theoretical because of fumly occluded salt. The product is essentially a poly-amidoxime having the following reoccurring unit

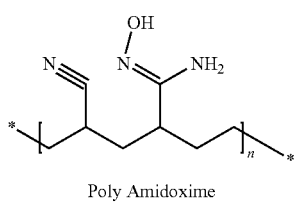

Poly Amidoxime

The following depicts metal complexing using amidoxime compounds.

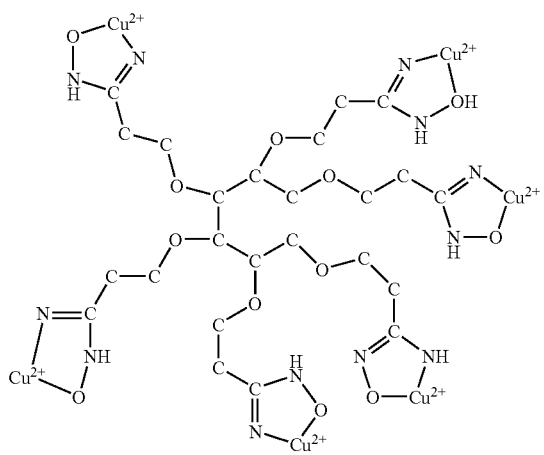

Amidoxime chelating agents can substitute for organic carboxylic acids, organic carboxylic ammonium salt or an amine carboxylates being used in cleaning formulations and processes.

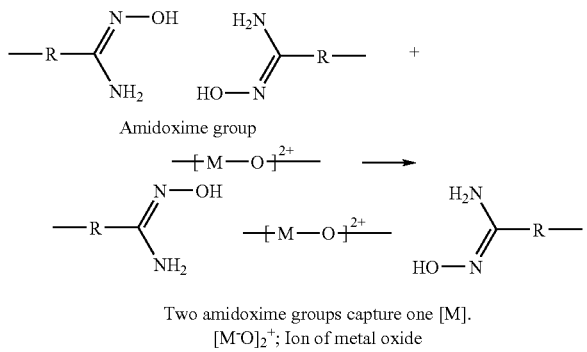

Two amidoxime groups capture one [M].
[M⁻O]₂⁺; Ion of metal oxide

With reference to the present invention, as hereinafter more fully described, the claimed compounds can be applied to applications in the state of the art forming a background to the present invention includes the following U.S. patents, the disclosures of which hereby are incorporated herein, in their respective entireties.

EXAMPLES OF EMBODIMENTS OF THE PRESENT INVENTION

Note that all patents cited in the examples are incorporated herein by reference regarding the proportions, amounts and support for the compositions and methods described in the examples.

Example 1

The patents referred to in the examples herein and elsewhere in the description and summary are each hereby incorporated by reference in their entirety. One embodiment involves a method for removing organometallic and organosilicate residues remaining after a dry etch process from semiconductor substrates. The substrate is exposed to a conditioning solution of phosphoric acid, hydrofluoric acid, and a carboxylic acid, such as acetic acid, which removes the remaining dry etch residues while minimizing removal of material from desired substrate features. The approximate proportions of the conditioning solution are typically 80 to 95 percent by weight amidoxime compound and acetic acid, 1 to 15 percent by weight phosphoric acid, and 0.01 to 5.0 percent by weight hydrofluoric acid. See, U.S. Pat. No. 7,261,835.

Another embodiment includes from about 0.5% to about 24% by weight of complexing agents with amidoxime functional groups with an method having a pH between about 1.5 and about 6 and comprising: at least about 75% by weight of a mixture of water and an organic solvent; from about 0.5% to about 10% by weight phosphoric acid; optionally one or more other acid compounds; optionally one or more fluoride-containing compounds; and at least one alkaline compound selected from the group consisting of: a trialkylammonium hydroxide and/or a tetraalkylammonium hydroxide; a hydroxylamine derivative; and one or more alkanolamines.

Example 2

Table 4 lists other embodiments of the present invention where the formulations additionally include from about 0.5% to about 24% by weight of compounds with amidoxime functional groups in methods. Such formulations may contain additional components consistent with this application such as surfactants, alkaline components, and organic solvents.

TABLE 4

| Examples of Useful Formulations with Chelating Agents for Use with Amidoxime Compounds of the Present Invention | | |
|---|---|---|
| H₃PO₄ (wt %) | Other Acid | wt % |
| 2 | methanesulfonic | 1.47 |
| 2 | pyrophosphoric acid (PPA) | 3.0 |
| 2 | Fluorosicilic | 0.24 |
| 2 | Oxalic | 2.0 |
| 4 | Oxalic | 2.0 |
| 6 | Glycolic | 1.0 |
| 3 | Oxalic | 2.0 |
| 3 | Lactic | 2.0 |
| 4 | Lactic | 2.0 |
| 3 | Citric | 2.0 |
| 4 | Citric | 2.0 |
| 3 | PPA | 0.5 |
| 3 | Glycolic | 2.0 |
| 6 | Glycolic | 2.0 |
| 3 | PPA | 2.0 |
| 3 | PPA | 4.0 |

Example 3

Another embodiment is a composition for cleaning or etching a semiconductor substrate and method for using the same. The compositions include from about 0.01% to about 50%, more preferably about 0.5% to about 24% by weight of compounds with amidoxime functional groups may include a fluorine-containing compound as an active agent such as a quaternary ammonium fluoride, a quaternary phosphonium fluoride, sulfonium fluoride, more generally an -onium fluoride or "multi" quaternary-onium fluoride that includes two or more quaternary-onium groups linked together by one or more carbon-containing groups. The composition may further include a pH adjusting acid such as a mineral acid, carboxylic acid, dicarboxylic acid, sulfonic acid, or combination thereof to give a pH of about 2 to 9. The composition can be anhydrous and may further include an organic solvent such as an alcohol, amide, ether, or combination thereof. The compositions are useful for obtaining improved etch rate, etch selectivity, etch uniformity and cleaning criteria on a variety of substrates.

Example 4

In another embodiment, the present invention can be used with methods and compositions for removing silicon-containing sacrificial layers from Micro Electro Mechanical System (MEMS) and other semiconductor substrates having such sacrificial layers is described. The etching compositions include a supercritical fluid (SCF), an etchant species, a co-solvent, chelating agent containing at least one amidoxime group, and optionally a surfactant. Such etching compositions overcome the intrinsic deficiency of SCFs as cleaning reagents, viz., the non-polar character of SCFs and their associated inability to solubilize polar species that must be removed from the semiconductor substrate. The resultant etched substrates experience lower incidents of stiction relative to substrates etched using conventional wet etching techniques. See U.S. Pat. No. 7,160,815.

Example 5

In another embodiment, the invention uses a supercritical fluid (SFC)-based composition, comprising at least one co-solvent, at least one etchant species, and optionally at least one surfactant, wherein said at least one etchant comprises an alkyl phosphonium difluoride and wherein said SFC-based composition is useful for etching sacrificial silicon-containing layers, said compositions containing from about 0.01% to about 50% by weight, preferably about 0.5% to about 24%, of compounds with one or more chelating group, at least one being an amidoxime functional groups. In another embodiment the surfactant comprises at least one nonionic or anionic surfactant, or a combination thereof, and the surfactant is preferably a nonionic surfactant selected from the group consisting of fluoroalkyl surfactants, polyethylene glycols, polypropylene glycols, polyethylene ethers, polypropylene glycol ethers, carboxylic acid salts, dodecylbenzenesulfonic acid; dodecylbeuzenesulfonic salts, polyacrylate polymers, dinonylphenyl polyoxyethylene, silicone polymers, modified silicone polymers, acetylenic diols, modified acetylenic diols, alkylammonium salts, modified alkylammonium salts, and combinations comprising at least one of the foregoing.

Example 6

Another embodiment of the present invention is a composition for use in semiconductor processing wherein the composition comprises water, phosphoric acid, and an organic acid; wherein the organic acid is ascorbic acid or is an organic acid having two or more carboxylic acid groups (e.g., citric acid). The said compositions containing from about 0.01% to about 50% by weight, preferably about 0.5% to about 24%, of compounds with one or more chelating groups/agents, at least one being an amidoxime functional group/compound and such compounds can be in addition to, part of, or in substitution of the organic acid. The water can be present in about 40 wt. % to about 85 wt. % of the composition, the phosphoric acid can be present in about 0.01 wt. % to about 10 wt. % of the composition, and the organic acid can be present in about 10 wt. % to about 60 wt. % of the composition. The composition can be used for cleaning various surfaces, such as, for example, patterned metal layers and vias by exposing the surfaces to the composition. See U.S. Pat. No. 7,135,444.

Example 7

The present invention can also be used with a polishing liquid composition for polishing a surface, with one embodiment comprising an insulating layer and a metal layer, the polishing liquid composition comprising a compound having six or more carbon atoms and a structure in which each of two or more adjacent carbon atoms has a hydroxyl group in a molecule, and water, wherein the compound having a structure in which each of two or more adjacent carbon atoms has a hydroxyl group in a molecule is represented by the formula (I): $R^1$—X—$(CH_2)_q$—$[CH(OH)]_n$—$CH_2OH$ (I) wherein $R^1$ is a hydrocarbon group having 1 to 12 carbon atoms; X is a group represented by $(CH_2)_m$, wherein m is 1, oxygen atom, sulfur atom, COO group, OCO group, a group represented by $NR^2$ or $O(R^2O)P(O)O$, wherein $R^2$ is hydrogen atom or a hydrocarbon group having 1 to 24 carbon atoms; q is 0 or 1; and n is an integer of 1 to 4, further comprising from about 0.01% to about 50% by weight, preferably about 0.5% to about 24%, of compounds with one or more chelating groups/agents, at least one being an amidoxime functional group/compound and such compounds can be in addition to, part of, or in substitution of an organic acid. Some embodiments includes an abrasive. See U.S. Pat. No. 7,118,685.

Example 8

Another embodiment of the present invention is a composition for use in semiconductor processing wherein the composition comprises water, phosphoric acid, and an organic acid; wherein the organic acid is ascorbic acid or is an organic acid having two or more carboxylic acid groups (e.g., citric acid), further comprising from about 0.01% to about 50% by weight, preferably about 0.5% to about 24%, of compounds with one or more chelating groups/agents, at least one being an amidoxime functional group/compound and such compounds can be in addition to, part of, or in substitution of the organic acid. The water can be present in about 40 wt. % to about 85 wt. % of the composition, the phosphoric acid can be present in about 0.01 wt. % to about 10 wt. % of the composition, and the organic acid can be present in about 10 wt. % to about 60 wt. % of the composition. The composition can be used for cleaning various surfaces, such as, for example, patterned metal layers and vias by exposing the surfaces to the composition. See U.S. Pat. Nos. 7,087,561, 7,067,466, and 7,029,588.

Example 9

In another embodiment of the present invention, from about 0.01% to about 50% by weight, preferably about 0.5% to about 24%, of compounds with one or more chelating groups/agents, at least one being an amidoxime functional group/compound can be used with an oxidizing solution and process for the in situ oxidation of contaminants, including hydrocarbon, organic, bacterial, phosphonic acid, and other contaminants, the contaminants being found in various surfaces and media, including soil, sludge, and water. In a preferred embodiment, the solution further includes a peroxygen compound, such as hydrogen peroxide, in solution with a pre-mixed solution of a carboxylic acid and a halogen salt, such as glycolic acid and sodium bromide, respectively.

Example 10

In another embodiment of the present invention from about 0.01% to about 5% by weight, preferably about 0.01 to about 0.1% of compounds with one or more chelating groups/agents, at least one being an amidoxime functional group/compound can be used with a chemical mechanical polishing slurry that is free of heteropolyacid and consisting essentially of about 3 to about 5 percent abrasive, about 3 to about 5 percent hydrogen peroxide, about 0.05 to about 0.1 percent citric acid, about 0.05 to about 0.5 percent iminodiacetic acid, about 0.005 to about 0.02 percent ammonia, and about 85-90 percent water, wherein the abrasive consists essentially of polymethylmethacrylate. See U.S. Pat. No. 7,029,373.

Example 11

In another embodiment, the present invention includes a non-corrosive cleaning composition for removing residues from a substrate comprising: (a) water; (b) at least one hydroxyl ammonium compound; (c) at least one basic compound, preferably selected from the group consisting of amines and quaternary ammonium hydroxides; (d) at least one organic carboxylic acid; (e) from about 0.01% to about 50% by weight, preferably about 0.5% to about 24%, of compounds with one or more chelating groups/agents, at least one being an amidoxime functional group/compound and such compounds can be in addition to, part of, or in substitution of the organic acid; and (f) optionally, a polyhydric compound. The pH of the composition is preferably between about 2 to about 6. See U.S. Pat. No. 7,001,874, which is incorporated herein by reference.

Example 12

The present invention may also be used with a cleaning solution where the cleaning solution also contains one of polyvalent carboxylic acid and its salt, such as where the polyvalent carboxylic acid contains at least one selected from the group consisting of oxalic acid, citric acid, malic acid, maleic acid, succinic acid, tartaric acid, and malonic acid, wherein the cleaning solution contains from about 0.01% to about 50% by weight, preferably about 0.5% to about 24%, of compounds with one or more chelating groups/agents, at least one being an amidoxime functional group/compound and such compounds can be in addition to, part of, or in substitution of the organic acid, which can be used in addition to, as part of, or in substitution of the polyvalent carboxylic acid. In another embodiment, the cleaning solution further contains a polyamino carboxylic acid and its salt. See U.S. Pat. No. 6,998,352.

Example 13

A further embodiment of the present invention is to a method of chemically-mechanically polishing a substrate, which method comprises: (i) contacting a substrate comprising at least one layer of ruthenium and at least one layer of copper with a polishing pad and a chemical-mechanical polishing composition comprising: (a) an abrasive consisting of α-alumina treated with a negatively-charged polymer or copolymer, (b) hydrogen peroxide, (c) from about 0.01% to about 50% by weight, preferably about 0.5% to about 24% of compounds with one or more chelating groups/agents, at least one being an amidoxime functional group/compound; (d) at least one heterocyclic compound, wherein the at least one heterocyclic compound comprises at least one nitrogen atom, (e) a phosphonic acid, and (f) water, (ii) moving the polishing pad relative to the substrate, and (iii) abrading at least a portion of the substrate to polish the substrate, wherein the pH of the water and any components dissolved or suspended therein is about 6 to about 12, wherein the at least one layer of ruthenium and at least one layer of copper are in electrical contact and are in contact with the polishing composition, wherein the difference between the open circuit potential of copper and the open circuit potential of ruthenium in the water and any components dissolved or suspended therein is about 50 mV or less, and wherein a selectivity for polishing copper as compared to ruthenium is about 2 or less.

Example 14

Another embodiment of the present invention is to a semiconductor wafer cleaning formulation, including 1-21% wt. fluoride source, 20-55% wt. organic amine(s), 0.5-40% wt. nitrogenous component, e.g., a nitrogen-containing carboxylic acid or an imine, 23-50% wt. water, and 0-21% wt. of compounds with one or more chelating groups/agents, at least one being an amidoxime functional group/compound. The formulations are useful to remove residue from wafers following a resist plasma ashing step, such as inorganic residue from semiconductor wafers containing delicate copper interconnecting structures. See U.S. Pat. No. 6,967,169.

Example 15

The present invention also includes a method for chemical mechanical polishing copper, barrier material and dielectric material, the method comprises the steps of: a) providing a first chemical mechanical polishing slurry comprising (i) 1-10 wt. % silica particles, (ii) 1-12 wt. % oxidizing agent, and (iii) 0-2 wt. % corrosion inhibitor and cleaning agent, wherein said first slurry has a higher removal rate on copper relative to a lower removal rate on said barrier material; b) chemical mechanical polishing a semiconductor wafer surface with said first slurry; c) providing a second chemical mechanical polishing slurry comprising (i) 1-10 wt. % silica particles, (ii) 0.1-1.5 wt. % oxidizing agent, and (iii) 0.1-2 wt. % carboxylic acid, having a pH in a range from about 2 to about 5, wherein the amount of (ii) is not more than the amount of (iii), and wherein said second slurry has a higher removal rate on said barrier material relative to a lower removal rate on said dielectric material and an intermediate removal rate on copper; and d) chemical mechanical polishing said semiconductor wafer surface with said second slurry, wherein either or both slurries contains from about 0.01% to about 50% by weight, preferably about 0.5% to about 24%, of compounds with one or more chelating groups/agents, at least one being an amidoxime functional group/compound. See U.S. Pat. No. 6,936,542.

Example 16

The present invention further includes a method for cleaning a surface of a substrate, which comprises at least the following steps (1) and (2), wherein the step (2) is carried out after carrying out the step (1): Step (1): A cleaning step of cleaning the surface of the substrate with an alkaline cleaning agent containing a complexing agent, and Step (2): A cleaning step employing a cleaning agent having a hydrofluoric acid content C (wt %) of from 0.03 to 3 wt %, the complexing agent is from about 0.01% to about 50% by weight, preferably about 0.5% to about 24%, of compounds with one or more chelating groups/agents, at least one being an amidoxime functional group/compound. See U.S. Pat. No. 6,896,744.

Example 17

Another embodiment of the present invention includes a cleaning gas that is obtained by vaporizing a carboxylic acid and/or a compound with one or more chelating groups/agents, at least one being an amidoxime functional group/compound which is supplied into a treatment chamber having an insulating substance adhering to the inside thereof, and the inside of the treatment chamber is evacuated. When the cleaning gas supplied into the treatment chamber comes in contact with the insulating substance adhering to an inside wall and a susceptor in the treatment chamber, the insulating substance is turned into a complex, so that the complex of the insulating substance is formed. The complex of the insulating substance is easily vaporized due to its high vapor pressure. The vaporized complex of the insulating substance is discharged out of the treatment chamber by the evacuation. See U.S. Pat. No. 6,893,964.

Example 18

The present invention includes a method for rinsing metallized semiconductor substrates following treatment of the substrates with an etch residue removal chemistry, the method comprising the steps of: providing at least one metallized semiconductor substrate, the substrate having etch residue removal chemistry thereon, wherein the etch residue removal chemistry includes N-methylpyrrolidinone; rinsing the etch residue removal chemistry from the substrate and minimizing metal corrosion of the substrate by rinsing the substrate with an aqueous medium comprising an anti-corrosive agent including an organic acid selected from the group consisting of mono- and polycarboxylic acids in an amount effective to minimize metal corrosion; removing the aqueous medium from the process vessel; and introducing a drying vapor into the process vessel which the substrate remains substantially stationary within the process vessel, wherein the remover includes from about 0.01% to about 50% by weight, preferably about 0.5% to about 24%, of compounds with one or more chelating groups/agents, at least one being an amidoxime functional group/compound, which can be in addition to, part of, or in substitution of the organic acid. The composition may further include acetic acid. See U.S. Pat. No. 6,878,213.

Example 19

The present invention may also be used with the compositions of U.S. Pat. No. 6,849,200 wherein the iminodiacetic acid component is supplemented by or substituted with compounds with one or more chelating groups/agents, at least one being an amidoxime functional group/compound.

Example 20

The present invention also includes a method of cleaning a surface of a copper-containing material by exposing the surface to an acidic mixture comprising NO3-, F—, and one or more compounds with one or more chelating groups/agents, at least one being an amidoxime functional group/compound.

The mixture may also include one or more organic acids to remove at least some of the particles. See U.S. Pat. No. 6,835,668.

Example 21

The present invention also includes a cleaning composition comprising at least one of fluoride salts and hydrogendifluoride salts; an organic solvent having a hetero atom or atoms; optionally one or more surfactants in an amount of from 0.0001 to 10.0%; water and from about 0.01% to about 50% by weight, preferably about 0.5% to about 24%, of compounds with one or more chelating groups/agents, at least one being an amidoxime functional group/compound. See U.S. Pat. No. 6,831,048.

Example 22

The present invention further includes a glycol-free composition for cleaning a semiconductor substrate, the composition consisting essentially of: a. an acidic buffer solution having an acid selected from a carboxylic acid and a polybasic acid and an ammonium salt of the acid in a molar ratio of acid to ammonium salt ranging from 10:1 to 1:10 and wherein the acidic buffer solution is present in an amount sufficient to maintain a pH of the composition from about 3 to about 6, b. from 30% by weight to 90% by weight of an organic polar solvent that is miscible in all proportion in water, c. from 0.1% by weight to 20% by weight of fluoride, d. from 0.5% by weight to 40% by weight of water, and e. optionally up to 15% by weight of a corrosion inhibitor. The composition further contains from about 0.01% to about 50% by weight, preferably about 0.5% to about 24%, of compounds with one or more chelating groups/agents, at least one being an amidoxime functional group/compound or such compounds may be used in place of the corrosion inhibitor. See U.S. Pat. No. 6,828,289.

Example 23

The present invention further includes compositions containing AEEA and or AEEA derivatives which can be present in an amount ranging from about 1% to about 99%, though in most instances the amount ranges from about 10% to about 85%. For each AEEA range given for various compositions described herein, there is a "high-AEEA" embodiment where the amount of AEEA is in the upper half of the range, and a "low-AEEA" embodiment where AEEA is present in an amount bounded by the lower half of the range. Generally, the higher AEEA embodiments exhibit lower etch rates than the low AEEA embodiments for selected substrates, the embodiments further include from about 0.01% to about 50% by weight, preferably about 0.5% to about 24%, of compounds with one or more chelating groups/agents, at least one being an amidoxime functional group/compound. In most embodiments, these compositions also include other compounds, particularly polar organic solvents, water, alkanolamines, hydroxylamines, additional chelating agents, and/or corrosion inhibitors. See U.S. Pat. No. 6,825,156.

Example 24

A composition for the stripping of photoresist and the cleaning of residues from substrates, and for silicon oxide etch, comprising from about 0.01 percent by weight to about 10 percent by weight of one or more fluoride compounds, from about 10 percent by weight to about 95% by weight of a sulfoxide or sulfone solvent, and from about 20 percent by weight to about 50 percent by weight water, further including from about 0.01% to about 50% by weight, preferably about 0.5% to about 24%, of compounds with one or more chelating groups/agents, at least one being an amidoxime functional group/compound. The composition may contain corrosion inhibitors, chelating agents, co-solvents, basic amine compounds, surfactants, acids and bases. See U.S. Pat. No. 6,777, 380.

Example 25

A polishing composition for polishing a semiconductor substrate has a pH of under 5.0 and comprises (a) a carboxylic acid polymer comprising polymerized unsaturated carboxylic acid monomers having a number average molecular weight of about 20,000 to 1,500,000 or blends of high and low number average molecular weight polymers of polymerized unsaturated carboxylic acid monomers, (b) 1 to 15% by weight of an oxidizing agent, (c) up to 3.0% by weight of abrasive particles, (d) 50-5,000 ppm (parts per million) of an inhibitor, (e) up to 3.0% by weight of a complexing agent, such as, malic acid, and (f) 0.1 to 5.0% by weight of a surfactant, from about 0.01% to about 50% by weight, preferably about 0.5% to about 24%, of compounds with one or more chelating groups/agents, at least one being an amidoxime functional group/compound. See U.S. Pat. No. 6,679,928.

Example 26

Particulate and metal ion contamination is removed from a surface, such as a semiconductor wafer containing copper damascene or dual damascene features, employing aqueous composition comprising a fluoride containing compound; a dicarboxylic acid and/or salt thereof; and a hydroxycarboxylic acid and/or salt thereof, the composition contains from about 0.01% to about 50% by weight, preferably about 0.5% to about 24%, of compounds with one or more chelating groups/agents, at least one being an amidoxime functional group/compound. See U.S. Pat. No. 6,673,757.

Example 27

A semiconductor wafer cleaning formulation, including 2-98% wt. organic amine, 0-50% wt. water, 0.1-60% wt. 1,3-dicarbonyl compound chelating agent, 0-25% wt. of additional different chelating agent(s), 0.5-40% wt. nitrogen-containing carboxylic acid or an imine, and 2-98% wt polar organic solvent. The formulations are useful to remove residue from wafers following a resist plasma ashing step, such as inorganic residue from semiconductor wafers containing delicate copper interconnecting structures.

Example 28

Another embodiment of the present invention relates to a method useful in removing etch residue from etcher equipment parts. The compositions used are aqueous, acidic compositions containing fluoride and polar, organic solvents. The compositions are free of glycols and hydroxyl amine and have a low surface tension and viscosity and further include from about 0.01% to about 50% by weight, preferably about 0.5% to about 24%, of compounds with one or more chelating groups/agents, at least one being an amidoxime functional group/compound. See U.S. Pat. No. 6,656,894.

Example 29

The invention includes a method of cleaning a surface of a copper-containing material by exposing the surface to an acidic mixture comprising $NO_3^-$, $F^-$ and from about 0.01% to about 50% by weight, preferably about 0.5% to about 24%, of compounds with one or more chelating groups/agents, at least one being an amidoxime functional group/compound and/or one or more organic acid anions having carboxylate groups. The invention also includes an improved semiconductor processing method of forming an opening to a copper-containing material. A mass is formed over a copper-containing material within an opening in a substrate. The mass contains at least one of an oxide barrier material and a dielectric material. A second opening is etched through the mass into the copper-containing material to form a base surface of the copper-containing material that is at least partially covered by particles comprising at least one of a copper oxide, a silicon oxide or a copper fluoride. The base surface is cleaned with a solution comprising nitric acid, hydrofluoric acid and one or more organic acids to remove at least some of the particles.

One or more organic acids may be used in the composition of this example. An exemplary composition includes an acetic acid solution (99.8%, by weight in water), an HF solution (49%, by weight in water), an $HNO_3$ solution (70.4%, by weight in water), and $H_2O$ the resulting cleaning mixture being: from about 3% to about 20% compounds with one or more chelating groups/agents, at least one being an amidoxime functional group/compound, by weight; from about 0.1% to about 2.0% $HNO_3$ by weight; and from about 0.05% to about 3.0% HF, by weight. See U.S. Pat. No. 6,589,882.

Example 30

Another embodiment of the present invention is a composition for selective etching of oxides over a metal. The composition contains water, hydroxylammonium salt, one or more compounds with one or more chelating groups/agents, at least one being an amidoxime functional group/compound, a fluorine containing compound, and optionally, a base. The pH of the composition is about 2 to 6. See U.S. Pat. No. 6,589,439.

Example 31

Another embodiment of the present invention is an etching treatment comprising a combination including hydrofluoric acid of 15 percent by weight to 19 percent by weight, one or more compounds with one or more chelating groups/agents, at least one being an amidoxime functional group/compound of 0.5 percent by weight to 24 percent by weight and ammonium fluoride of 12 percent by weight to 42 percent by weight, said combination having a hydrogen ion concentration of $10^{-6}$ mol/L to $10^{-1.8}$, further comprising a surfactant of 0.001 percent by weight to 1 percent by weight. See U.S. Pat. No. 6,585,910.

Example 32

Another embodiment of the present invention includes a semiconductor wafer cleaning formulation, including 2-98% wt. organic amine, 0-50% wt. water, 0.1-60% wt. one or more compounds with one or more chelating groups/agents, at least one being an amidoxime functional group/compound, 0-25% wt. of additional different chelating agent(s), 0.1-40% wt. nitrogen-containing carboxylic acid or an imine, optionally 1,3-dicarbonyl compound chelating agent, and 2-98% wt polar organic solvent. The formulations are useful to remove residue from wafers following a resist plasma ashing step, such as inorganic residue from semiconductor wafers containing delicate copper interconnecting structures. See U.S. Pat. No. 6,566,315.

Example 33

An alternative embodiment of the present invention is a method for removing organometallic and organosilicate residues remaining after a dry etch process from semiconductor substrates. The substrate is exposed to a conditioning solution of a fluorine source, a non-aqueous solvent, a complementary acid, and a surface passivation agent. The fluorine source is typically hydrofluoric acid. The non-aqueous solvent is typically a polyhydric alcohol such as propylene glycol. The complementary acid is typically either phosphoric acid or hydrochloric acid. The surface passivation agent is one or more compounds with one or more chelating groups/agents, at least one being an amidoxime functional group/compound, and may optionally include a carboxylic acid such as citric acid. Exposing the substrate to the conditioning solution removes the remaining dry etch residues while minimizing removal of material from desired substrate features. See U.S. Pat. No. 6,562,726.

Example 34

Another embodiment of the present invention is a stripping and cleaning composition for the removal of residue from metal and dielectric surfaces in the manufacture of semiconductors and microcircuits. The composition is an aqueous system including organic polar solvents including corrosive inhibitor component from one or more compounds with one or more chelating groups/agents, at least one being an amidoxime functional group/compound and optionally a select group of aromatic carboxylic acids used in effective inhibiting amounts. A method in accordance with this invention for the removal of residues from metal and dielectric surfaces comprises the steps of contacting the metal or dielectric surface with the above inhibited compositions for a time sufficient to remove the residues. See U.S. Pat. No. 6,558,879.

Example 35

Another embodiment of the present invention is a homogeneous non-aqueous composition containing a fluorinated solvent, ozone, one or more compounds with one or more chelating groups/agents, at least one being an amidoxime functional group/compound, and optionally a co-solvent and the use of these compositions for cleaning and oxidizing substrates is described. See U.S. Pat. No. 6,537,380.

Example 36

The present invention also includes a chemical mechanical polishing slurry and method for using the slurry for polishing copper, barrier material and dielectric material that comprises a first and second slurry. The first slurry has a high removal rate on copper and a low removal rate on barrier material. The second slurry has a high removal rate on barrier material and a low removal rate on copper and dielectric material. The first and second slurries at least comprise silica particles, an oxidizing agent, one or more compounds with one or more chelating groups/agents, at least one being an amidoxime functional group/compound, optionally a corrosion inhibitor, and a cleaning agent. See, U.S. Pat. No. 6,527,819.

Example 37

Another embodiment of the present invention also includes a method for removing organometallic and organosilicate residues remaining after a dry etch process from semiconductor substrates. The substrate is exposed to a conditioning solution of phosphoric acid, hydrofluoric acid, and one or more compounds with one or more chelating groups/agents, at least one being an amidoxime functional group/compound, and optionally a carboxylic acid, such as acetic acid, which removes the remaining dry etch residues while minimizing removal of material from desired substrate features. The approximate proportions of the conditioning solution are typically 80 to 95 percent by weight one or more compounds with one or more chelating groups/agents, at least one being an amidoxime functional group/compound and carboxylic acid, 1 to 15 percent by weight phosphoric acid, and 0.01 to 5.0 percent by weight hydrofluoric acid. U.S. Pat. No. 6,517,738.

Example 38

Another embodiment of the present invention is a composition for use in semiconductor processing wherein the composition comprises water, phosphoric acid, and one or more compounds with one or more chelating groups/agents, at least one being an amidoxime functional group/compound, and optionally an organic acid; wherein the organic acid is ascorbic acid or is an organic acid having two or more carboxylic acid groups (e.g., citric acid). The water can be present in about 40 wt. % to about 85 wt. % of the composition, the phosphoric acid can be present in about 0.01 wt. % to about 10 wt. % of the composition, and the one or more compounds with one or more chelating groups/agents, at least one being an amidoxime functional group/compound and organic acid can be present in about 10 wt. % to about 60 wt. % of the composition. The composition can be used for cleaning various surfaces, such as, for example, patterned metal layers and vias by exposing the surfaces to the composition. See U.S. Pat. No. 6,486,108.

Example 39

Another embodiment of the present invention is a method for removing organometallic and organosilicate residues remaining after a dry etch process from semiconductor substrates. The substrate is exposed to a conditioning solution of phosphoric acid, hydrofluoric acid, and one or more compounds with one or more chelating groups/agents, at least one being an amidoxime functional group/compound, and optionally a carboxylic acid, such as acetic acid, which removes the remaining dry etch residues while minimizing removal of material from desired substrate features. The approximate proportions of the conditioning solution are typically 80 to 95 percent by weight one or more compounds with one or more chelating groups/agents, at least one being an amidoxime functional group/compound and acetic acid, 1 to 15 percent by weight phosphoric acid, and 0.01 to 5.0 percent by weight hydrofluoric acid. See U.S. Pat. No. 6,453,914.

Example 40

Another example of the present invention is show in cleaning a substrate which has a metal material and a semiconductor material both exposed at the surface and which has been subjected to a chemical mechanical polishing treatment, the substrate is first cleaned with a first cleaning solution containing ammonia water, etc. and then with a second cleaning solution containing (a) a first complexing agent capable of easily forming a complex with the oxide of said metal material, etc. and (b) an anionic or cationic surfactant. See U.S. Pat. No. 6,444,583.

Example 41

The present invention is also exemplified by a cleaning agent for semiconductor parts, which can decrease a load on the environment and has a high cleaning effect on CMP (chemical mechanical polishing) abrasive particles, metallic impurities and other impurities left on the semiconductor parts such as semiconductor substrates after the CMP, comprising a (co)polymer having one or more compounds with one or more chelating groups/agents, at least one being an amidoxime functional group/compound, and optionally at least one kind of group selected from the group consisting of sulfonic acid (salt) groups and carboxylic acid (salt) groups, the cleaning agent further containing a phosphonic acid (salt) group-containing (co)polymer, a phosphonic acid compound or a surfactant as needed; and a method for cleaning semiconductor parts with the above cleaning agent. See U.S. Pat. No. 6,440,856.

Example 42

The present invention also includes a non-corrosive cleaning composition for removing residues from a substrate. The composition comprises: (a) water; (b) at least one hydroxylammonium compound; (c) at least one basic compound, preferably selected from the group consisting of amines and quaternary ammonium hydroxides; (d) one or more compounds with one or more chelating groups/agents, at least one being an amidoxime functional group/compound, (e) optionally at least one organic carboxylic acid; and (f) optionally, a polyhydric compound. The pH of the composition is preferably between about 2 to about 6. See U.S. Pat. No. 6,413,923.

Example 43

Another embodiment of the present invention is a composition comprising a slurry having an acidic pH and a corrosion inhibitor with one or more compounds with one or more chelating groups/agents, at least one being an amidoxime functional group/compound, and optionally a carboxylic acid corrosion inhibitor, wherein said carboxylic acid is selected from the group consisting of: glycine, oxalic acid, malonic acid, succinic acid and nitrilotriacetic acid. U.S. Pat. No. 6,409,781.

Example 44

An alternative embodiment of the present invention is a chemical formulation consisting of a chelating agent, wherein said chelating agent is one or more compounds with one or more chelating groups/agents, at least one being an amidoxime functional group/compound, and optionally one or more additional chelating agents selected from the group consisting of iminodiacetic, malonic, oxalic, succinic, boric and malic acids and 2,4 pentanedione; a fluoride; and a glycol solvent, wherein said chelating agents consist of approximately 0.1-10% by weight of the formulation; and wherein said fluoride consists of a compound selected from the group consisting of ammonium fluoride, an organic derivative of ammonium fluoride, and a organic derivative of a polyammonium fluoride; and wherein said fluoride consists of approximately 1.65-7% by weight of the formulation; and wherein said glycol solvent consists of approximately 73-98.25% by weight of said formulation, further comprising: an amine, wherein said amine consists of approximately 0.1-10% by weight of said formulation. The chelating agents generally contain one or more compounds with one or more chelating groups/agents, at least one being an amidoxime functional group/compound, and optionally contain two carboxylic acid groups or two hydroxyl groups or two carbonyl groups such that the two groups in the chelating agent are in close proximity to each other. Other chelating agents which are also weakly to moderately acidic and are structurally similar to those claimed are also expected to be suitable. See U.S. Pat. No. 6,383,410.

Example 45

Another embodiment of the present invention is a cleaning composition comprising a partially fluorinated solvent, a co-solvent, one or more compounds with one or more chelating groups/agents, at least one being an amidoxime functional group/compound, and ozone, wherein said fluorinated solvent comprises hydrofluoroethers, wherein said co-solvent is selected from the group consisting of ethers, esters, tertiary alcohols, carboxylic acids, ketones and aliphatic hydrocarbons. See U.S. Pat. No. 6,372,700.

Example 46

Yet another embodiment of the present invention is a combination of one or more compounds with one or more chelating groups/agents, at least one being an amidoxime functional group/compound and optionally a carboxylic acid corrosion inhibitor. The combination of corrosion inhibitors can effectively inhibit metal corrosion of aluminum, copper, and their alloys. Suitable carboxylic acids include monocarboxylic and polycarboxylic acids. For example, the carboxylic acid may be, but is not limited to, formic acid, acetic acid, propionic acid, valeric acid, isovaleric acid, oxalic acid, malonic acid, succinic acid, glutaric acid, maleic acid, filmaric acid, phthalic acid, 1,2,3-benzenetricarboxylic acid, glycolic acid, lactic acid, citric acid, salicylic acid, tartaric acid, gluconic acid, and mixtures thereof. The preferred carboxylic acid is citric acid.

Example 47

Another example of the present invention is a composition for selective etching of oxides over a metal comprising: (a) water; (b) hydroxylammonium salt in an amount about 0.1 wt. % to about 0.5 wt. % of said composition; (c) one or more compounds with one or more chelating groups/agents, at least one being an amidoxime functional group/compound; (d) optionally a carboxylic acid selected from the group consisting of: formic acid, acetic acid, propionic acid, valeric acid, isovaleric acid, oxalic acid, malonic acid, succinic acid, glutaric acid, maleic acid, fimaric acid, phthalic acid, 1,2,3-benzenetricarboxylic acid, glycolic acid, lactic acid, citric acid, salicylic acid, tartaric acid, gluconic acid, and mixtures thereof; (e) a fluorine-containing compound; and (e) optionally, base. See U.S. Pat. No. 6,361,712.

Example 48

In a further aspect, the invention relates to a semiconductor wafer cleaning formulation for use in post plasma ashing semiconductor fabrication, comprising the following components in the percentage by weight (based on the total weight of the formulation) ranges shown:

TABLE 5

| | |
|---|---|
| Organic amine(s) | 2-98% by weight |
| Water | 0-50% by weight |
| amidoxime chelating agent | 0.1-60% by weight |
| Complexing agent | 0-25% by weight |
| Nitrogen-containing carboxylic acid or imine | 0.5-40% by weight |
| polar organic solvent | 2-98% by weight. |

Example 49

Another example of the present invention includes an essentially anhydrous cleaning composition comprising 88 weight percent or more of a fluorinated solvent, from 0.005 to 2 weight percent of hydrogen fluoride or complex thereof, and from 0.01 to 5 weight percent of a co-solvent, wherein said co-solvent is selected from one or more compounds with one or more chelating groups/agents, at least one being an amidoxime functional group/compound, ethers, polyethers, carboxylic acids, primary and secondary alcohols, phenolic alcohols, ketones, aliphatic hydrocarbons and aromatic hydrocarbons. See U.S. Pat. No. 6,310,018.

Example 50

TABLE 6

| | | |
|---|---|---|
| A. | Amidoxime compound | 2.5% by weight |
| | Tetramethylammonium fluoride | 4.5% by weight |
| | Ethylene glycol | 93% by weight |
| B. | Amidoxime compound | 1.3% by weight |
| | Pentamethyldiethylenetriammonium trifluoride | 4.6% by weight |
| | Ethylene glycol | 94.1% by weight |
| C. | Amidoxime compound | 1.25% by weight |
| | Triethanolammonium fluoride | 5% by weight |
| | Ethylene glycol | 93.75% by weight |
| D. | Amidoxime compound | 2.8% by weight |
| | Tetramethylammonium fluoride | 5.1% by weight |
| | Ethylene glycol | 92.1% by weight |
| E. | Amidoxime compound | 2% by weight |
| | Ammonium fluoride | 7% by weight |
| | Ethylene glycol | 91% by weight |
| F. | Amidoxime compound | 2.8% by weight |
| | Ammonium fluoride | 5% by weight |
| | Ethylene glycol | 92.2% by weight |

Example 51

Another embodiment of the present invention includes a chelating agent, a fluoride salt, and a glycol solvent, wherein said chelating agent is weakly to moderately acidic, and consists of approximately 0.1-10% by weight of the formulation; and wherein said fluoride salt consists of a compound selected from the group consisting of ammonium fluoride, an organic derivative of ammonium fluoride, and a organic derivative of a polyammonium fluoride; and wherein said fluoride salt consists of approximately 1.65-7% by weight of the formulation; and wherein said glycol solvent consists of 73-98.25% by weight of said formulation; and further including an amine, wherein said amine consists of approximately 0.1-10% by weight of said formulation; and wherein said chelating agent is an amidoxime or hydroxamic acid. See U.S. Pat. No. 6,280,651.

Example 52

Another example of the present invention is a cleaning agent for use in producing semiconductor devices, which consists essentially of an aqueous solution containing (A) 0.1 to 15% by weight based on the total amount of the cleaning agent of at least one fluorine-containing compound selected from the group consisting of hydrofluoric acid, ammonium fluoride, ammonium hydrogenfluoride, acidic ammonium fluoride, methylamine salt of hydrogen fluoride, ethylamine salt of hydrogen fluoride, propylamine salt of hydrogen fluoride and tetramethylammonium fluoride, (B) 0.1 to 15% by weight based on the total amount of the cleaning agent of a salt of boric acid and (C) 0.5 to 50% by weight of one or more compounds with one or more chelating groups/agents, at least one being an amidoxime functional group/compound; and (d) 5 to 80% by weight based on the total amount of the cleaning agent of a water-soluble organic solvent, and optionally further containing at least one of a quaternary ammonium salt, an ammonium salt of an organic carboxylic acid, an amine salt of an organic carboxylic acid and a surfactant. See U.S. Pat. No. 6,265,309.

Example 53

Another embodiment of the present invention includes a cleaning liquid in the form of an aqueous solution for cleaning a semiconductor device during production of a semiconductor device, which comprises (A) a fluorine-containing compound; (B) a water-soluble or water-miscible organic solvent; (C) one or more compounds with one or more chelating groups/agents, at least one being an amidoxime functional group/compound; (D) optionally, an organic acid; and (E) a quaternary ammonium salt. In some embodiments the cleaning solution also contains a surfactant. The organic acid is typically selected from the group consisting of formic acid, acetic acid, propionic acid, butyric acid, isobutyric acid, valeric acid, isovaleric acid, heptanoic acid, lauric acid, palmitic acid, stearic acid, acrylic acid, crotonic acid, methacrylic acid, oxalic acid, malonic acid, maleic acid, succinic acid, adipic acid, azelaic acid, sebacic acid, benzoic acid, toluic acid, phthalic acid, trimellitic acid, pyromellitic acid, benzenesulfonic acid, toluenesulfonic acid, salicylic acid and phthalic anhydride. See U.S. Pat. No. 5,972,862.

Example 54

Another embodiment is a method for semiconductor processing comprising etching of oxide layers, especially etching thick SiO2 layers and/or last step in the cleaning process wherein the oxide layers are etched in the gas phase with a mixture of hydrogen fluoride, one or more compounds with one or more chelating groups/agents, at least one being an amidoxime functional group/compound, and optionally one or more carboxylic acids, eventually in admixture with water. See U.S. Pat. No. 5,922,624.

Example 55

The complexing agents of the present invention may also be added to the rinse containing a peroxide of U.S. Pat. No. 5,911,836.

Example 56

Another example of the present invention is a method and apparatus for increasing the deposition of ions onto a surface, such as the adsorption of uranium ions on the detecting surface of a radionuclide detector. The method includes the step of exposing the surface to one or more compounds with one or more chelating groups/agents, at least one being an amidoxime functional group/compound, and optionally, a phosphate ion solution, which has an affinity for the dissolved species to be deposited on the surface. This provides, for example, enhanced sensitivity of the radionuclide detector. See U.S. Pat. No. 5,652,013.

Example 57

Another embodiment of the present invention is a stripping and cleaning agent for removing dry-etching photoresist residues, and a method for forming an aluminum based line pattern using the stripping and cleaning agent. The stripping and cleaning agent contains (a) from 5 to 50% by weight of one or more compounds with one or more chelating groups/agents, at least one being an amidoxime functional group/compound; (b) from 0.5 to 15% by weight of a fluorine compound; and (c) a solvent, including water The inventive method is advantageously applied to treating a dry-etched semiconductor substrate with the stripping and cleaning agent. The semiconductor substrate comprises a semiconductor wafer having thereon a conductive layer containing aluminum. The conductive layer is dry-etched through a patterned photoresist mask to form a wiring body having etched side walls. The dry etching forms a side wall protection film on the side walls. In accordance with the inventive method, the side wall protection film and other resist residues are completely released without corroding the wiring body. See, U.S. Pat. No. 5,630,904.

Procedure for Evaluation of Post Etch Residue Removal:

Copper patterned wafer was used for this study. After cleaning with each composition containing amidoxime solution, the wafer was cut into small pieces for SEM observation. Post etch reside removal was evaluated by observation of damascene cross sectional image observed by using Hitachi SEM (S-5200).

Example 58

Figure 2:
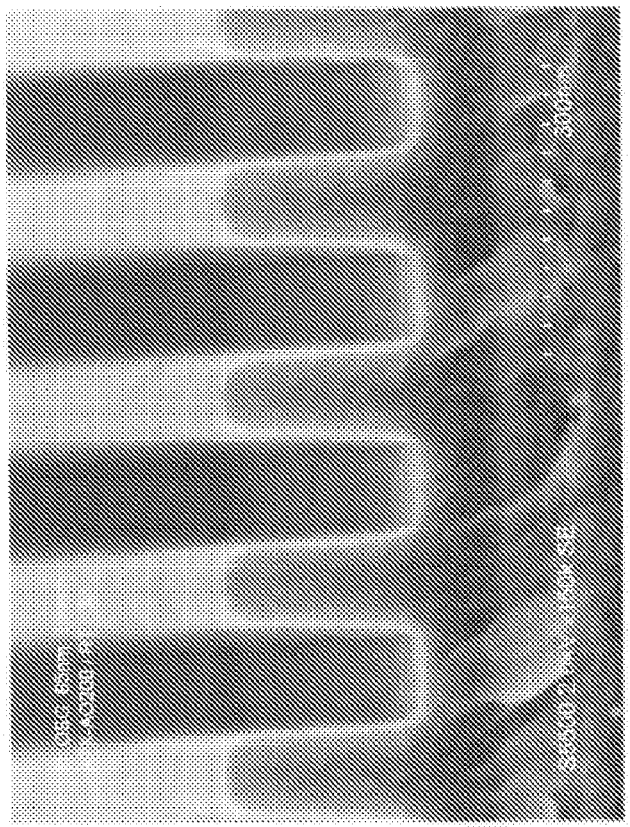
FIG. 2 illustrates the results from Example 58. It provides an SEM micrograph showing that the post etch residues are removed from the device substrate after treatment with the amidoxime compositions of the invention at room temperature FIGS. 3A to 3C provide the results from Example 58 and illustrate the efficacy of residue removal using a composition containing amidoxime. The SEM shows that the residue had been removed from a line/space (L/S) feature of a dual damascence semiconductor structure with composition APX-AMS109, which is a mixtures of amidoxime, ammonium bifluoride, hydrogen peroxide and water at a pH of 7.
Figure 2:
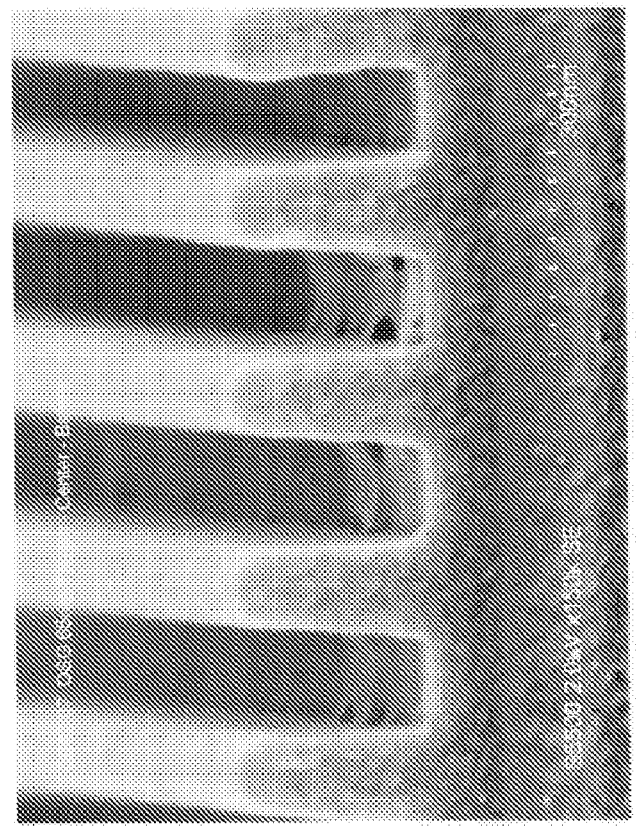
Figure 3A:
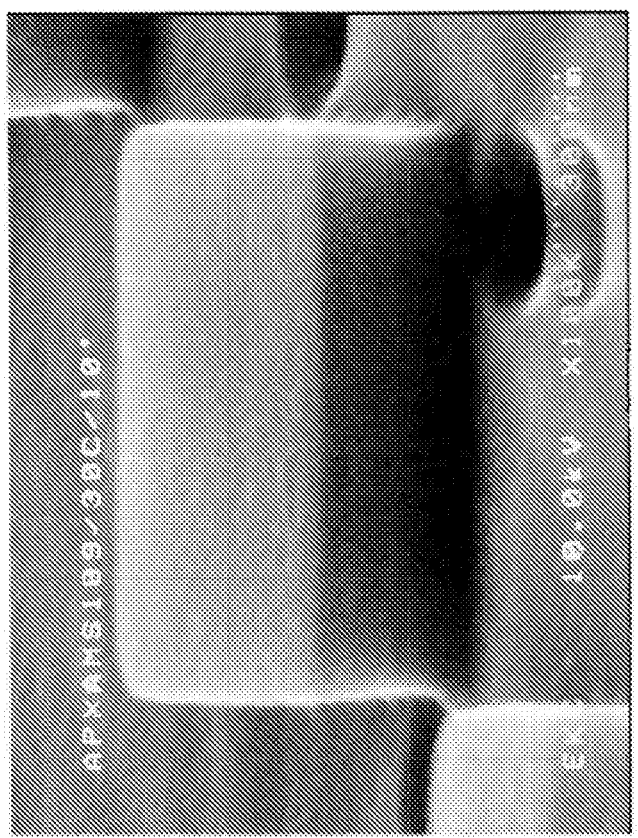
Figure 3A:
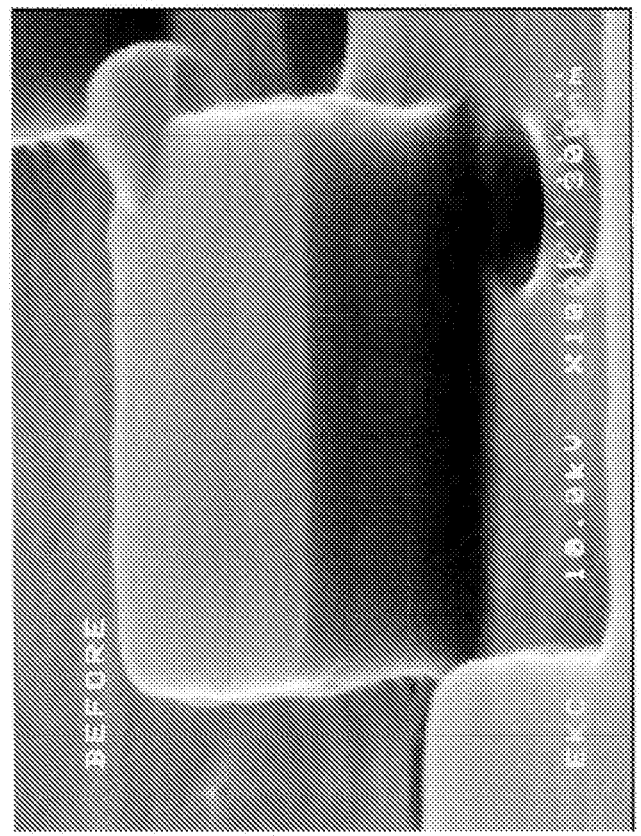
Figure 3B:
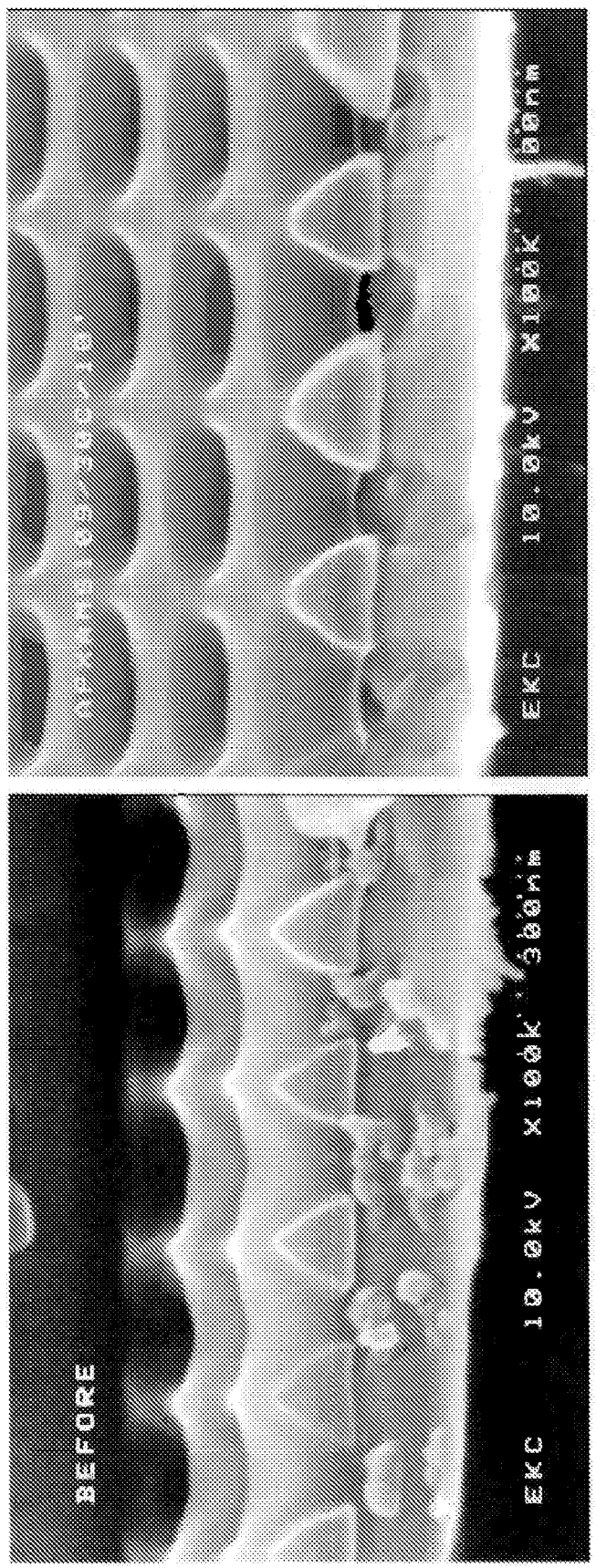
Figure 3C:
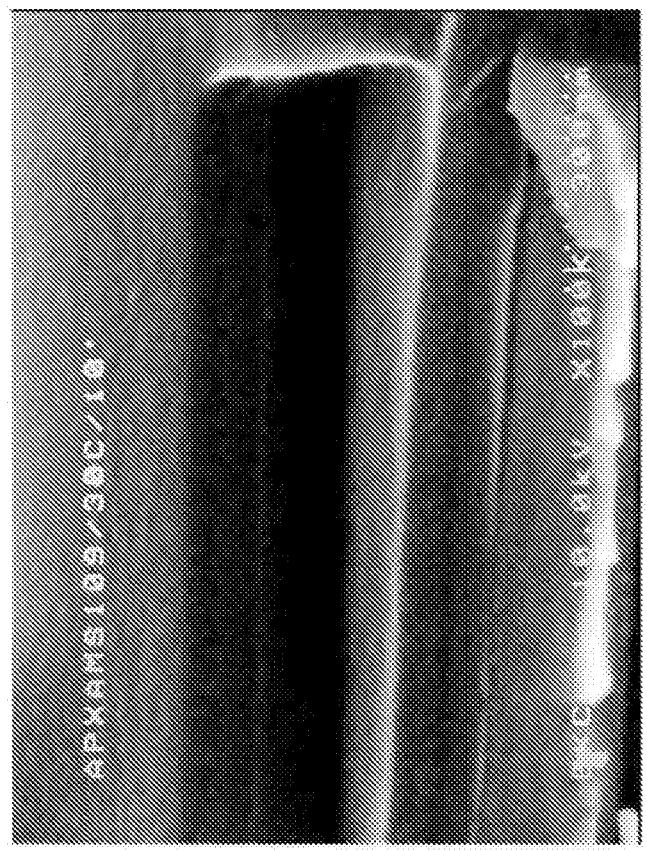
Figure 3C:
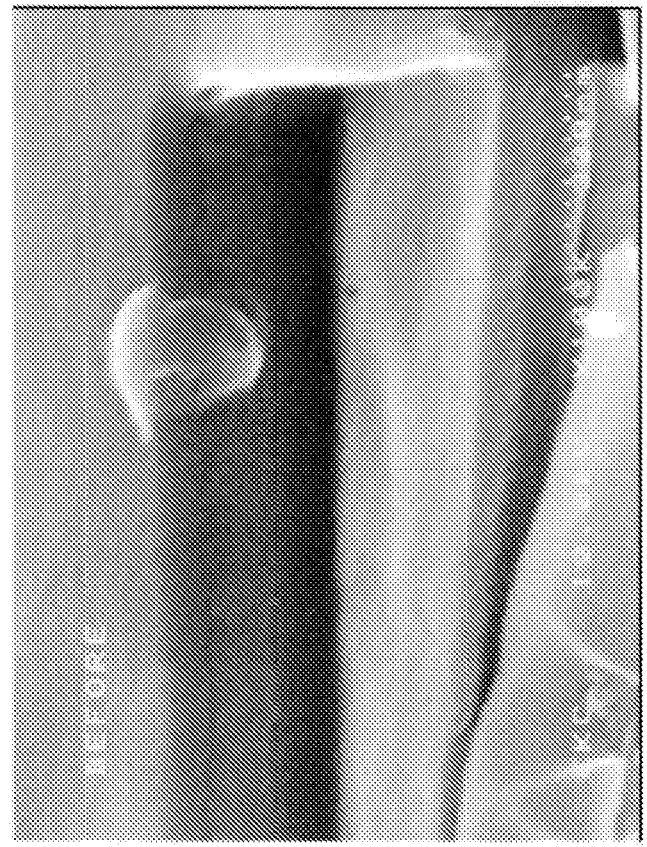

The amidoxime containing compositions were prepared for removal of metal hard mask residue evaluations. The results show that such mixtures are effective in removing etch residues, as illustrated in the SEM pictures in FIG. 2. FIG. 2 shows that post etch residues are removed from the device substrate after treatment with the amidoxime composition of the invention at room temperature Various compositions comprising varying mixtures of the amidoxime compound (1,2,3,4,5,6-(hexa-(2-amidoximo)ethoxy)hexane Hexitol were prepared as residue removal formulations according to Table 7. The results show that other components, such as fluoride, propyleneglycol, a polar solvent and hydrogen peroxide can be formulated with the amidoxime compound to become an effective post etch residue remover. FIGS. 2 and 3A to 3C are examples comparing the results before and after cleaning. Cleaning compositions containing amidoxime compounds of the invention effectively removed the residue without damaging the copper and low k dielectric material.

Example 59

Copper Etch Rate

Copper blanket wafers used in this study were purchased from FRIEND SCIENCE CO. LTD. Copper films was prepared on Si wafers by plating process with the thickness of 1000 A. The copper film thickness was determined by four-point probe measurement (FOUR DIMENSIONS, Mode1280) of the change in sheet resistance of blanket samples. Copper etch rates at various compositions were evaluated at 25° C., for times ran9in9 of 30 minutes. The copper etch rate was calculated from thickness before and after. The result shows the copper and copper oxide solubility in amidoxime solution are pH and concentration dependent. 10% amidoxime solution of (1,2,3,4,5,6-(hexa-(2-amidoximo)ethoxy)hexane Hexitol removes 9 nm of copper in 30 minutes or 0.3 nm/min.

Example 60

Low-k Dielectric Compatibility

Figure 4:
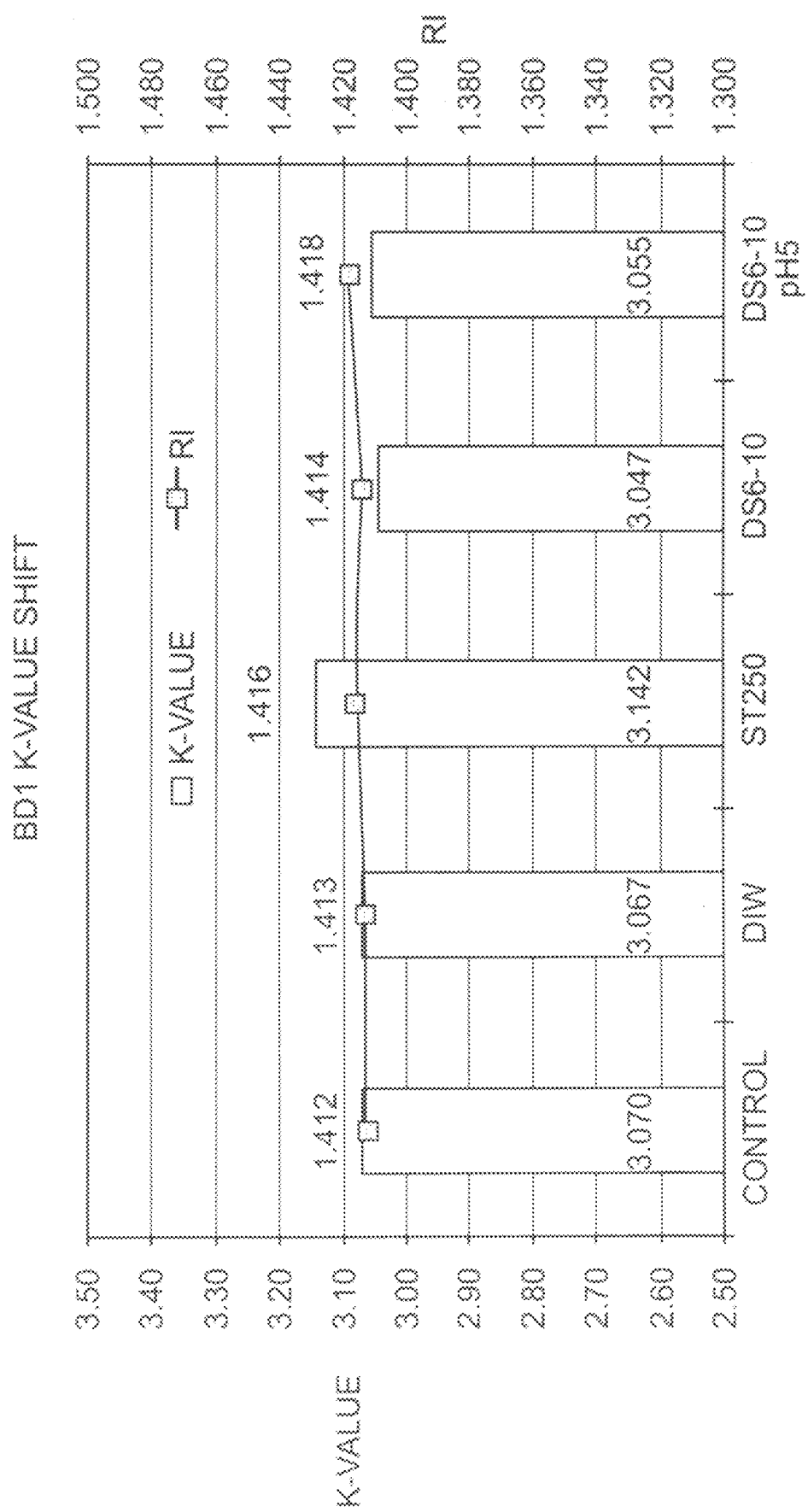
FIG. 4 provides the results from Example 61 demonstrating that the compatibility of the amidoxime composition of the invention has no effect on the carbon dope oxide—Black-Diamond (BDI) from Applied Materials.

Low-k blanket wafer was used for low-k dielectric compatibility test. Refractive index and k-value were selected as indexes of low-k compatibility. Low-k wafer pieces were immersed in each composition for 10 minutes at room temperature. rinsed with DIW and dried with N2 blow drier. Thickness and refractive index of low-k were measured by using by optical interferometer (NanoSpec 6100. Nanometrics Inc). Before measurement of k-value, Porous low-k wafer was baked in a oven at 200' C. for 20 minutes to remove water. K-value was measured by using Hg-probe relative dielectric constant meter (FOUR DIMENSIONS, CV-map 3092A). K value shift" listed in the table was calculated from k value before and after treatment with each composition. FIG. 4 demonstrates that the compatability of the amidoxime composition of the invention has no effect on the carbon dope oxide—Black Diamond (BDl) from Applied Materials.

TABLE 8

| | BD1 | |
|---|---|---|
| | k value | RI |
| Control | 3.070 | 1.412 |
| DIW | 3.067 | 1.413 |

TABLE 7

| Chemicals | | ABF | PG | Citric acid | AmiSorb DS6 60% | Hydrogen Peroxide (30%) | Water | pH |
|---|---|---|---|---|---|---|---|---|
| APX-AMS110 | A | 0.5 | 0 | 0 | 17 | 10 | 72.5 | 7.6 |
| APX-AMS109 | B | 0.5 | 0 | 0 | 8.5 | 10 | 81 | 6.97 |
| APX-AMS107 | C | 0.5 | 0 | 0 | 17 | 0 | 82.5 | 9.36 |
| APX-AMS108 | D | 0.5 | 0 | 0 | 1.7 | 10 | 87.8 | 7.62 |
| APX-AMS105 | E | 0.5 | 0 | 0 | 1.7 | 0 | 97.8 | 8.25 |
| APX-AMS104 | F | 0 | 3.93 | 0 | 1.7 | 0 | 94.37 | 8.58 |
| APX-AMS103 | G | 0 | 3.93 | 1 | 0 | 0 | 95.07 | 8.63 |
| APX-AMS102 | H | 0.0175 | 3.93 | 0 | 1.7 | 0 | 94.35 | 7.29 |
| APX-AMS101 | I | 0.035 | 3.93 | 0 | 1.7 | 0 | 94.34 | 8.04 |
| APX-AMS100 | J | 0.0525 | 3.93 | 0 | 1.7 | 0 | 94.31 | 8.11 |

TABLE 8-continued

| | BD1 | |
| --- | --- | --- |
| | k value | RI |
| DS6-10 | 3.047 | 1.414 |
| DS6-10 pH 5 | 3.055 | 1.418 |

Example 61

Figure 5A:
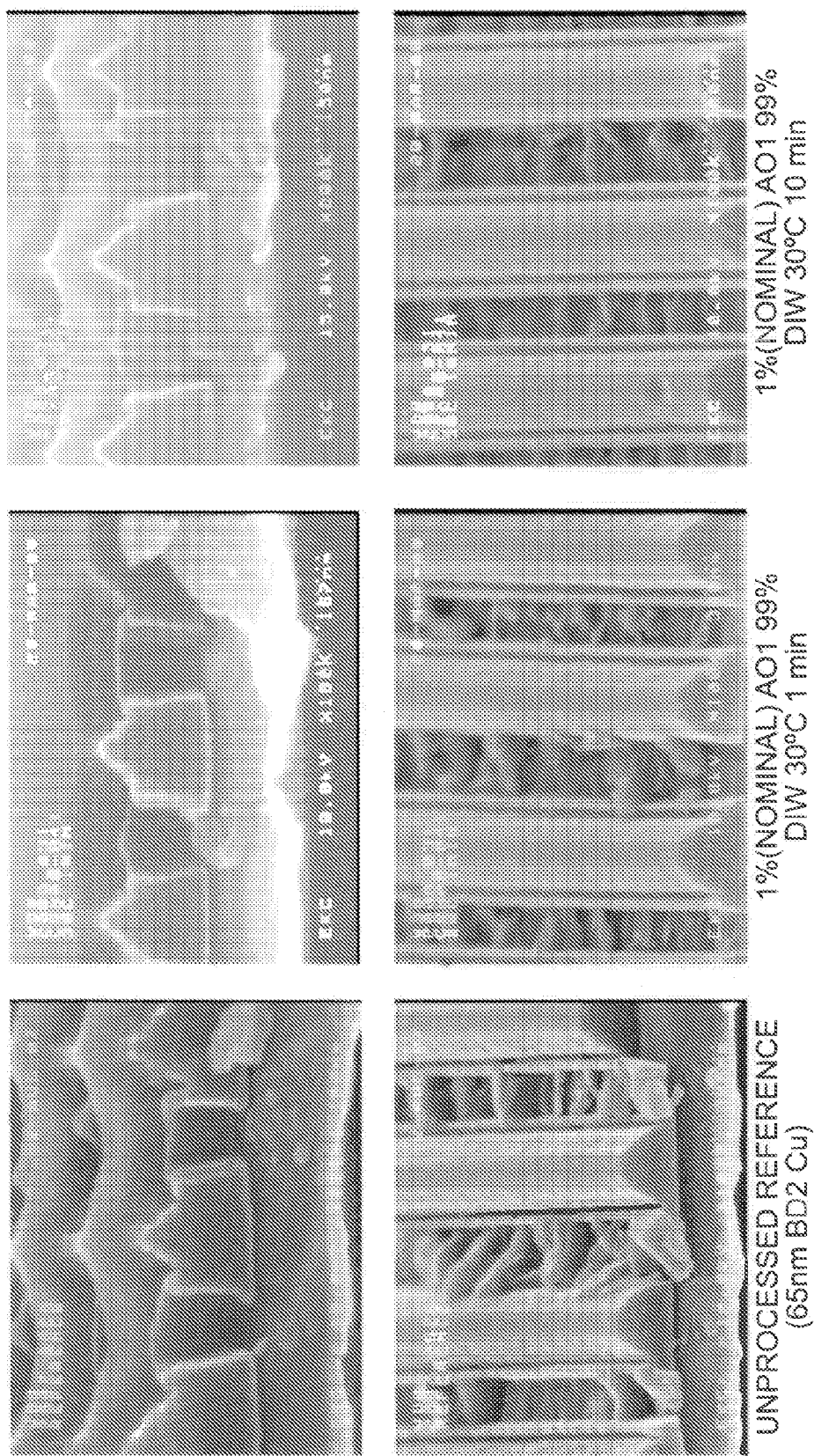
FIGS. 5A and 5B provide the results from Example 61 illustrating the cleaning performance of a composition comprising 1% of (1,2,3,4,5,6-(hexa-(2-amidoximo)ethoxy)hexane Hexitol at 30° C. for 1 minute and 10 minutes on a dual damascene structure with carbon doped oxide—BlackDiamond II (BDII) from Applied Materials. The amidoxime composition at a concentration of 1% of the invention is capable of removing the post etch residue at 30° C. in 10 minutes.
Figure 5B:
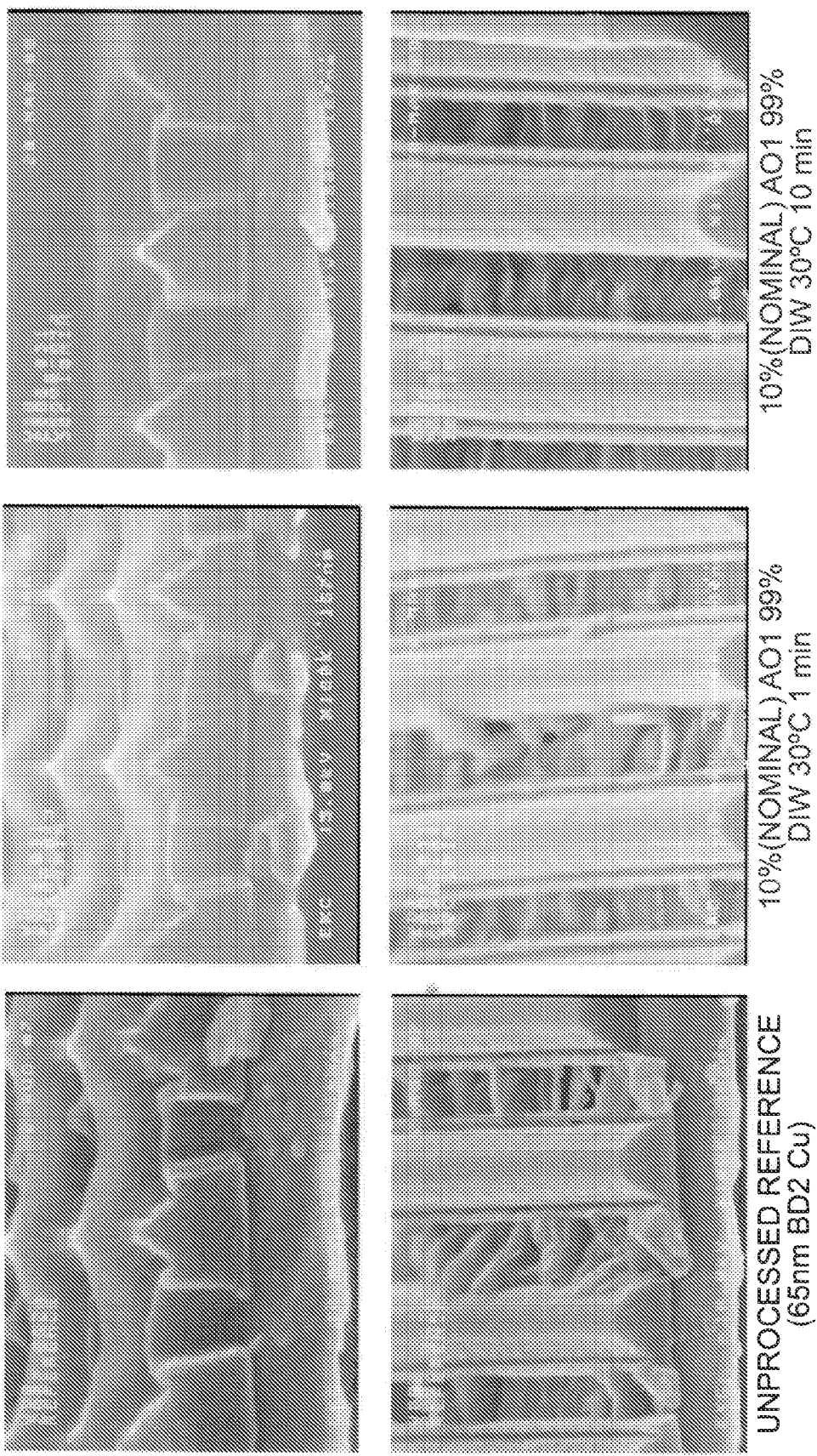

FIGS. 5A-5C provide a further illustration of the cleaning performance of a composition comprising amidoxime (1,2,3,4,5,6-(hexa-(2-amidoximo)ethoxy)hexane Hexitol in cleaning 65 nm technology node using BD2 and copper.

Example 62

Figure 6A:
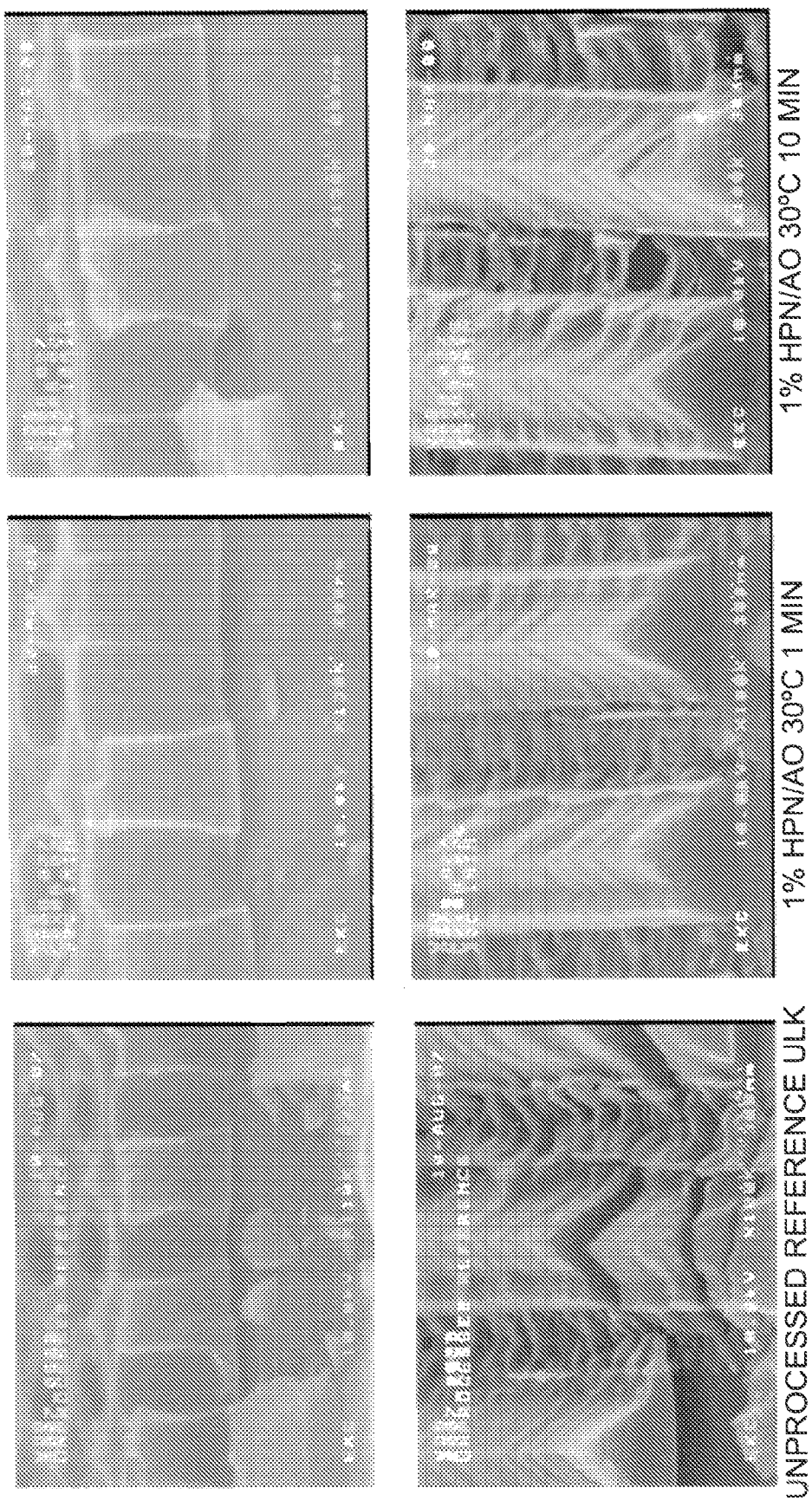
FIGS. 6A to 6C provide the results from Example 62 illustrating the cleaning performance of a composition comprising 1% of N',3-dihydroxypropanimidamide(amidoxime from reaction of hydroxylamine with 3-hydroxypropionitrile) at 30° C. for 1 minute and 10 minutes. The cleaning was performed on a dual damascene structure with Ultra Low K dielectric material. The amidoxime solution at a concentration of 1% of the invention is capable of removing the post etch residue at 30° C. in 10 minutes without damaging the copper surface and the low k dielectric material. Small amounts of residue remained on the structure FIG. 7 provides the result from Example 63 illustrating that the amidoxime containing composition of the invention can also remove post etch residues from aluminum metal line structures. A composition comprising 5% N',3-dihydroxypropanimidamide (amidoxime from reaction of hydroxylamine with 3-hydroxypropionitrile) is capable of removing the post etch residue at 30° C. in 10 minutes without damaging the aluminum surface.
Figure 6B:
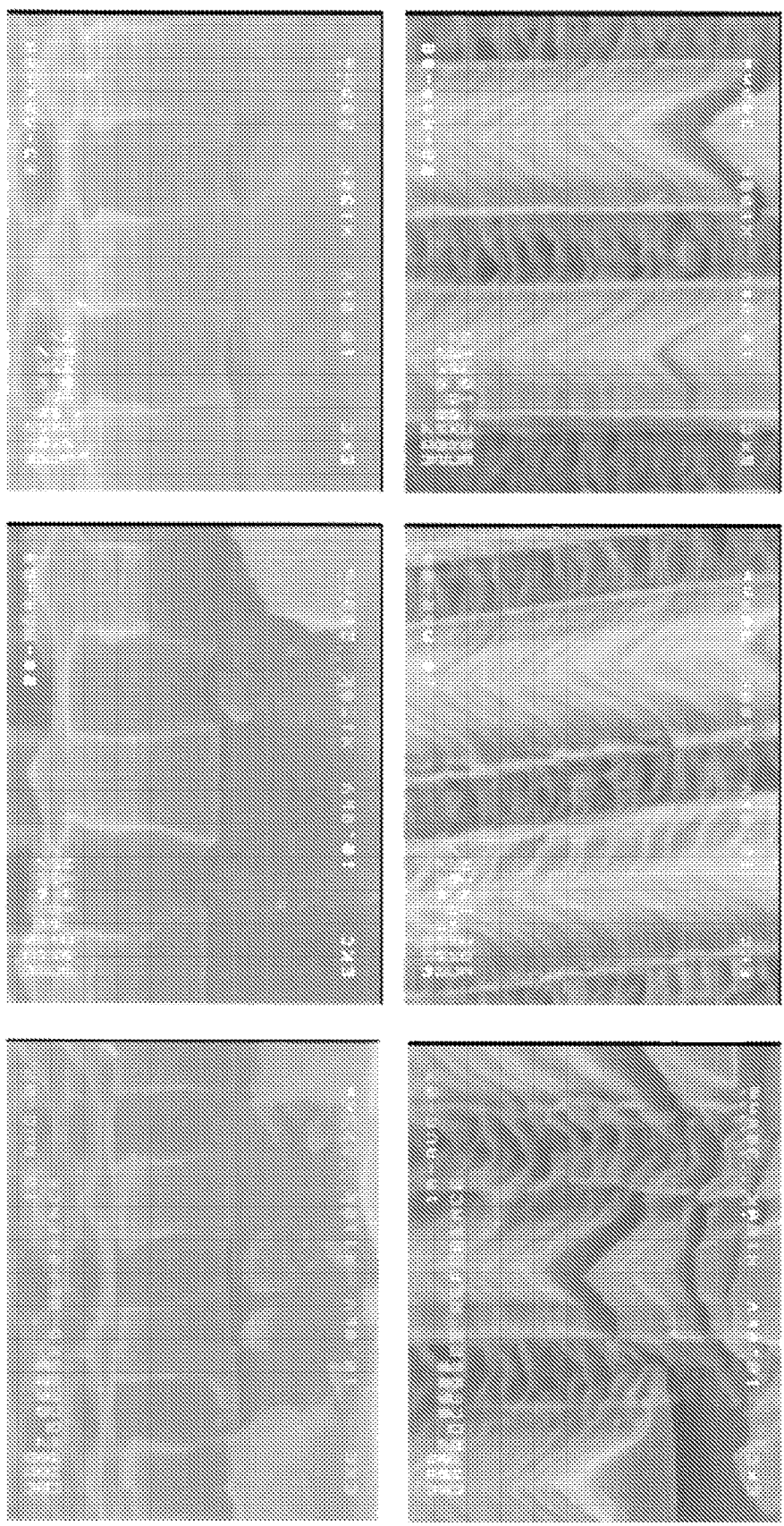
Figure 6C:
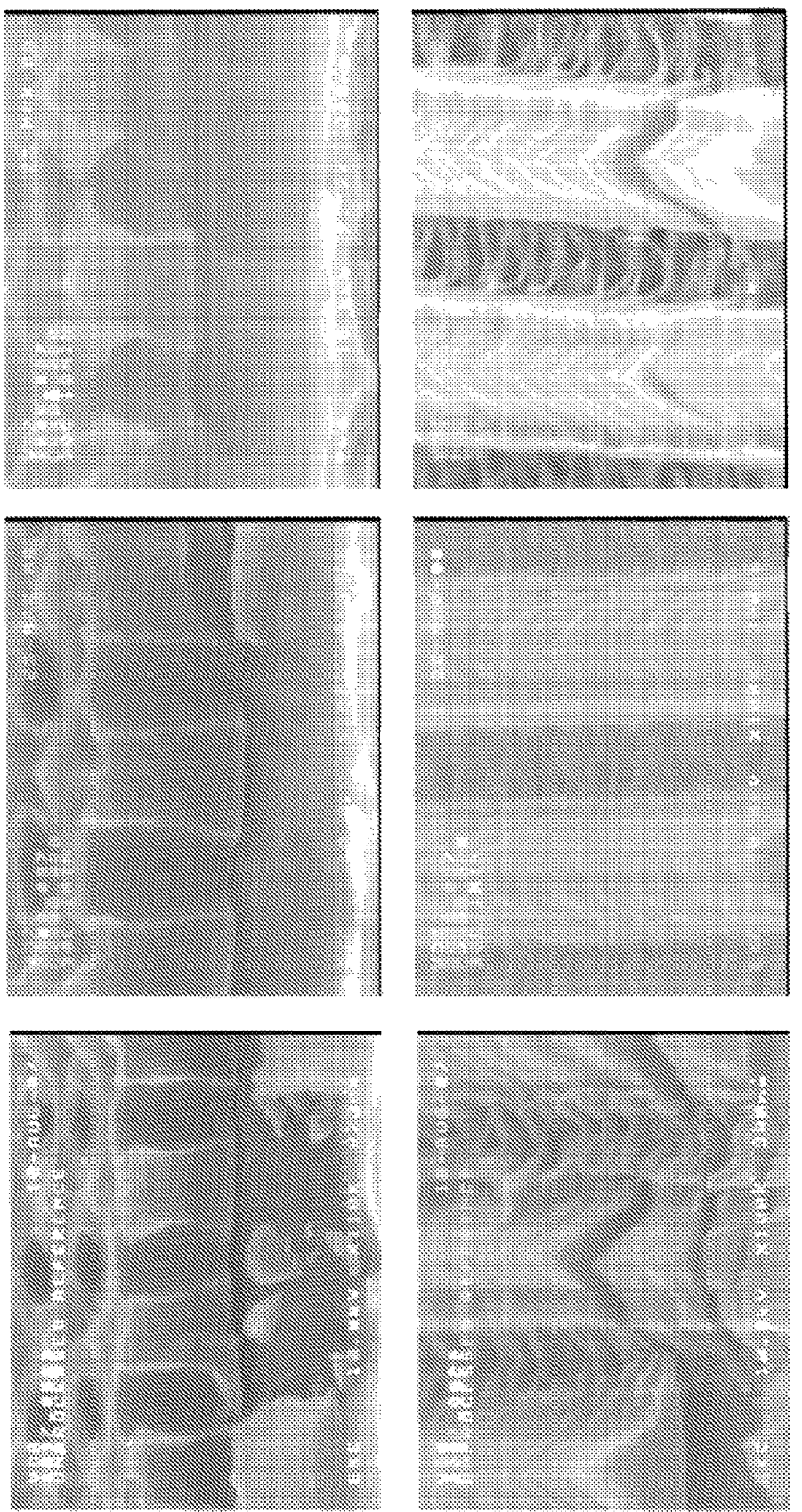

1%, 5% and 10% solutions of amidoxime prepared from 3-hydroxypropionitrile in water were evaluated for cleaning performance with copper and Ultra Low K dual damascence structure etched wafer. The results can be seen on the SEM micrographs (FIG. 6A to 6C). The results show that the residue can be removed after processing at 30° C. between 1 and 10 minutes. The amidoxime of the present invention can also be used in cleaning a substrate with copper and Ultra Low k substrates.

Example 63

Figure 7:
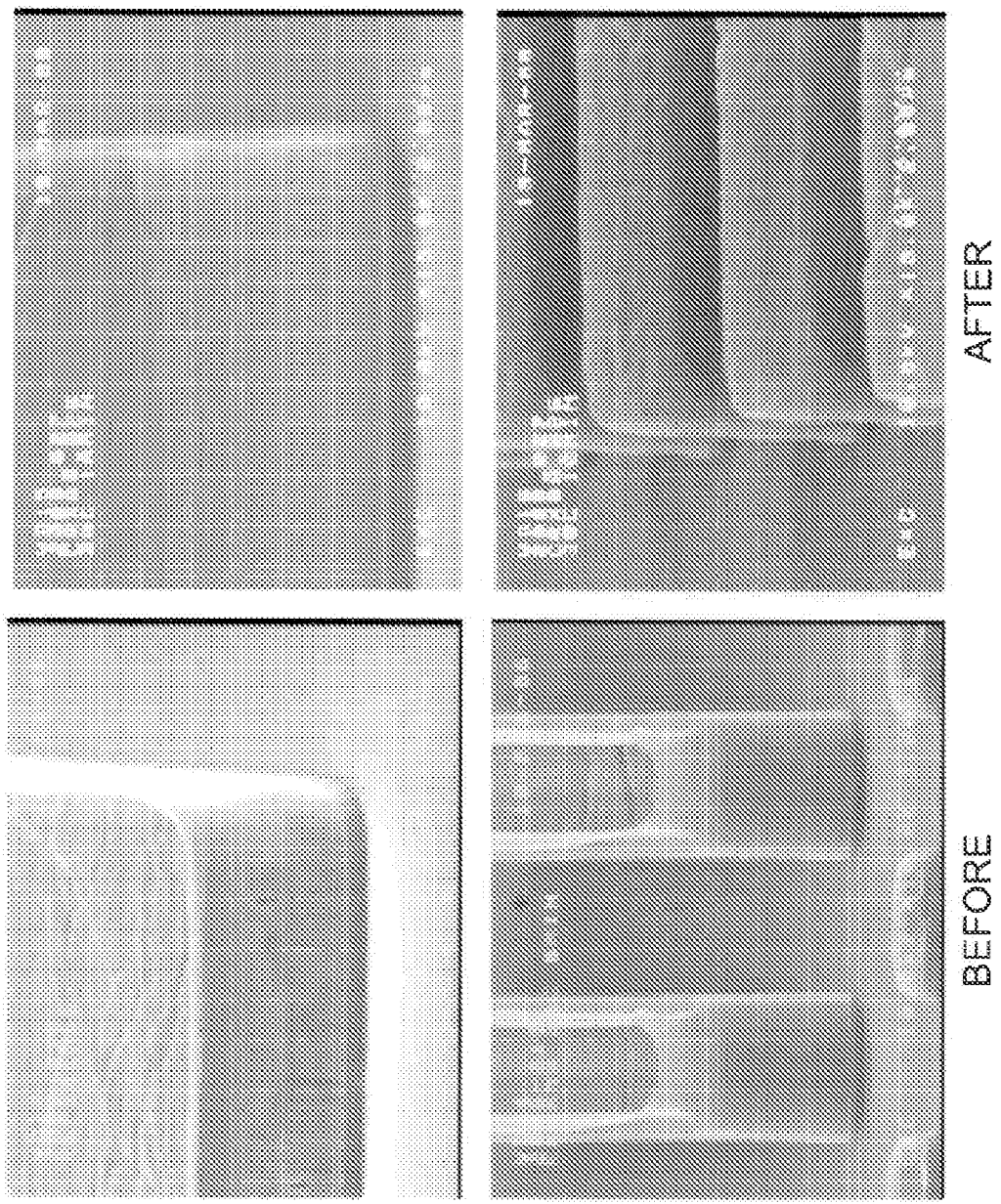
Figure 8A:
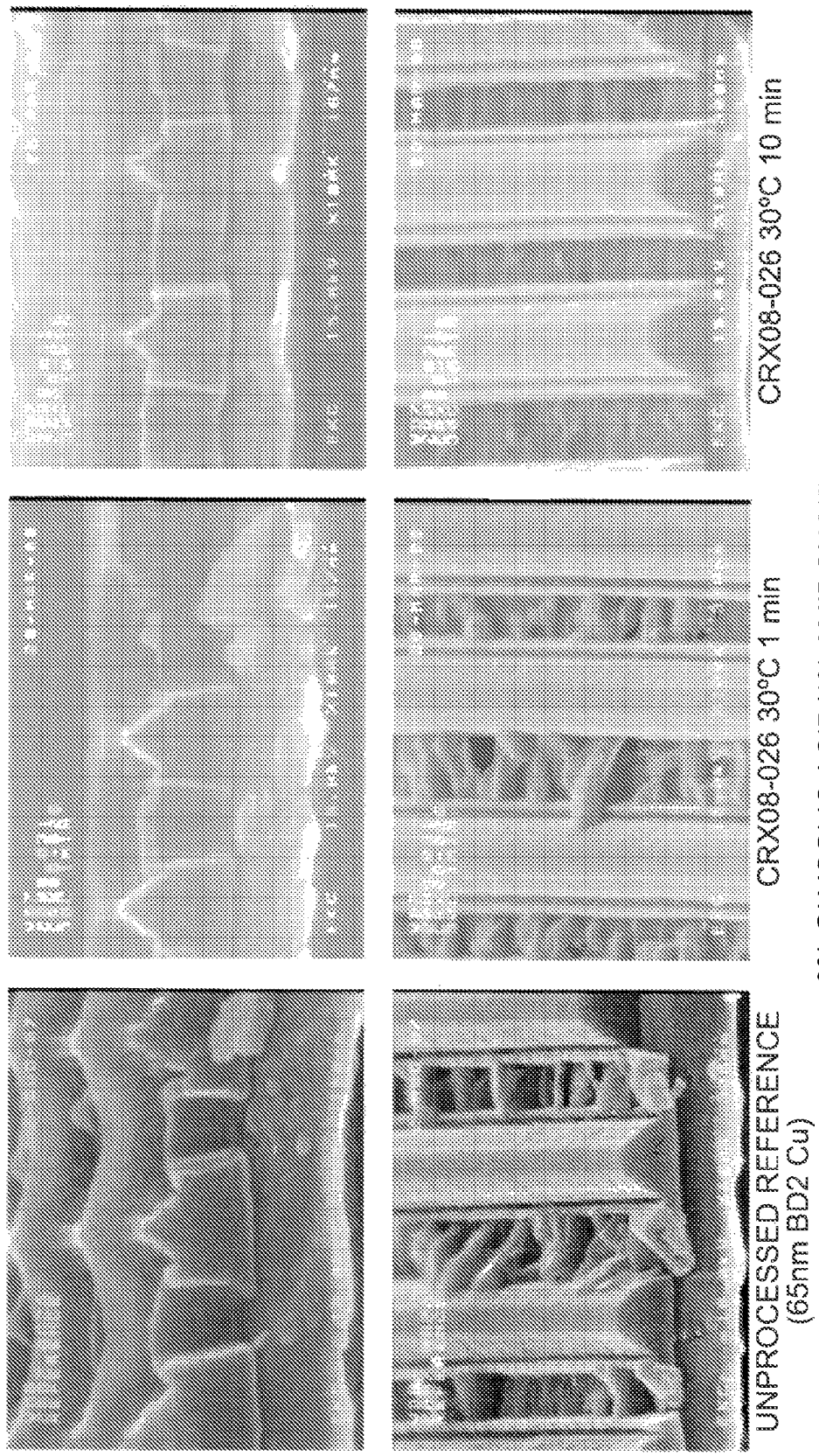
FIGS. 8A to 8L provide the results from Example 65.
Figure 8B:
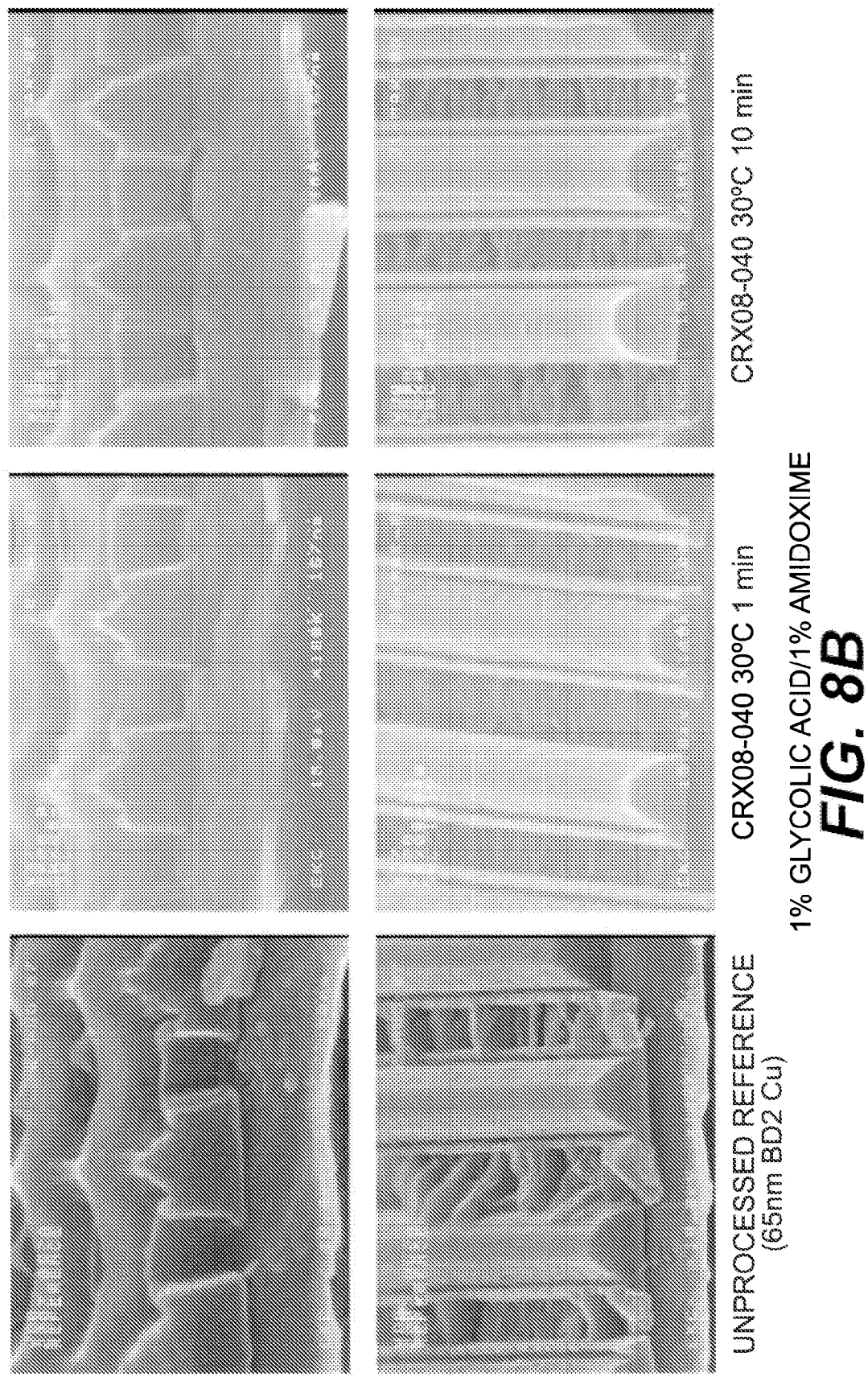
Figure 8C:
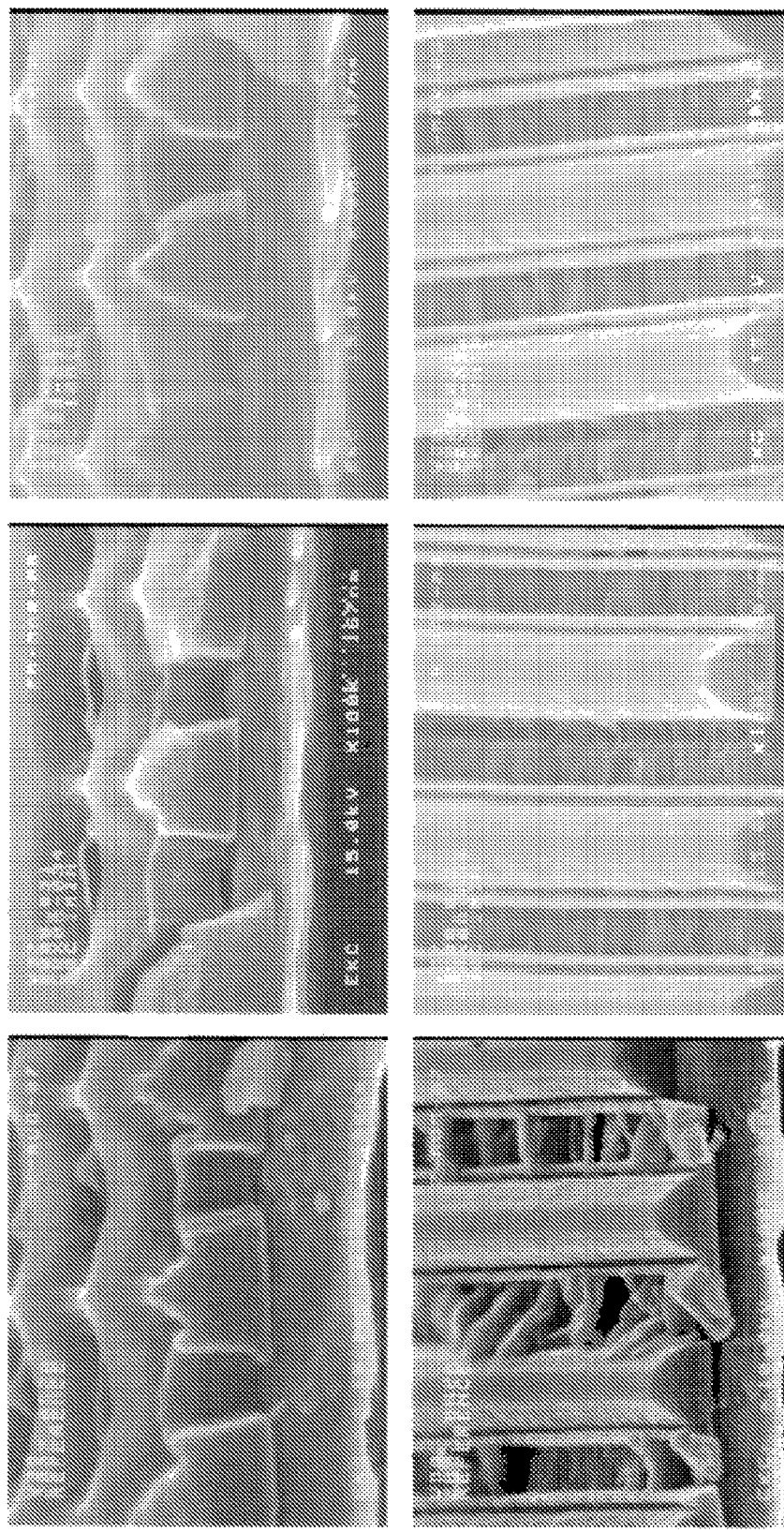
Figure 8D:
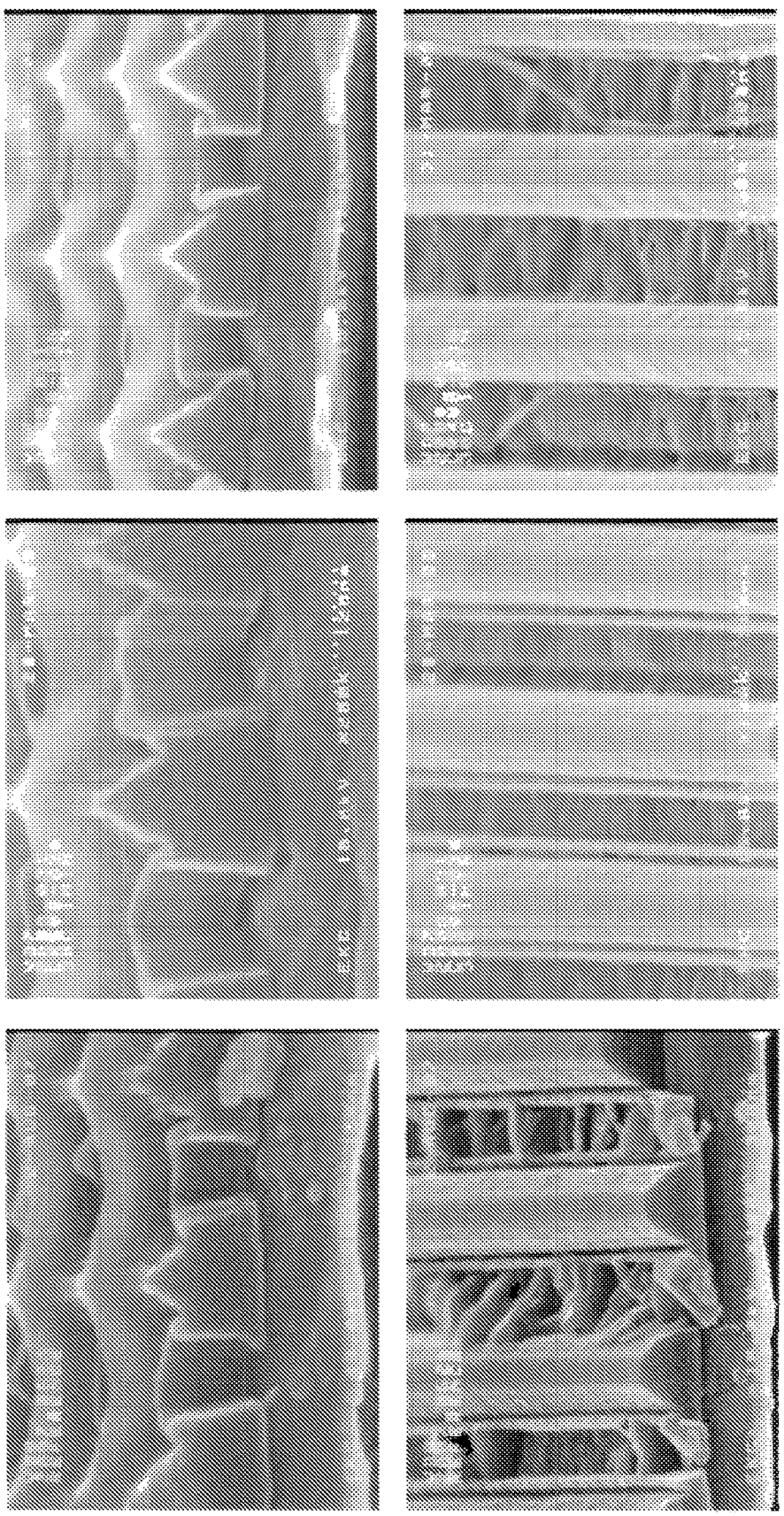
Figure 8E:
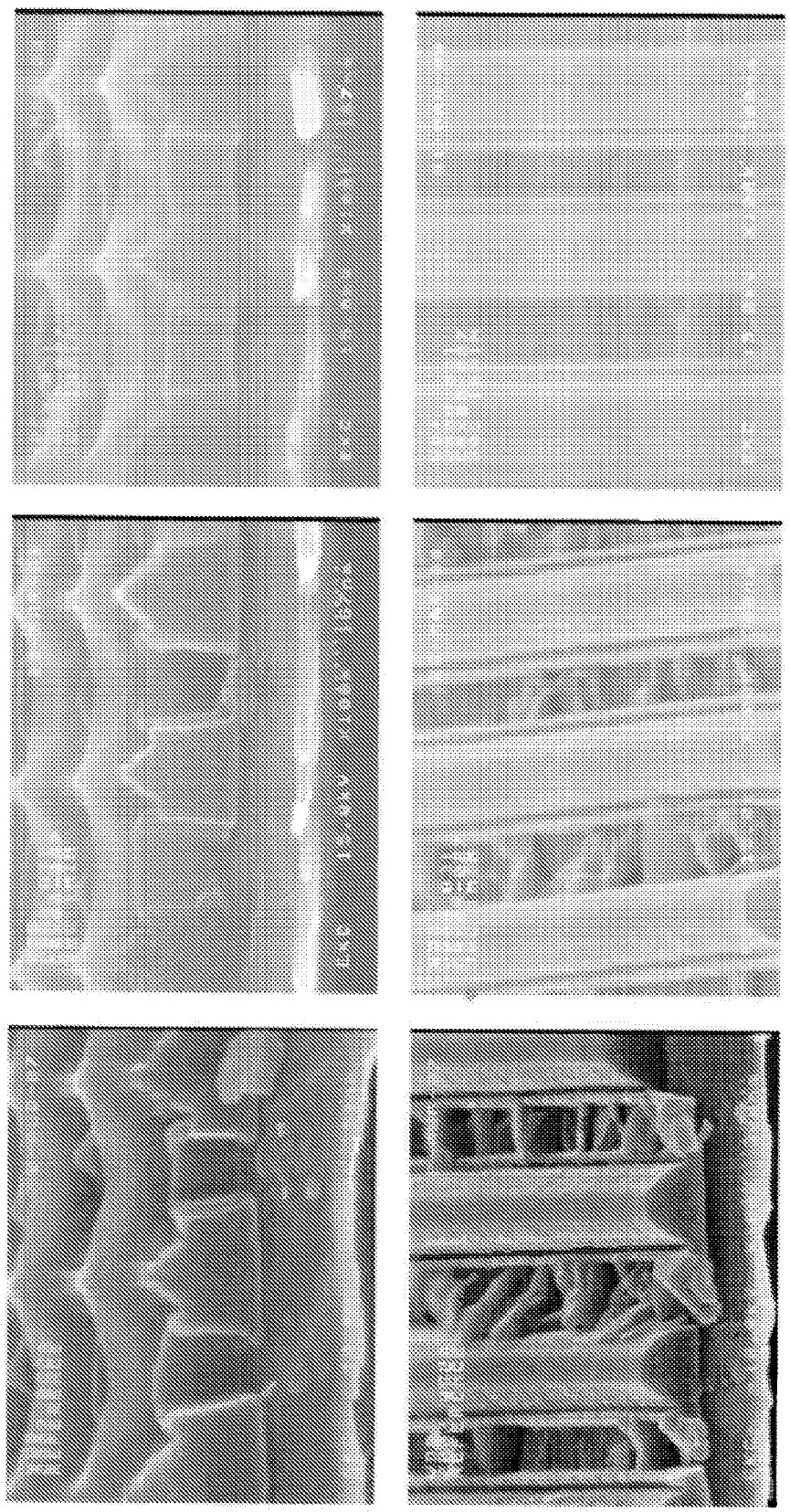
Figure 8F:
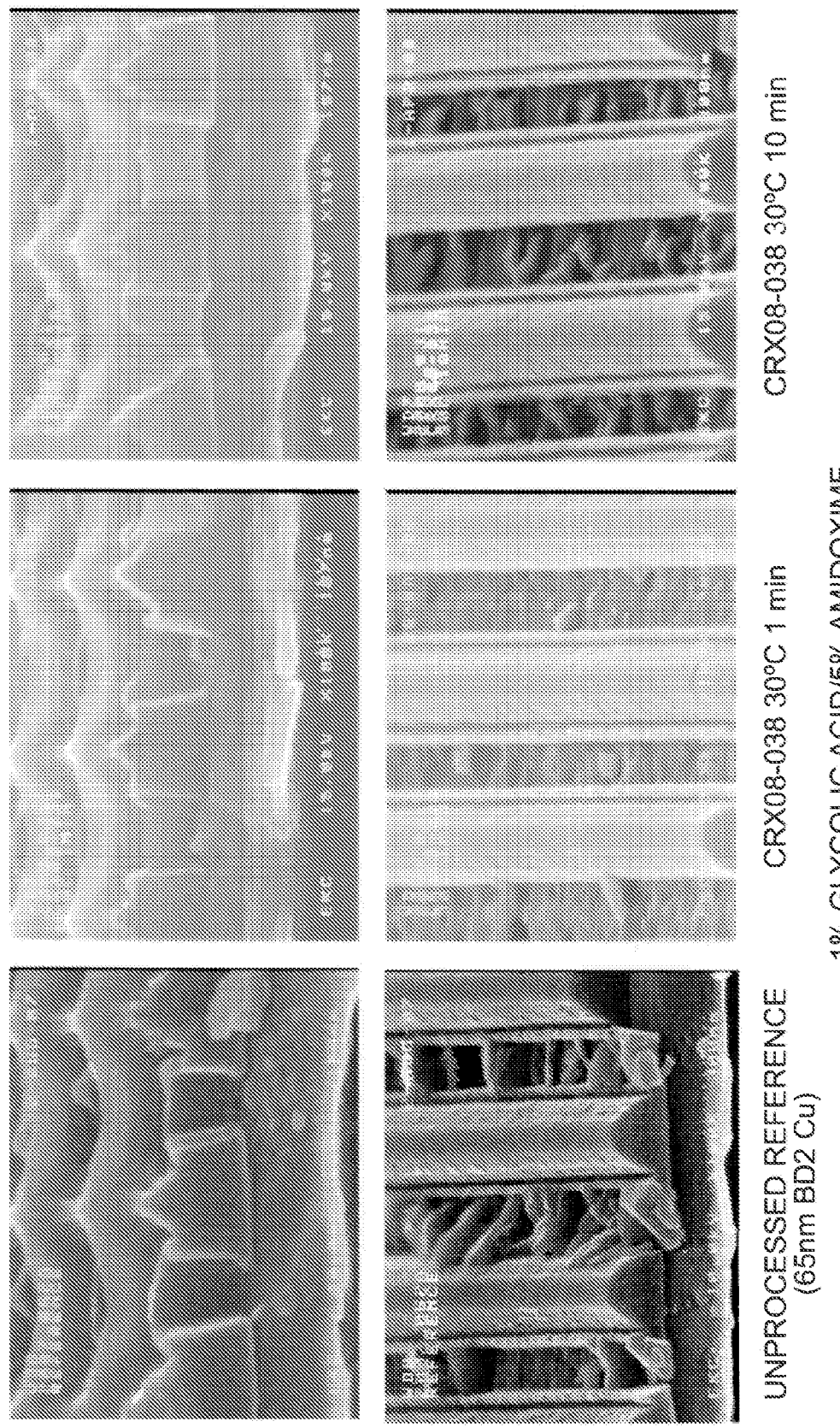
Figure 8G:
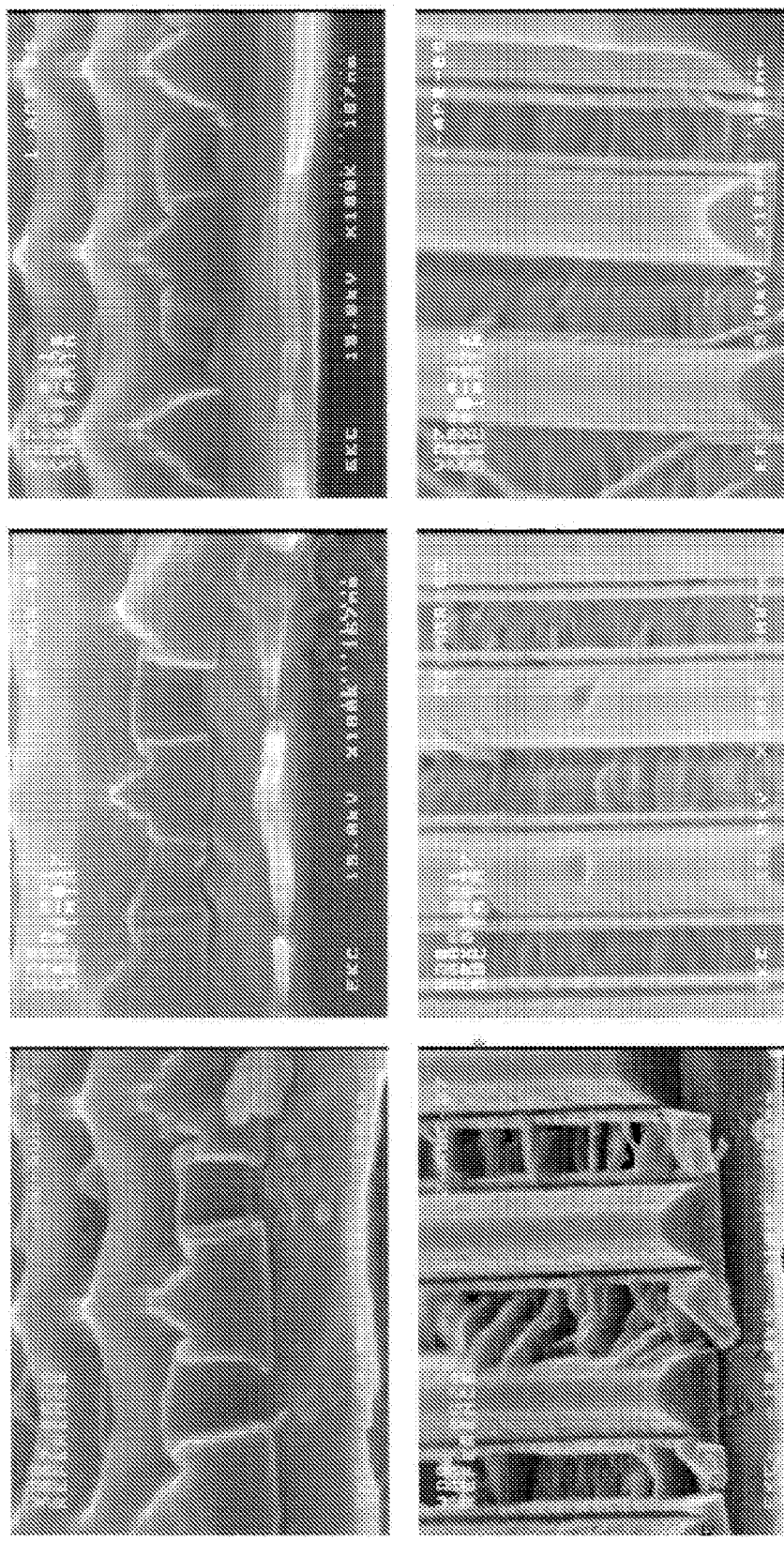
Figure 8H:
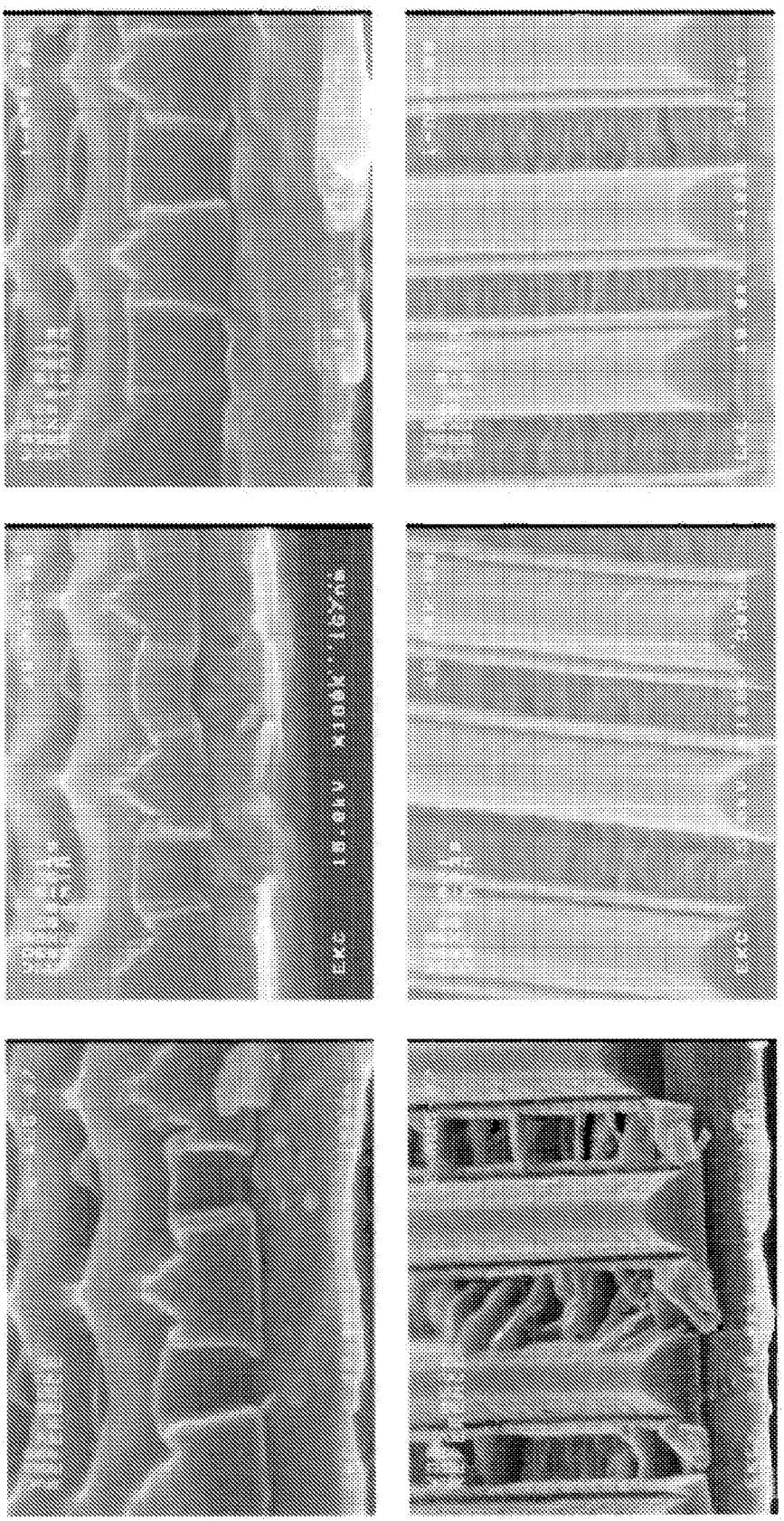
Figure 8I:
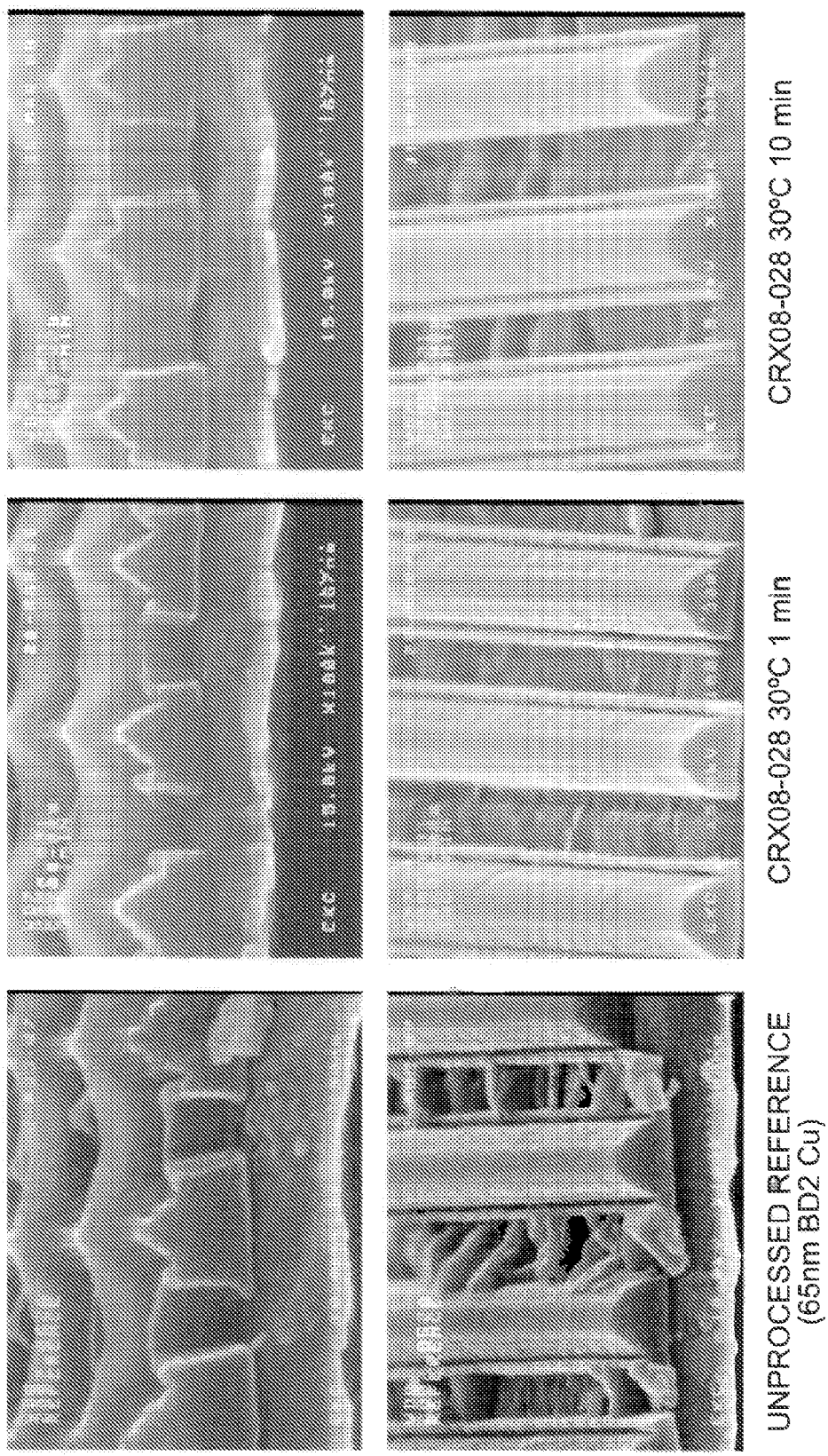
Figure 8J:
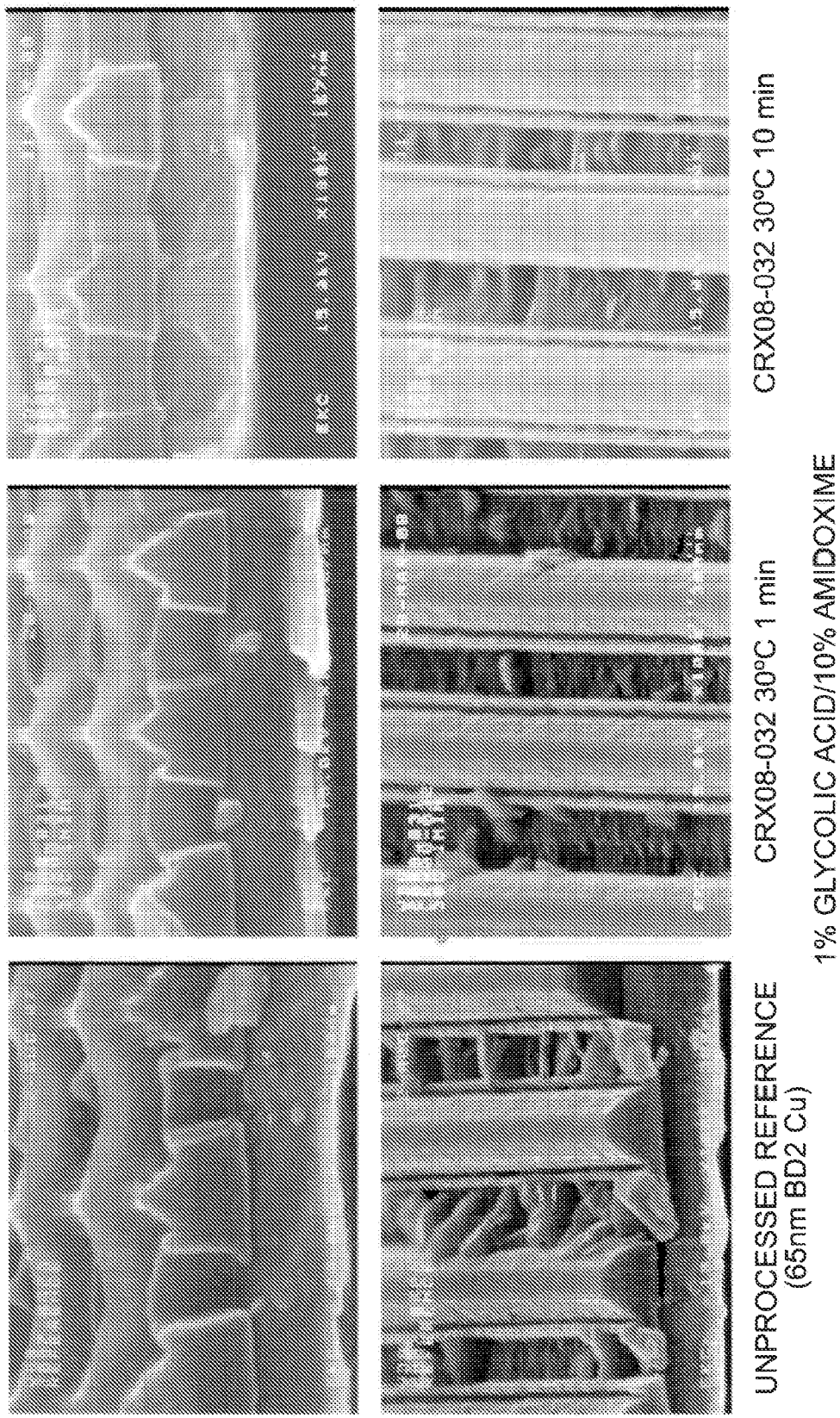
Figure 8K:
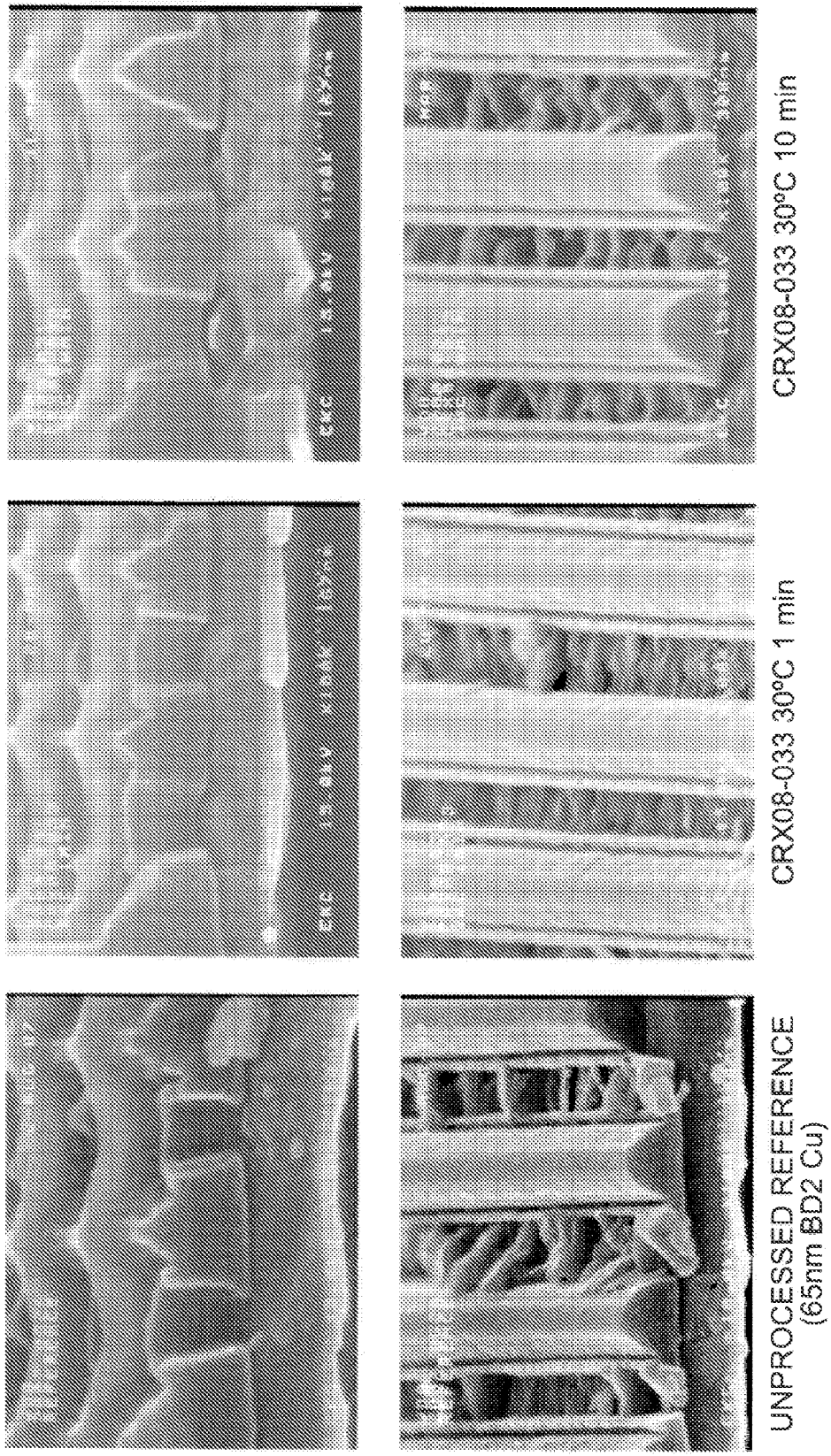
Figure 8L:
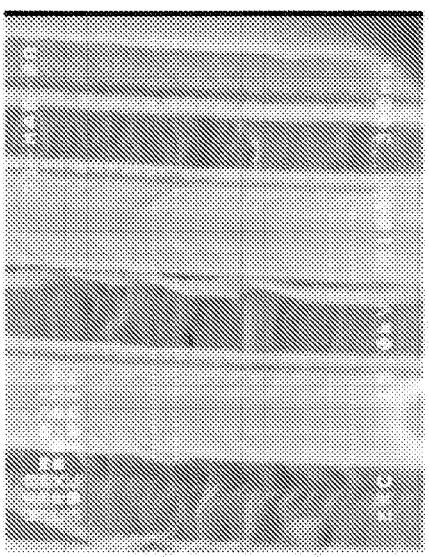
Figure 8L:
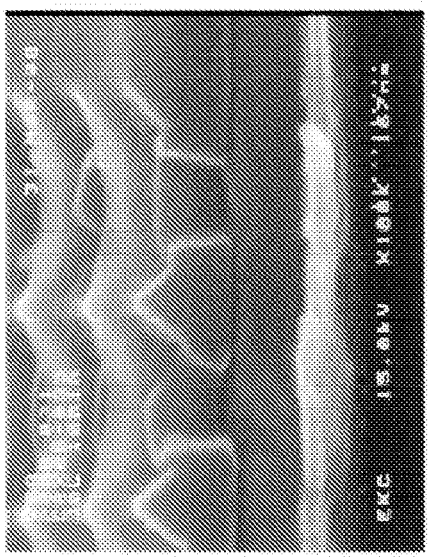
Figure 8L:
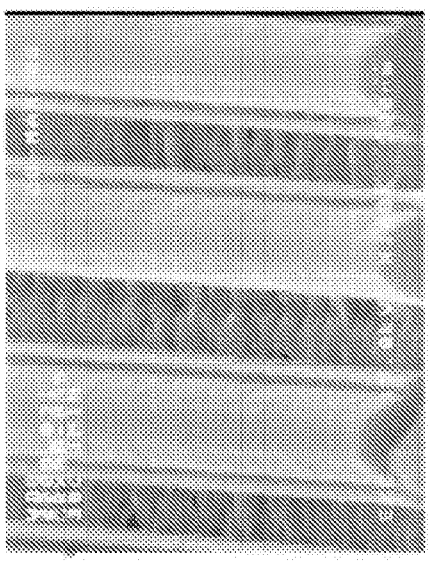
Figure 8L:
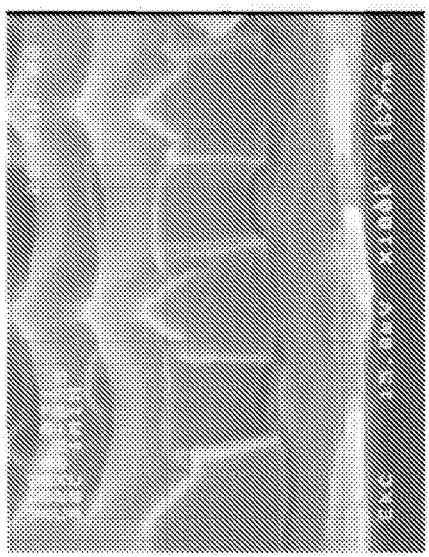
Figure 8L:
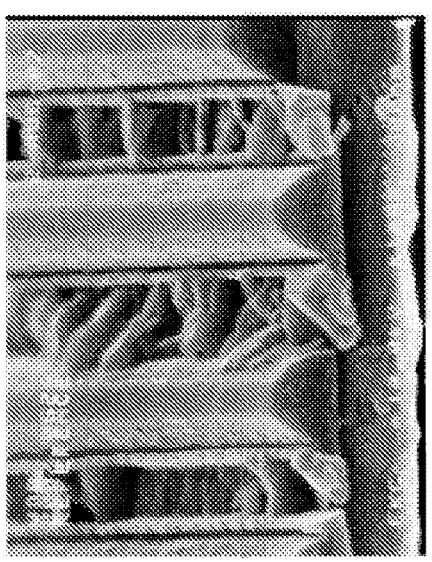
Figure 8L:
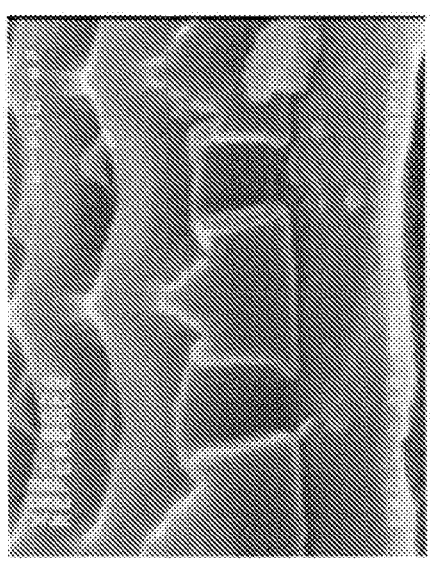

A 5% solution of amidoxime prepared from 3-hydroxypropionitrile in water are evaluated for cleaning performance with aluminum etched wafer. The results can be seen on the SEM micrographs (FIG. 7). The results show that the residue can be removed after processing at 30° C. for 10 minutes. The amidoxime based compositions of the present invention can also be used in cleaning substrate with aluminum as metal wiring devices.

Example 64

Effect in cleaning performance with pH adjustment of N',3-dihydroxypropanimidamide (amidoxime from reaction of hydroxylamine with 3-hydroxypropionitrile).

Glycolic acid was added to various ratios of compositions comprising amidoxime to compare their cleaning effectiveness and compatibility to copper and low k dielectric materials. By adding 10% of glycolic acid to 1% amidoxime solution lowers the pH from 9.14 to 2.58. The pH increases as amidoxime concentration increases to 4.89 with equal concentrations of 10% glycolic acid and 10% amidoxime solution. The pH values of the different mixtures formulation are listed in Table 9 below. The results, as can be viewed in FIG. 8 show that the amidoxime solution of the invention can remove residue at wide pH ranges.

TABLE 9

| CRX08- | | Glycolic Acid (70%) | AO3 | DIW | pH |
| --- | --- | --- | --- | --- | --- |
| 32 | K | 1 | 10 | 89 | 6.83 |
| 33 | L | 5 | 10 | 85 | 5.88 |
| 34 | M | 5 | 1 | 94 | 3.03 |
| 27 | N | 0 | 5 | 95 | 9.27 |
| 35 | O | 10 | 10 | 80 | 4.89 |
| 36 | P | 10 | 1 | 89 | 2.58 |
| 37 | Q | 5 | 5 | 90 | 4.93 |
| 38 | R | 1 | 5 | 94 | 6.39 |
| 26 | S | 0 | 1 | 99 | 9.14 |

TABLE 9-continued

| CRX08- | | Glycolic Acid (70%) | AO3 | DIW | pH |
| --- | --- | --- | --- | --- | --- |
| 39 | T | 10 | 5 | 85 | 3.53 |
| 40 | U | 1 | 1 | 98 | 9.23 |
| 28 | V | 0 | 10 | 90 | 4.18 |

Example 65

U.S. Pat. No. 6,927,176 describes the effectiveness of chelating compounds due to their binding sites as illustrated below. It highlights that there are 6 binding sites for ethylenediaminetetraacetic acid (EDTA).

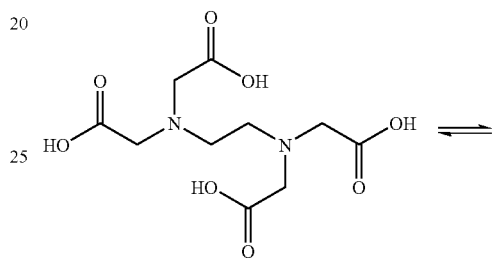

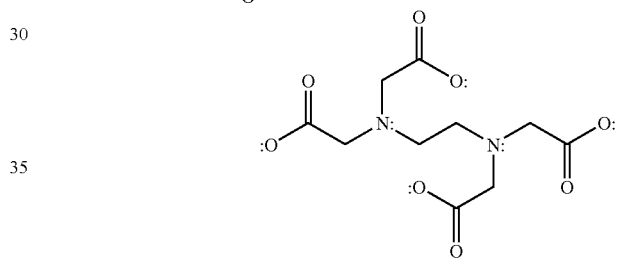

6 binding sites

The same principle applying to a amidoxime from the conversion of a cyanoethylation compound of ethylenediamine results in a total of 14 binding sites, as depicted in the following

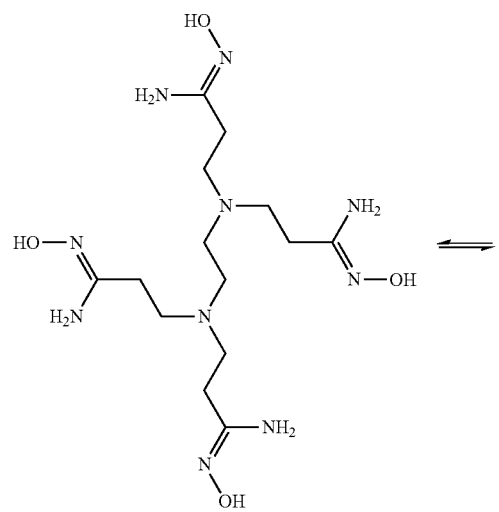

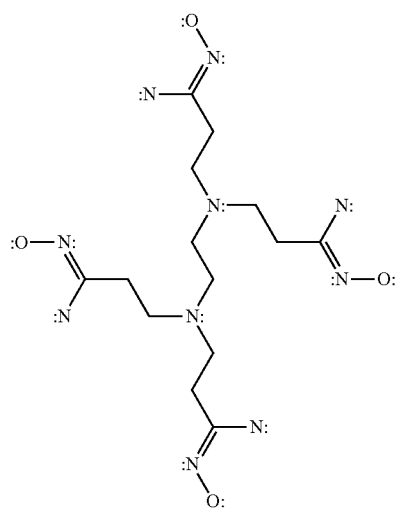

(1,2,3,4,5,6-(hexa-(2-amidoximo)ethoxy)hexane Hexitol 14 binding sites

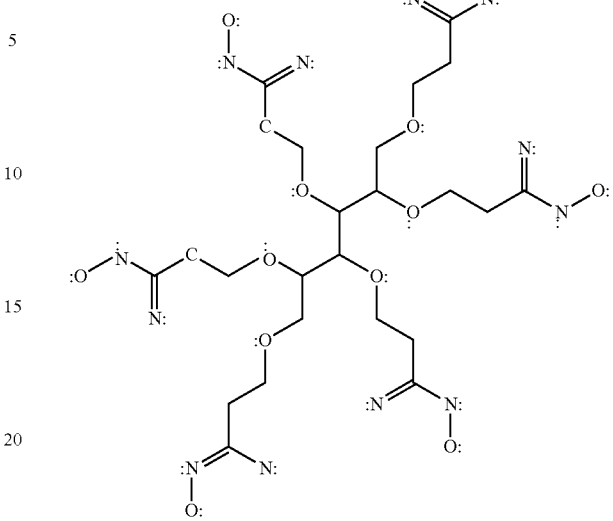

has a total of 18 binding sites. It is more effective in binding metal ions from the etching residues.

The claimed amidoxime chelating agent can substitute in application to replace polyacrylates, carbonates, phosphonates, and gluconates, ethylenediaminetetraacetic acid (EDTA), N,N'-bis(2-hydroxyphenyl)ethylenediiminodiacetic acid (HPED), triethylenetetranitrilohexaacetic acid (TTHA), desferriferrioxamin B,N,N',N"-tris[2-(N-hydroxycarbonyl)ethyl]-1,3,5-benzenetricarboxamide (BAMTPH), and ethylenediaminediorthohydroxyphenylacetic acid (EDDHA).

Cleaning solutions of the present application include compositions comprising:

A) An organic compound with one or more amidoxime functional group.

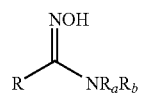

or salts thereof.

Firstly considering the amidoxime functional group itself, in one embodiment, $R_a$ and $R_b$ are independently hydrogen, alkyl, hetero-alkyl, alkyl-aryl, or alkyl-heteroaryl groups. R is independently selected from alkyl, alkyl-aryl, or alkyl-heteroaryl groups. In these two embodiments, chelation of the amidoxime to metal centers may be favored because, in reaction with a metal center, a proton can be lost from $NR_aR_b$ so as to form a nominally covalent bond with the metal center.

In another embodiment, $NR_aR_b$ is further substituted with $R_c$ so the amidoxime has the following chemical formula:

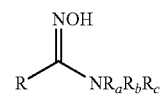

In this case, a counter-ion balances the positive charge on the nitrogen atom. Any counter-ion may be used, for example

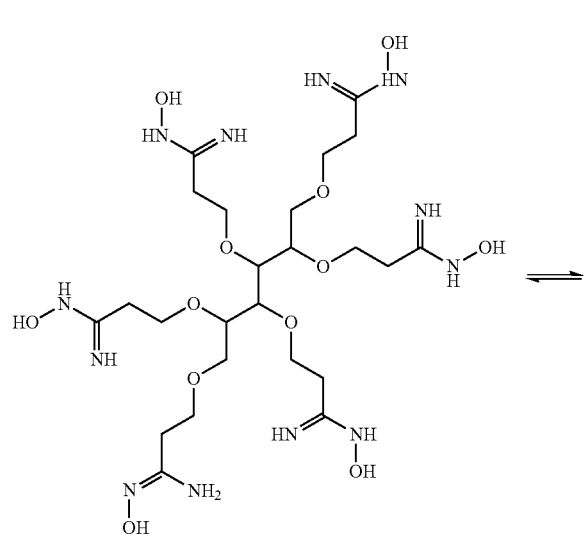

chloride, bromide, iodide, a SO$_4$ ion, a PF$_6$ ion or a ClO$_4$ ion. R$_c$ may be hydrogen, alkyl, alkyl-aryl, or alkyl-heteroaryl group.

It is noted that R$_a$, R$_b$ and/or R$_c$ can join onto one another and/or join onto R so as to form one or more cycles.

It is also noted that amidoxime can exist as their tautomers:

Compounds that exist mainly or wholly in this tautomeric form are included within the scope of the present invention.

Accordingly, the amidoxime functional group includes the following functionalities and their tautomers:

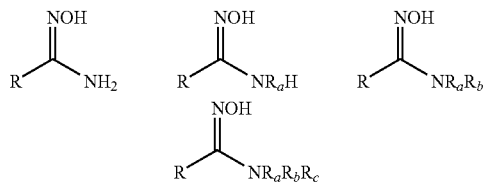

wherein R may be connected to one or more of R$_a$, R$_b$ and R$_c$.

For example, the amidoxime functional group includes within its scope:

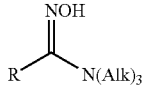

wherein Alk is an alkyl group as defined below. The three alkyl groups may be independently selected or may be the same. In one embodiment, the alkyl group is methyl or ethyl.

Turning now to the R group, R may be an alkyl group (in other words, a group containing carbon and hydrogen). The alkyl group may be completely saturated or may contain unsaturated groups (i.e. may contain alkene and alkyne functional groups, so the term "alkyl" encompasses the terms "alkylene" and "alkylyne" within its scope). The alkyl group may be straight-chained or branched.

The alkyl group may contain any number of carbon and hydrogen atoms. While alkyl groups having a lesser number of carbon atoms tend to be more soluble in polar solvents such as DMSO and water, alkyl groups having a greater number of carbons can have other advantageous properties, for example surfactant properties. Therefore, in one embodiment, the alkyl group contains 1 to 10 carbon atoms, for example the alkyl group is a lower alkyl group containing 1 to 6 carbon atoms. In another embodiment, the alkyl group contains 10 or more carbon atoms, for example 10 to 24 carbon atoms.

The alkyl group may be unsubstituted (i.e. the alkyl group contains only carbon and hydrogen). The unsubstituted alkyl group may be unsaturated or saturated. Examples of possible saturated unsubstituted alkyl groups include methyl, ethyl, n-propyl, sec-propyl, cyclopropyl, n-butyl, sec-butyl, tert-butyl, cyclobutyl, pentyl (branched or unbranched), hexyl (branched or unbranched), heptyl (branched or unbranched), octyl (branched or unbranched), nonyl (branched or unbranched), and decyl (branched or unbranched). Saturated unsubstituted alkyl groups having a greater number of carbons may also be used. Cyclic alkyl groups may also be used, so the alkyl group may comprise, for example, a cyclopropyl group, a cylcobutyl group, a cyclopentyl group, a cyclohexyl group, a cycloheptyl group, a cyclooctyl group, a cylcononyl group and/or a cyclodecyl group. These cyclic alkyl groups may directly append the amidoxime group or may be joined to the amidoxime through one or more carbon atoms.

Examples of amidoxime compounds containing unsubstituted saturated alkyl groups include:

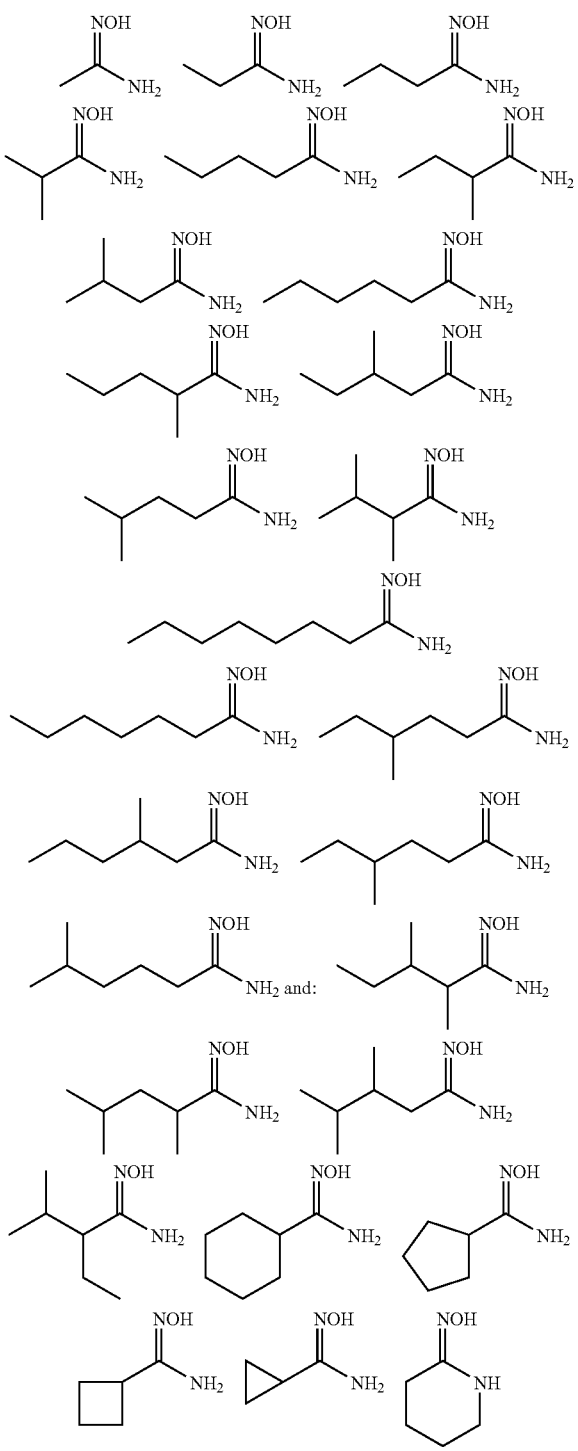

-continued

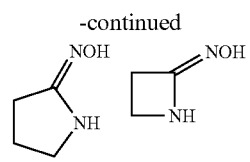

Examples further include:

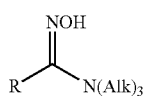

wherein Alk is methyl or ethyl and R is an alkyl group, typically but not necessarily straight chained. R may be for example an alkyl group containing 8 to 25 carbon atoms. If the alkyl group is substituted, it may for example be substituted at the opposite end of the alkyl group to the amidoxime group. For example, it may be substituted antipodally to the amidoxime group by one or more halogens, for example fluorine.

Examples further include alkyl groups appending two or more amidoxime functional groups.

For example, the amidoxime may be:

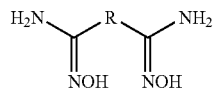

where R is independently selected from alkylene, heteroalkylene, arylene, heteroarylene, alkylene-heteroaryl, or alkylene-aryl group. For example, R may be a straight chained alkyl group, such as an unsubstituted straight chained alkyl group. Examples of suitable groups include methyl, ethyl, propyl, butyl, pentyl, hexyl, heptyl, octyl, nonyl and decyl.

Specific examples of unsubstituted saturated alkyl amidoximes are:

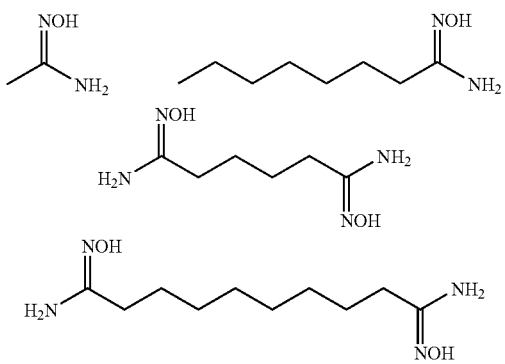

If the alkyl group is unsaturated, it may be any of the groups just listed except for having one or more unsaturated carbon-carbon bonds (so it may contain one or more alkene and/or alkyne groups). These unsaturated group(s) may optionally be in conjugation with the amidoxime group. A specific example of an unsubstituted unsaturated alkyl amidoxime molecules is:

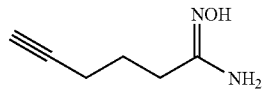

The alkyl group may also be substituted with one or more hetero-atoms or group of hetero-atoms. If more than one hetero-substituent is present, the substituents are independently selected from one another unless they form a part of a particular functional group (e.g. an amide group). (Groups containing hetero-atoms joined to carbon atoms are contained within the scope of the term "heteroalklyl" as discussed below). One or more of the substituents may be a halogen atom, including fluorine, chlorine, bromine or iodine, —OH, =O, —NH$_2$, =NH, —NHOH, =NOH, —OPO(OH)$_2$, —SH, =S or —SO$_2$OH. In one embodiment, the substituent is an oxime group (=NOH). The alkyl group may also be itself substituted with one or more amidoxime functional groups.

If the alkyl group is substituted with =O, the alkyl group may comprise an aldehyde, a ketone, a carboxylic acid or an amide. Preferably, there is an enolizable hydrogen adjacent to the =O, =NH or =NOH (i.e. there is a hydrogen in the alpha position to the carbonyl). The alkyl group may comprise the following functionality: —(CZ$_1$)—CH—(CZ$_2$)—, wherein Z$_1$ and Z$_2$ are independently selected from O, NH and NOH. The CH in this group is further substituted with hydrogen or an alkyl group or joined to the amidoxime functional group.

Thus, an alkyl group appending an amidoxime group may simply be substituted with, for example one or more independently-selected halogens, for example fluorine, chlorine, bromine or iodine. In one embodiment, the halogens are substituted at the antipodal (i.e. opposite) end of the alkyl group to the amidoxime group. This can for example provide surfactant activity, in particular for example if the halogen is fluorine.

A specific example of an amidoxime group substituted with a substituted alkyl group is:

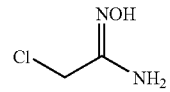

Details of the characterization of this molecule are given in the examples.

Compounds that are substituted in a β position are conveniently synthesized from readily-available starting materials.

Examples of such compounds include:

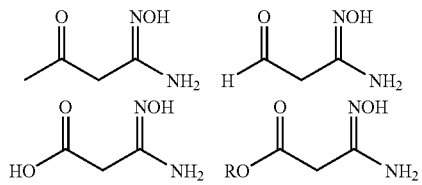

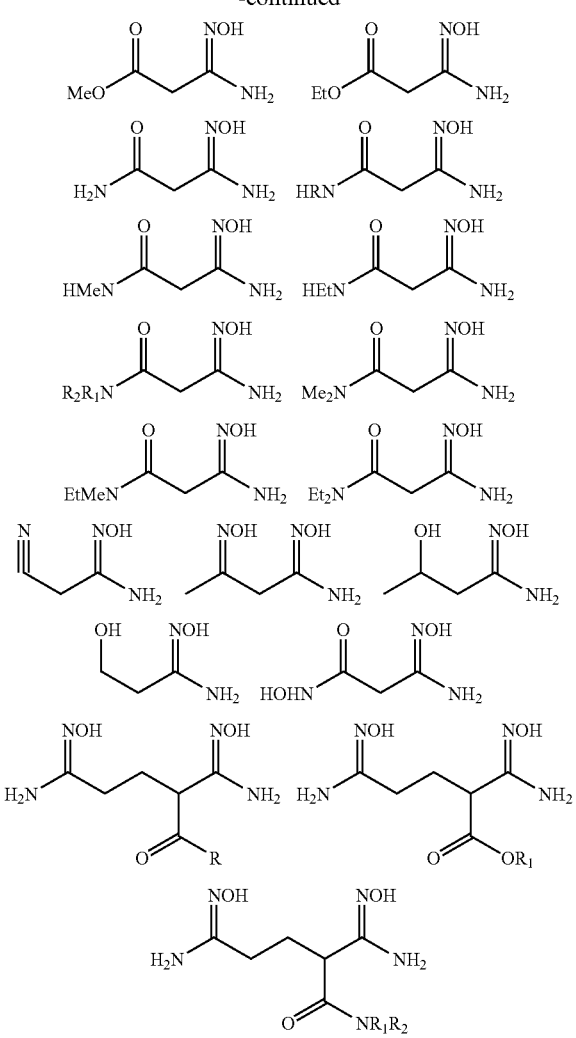

wherein $R_1$ and $R_2$ are independently-selected alkyl groups or hydrogen atoms.

Specific examples of substituted alkyl amidoxime molecules are:

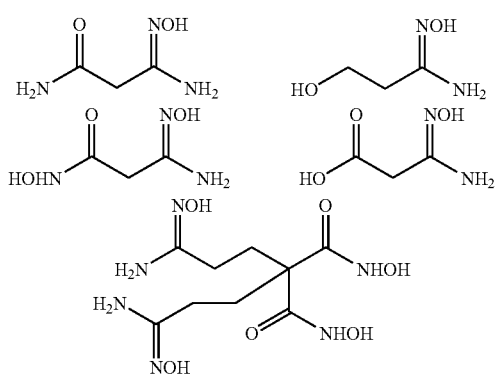

It should be noted that some of these molecules can exist as different isomers. For example:

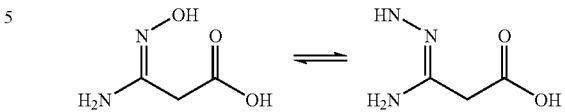

The different isomers can be differentiated by carbon-13 NMR. Characterization of this isomer is provided in the example.

R may be a heteroalkyl group. The term heteroalkyl refers to optionally a first alkyl group connected to one or more independently-selected hetero-atoms or groups of hetero-atoms, which itself is substituted with one or more independently-selected groups containing one or more carbon atoms. The presence of the first alkyl group is optional because the amidoxime group may be attached directly to the one or more heteroatoms. As an illustrative example, an alkyl group substituted with an ether group is a heteroalkyl group because the alkyl group is substituted with oxygen, which itself is substituted with a second alkyl group. Alternatively, an —O—CH$_3$ group is an example of a heteroalkyl group.

When R is a heteroalkyl group, the amidoxime may have the following chemical structure:

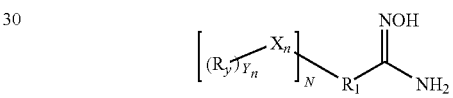

where "n" varies from 1 to N and y varies from 1 to $Y_n$; N varies from 0 to 3; $Y_n$ varies from 0 to 5. In this formula, $R_1$ is independently-selected alkylene groups; $R_y$ is independently selected from alkyl, or hetero-alkyl groups, or adjoins $R_1$ so to form a heterocycle with the directly appending $X_n$. $R_1$ may also be a direct bond, so that the amidoxime group is connected directly to the one or more heteroatoms. $X_n$ is a heteroatom or a group of heteroatoms selected from boron, nitrogen, oxygen, silicon, phosphorus and sulphur. Each heteroatom or group of heteroatoms and each alkyl group is independently selected from one another. The above formula includes an amidoxime group directly bearing an alkyl group. The alkyl group is substituted with N independently-selected heteroatoms or groups of heteroatoms. Each heteroatom or group of heteroatoms is itself substituted with one or more independently-selected alkyl groups or hetero-alkyl groups.

X is one or more hetero-atoms. For example, X may be or may comprise boron, nitrogen, oxygen, silicon, phosphorus or sulphur. In one embodiment, In one embodiment, X is oxygen. In this case, X may be part of an ether group (—O—), an ester (—O—CO—), —O—CO—O—, —O—CO—NH—, —O—CO—NR$_2$—, —O—CNH—, —O—CNH—O—, —O—CNH—NH—, —O—CNH—NR$_2$—, —O—CNOH—, —O—CNOH—O—, —O—CNOH—NH— or —O—CNOH—NR$_2$—, wherein R$_2$ is independently selected alkyl group, hetero-alkyl group, or hetero-aryl group. In another embodiment, X is a nitrogen atom. In this case, X may be part of one of the following groups: —NR$_2$H, —NR$_2$—, —NR$_2$R$_3$— (with an appropriate counter-ion), —NHNH—, —NH—CO—, —NR2-CO—, —NH—CO—O—, —NH—CO—NH—, —NH—CO—NR$_2$—, —NR$_2$—CO—NH—, —NR$_2$—CO—NR$_3$—, —NH—CNH—, —NR2-CNH—, —NH—CNH—O—, —NH—CNH—

NH—, —NH—CNH—NR$_2$—, —NR$_2$—CNH—NH—, —NR$_2$—CNH—NR$_3$—, —NH—CNOH—, —NR2-CNOH—, —NH—CNOH—O—, —NH—CNOH—NH—, —NH—CNOH—NR$_2$—, —NR$_2$—CNOH—NH—, —NR$_2$—CNOH—NR$_3$—. R$_2$ to R$_3$ are independently selected alkyl groups, hetero-alkyl groups, or hetero-aryl groups, wherein the heteroalkyl group and hetero-aryl group may be unsubstituted or substituted with one or more heteroatoms or group of heteroatoms or itself be substituted with another heteroalkyl group. If more than one hetero-substituent is present, the substituents are independently selected from one another unless they form a part of a particular functional group (e.g., an amide group).

In another embodiment, X comprises boron. In this case, X may also comprise oxygen. In another embodiment, X comprises phosphorus. In this case, X may also comprise oxygen, for example in an —OPO(OH)(OR$_2$) group or an —OPO(OR$_2$)(OR$_3$) group. In another embodiment, X comprises sulphur, for example as a thiol ether or as a sulphone.

The term heteroalkyl also includes within its scope cyclic alkyl groups containing a heteroatom. If X is N or O, examples of such groups include a lactone, lactam or lactim. Further examples of heteroalkyl groups include azetidines, oxetane, thietane, dithietane, dihydrofuran, tetrahydrofuran, dihydrothiophene, tetrahydrothiophene, piperidine, pyroline, pyrolidine, tetrahydropyran, dihydropyran, thiane, piperazine, oxazine, dithiane, dioxane and morpholine. These cyclic groups may be directly joined to the amidoxime group or may be joined to the amidoxime group through an alkyl group.

The heteroalkyl group may be unsubstituted or substituted with one or more hetero-atoms or group of hetero-atoms or itself be substituted with another heteroalkyl group. If more than one hetero-substituent is present, the substituents are independently selected from one another unless they form a part of a particular functional group (e.g. an amide group). One or more of the substituents may be a halogen atom, including fluorine, chlorine, bromine or iodine, —OH, =O, —NH$_2$, =NH, —NHOH, =NOH, —OPO(OH)$_2$, —SH, =S or —SO$_2$OH. In one embodiment, the substituent is an oxime group (=NOH). The heteroalkyl group may also be itself substituted with one or more amidoxime functional groups.

If the heteroalkyl group is substituted with =O, the heteroalkyl group may comprise an aldehyde, a ketone, a carboxylic acid or an amide. Preferably, there is an enolizable hydrogen adjacent to the =O, =NH or =NOH (i.e. there is a hydrogen in the alpha position to the carbonyl). The heteroalkyl group may comprise the following functionality: —(CZ$_1$)—CH—(CZ$_2$)—, wherein Z$_1$ and Z$_2$ are independently selected from O, NH and NOH. The CH in this group is further substituted with hydrogen or an alkyl group or heteroalkyl group or joined to the amidoxime functional group.

Amines are particularly versatile functional groups for use in the present invention, in part because of their ease of preparation. For example, by using acrylonitrile as described later, a variety of functionalized amines can be synthesized. Examples include:

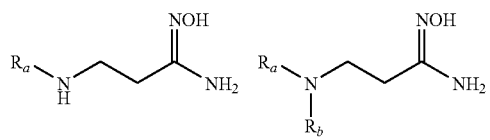

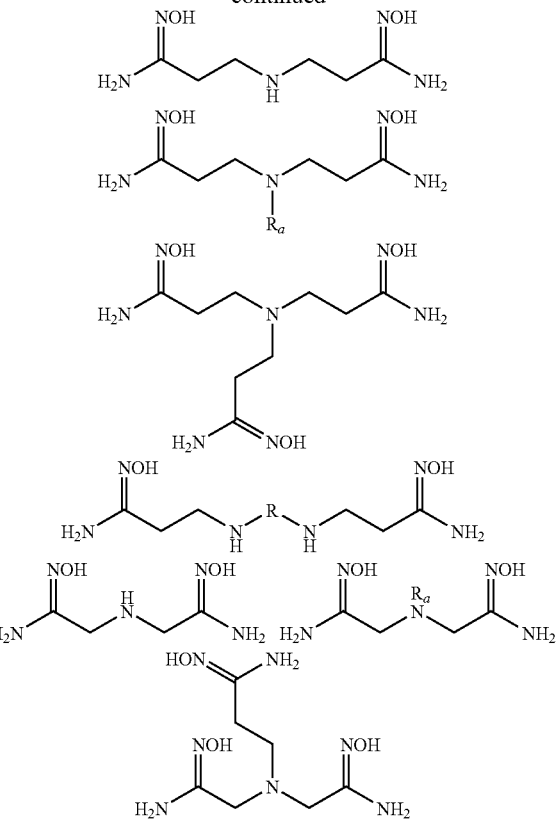

where R$_a$ and R$_b$ are independently-selected hydrogen, alkyl, hetero-alkyl, aryl, hetero-aryl, alkyl-aryl, or alkyl-heteroaryl groups.

R may itself be an alkylene group or a heteroatom or group of heteroatoms. The heteroatoms may be unsubstituted or substituted with one or more alkyl groups.

One or more of the hetero-atom substituents may be for example, a halogen atom, including fluorine, chlorine, bromine or iodine, —OH, =O, —NH$_2$, =NH, —NHOH, =NOH, —OPO(OH)$_2$, —SH, =S or —SO$_2$OH. In one embodiment, the substituent is an oxime group (=NOH).

R may be an aryl group. The term "aryl" refers to a group comprising an aromatic cycle. A particular example of an aryl substituent is a phenyl group.

The aryl group may be unsubstituted. A specific example of an amidoxime bearing an unsubstituted aryl is:

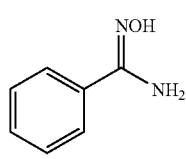

The aryl group may also be substituted with one or more alkyl groups, heteroalkyl groups or heteroatom substituents. If more than one substituent is present, the substituents are independently selected from one another.

Specific examples of amidoximes comprising a heteroalkyl group include:

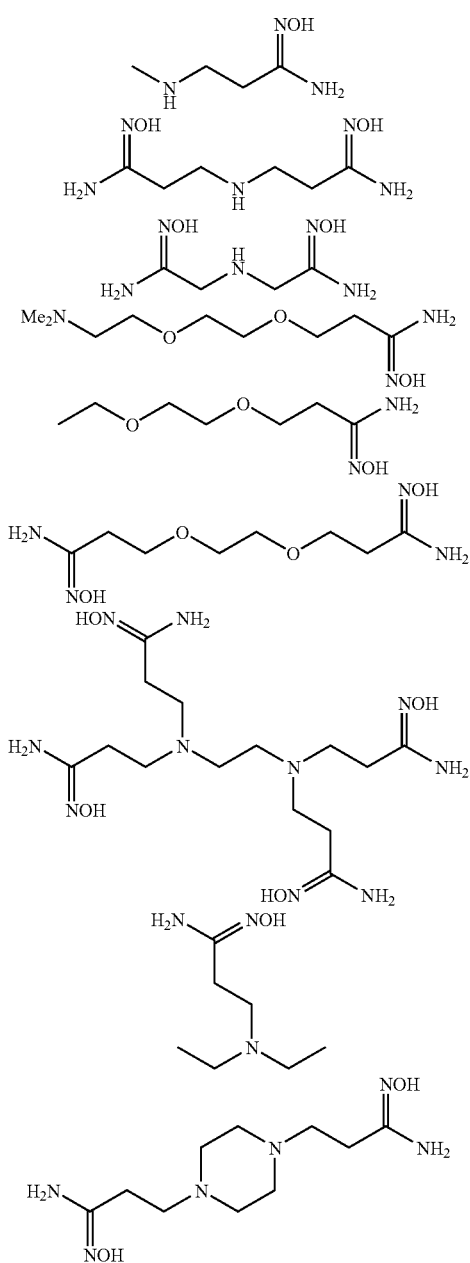

Experimental details of these molecules are given in the examples.

The one or more alkyl groups are the alkyl groups defined previously and the one or more heteroalkyl groups are the heteroalkyl groups defined previously.

Specific examples of substituted aryl amidoxime molecules are:

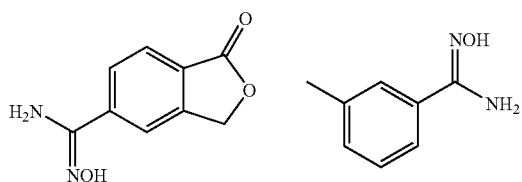

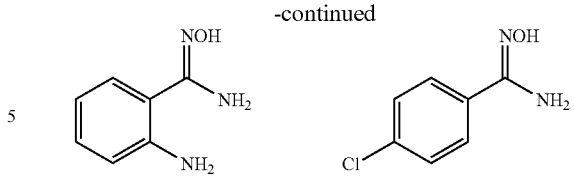

R may also be hetero-aryl. The term hetero-aryl refers to an aryl group containing one or more hetero-atoms in its aromatic cycle. The one or more hetero-atoms are independently-selected from, for example, boron, nitrogen, oxygen, silicon, phosphorus and sulfur. Examples of hetero-aryl groups include pyrrole, furan, thiophene, pyridine, melamine, pyran, thiine, diazine and thiazine.

The hetero-aryl group may be unsubstituted. A specific example of an unsubstituted heteroaryl amidoxime molecule is:

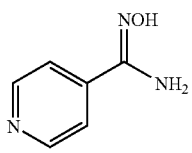

It should be noted that the heteroaryl group may be attached to the amidoxime group through its heteroatom, for example (the following molecule being accompanied by a counter anion):

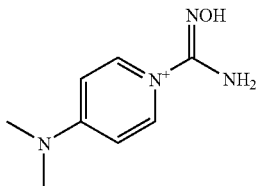

The hetero-aryl group may be substituted with one or more alkyl groups, heteroalkyl groups or hetero-atom substituents. If more than one substituent is present, the substituents are independently selected from one another.

One or more of the hetero-atom substituents may be, for example, a halogen atom, including fluorine, chlorine, bromine or iodine, —OH, =O, —NH$_2$, =NH, —NHOH, =NOH, —OPO(OH)$_2$, —SH, =S or —SO$_2$OH. The one or more alkyl groups are the alkyl groups defined previously and the one or more heteroalkyl groups are the heteroalkyl groups defined previously.

Within the scope of the term aryl are alkyl-aryl groups. The term "alkyl-aryl" refers to an amidoxime group bearing (i.e. directly joined to) an alkyl group. The alkyl group is then itself substituted with an aryl group. Correspondingly, within the scope of the term heteroaryl are alkyl-heteroaryl groups.

The alkyl group may be any alkyl group previously defined. The aryl/heteroaryl group may also be any aryl group previously defined.

Both the alkyl group and the aryl/heteroalkyl group may be unsubstituted. Specific examples of unsubstituted alkyl-aryl amidoxime molecules are:

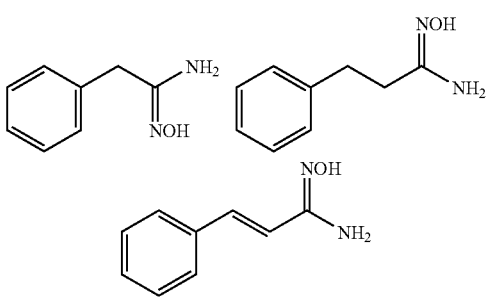

Alternatively, one or both of the alkyl group and the aryl/heteroalkyl group may be substituted. If the alkyl group is substituted, it may be substituted with one or more hetero-atoms or groups containing hetero-atoms. If the aryl/heteroalkyl group is substituted, it may be substituted with one or more alkyl groups, heteroalkyl groups or hetero-atom substituents. If more than one substituent is present, the substituents are independently selected from one another.

One or more of the hetero-atom substituents may be, for example, a halogen atom, including fluorine, chlorine, bromine or iodine, —OH, =O, —NH$_2$, =NH, —NHOH, =NOH, —OPO(OH)$_2$, —SH, =S or —SO$_2$OH. In one embodiment, the substituent is an oxime group (=NOH). The alkyl group may also be itself substituted with one or more amidoxime functional groups.

If the alkyl group is substituted with =O, the alkyl group may comprise an aldehyde, a ketone, a carboxylic acid or an amide. Preferably, there is an enolizable hydrogen adjacent to the =O, =NH or =NOH (i.e. there is a hydrogen in the alpha position to the carbonyl). The alkyl group may comprise the following functionality: —(CZ$_1$)—CH—(CZ$_2$)—, wherein Z$_1$ and Z$_2$ are independently selected from O, NH and NOH. The CH in this group is further substituted with hydrogen or an alkyl group or heteroalkyl group or joined to the amidoxime functional group.

Within the scope of the term aryl are also heteroalkyl-aryl groups. The term "heteroalkyl-aryl" refers to an amidoxime group bearing (i.e. directly joined to) an heteroalkyl group. The heteroalkyl group is then itself substituted with an aryl group. Correspondingly, within the scope of the term heteroaryl are also heteroalkyl-aryl groups The heteroalkyl group may be any alkyl group previously defined. The aryl/heteroaryl group may also be any aryl group previously defined.

Both the heteroalkyl group and the aryl/heteroaryl group may be unsubstituted. Alternatively, one or both of the heteroalkyl group and the aryl/heteroaryl group may be substituted. If the heteroalkyl group is substituted, it may be substituted with one or more hetero-atoms or groups containing hetero-atoms. If the aryl/heteroaryl group is substituted, it may be substituted with one or more alkyl groups, heteroalkyl groups or hetero-atom substituents. If more than one substituent is present, the substituents are independently selected from one another.

One or more of the hetero-atom substituents may be, for example, a halogen atom, including fluorine, chlorine, bromine or iodine, —OH, =O, —NH$_2$, =NH, —NHOH, =NOH, —OPO(OH)$_2$, —SH, =S or —SO$_2$OH. In one embodiment, the substituent is an oxime group (=NOH). The alkyl group may also be itself substituted with one or more amidoxime functional groups.

If the heteroalkyl group is substituted with =O, the heteroalkyl group may comprise an aldehyde, a ketone, a carboxylic acid or an amide. Preferably, there is an enolizable hydrogen adjacent to the =O, =NH or =NOH (i.e. there is a hydrogen in the alpha position to the carbonyl). The heteroalkyl group may comprise the following functionality: —(CZ$_1$)—CH—(CZ$_2$)—, wherein Z$_1$ and Z$_2$ are independently selected from O, NH and NOH. The CH in this group is further substituted with hydrogen or an alkyl group or heteroalkyl group or joined to the amidoxime functional group.

A preferred substituent to any type of R group is a tetra-valent nitrogen. In other words, any of the above groups may be substituted with —NR$_a$R$_b$R$_c$R$_d$ where R$_a$ to R$_d$ are independently-selected R groups as defined herein. In one embodiment, R$_a$ to R$_d$ are unsubstituted saturated alkyl groups having 1 to 6 carbon atoms. For example, one or more of (for example all of) R$_a$ to R$_d$ are methyl and/or ethyl. With this substituent, the tetra-valent nitrogen is preferably substituted in an antipodal position to the amidoxime group. For example, if R is a straight-chained unsubstituted saturated alkyl group of the form (CH$_2$)$_n$, then the tetra-valent nitrogen is at one end of the alkyl group and the amidoxime group is at the other end. In this embodiment, n is preferably 1, 2, 3, 4, 5 or 6.

In one embodiment, the present invention provides an amidoxime molecule that contains only one amidoxime functional group. In another embodiment, the present invention provides an amidoxime molecule containing two or more amidoxime functional groups. In fact, a large number of functional groups can be contained in a single molecule, for example if a polymer has repeating units having appending amidoxime functional groups. Examples of amidoxime compounds that contain more than one amidoxime functional groups have been described previously throughout the specification.

Amidoximes may be conveniently prepared from nitrile-containing molecules as follows:

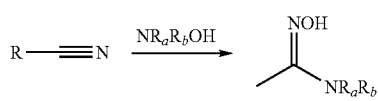

Typically, to prepare a molecule having R$_a$=R$_b$=H, hydroxylamine is used. If one or both of R$_a$ and R$_b$ in the desired amidoxime is not hydrogen, the amidoxime can be prepared either using the corresponding hydroxylamine or by further reacting the amidoxime once it has been formed. This may, for example, occur by intra-molecular reaction of the amidoxime.

Accordingly, amidoxime molecules containing more than one amidoxime functional groups can be conveniently prepared from precursors having more than one nitrile group. Specific amidoxime molecules having two amidoxime functional groups which have been synthesised in this way include:

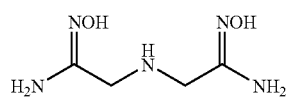

-continued

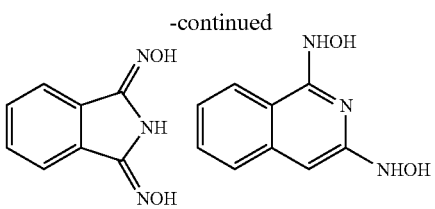

One preferred method of forming the nitrile precursors to the amidoximes of the present invention is by nucleophilic substitution of a leaving group with a nucleophile. Nucleophiles are well known to the person skilled in the art, see for example the Guidebook to Mechanism in Organic Chemistry by Peter Sykes. Examples of suitable nucleophiles are molecules having an OH, SH, NH— or a suitable CH— group, for example one having a low $pK_a$ (for example below about 15). For OH, SH and NH—, the hydrogen is optionally removed before acting as a nucleophile in order to augment its nucleophilicity. For CH—, they hydrogen is usually removed with a suitable base so that it can act as a nucleophile.

Leaving groups are well known to the person skilled in the art, see for example the Guidebook to Mechanism in Organic Chemistry by Peter Sykes. Examples of suitable leaving groups include Cl, Br, I, O-tosyl, O-mesolate and other leaving group well known to the person skilled in the art. The ability to act as a leaving group may be enhanced by adding an acid, either protic or Lewis.

For example, a nitrile can be formed accordingly:

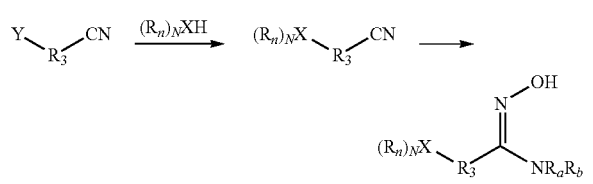

In this example, $R_3$ is independently selected from alkylene, heteroalkylene, arylene, heteroarylene, alkylene-heteroaryl, or alkylene-aryl group. $R_n$ is independently selected from hydrogen, alkyl, heteroalkyl, aryl, heteroaryl, alkyl-heteroaryl, or alkyl-aryl group. X may be any a nucleophile selected from O, S, N, and suitable C. N varies from 1 to 3. Y is a leaving group.

For XH=OH, the OH may be an alcohol group or may, for example, be part of a hemiacetal or carboxylic acid group.

For X=NH—, the NH may be part of a primary or secondary amine (i.e. $NH_2$ or $NHR_5$), NH—CO—, NH—CNH—, NH—CHOH— or —$NHNR_5R_6$ (wherein $R_5$ and $R_6$ are independently-selected alkyl, heteroalkyl, aryl, heteroaryl or alkyl-aryl).

For XH=CH—, wherein a stabilized anion may be formed. XH may be selected from but not limited to —$CHCO—R_5$, —CHCOOH, —CHCN, —CHCO—$OR_5$, —CHCO—$NR_5R_6$, —CHCNH—$R_5$, —CHCNH—$OR_5$, —CHCNH—$NR_5R_6$, —CHCNOH—$R_5$, —CHCNOH—$OR_5$ and —CHCNOH—$NR_5R_6$.

A preferred example is:

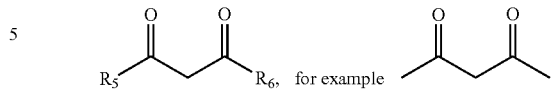

wherein $R_5$ and $R_6$ are independently-selected alkyl, heteroalkyl, aryl, heteroaryl or alkyl-aryl or a heteroatom optionally substituted with any of these groups. In one embodiment, either one or both of $R_5$ and $R_6$ are oxygen or nitrogen atoms optionally independently substituted with alkyl, heteroalkyl, aryl, heteroaryl or alkyl-aryl groups, for example:

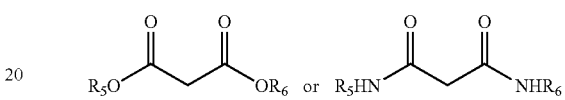

The compounds may also be formed by any type of nucleophilic reaction using any of the above nucleophiles.

The inventors have found one reaction in particular to be particularly versatile for producing nitrile precursors for amidoxime compounds:

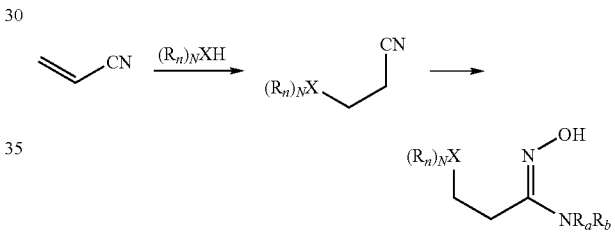

In this example, $R_3$ is independently selected from alkylene, heteroalkylene, arylene, heteroarylene, alkylene-heteroaryl, or alkylene-aryl group. $R_n$ is independently selected from hydrogen, alkyl, heteroalkyl, aryl, heteroaryl, alkyl-heteroaryl, or alkyl-aryl group. X may be any a nucleophile selected from O, S, N, and suitable C. N varies from 1 to 3. Y is a leaving group.

For example, the acrylonitrile may have the following formula:

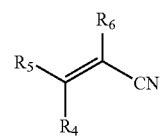

wherein $R_4$, $R_5$ and $R_6$ are independently selected from hydrogen, heteteroatoms, heterogroups, alkyl, heteroalkyl, aryl and heteroaryl.

Accordingly, the present invention also relates to amidoxime compounds for use in semiconductor processing prepared by the addition of a nucleophile to an unsubstituted or substituted acrylonitrile. Once nucleophilic addition to the acrylonitrile has occurred, the intermediate can be function alized using standard chemistry known to the person skilled in the art:

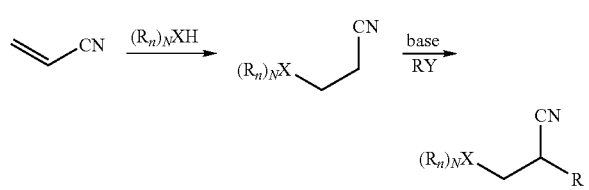

where Y is a leaving group as previously defined.

Examples of simple nucleophiles with show the adaptability of this reaction include:

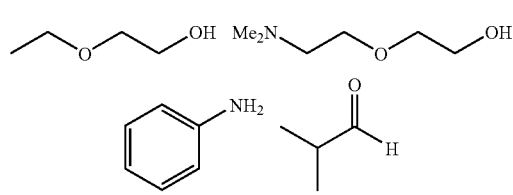

This reaction is particularly versatile, especially when applied to the synthesis of multidentate amidoxime compounds (i.e. molecules containing two or more amidoxime functional groups). For example, it can be used to functionalize compounds having two or more NH groups. In one example, the reaction can be used to functionalize a molecule containing two or more primary amines.

For example:

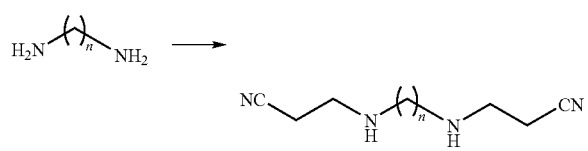

where n is 1 or more, for example 1 to 24.

Further functionalization of a primary amine is possible For example, a tetradentate amidoxime, for example the functional equivalent of EDTA, may be conveniently formed:

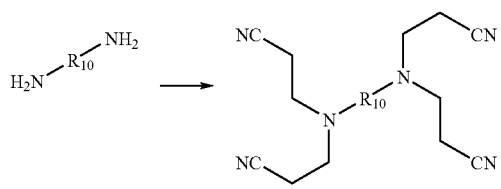

wherein $R_{10}$ is alkyl, heteroalkyl, aryl or heteroaryl. In an alternative conceived embodiment, $R_{10}$ is nothing: the starting material is hydrazine. An example of this reaction where $R_{10}$ is $CH_2CH_2$ is provided in the examples.

In a related embodiment, a molecule having two or more secondary amines can be functionized:

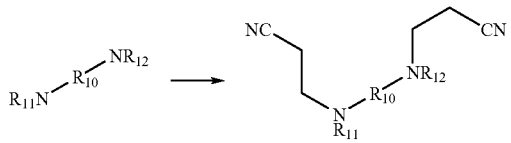

where $R_{10}$ is defined as above and $R_{11}$ and $R_{12}$ are independently selected alkyl, heteroalkyl, aryl or heteroaryl. Again, an embodiment where $R_{10}$ is nothing is contemplated.

For example, the secondary amines can be part of a cyclic system:

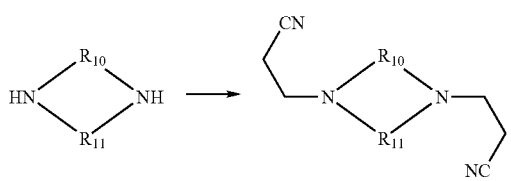

where $R_{10}$ and $R_{11}$ are defined above. For example, common solvent used in semiconductor processing can be functionalized with amidoxime functional groups. For example:

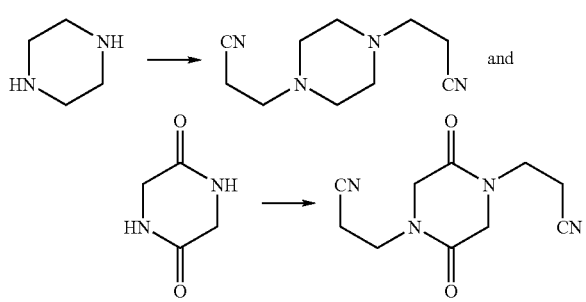

Details of theses reactions are contained in the examples.

Similarly, an oxygen nucleophile may be used to provide nitrile precursors to amidoxime molecules. In one embodiment, the nucleophile is an alcohol:

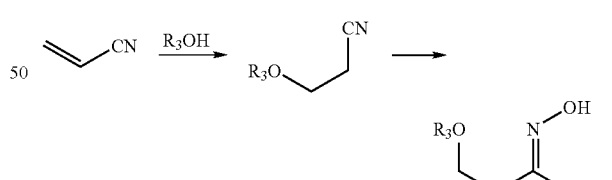

where $R_3$ is alkyl, heteroalkyl, aryl or heteroaryl.

For example, polyalcohol compounds may be functionalized. Poly-alcohols are molecules that contain more than one alcohol functional group. As an example, the following is a polyalcohol:

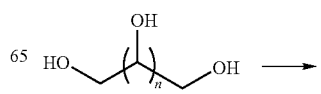

-continued

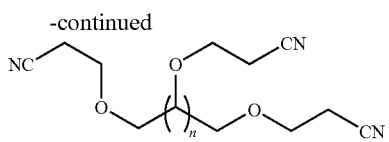

wherein n is 0 or more, for example 0 to 24. In one example, n is 0 (glycol). In another example, n is 6 (sorbitol).

In another example, the polyalcohol forms part of a polymer. For example, reaction may be carried out with a polymer comprising polyethylene oxide. For example, the polymer may contain just ethylene oxide units, or may comprise polyethylene oxide units as a copolymer (i.e. with one or more other monomer units). For example, the polymer may be a block copolymer comprising polyethylene oxide. For copolymers, especially block copolymers, the polymer may comprise a monomer unit not containing alcohol units. For example, the polymer may comprise blocks of polyethylene glycol (PEG). Copolymer (e.g. block copolymers) of polyethylene oxide and polyethylene glycol may be advantageous because the surfactant properties of the blocks of polyethylene glycol can be used and controlled.

Carbon nucleophiles can also be used. Many carbon nucleophiles are known in the art. For example, an enol group can act as a nucleophile. Harder carbon-based nucleophiles can be generated by deprotonation of a carbon. While many carbons bearing a proton can be deprotonated if a strong enough base is provided, it is often more convenient to be able to use a weak base to generate a carbon nucleophile, for example NaOEt or LDA. As a result, in one embodiment, a CH group having a $pK_a$ of 20 or less, for example 15 or less, is deprotonated to form the carbon-based nucleophile.

An example of a suitable carbon-based nucleophile is a molecule having the β-diketone functionality (it being understood that the term β-diketone also covers aldehydes, esters, amides and other C=O containing functional groups. Furthermore, one or both of the C=O groups may be replaced by NH or NOH). For example:

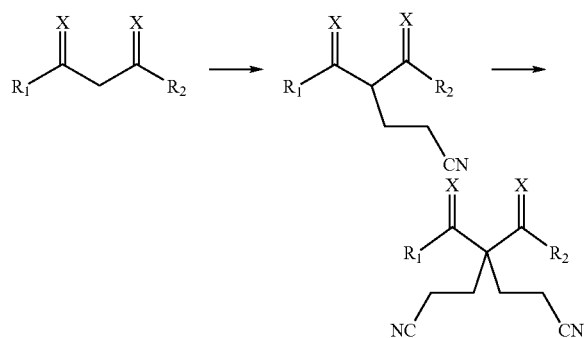

where $R_1$ and $R_2$ are independently selected alkyl groups, heteroalkyl groups, aryl groups, heteroaryl groups and heteroatoms.

A specific example of this reaction sequence where $R_1$=$R_2$=OEt is given in the examples.

Nitrile groups themselves act to lower the $pK_a$ of hydrogens in the alpha position. This in fact means that sometimes control of reaction conditions is preferably used to prevent a cyano compound, once formed by reaction of a nucleophile with acrylonitrile, from deprotonating at its alpha position and reacting with a second acrylonitrile group. For example, selection of base and reaction conditions (e.g. temperature) can be used to prevent this secondary reaction. However, this observation can be taken advantage of to functionalize molecules that already contain one or more nitrile functionalities. For example, the following reaction occurs in basic conditions:

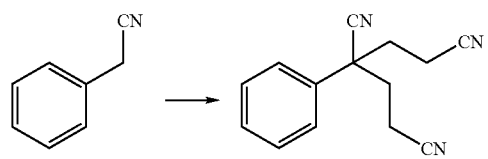

The cyanoethylation process usually requires a strong base as a catalyst. Most often such bases are alkali metal hydroxides such as, e.g., sodium oxide, lithium hydroxide, sodium hydroxide and potassium hydroxide. These metals, in turn, can exist as impurities in the amidoxime compound solution. The existence of such metals in the amidoxime compound solution is not acceptable for use in electronic, and more specifically, semiconductor manufacturing processes and as stabilizer for hydroxylamine freebase and other radical sensitive reaction chemicals.

Preferred alkali bases are metal ion free organic ammonium hydroxide compound, such as tetramethylammonium hydroxide, trimethylbenzylammonium hydroxide and the like.

Water

Within the scope of this invention, water may be introduced into the composition essentially only in chemically and/or physically bound form or as a constituent of the raw materials or compounds.

The composition further comprises chemicals from one or more groups selecting from the following:

Solvent—from about 1% to 99% by Weight.

The compositions of the present invention also include 0% to about 99% by weight and more typically about 1% to about 80% by weight of a water miscible organic solvent where the solvent(s) is/are preferably chosen from the group of water miscible organic solvents. Examples of water miscible organic solvents include, but are not limited to, dimethylacetamide (DMAC), N-methyl pyrrolidinone (NMP), N-Ethyl pyrrolidone (NEP), N-Hydroxyethyl Pyrrolidone (HEP), N-Cyclohexyl Pyrrolidone (CHP) dimethylsulfoxide (DMSO), Sulfolane, dimethylformamide (DMF), N-methylformamide (NMF), formamide, Monoethanol amine (MEA), Diglycolamine, dimethyl-2-piperidone (DMPD), morpholine, N-morpholine-N-Oxide (NMNO), imidazolidinones such as 1,3-dimethyl-2-imidazolidinone, 1,3-diethyl-2-imidazolidinone, or 1,3-diisopropyl-2-imidazolidinone; lactones such as gamma-butyrolactone or delta-valerolactone; tetrahydrofurfuryl alcohol, cyclohexanol, cyclohexanone, polyethylene glycols and polypropylene glycols, glycerol, glycerol carbonate, triacetin, ethylene glycol, propylene glycol, propylene carbonate, hexylene glycol, ethanol and n-propanol and/or isopropanol, diglycol, propyl or butyl diglycol, hexylene glycol, ethylene glycol methyl ether, ethylene glycol ethyl ether, ethylene glycol propyl ether, ethylene glycol mono-n-butyl ether, diethylene glycol methyl ether, diethylene glycol ethyl ether, propylene glycol methyl, ethyl or propyl ether, dipropylene glycol methyl or ethyl ether, methoxy, ethoxy or butoxy triglycol, I-butoxyethoxy-2-propanol, 3-methyl-3-methoxybutanol, propylene glycol t-butyl ether, and other amides, alcohols or pyrrolidones, ketones, sulfoxides, or multifunctional compounds, such as hydroxyamides or aminoalcohols, and mixtures of these solvents thereof. The preferred solvents, when employed, are dimethyl acetamide and dimethyl-2-piperidone, dimethylsulfoxide and N-methylpyrrolidinone, diglycolamine, and monoethanolamine.

Acids—from about 0.001% to 15% by Weight

Possible acids are either inorganic acids or organic acids provided these are compatible with the other ingredients. Inorganic acids include hydrochloric acid, hydrofluoric acid, sulfuric acid, phosphoric acid, phosphorous acid, hypophosphorous acid, phosphonic acid, nitric acid, and the like.

Organic acids include monomeric and/or polymeric organic acids from the groups of unbranched saturated or unsaturated monocarboxylic acids, of branched saturated or unsaturated monocarboxylic acids, of saturated and unsaturated dicarboxylic acids, of aromatic mono-, di- and tricarboxylic acids, of sugar acids, of hydroxy acids, of oxo acids, of amino acids and/or of polymeric carboxylic acids are preferred.

From the group of unbranched saturated or unsaturated monocarboxylic acids: methanoic acid (formic acid), ethanoic acid (acetic acid), propanoic acid (propionic acid), pentanoic acid (valeric acid), hexanoic acid (caproic acid), heptanoic acid (enanthic acid), octanoic acid (caprylic acid), nonanoic acid (pelargonic acid), decanoic acid (capric acid), undecanoic acid, dodecanoic acid (lauric acid), tridecanoic acid, tetradecanoic acid (myristic acid), pentadecanoic acid, hexadecanoic acid (palmitic acid), heptadecanoic acid (margaric acid), octadecanoic acid (stearic acid), eicosanoic acid (arachidic acid), docosanoic acid (behenic acid), tetracosanoic acid (lignoceric acid), hexacosanoic acid (cerotic acid), triacontanoic acid (melissic acid), 9c-hexadecenoic acid (palmitoleic acid), 6c-octadecenoic acid (petroselic acid), 6t-octadecenoic acid (petroselaidic acid), 9c-octadecenoic acid (oleic acid), 9t-octadecenoic acid (elaidic acid), 9c,12c-octadecadienoic acid (linoleic acid), 9t,12t-octadecadienoic acid (linolaidic acid) and 9c,12c,15c-octadecatrienoic acid (linolenic acid).

From the group of branched saturated or unsaturated monocarboxylic acids: 2-methylpentanoic acid, 2-ethylhexanoic acid, 2-propylheptanoic acid, 2-butyloctanoic acid, 2-pentylnonanoic acid, 2-hexyldecanoic acid, 2-heptylundecanoic acid, 2-octyldodecanoic acid, 2-nonyltridecanoic acid, 2-decyltetradecanoic acid, 2-undecylpentadecanoic acid, 2-dodecylhexadecanoic acid, 2-tridecylheptadecanoic acid, 2-tetradecyloctadecanoic acid, 2-pentadecylnonadecanoic acid, 2-hexadecyleicosanoic acid, 2-heptadecylheneicosanoic acid.

From the group of unbranched saturated or unsaturated di- or tricarboxylic acids: propanedioic acid (malonic acid), butanedioic acid (succinic acid), pentanedioic acid (glutaric acid), hexanedioic acid (adipic acid), heptanedioic acid (pimelic acid), octanedioic acid (suberic acid), nonanedioic acid (azelaic acid), decanedioic acid (sebacic acid), 2c-butenedioic acid (maleic acid), 2t-butenedioic acid (fumaric acid), 2-butynedicarboxylic acid (acetylenedicarboxylic acid).

From the group of aromatic mono-, di- and tricarboxylic acids: benzoic acid, 2-carboxybenzoic acid (phthalic acid), 3-carboxybenzoic acid (isophthalic acid), 4-carboxybenzoic acid (terephthalic acid), 3,4-dicarboxybenzoic acid (trimellitic acid), and 3,5-dicarboxybenzoic acid (trimesionic acid).

From the group of sugar acids: galactonic acid, mannonic acid, fructonic acid, arabinonic acid, xylonic acid, ribonic acid, 2-deoxyribonic acid, alginic acid. From the group of hydroxy acids: hydroxyphenylacetic acid (mandelic acid), 2-hydroxypropionic acid (lactic acid), hydroxysuccinic acid (malic acid), 2,3-dihydroxybutanedioic acid (tartaric acid), 2-hydroxy-1,2,3-propanetricarboxylic acid (citric acid), ascorbic acid, 2-hydroxybenzoic acid (salicylic acid), an d 3,4,5-trihydroxybenzoic acid (gallic acid).

From the group of oxo acids: 2-oxopropionic acid (pyruvic acid) and 4-oxopentanoic acid (levulinic acid).

From the group of amino acids: alanine, valine, leucine, isoleucine, proline, tryptophan, phenylalanine, methionine, glycine, serine, tyrosine, threonine, cysteine, asparagine, glutamine, aspartic acid, glutamic acid, lysine, arginine, and histidine.

Bases—from about 1% to 45% by Weight

Possible bases are either inorganic bases or organic bases provided these are compatible with the other ingredients. Inorganic bases include sodium hydroxide, lithium hydroxide, potassium hydroxide, ammonium hydroxide and the like.

Organic bases including organic amines and quaternary alkylammonium hydroxide. Organic amine which many include, but are not limited to alkanolamines, suitable for use in the present invention are miscible with polar organic solvents.

water-soluble.

have relatively high boiling points, such as 100° C. or above, and a high flash point, such as 45° C. or above.

In one embodiment, the alkanolamines are primary, secondary or tertiary amines. In an exemplary embodiment, the alkanolamines are monoamines, diamines or triamines. In a particular embodiment, the alkanolamines are monoamines. The alkanol group of the amines preferably has from 1 to 5 carbon atoms. Examples of suitable alkanolamines include, but are not limited to, mono-ethanolamine (MEA), diethanolamine, triethanolamine, tertiary-butyldiethanolamine isopropanolamine, 2-amino-1-propanol, 3-amino-1-propanol, isobutanolamine, 2-amino-2-ethoxyethanol, and 2-amino-2-ethoxy-propanol.

Quaternary alkylammonium hydroxide which may include, but are not limited to, tetramethylammonium hydroxide (TMAH), TMAH pentahydrate, benzyltetramethylammonium hydroxide (BTMAH), TBAH, choline, and Tris(2-hydroxyethyl)methylammonium hydroxide (TEMAH).

Activator—from about 0.001% to 25% by Weight

According to the present invention, the cleaning compositions comprise one or more substances from the group of activators, in particular from the groups of polyacylated alkylenediamines, in particular tetraacetylethylenediamine (TAED), N-acylimides, in particular N-nonanoylsuccinimide (NOSI), acylated phenolsulfonates, in particular n-nonanoyl- or isononanoyloxybenzenesulfonate (n- or iso-NOBS) and n-methylmorpholiniumacetonitrile, methylsulfate (MMA), and "nitrile quaternary" compound in amounts of from 0.1 to 20% by weight, preferably from 0.5 to 15% by weight and in particular from 1 to 10% by weight, in each case based on the total composition to enhance the oxidation/reduction performance of the cleaning solutions. The "nitrile quats", cationic nitrites has the formula,

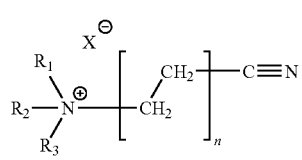

Compounds having oxidation and reduction potential—from about 0.001% to 25% by weight These compounds include hydroxylamine and its salts, such as hydroxylamine chloride, hydroxylamine nitrate, hydroxylamine sulfate, hydroxylamine phosphate or its derivatives, such as N,N-diethylhydroxylamine, N-Phenylhydroxylamine Hydrazine and its derivatives; hydrogen peroxide; persulfate salts of ammonium, potassium and sodium, permanganate salt of potassium, sodium; and other sources of peroxide are selected from the group consisting of: perborate monohydrate, perborate tetrahydrate, percarbonate, salts thereof, and combinations thereof. For environmental reasons, hydroxylamine phosphate is not preferred.

Other compounds which may be used as ingredients within the scope of the present invention are the diacyl peroxides, such as, for example, dibenzoyl peroxide. Further typical organic compounds which have oxidation/reduction potentials are the peroxy acids, particular examples being the alkyl peroxy acids and the aryl peroxy acids. Preferred representatives are (a) peroxybenzoic acid and its ring substituted derivatives, such as alkylperoxybenzoic acids, but also peroxy-a-naphthoic acid and magnesium monoperphthalate, (b) the aliphatic or substituted aliphatic peroxy acids, such as peroxylauric acid, peroxystearic acid, c-phthalimidoperoxycaproic acid [phthaloiminoperoxyhexanoic acid (PAP)], o-carboxybenzamidoperoxycaproic acid, N-nonenylamidoperadipic acid and N-nonenylamidopersuccinate, and (c) aliphatic and araliphatic peroxydicarboxylic acids, such as 1,2-diperoxycarboxylic acid, 1,9-diperoxyazelaic acid, diperoxysebacic acid, diperoxybrassylic acid, the diperoxyphthalic acids, 2-decyldiperoxybutane-1,4-dioic acid, N,N-terephthaloyldi(6-aminopercaproic acid) may be used.

Other Chelating agents—Preferably, the cleaning composition comprises (by weight of the composition) from 0.0% to 15% of additional one or more chelant.

A further possible group of ingredients are the chelate complexing agents. Chelate complexing agents are substances which form cyclic compounds with metal ions, where a single ligand occupies more than one coordination site on a central atom, i.e. is at least "bidentate". In this case, stretched compounds are thus normally closed by complex formation via an ion to give rings. The number of bonded ligands depends on the coordination number of the central ion.

Complexing groups (ligands) of customary complex forming polymers are iminodiacetic acid, hydroxyquinoline, thiourea, guanidine, dithiocarbamate, hydroxamic acid, amidoxime, aminophosphoric acid, (cycl.) polyamino, mercapto, 1,3-dicarbonyl and crown ether radicals, some of which have very specific activities toward ions of different metals For the purposes of the present invention, it is possible to use complexing agents of the prior art. These may belong to different chemical groups. Preferred chelating/complexing agents include the following, individually or in a mixture with one another:

1) polycarboxylic acids in which the sum of the carboxyl and optionally hydroxyl groups is at least 5, such as gluconic acid, 2) nitrogen-containing mono- or polycarboxylic acids, such as ethylenediaminetetraacetic acid (EDTA), N-hydroxyethylethylenediaminetriacetic acid, diethylenetriaminepentaacetic acid, hydroxy-ethyliminodiacetic acid, nitridodiacetic acid-3-propionic acid, isoserinediacetic acid, N,N-di(.β.-hydroxyethyl)glycine, N-(1,2-dicarboxy-2-hydroxyethyl) glycine, N-(1,2-dicarboxy-2-hydroxyethyl)-aspartic acid or nitrilotriacetic acid (NTA), 3) geminal diphosphonic acids, such as 1-hydroxyethane-1,1-diphosphonic acid (HEDP), higher homologs thereof having up to 8 carbon atoms, and hydroxy or amino group-containing derivatives thereof and 1-aminoethane-1,1-diphosphonic acid, higher homologs thereof having up to 8 carbon atoms, and hydroxy or amino group-containing derivatives thereof, 4) aminophosphonic acids, such as ethylenediamine-tetra (methylenephosphonic acid), diethylenetriaminepenta(methylenephosphonic acid) or nitrilotri(methylenephosphonic acid), 5) phosphonopolycarboxylic acids, such as 2-phosphonobutane-1,2,4-tricarboxylic acid, and 6) cyclodextrins.

Surfactants—from about 10 ppm to 5%.

The compositions according to the invention may thus also comprise anionic, cationic, and/or amphoteric surfactants as surfactant component.

Source of Fluoride Ions—from an Amount about 0.001% to 10%

Sources of fluoride ions include, but are not limited to, ammonium bifluoride, ammonium fluoride, hydrofluoric acid, sodium hexafluorosilicate, fluorosilicic acid and tetrafluoroboric acid.

Although ideally situated for a single wafer process, the solution according to the present invention can also be used in an immersion bath for a batch type cleaning process and provide improved cleaning.

The components of the claimed compositions can be metered and mixed in situ just prior dispensing to the substrate surface for treatment. Furthermore, analytical devices can be installed to monitor the composition and chemical ingredients can be re-constituted to mixture to the specification to deliver the cleaning performance. Critical parameters that can be monitored include physical and chemical properties of the composition, such as pH, water concentration, oxidation/reduction potential and solvent components.

The composition claims a range at point of use and also as mixtures which can be diluted to meet the specific cleaning requirements.

Summary of preferred amidoxime compounds from nitrites and not limited to

TABLE 10

| | Nitrile (N) | Amidoxime (AO) |
|---|---|---|
| 3 | 3-hydroxypropionitrile | N',3-dihydroxypropanimidamide |
| 4 | Acetonitrile | NN'-hydroxyacetimidamide |
| 5 | 3-methylaminopropionitrile | N'-hydroxy-3-(methylamino)propanimidamide |
| 6 | Benzonitrile | N'-hydroxybenzimidamide |
| 8 | 3,3' iminodipropionitrile | 3,3'-azanediylbis(N'-hydroxypropanimidamide) |
| 9 | octanonitrile | N'-hydroxyoctanimidamide |
| 10 | 3-phenylpropionitrile | N'-hydroxy-3-phenylpropanimidamide |
| 11 | ethyl 2-cyanoacetate | 3-amino-N-hydroxy-3-(hydroxyimino)propanamide |
| 12 | 2-cyanoacetic acid | 3-amino-3-(hydroxyimino)propanoic acid |
| 13 | 2-cyanoacetamide | 3-amino-3-(hydroxyimino)propanamide |
| 15 | adiponitrile | N'1,N'6-dihydroxyadipimidamide |
| 16 | sebaconitrile | N'1,N'10-dihydroxydecanebis(imidamide) |
| 17 | 4-pyridinecarbonitrile | N'-hydroxyisonicotinimidamide |

TABLE 10-continued

| | Nitrile (N) | Amidoxime (AO) |
|---|---|---|
| 18 | m-tolunitrile | N'-hydroxy-3-methylbenzimidamide |
| 19 | phthalonitrile | isoindoline-1,3-dione dioxime |
| 20 | glycolonitrile | N',2-dihydroxyacetimidamide |
| 21 | chloroacetonitrile | 2-chloro-N'-hydroxyacetimidamide |
| 22 | benzyl cyanide | product N'-hydroxy-2-phenylacetimidamide |
| 24 | Anthranilonitrile | 2-amino-N'-hydroxybenzimidamide |
| 25 | 3,3' iminodiacetonitrile | 2,2'-azanediylbis(N'-hydroxyacetimidamide) |
| 26 | 5-cyanophthalide | N'-hydroxy-1-oxo-1,3-dihydroisobenzofuran-5-carboximidamide |
| 27 | 2-cyanophenylacetonitrile | 3-aminoisoquinolin-1(4H)-one oxime or 3-(hydroxyamino)-3,4-dihydroisoquinolin-1-amine |
| 29 | cinnamonitrile | N'-hydroxycinnamimidamide |
| 30 | 5-hexynenitrile | 4-cyano-N'-hydroxybutanimidamide |
| 31 | 4-chlorobenzonitrile | 4-chloro-N'-hydroxybenzimidamide |

For example, N3 represents 3-hydroxypropionitrile and AO3 is N',3-dihydroxypropanimidamide from reacting 3-hydroxypropionitrile with hydroxylamine to form its corresponding amidoxime.

Summary of preferred amidoxime compounds from nitrites by cyanoethylation of nucleophilic compounds and not limited to the list below

TABLE 11

| ID | Nucleophilic compounds | Cyanoethylated Compounds (CE) | Amidoxime from cyanoethylated compounds (AO) |
|---|---|---|---|
| 01 | Sorbitol | 1,2,3,4,5,6-hexakis-O-(2-cyanoetyl)hexitol | 1,2,3,4,5,6-hexakis-O-[3-(hydroxyamino)-3-iminopropyl Hexitol, |
| 07 | ethylenediamine | 3,3',3'',3'''-(ethane-1,2-diylbis(azanetriyl))tetrapropanenitrile | 3,3',3'',3'''-(ethane-1,2-diylbis(azanetriyl))tetrakis(N'-hydroxypropanimidamide) |
| 28 | ethylene glycol | 3,3'-(ethane-1,2-diylbis(oxy))dipropanenitrile | 3,3'-(ethane-1,2-diylbis(oxy))bis(N'-hydroxypropanimidamide) |
| 34 | diethylamine | 3-(diethylamino)propane nitrile | 3-(diethylamino)-N'-hydroxypropanimidamide |
| 35 | piperazine | 3,3'-(piperazine-1,4-diyl)dipropanenitrile | 3,3'-(piperazine-1,4-diyl)bis(N'-hydroxypropanimidamide) |
| 36 | 2-ethoxyethanol | 3-(2-ethoxyethoxy) propanenitrile | 3-(2-ethoxyethoxy)-N'-hydroxypropanimidamide |
| 37 | 2-(2-dimethylamino ethoxy)ethanol | 3-(2-(2-(dimethylamino)ethoxy)ethoxy) propanenitrile | 3-(2-(2-(dimethylamino)ethoxy)ethoxy)-N'-hydroxypropanimidamide |
| 38 | isobutyraldehyde | 4,4-dimethyl-5-oxo pentanenitrile | N'-hydroxy-4,4-dimethyl-5-oxopentanimidamide |
| 39 | diethyl malonate | diethyl 2,2-bis(2-cyanoethyl)malonate | 2,2-bis(3-amino-3-(hydroxyimino)propyl)malonic acid |
| 40 | aniline | 3-(phenylamino) propanenitrile | N'-hydroxy-3-(phenylamino) propanimidamide |
| 41 | ammonia | 3,3',3''-nitrilotri propanenitrile | 3,3',3''-nitrilotris(N'-hydroxypropanimidamide) |
| 42 | diethyl malonate | 2,2-bis(2-cyanoethyl) malonic acid | 2,2-bis(3-amino-3-(hydroxyimino)propyl)malonic acid |
| 43 | Glycine (Mono cyanoethylated) | 2-(2-cyanoethylamino)acetic acid | 2-(3-amino-3-(hydroxyimino)propylamino)acetic acid |
| 44 | Glycine (Dicyanothylated) | 2-(bis(2-cyanoethyl)amino) acetic acid | 2-(bis(3-amino-3-(hydroxyimino)propyl)amino)acetic acid |
| 45 | malononitrile | propane-1,1,3-tricarbonitrile | N1,N'1,N'3-trihydroxypropane-1,1,3-tris(carboximidamide) |
| 46 | cyanoacetamide | 2,4-dicyano-2-(2-cyanoethyl)butanamide | 5-amino-2-(3-amino-3-(hydroxyimino)propyl)-2-(N'-hydroxycarbamimidoyl)-5-(hydroxyimino)pentanamide |
| 47 | Pentaerythritol | 3,3'-(2,2-bis((2-cyanoethoxy)methyl) propane-1,3-diyl)bis(oxy) dipropanenitrile | 3,3'-(2,2-bis((3-(hydroxyamino)-3-iminopropoxy)methyl)propane-1,3-diyl)bis(oxy)bis(N-hydroxypropanimidamide) |
| 48 | N-methyl diethanol amine | 3,3'-(2,2'-(methylazanediyl)bis(ethane-2,1-diyl)bis(oxy))dipropanenitrile | 3,3'-(2,2'-(methylazanediyl)bis(ethane-2,1-diyl)bis(oxy))bis(N'-hydroxypropanimidamide) |
| 49 | glycine anhydride | 3,3'-(2,5-dioxopiperazine-1,4-diyl)dipropanenitrile | 3,3'-(2,5-dioxopiperazine-1,4-diyl)bis(N'-hydroxypropanimidamide) |
| 50 | acetamide | N,N-bis(2-cyanoethyl)acetamide | N,N-bis(3-amino-3-(hydroxyimino)propyl)acetamide |
| 51 | anthranilonitrile | 3,3'-(2-cyanophenylazanediyl)dipropanenitrile | 3,3'-(2-(N'-hydroxycarbamimidoyl)phenylazanediyl)bis(N'-hydroxypropanimidamide) |
| 52 | diethanolamine | 3,3'-(2,2'-(2-cyanoethylazanediyl)bis(ethane-2,1-diyl)bis(oxy))dipropane nitrile | 3,3'-(2,2'-(3-amino-3-(hydroxyimino)propylazanediyl)bis(ethane-2,1-diyl))bis(oxy)bis(N'-hydroxypropanimidamide) |

For example, CE36 represents cyanoethylated product of ethylene glycol and AO36 is from reacting 3-(2-ethoxyethoxy)propanenitrile with hydroxylamine to form its corresponding amidoxime It is to be appreciated that the disclosed specific embodiments of the present invention are only illustrative of the present invention and one of ordinary skill in the art will appreciate the ability to substitute features or to eliminate disclosed features. As such, the scope of applicant's cleaning solution and cleaning methodology are to be measured by the appended claims that follow.

Thus, a novel cleaning method and solution for use in a BEOL cleaning process have been described.

While the invention has been described and illustrated herein by references to various specific materials, procedures and examples, it is understood that the invention is not restricted to the particular combinations of materials and procedures selected for that purpose. Numerous variations of such details can be implied as will be appreciated by those skilled in the art. It is intended that the specification and examples be considered as exemplary, only, with the true scope and spirit of the invention being indicated by the following claims. All references, patents, and patent applications referred to in this application are herein incorporated by reference in their entirety.

What is claimed is:

1. A method of removing residue from a substrate during integrated circuit fabrication comprising:
   providing a substrate comprising metal and/or metal alloy portions and/or layers and a surface having organic, organometallic, and/or metal oxide etching residue thereon, and
   contacting the substrate with a composition comprising:
   (i) at least one amidoxime compound selected from the group consisting of
      1,2,3,4,5,6-hexakis-O-[3-(hydroxyamino)-3-iminopropyl hexitol;
      3,3',3'',3'''-(ethane-1,2-diylbis(azanetriyl))tetrakis(N'-hydroxypropanimidamide);
      3,3'-(ethane-1,2-diylbis(oxy))bis(N'-hydroxypropanimidamide);
      3-(diethylamino)-N'-hydroxypropanimidamide:
      3,3'-(piperazine-1,4-diyl)bis(N'-hydroxypropanimidamide);
      3-(2-ethoxyethoxy)-N'-hydroxypropanimidamide;
      3-(2-(2-(dimethylamino)ethoxy)ethoxy)-N'-hydroxypropanimidamide;
      N'-hydroxy-3-(phenylamino)propanimidamide;
      3,3',3''-nitrilotris(N'-hydroxypropanimidamide);
      3,3'-(2,2-bis((3-(hydroxyamino)-3-iminopropoxy)methyl)propane-1,3-diyl)bis(oxy)bis(N-hydroxypropanimidamide);
      3,3'-(2,2'-(methylazanediyl)bis(ethane-2,1-diyl)bis(oxy))bis(N'-hydroxypropanimidamide);
      N,N-bis(3-amino-3-(hydroxyimino)propyl)acetamide;
      3,3'-(2-(N'-hydroxycarbamimidoyl)phenylazanediyl)bis(N'-hydroxypropanimidamide);
      3,3'-(2,2'-(3-amino-3-(hydroxyimino)propylazanediyl)bis(ethane-2,1-diyl))bis(oxy)bis(N'-hydroxypropanimidamide);
      N',3-dihydroxypropanimidamide;
      NN'-hydroxyacetimidamide;
      N'-hydroxy-3-(methylamino)propanimidamide;
      3,3'-azanediylbis(N'-hydroxypropanimidamide);
      3-amino-3-(hydroxyimino)propanoic acid;
      3-amino-3-(hydroxyimino)propanamide;
      N'1,N'10-dihydroxydecanebis(imidamide):
      N'-hydroxyisonicotinimidamide;
      2-dihydroxyacetimidamide;
      2-chloro-N'-hydroxyacetimidamide;
      2-amino-N'-hydroxybenzimidamide;
      2,2'-azanediylbis(N'-hydroxyacetimidamide);
      N'-hydroxy-1-oxo-1,3-dihydroisobenzofuran-5-carboximidamide;
      3-aminoisoquinolin-1(4H)-one oxime;
      3-(hydroxyamino)-3,4-dihydroisoquinolin-1-amine;
      N'-hydroxycinnamimidamide;
      4-chloro-N'-hydroxybenzimidamide;
      and salts thereof; and
   (ii) water,
      for a time and at a temperature sufficient to remove the residue from the substrate.

2. The method of claim 1, wherein the composition further comprises a surfactant.

3. The method of claim 1, wherein the concentration of water is at least about 85% by weight.

4. The method of claim 1, wherein the composition is further diluted with water prior to removing residue from a substrate during integrated circuit fabrication.

5. The method of claim 4, wherein the dilution factor is from about 10 to 500.

6. The method of claim 1, wherein the composition further comprises an organic solvent which is miscible in water.

7. The method of claim 6, wherein the organic solvent is present in an amount from about 5% to about 75% by weight and is selected from the group consisting of glycol, sulfoxide, sulfolane and pyrrolidone.

8. The method of claim 1, wherein the composition further comprises one or more acid compounds.

9. The method of claim 8, wherein the one or more acid compounds is an organic acid which is present in an amount from about 0.2% to about 45% by weight and which is selected from the group consisting of methanesulfonic acid, oxalic acid, lactic acid, citric acid, xylenesulfonic acid, toluenesulfonic acid, dodecylbenzenesulfonic acid, formic acid, tartaric acid, propionic acid, benzoic acid, ascorbic acid, gluconic acid, malic acid, malonic acid, succinic acid, gallic acid, butyric acid, trifluoracetic acid, and mixtures thereof.

10. The method of claim 1, wherein the composition further comprises one or more fluoride-containing compounds which are substantially free from metal ions.

11. The method of claim 10, wherein one or more fluoride-containing compounds is present in an amount from about 0.01% to about 5% by weight, and wherein the one or more fluoride-containing compounds comprise ammonium bifluoride, quaternary ammonium fluoride, ammonium fluoride, or mixtures thereof.

12. The method of claim 1, wherein the composition further comprises one or more basic compounds.

13. The method of claim 12, wherein the one or more basic compounds is present in an amount from about 0.1% to about 50% by weight and the one or more basic compounds is selected from the group consisting of an ammonium compound; hydroxylamine; a hydroxylamine derivative; one or more alkanolamines and mixtures thereof.

14. The method of claim 13, wherein the hydroxylamine is 50% hydroxylamine in water.

15. The method of claim 13, wherein the ammonium compound is present in the amount from about 0.3% to about 45% by weight and is selected from the group consisting of tetramethylammonium hydroxide (TMAH), TMAH pentahydrate, BTMAH, TBAH, choline, and THEMAH.

16. The method of claim 13, wherein the alkanolamine component is present in the amount from about 0.3% to about 45% by weight and comprises monoethanolamine, 2-(2-hydroxylethylamino)ethanol, 2-(2-aminoethoxy)ethanol, N,N, N-tris(2-hydroxyethyl)-ammonia, isopropanolamine, 3-amino-1-propanol, 2-amino-1-propanol, 2-(N-methylamino)ethanol, 2-(2-aminoethylamino)ethanol, tris(hydroxymethyl)aminoethane, or mixtures thereof.

17. The method of claim 13, wherein the one or more basic compounds comprise hydroxylamine and/or a hydroxylamine derivative present in an amount from about 0.3% to about 45% by weight.

18. The method of claim 17, wherein the one or more basic compounds comprise hydroxylamine or N,N-diethylhydroxylamine.

* * * * *

UNITED STATES PATENT AND TRADEMARK OFFICE
CERTIFICATE OF CORRECTION

| | | |
|---|---|---|
| PATENT NO. | : 8,062,429 B2 | Page 1 of 1 |
| APPLICATION NO. | : 12/260625 | |
| DATED | : November 22, 2011 | |
| INVENTOR(S) | : Lee | |

It is certified that error appears in the above-identified patent and that said Letters Patent is hereby corrected as shown below:

Column 12, line 23: Delete "nitrites," and replace with -- nitriles --

Column 12, line 26: Delete "nitrites," and replace with -- nitriles --

Column 58, line 1: Delete "br S," and replace with -- br s, --

Signed and Sealed this
Twenty-ninth Day of May, 2012

David J. Kappos
*Director of the United States Patent and Trademark Office*